(12) United States Patent
Leipold et al.

(10) Patent No.: US 11,300,816 B2
(45) Date of Patent: Apr. 12, 2022

(54) QUANTUM STRUCTURE INCORPORATING THETA ANGLE CONTROL

(71) Applicant: equal1.labs Inc., Fremont, CA (US)

(72) Inventors: Dirk Robert Walter Leipold, Fremont, CA (US); George Adrian Maxim, Saratoga, CA (US); Michael Albert Asker, San Jose, CA (US)

(73) Assignee: Equal1.Labs Inc., Fremont, CA (US)

( * ) Notice: Subject to any disclaimer, the term of this patent is extended or adjusted under 35 U.S.C. 154(b) by 535 days.

(21) Appl. No.: 16/445,760

(22) Filed: Jun. 19, 2019

(65) Prior Publication Data
US 2019/0392338 A1  Dec. 26, 2019

Related U.S. Application Data

(60) Provisional application No. 62/794,655, filed on Jan. 20, 2019, provisional application No. 62/794,591, (Continued)

(51) Int. Cl.
*B82Y 10/00* (2011.01)
*G02F 1/017* (2006.01)
(Continued)

(52) U.S. Cl.
CPC .......... *G02F 1/01725* (2013.01); *B82Y 10/00* (2013.01); *B82Y 15/00* (2013.01);
(Continued)

(58) Field of Classification Search
CPC ..... B82Y 10/00; B82Y 15/00; G02F 1/01725; G02F 1/1791; G06F 1/20; G06F 11/0724; (Continued)

(56) References Cited

U.S. PATENT DOCUMENTS 6,301,029 B1   10/2001  Azuma et al.
6,472,681 B1   10/2002  Kane et al.
(Continued)

FOREIGN PATENT DOCUMENTS

EP   1860600    11/2007
EP   2421043    2/2012
(Continued)

OTHER PUBLICATIONS

Guo et al., "Control and Readout of Software in Superconducting Quantum Computing," https://arxiv.org/abs/1806.04021, Jun. 2018.
(Continued)

*Primary Examiner* — Kurtis R Bahr
(74) *Attorney, Agent, or Firm* — Zaretsky Group PC; Howard Zaretsky

(57) ABSTRACT

Novel and useful electronic and magnetic control of several quantum structures that provide various control functions. An electric field provides control and is created by a voltage applied to a control terminal. Alternatively, an inductor or resonator provides control. An electric field functions as the main control and an auxiliary magnetic field provides additional control on the control gate. The magnetic field is used to control different aspects of the quantum structure. The magnetic field impacts the spin of the electron by tending to align to the magnetic field. The Bloch sphere is a geometrical representation of the state of a two-level quantum system and defined by a vector in x, y, z spherical coordinates. The representation includes two angles θ and φ whereby an appropriate electrostatic gate control voltage signal is generated to control the angle θ of the quantum state and an appropriate control voltage to an interface device generates a corresponding electrostatic field in the quantum structure to control the angle φ.

22 Claims, 70 Drawing Sheets

Related U.S. Application Data filed on Jan. 19, 2019, provisional application No. 62/791,818, filed on Jan. 13, 2019, provisional application No. 62/788,865, filed on Jan. 6, 2019, provisional application No. 62/731,810, filed on Sep. 14, 2018, provisional application No. 62/726,397, filed on Sep. 3, 2018, provisional application No. 62/726,290, filed on Sep. 2, 2018, provisional application No. 62/726,271, filed on Sep. 2, 2018, provisional application No. 62/703,888, filed on Jul. 27, 2018, provisional application No. 62/698,278, filed on Jul. 15, 2018, provisional application No. 62/695,842, filed on Jul. 10, 2018, provisional application No. 62/694,022, filed on Jul. 5, 2018, provisional application No. 62/692,804, filed on Jul. 1, 2018, provisional application No. 62/692,844, filed on Jul. 1, 2018, provisional application No. 62/692,745, filed on Jun. 30, 2018, provisional application No. 62/689,291, filed on Jun. 25, 2018, provisional application No. 62/689,166, filed on Jun. 24, 2018, provisional application No. 62/689,100, filed on Jun. 23, 2018, provisional application No. 62/689,035, filed on Jun. 22, 2018, provisional application No. 62/687,803, filed on Jun. 21, 2018, provisional application No. 62/688,341, filed on Jun. 21, 2018, provisional application No. 62/687,793, filed on Jun. 20, 2018, provisional application No. 62/687,800, filed on Jun. 20, 2018, provisional application No. 62/687,779, filed on Jun. 20, 2018.

(51) Int. Cl.

| | |
|---|---|
| *G06N 10/00* | (2022.01) |
| *H01L 29/12* | (2006.01) |
| *H01L 29/66* | (2006.01) |
| *H03K 19/195* | (2006.01) |
| *B82Y 15/00* | (2011.01) |
| *G06F 1/20* | (2006.01) |
| *G06F 11/07* | (2006.01) |
| *G06F 15/16* | (2006.01) |
| *G06N 99/00* | (2019.01) |
| *G11C 19/32* | (2006.01) |
| *H01L 21/02* | (2006.01) |
| *H01L 27/088* | (2006.01) |
| *H01L 27/18* | (2006.01) |
| *H01L 29/15* | (2006.01) |
| *H01L 29/417* | (2006.01) |
| *H01L 33/04* | (2010.01) |
| *H01L 39/22* | (2006.01) |
| *H03M 1/34* | (2006.01) |
| *H03M 1/66* | (2006.01) |
| *H03K 3/38* | (2006.01) |
| *H03M 13/15* | (2006.01) |

(52) U.S. Cl.
CPC ............ *G06F 1/20* (2013.01); *G06F 11/0724* (2013.01); *G06F 11/0751* (2013.01); *G06F 11/0793* (2013.01); *G06F 15/16* (2013.01); *G06N 10/00* (2019.01); *G06N 99/00* (2013.01); *G11C 19/32* (2013.01); *H01L 21/02694* (2013.01); *H01L 27/0883* (2013.01); *H01L 27/18* (2013.01); *H01L 29/122* (2013.01); *H01L 29/157* (2013.01); *H01L 29/41791* (2013.01); *H01L 29/66977* (2013.01); *H01L 29/66984* (2013.01); *H01L 33/04* (2013.01); *H01L 39/221* (2013.01); *H01L 39/228* (2013.01); *H03K 3/38* (2013.01); *H03K 19/195* (2013.01); *H03M 1/34* (2013.01); *H03M 1/66* (2013.01); *H03M 13/1575* (2013.01); *G02F 1/01791* (2021.01)

(58) Field of Classification Search
CPC .. G06F 11/0751; G06F 11/0793; G06F 15/16; G06N 99/00; G11C 19/32; H03K 3/38; H03K 19/195; H01L 21/02694; H01L 27/0883; H01L 27/18; H01L 29/122; H01L 29/157; H01L 29/41791; H01L 29/66977; H01L 29/66984; H01L 33/04; H03M 1/34; H03M 1/66; H03M 13/1575
See application file for complete search history.

(56) References Cited

U.S. PATENT DOCUMENTS

| | | | |
|---|---|---|---|
| 6,597,010 | B2 | 7/2003 | Erikkson et al. |
| 6,635,898 | B2 | 10/2003 | Williams et al. |
| 6,657,222 | B1 | 12/2003 | Foden et al. |
| 6,720,589 | B1 | 4/2004 | Shields |
| 6,787,794 | B2 | 9/2004 | Cain et al. |
| 7,026,641 | B2 | 4/2006 | Mohseni |
| 7,317,230 | B2 | 1/2008 | Lee et al. |
| 7,451,292 | B2 | 11/2008 | Routt |
| 7,498,832 | B2 | 3/2009 | Baumgardner et al. |
| 7,655,850 | B1 | 2/2010 | Ahn |
| 7,659,538 | B2 | 2/2010 | Snyder et al. |
| 7,830,695 | B1 | 11/2010 | Moon |
| 8,035,540 | B2 | 10/2011 | Berkley |
| 8,229,863 | B2 | 7/2012 | Amin et al. |
| 8,294,137 | B2 | 10/2012 | Jain et al. |
| 8,507,894 | B2 | 8/2013 | Morello et al. |
| 9,126,829 | B2 | 9/2015 | Wu |
| 9,153,594 | B2 | 10/2015 | Jain |
| 9,269,052 | B2 | 2/2016 | Svore et al. |
| 9,633,313 | B2 | 4/2017 | Svore et al. |
| 9,691,033 | B2 | 6/2017 | Rogge et al. |
| 9,741,081 | B2 | 8/2017 | Alboszta et al. |
| 9,842,921 | B2 | 12/2017 | Erikkson et al. |
| 9,858,531 | B1 | 1/2018 | Monroe et al. |
| 9,859,409 | B2 | 1/2018 | Cheng et al. |
| 9,978,020 | B1 | 5/2018 | Gambetta et al. |
| 10,068,903 | B2 | 9/2018 | Edwards et al. |
| 10,192,976 | B2 | 1/2019 | Petta et al. |
| 10,229,365 | B2 | 3/2019 | Fuechsle et al. |
| 10,255,556 | B2 | 4/2019 | Hollenberg et al. |
| 10,311,369 | B2 | 6/2019 | Epstein |
| 10,332,023 | B2 | 6/2019 | Mezzacapo et al. |
| 10,340,290 | B2 | 7/2019 | Pawlak |
| 10,380,496 | B2 | 8/2019 | Elsherbini et al. |
| 10,483,980 | B2 | 11/2019 | Sete et al. |
| 10,491,221 | B1 | 11/2019 | McKay et al. |
| 10,528,884 | B2 | 1/2020 | Morello et al. |
| 10,560,096 | B2 | 2/2020 | Raeisi et al. |
| 10,565,515 | B2 | 2/2020 | Lampert et al. |
| 10,635,989 | B2 | 4/2020 | Blais et al. |
| 10,726,351 | B1 | 7/2020 | Li et al. |
| 10,763,349 | B2 | 9/2020 | Pillarisetty et al. |
| 10,804,399 | B2 | 10/2020 | Pillarisetty |
| 2002/0190249 | A1 | 12/2002 | Williams et al. |
| 2008/0185576 | A1 | 8/2008 | Hollenberg et al. |
| 2009/0127542 | A1 | 5/2009 | Sugaya |
| 2011/0121895 | A1 | 5/2011 | Morello et al. |
| 2012/0212375 | A1 | 8/2012 | Depree |
| 2014/0026107 | A1 | 1/2014 | Bocharov |
| 2014/0203243 | A1 | 7/2014 | Xiao |
| 2016/0112066 | A1 | 4/2016 | Ashikhmin |
| 2016/0189053 | A1 | 6/2016 | Alboszta et al. |
| 2016/0021560 | A1 | 7/2016 | Alboszta et al. |
| 2016/0268406 | A1 | 9/2016 | Barraud |
| 2016/0300155 | A1 | 10/2016 | Betz et al. |
| 2017/0147939 | A1* | 5/2017 | Dzurak .................. G06N 10/00 |
| 2018/0260732 | A1 | 9/2018 | Bloom |
| 2018/0279429 | A1 | 9/2018 | Sadwick |
| 2019/0044049 | A1 | 2/2019 | Thomas et al. |

(56) References Cited

U.S. PATENT DOCUMENTS

| | | |
|---|---|---|
| 2019/0044050 A1 | 2/2019 | Pillarisetty et al. |
| 2019/0080256 A1 | 3/2019 | Irwin |
| 2019/0130298 A1 | 5/2019 | Pioro-Ladriere et al. |
| 2019/0181256 A1 | 6/2019 | Roberts et al. |
| 2019/0198618 A1 | 6/2019 | George et al. |
| 2019/0214385 A1 | 7/2019 | Roberts et al. |
| 2019/0266511 A1 | 8/2019 | Pillarisetty |
| 2019/0273197 A1 | 9/2019 | Roberts |
| 2019/0334020 A1 | 10/2019 | Amin et al. |
| 2019/0392352 A1 | 12/2019 | Lampert et al. |
| 2019/0392912 A1* | 12/2019 | Leipold ............. H01L 29/66977 |
| 2019/0392913 A1* | 12/2019 | Leipold ............. H01L 27/0883 |
| 2019/0392917 A1* | 12/2019 | Leipold ............. H01L 27/0886 |
| 2020/0127096 A1 | 4/2020 | Eendebak |

FOREIGN PATENT DOCUMENTS

| | | |
|---|---|---|
| EP | 3505490 | 1/2018 |
| EP | 3869421 | 8/2021 |
| WO | 2018004554 | 1/2018 |

OTHER PUBLICATIONS

Alkhalil et al., "Realization of Fully Tunable FinFET Double Quantum Dots with Close Proximity Plunger Gates," 12th IEEE International Conference on Nanotechnology (IEEE-NANO), 2012.
Kuhlmann et al., "Ambipolar quantum dots in undoped silicon fin field-effect transistors," Applied Physics Letters 113 122107, 2018.
Angus et al., "Gate-Defined Quantum Dots in Intrinsic Silicon," Nano Letters, vol. 7, No. 7, pp. 2051-2055, 2007.
Lansbergen et al., "Transport-based dopant metrology in advanced FinFETs," IEEE, 2008.
Rashba. "Electron spin operation by electric fields: spin dynamics and spin injection," Physica E 20 (2004) pp. 189-195.
Zajac et al., "Resonantly driven CNOT gate for electron spins", Science 359, pp. 439-442, 2018.
Veldhorst et al., "A Two Qubit Logic Gate in Silicon", 2014.

* cited by examiner

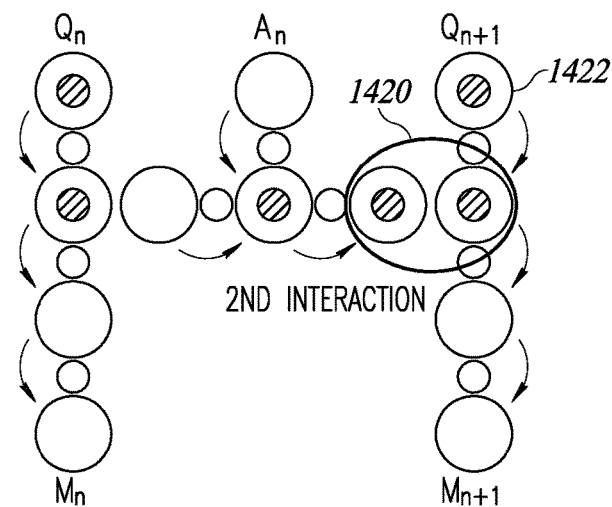
FIG. 15G
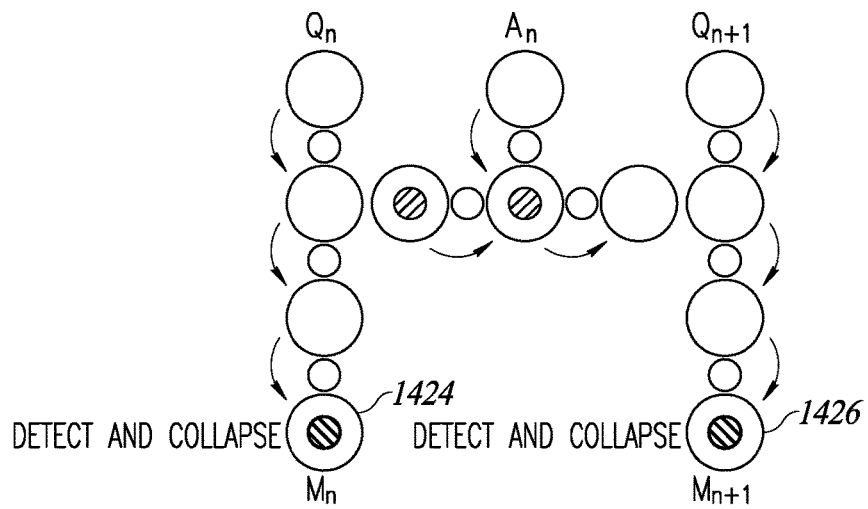
FIG. 15H
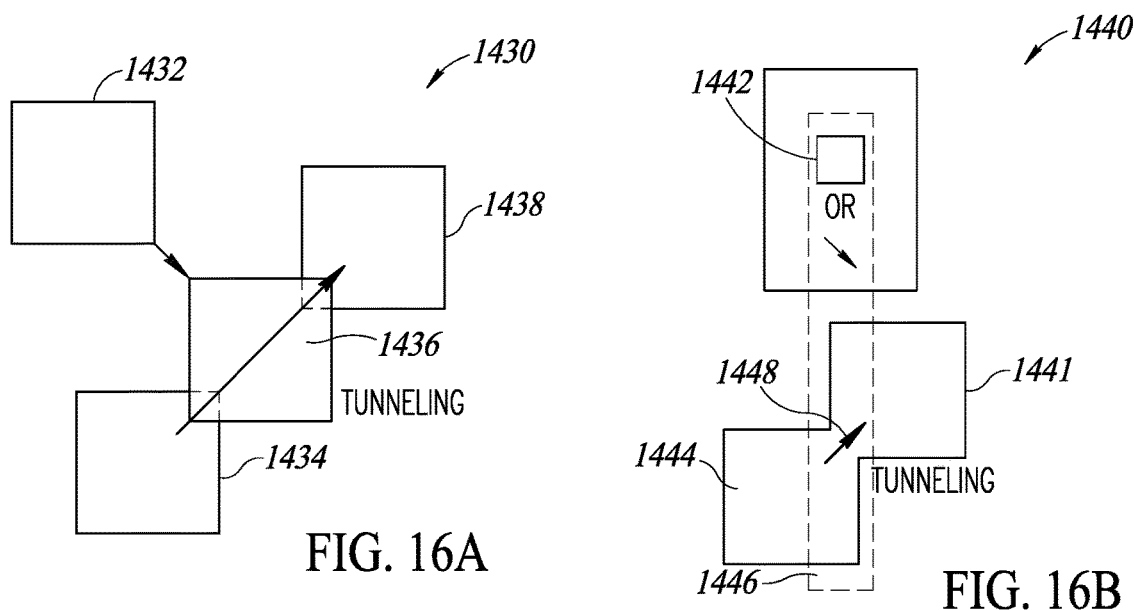
FIG. 16A
FIG. 16B

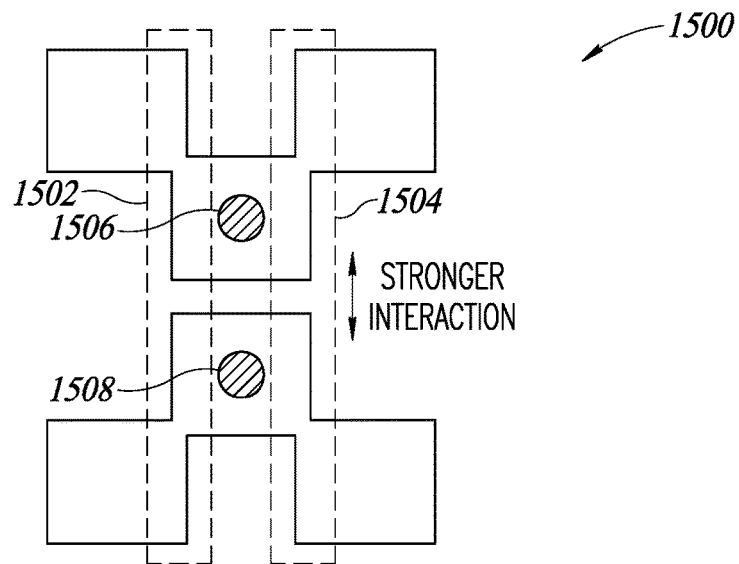
FIG. 16I
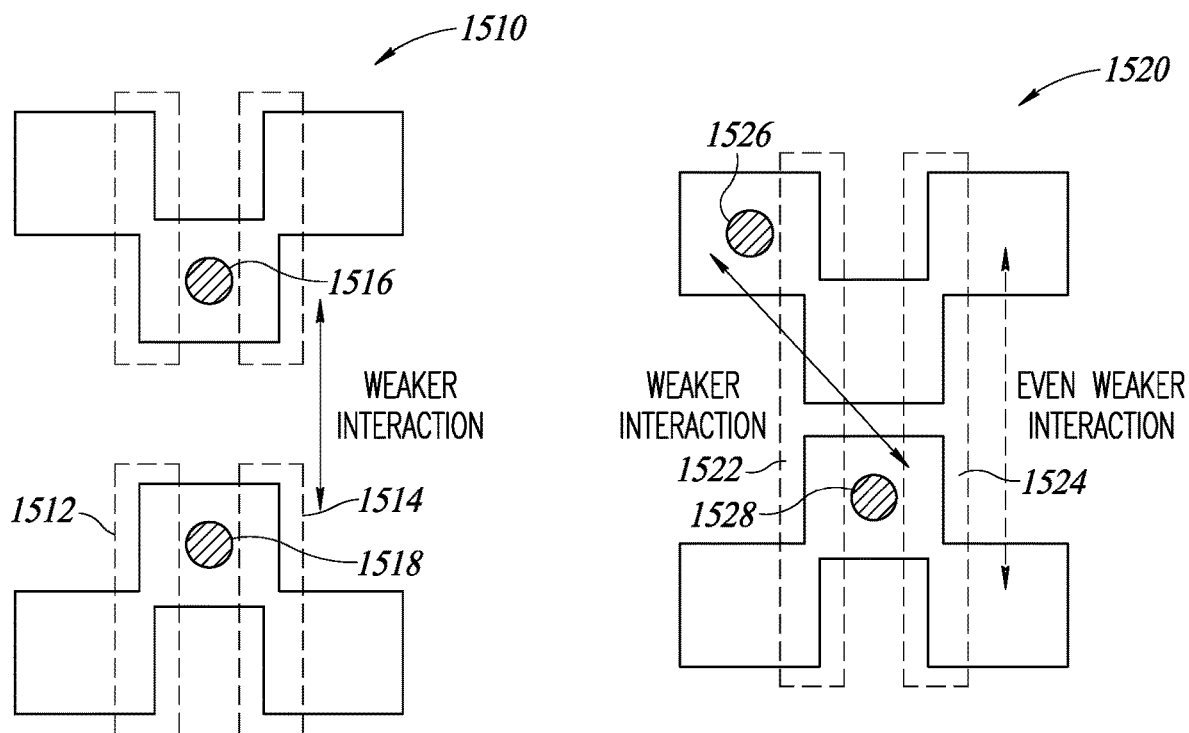
FIG. 16J
FIG. 16K

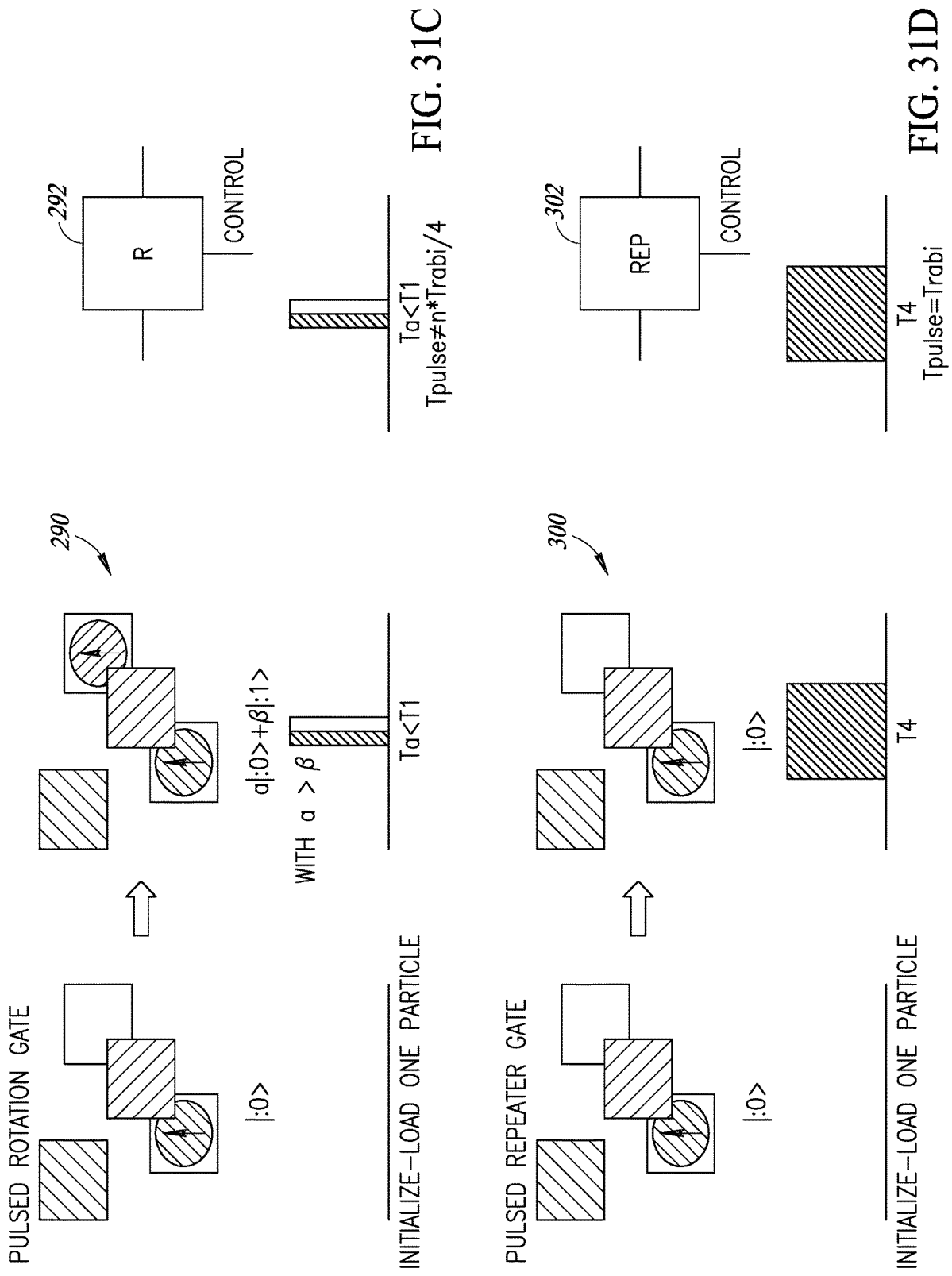

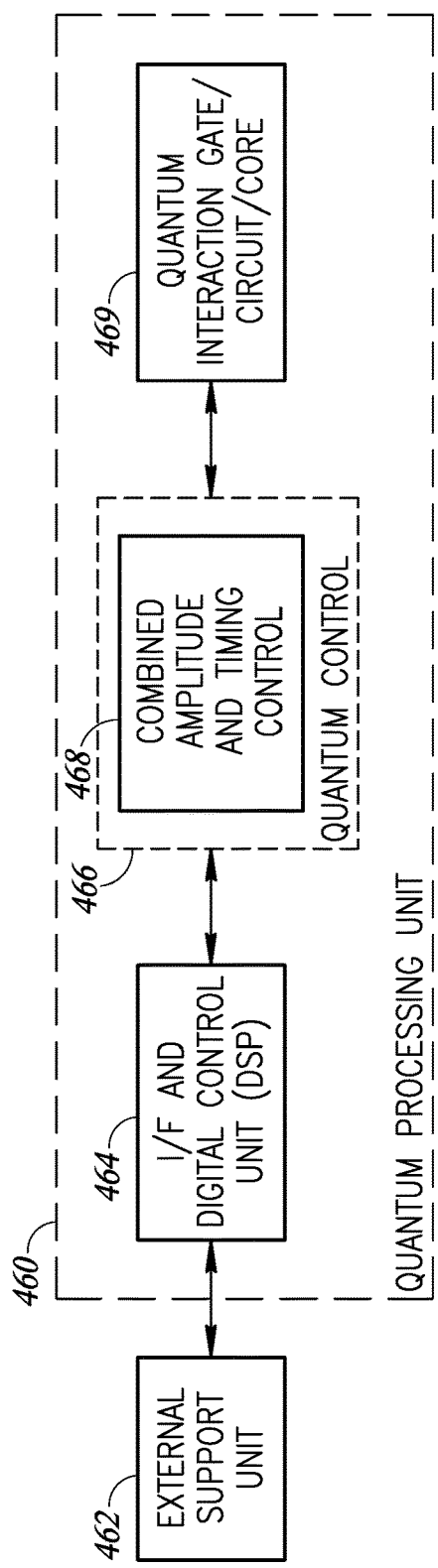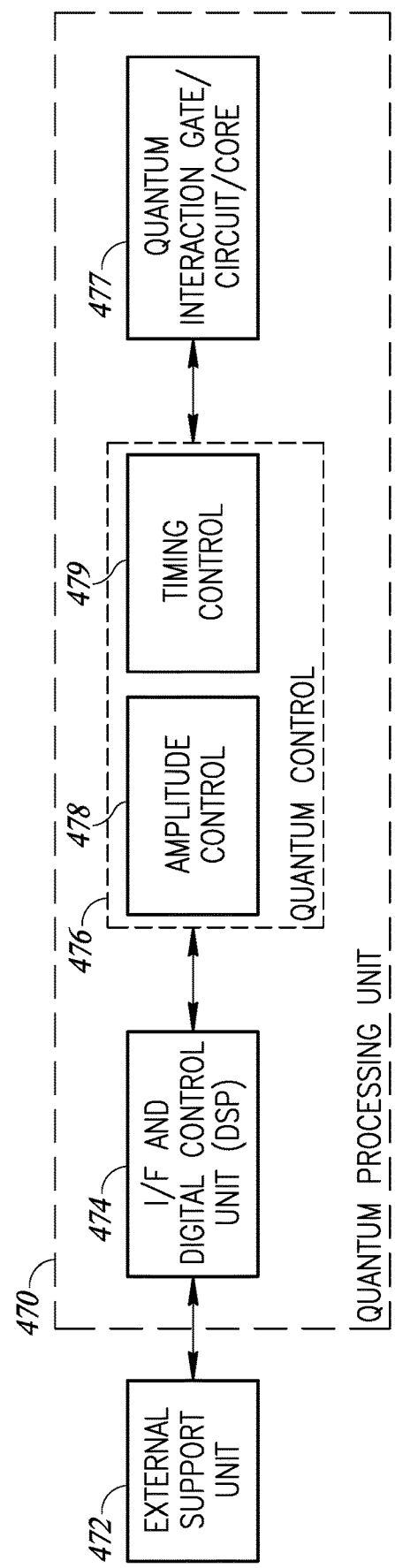
FIG. 37A
FIG. 37B

QUANTUM STRUCTURE INCORPORATING THETA ANGLE CONTROL

REFERENCE TO PRIORITY APPLICATIONS

This application claims the benefit of U.S. Provisional Application No. 62/687,800, filed Jun. 20, 2018, entitled "Electric Signal Pulse-Width And Amplitude Controlled And Re-Programmable Semiconductor Quantum Rotation Gates," U.S. Provisional Application No. 62/687,803, filed Jun. 21, 2018, entitled "Semiconductor Quantum Structures and Computing Circuits Using Local Depleted Well Tunneling," U.S. Provisional Application No. 62/689,100, filed Jun. 23, 2018, entitled "Semiconductor Controlled Entangled-Aperture-Logic Quantum Shift Register," U.S. Provisional Application No. 62/694,022, filed Jul. 5, 2018, entitled "Double-V Semiconductor Entangled-Aperture-Logic Parallel Quantum Interaction Path," U.S. Provisional Application No. 62/687,779, filed Jun. 20, 2018, entitled "Semiconductor Quantum Structures And Gates Using Through-Thin-Oxide Well-To-Gate Aperture Tunneling," U.S. Provisional Application No. 62/687,793, filed Jun. 20, 2018, entitled "Controlled Semiconductor Quantum Structures And Computing Circuits Using Aperture Well-To-Gate Tunneling," U.S. Provisional Application No. 62/688,341, filed Jun. 21, 2018, entitled "3D Semiconductor Quantum Structures And Computing Circuits Using Fin-To-Gate Tunneling," U.S. Provisional Application No. 62/689,035, filed Jun. 22, 2018, entitled "3D Semiconductor Quantum Structures And Computing Circuits Using Controlled Tunneling Through Local Fin Depletion Regions," U.S. Provisional Application No. 62/689,291, filed Jun. 25, 2018, entitled "Semiconductor Quantum Dot And Qubit Structures Using Aperture-Tunneling Through Oxide Layer," U.S. Provisional Application No. 62/689,166, filed Jun. 24, 2018, entitled "Semiconductor Entangled-Aperture-Logic Quantum Ancillary Gates," U.S. Provisional Application No. 62/692,745, filed Jun. 20, 2018, entitled "Re-Programmable And Re-Configurable Quantum Processor Using Pulse-Width Based Rotation Selection And Path Access Or Bifurcation Control," U.S. Provisional Application No. 62/692,804, filed Jul. 1, 2018, entitled "Quantum Processor With Dual-Path Quantum Error Correction," U.S. Provisional Application No. 62/692,844, filed Jul. 1, 2018, entitled "Quantum Computing Machine With Partial Data Readout And Re-Injection Into The Quantum State," U.S. Provisional Application No. 62/726,290, filed Jun. 20, 2018, entitled "Controlled-NOT and Tofolli Semiconductor Entangled-Aperture-Logic Quantum Gates," U.S. Provisional Application No. 62/695,842, filed Jul. 10, 2018, entitled "Entangled Aperture-Logic Semiconductor Quantum Computing Structure with Intermediary Interactor Path," U.S. Provisional Application No. 62/698,278, filed Jul. 15, 2018, entitled "Entangled Aperture-Logic Semiconductor Quantum Bifurcation and Merging Gate," U.S. Provisional Application No. 62/726,397, filed Sep. 3, 2018, entitled "Semiconductor Quantum Structure With Simultaneous Shift Into Entangled State," U.S. Provisional Application No. 62/791,818, filed Jan. 13, 2019, entitled "Semiconductor Process for Quantum Structures with Staircase Active Well," U.S. Provisional Application No. 62/788,865, filed Jan. 6, 2018, entitled "Semiconductor Process For Quantum Structures Without Inner Contacts And Doping Layers," U.S. Provisional Application No. 62/794,591, filed Jan. 19, 2019, entitled "Semiconductor Quantum Structures Using Localized Aperture Channel Tunneling Through Controlled Depletion Region," U.S. Provisional Application No. 62/703,888, filed Jul. 27, 2018, entitled "Aperture Tunneling Semiconductor Quantum Dots and Chord-Line Quantum Computing Structures," U.S. Provisional Application No. 62/726,271, filed Sep. 2, 2018, entitled "Controlled Local Thermal Activation Of Freeze-Out Semiconductor Circuits For Cryogenic Operation," U.S. Provisional Application No. 62/731,810, filed Sep. 14, 2018, entitled "Multi-Stage Semiconductor Quantum Detector with Anti-Correlation Merged With Quantum Core," and U.S. Provisional Application No. 62/794,655, filed Jan. 20, 2019, entitled "Semiconductor Quantum Structures Using Preferential Tunneling Direction Through Thin Insulator Layers." All of which are incorporated herein by reference in their entirety.

FIELD OF THE DISCLOSURE

The subject matter disclosed herein relates to the field of quantum computing and more particularly relates to electronic and magnetic control of quantum interaction gates used to perform quantum functions and operations.

BACKGROUND OF THE INVENTION

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, analog and digital are the two main approaches to physically implementing a quantum computer. Analog approaches are further divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

The key challenge of quantum computing is isolating such microscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement of the particles to well below the energy/movement coming from their desired interaction. Current physical quantum computers, however, are very noisy and quantum error correction is commonly applied to compensate for the noise.

Most existing quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of milli-kelvin (mK) temperatures, that are difficult to achieve and where it is difficult to dissipate significant power to operate the quantum machine.

SUMMARY OF THE INVENTION

The present invention describes electronic and magnetic control of several quantum structures that provide various control functions. Particles are brought into close proximity so they can interact with one another. Particles relatively far away one from the other have small or negligible interaction. Two or more quantum particles or states brought in close proximity will interact and exchange information.

A target semiconductor quantum interaction gate is the quantum interaction gate to be controlled. An electric field provides control and is created by a voltage applied to a control terminal. Note that there can be multiple electric control fields where different voltages are applied to each of them. In another embodiment, multiple quantum interaction gates can be used where the control terminals are appropriately controlled to realize different quantum functions. Another way of controlling quantum interaction gates is by using an inductor or resonator. Typically, an electric field functions as the main control and an auxiliary magnetic field provides additional control on the control gate. The magnetic field is used to control different aspects of the quantum structure. The magnetic field has an impact on the spin of the electron such that the spin tends to align to the magnetic field.

The Bloch sphere is a geometrical representation of the state of a two-level quantum system or qubit. The space of pure states of a quantum system is given by the one-dimensional subspaces of the corresponding Hilbert space. The north and south poles of the sphere correspond to the pure states of the system, e.g., |0> or |A> and |1> or |B>, whereas the other points on the sphere correspond to the mixed states. The system can be described graphically by a vector in the x, y, z spherical coordinates. A representation of the state of the system in spherical coordinates includes two angles $\theta$ and $\varphi$. Considering a unitary sphere, the state of the system is completely described by the vector $\Psi$. The vector $\Psi$ in spherical coordinates can be described in two angles $\theta$ and $\varphi$. The angle $\theta$ is between the vector $\Psi$ and the z-axis and the angle $\varphi$ is the angle between the projection of the vector on the XY plane and the x-axis. Thus, any position on the sphere is described by these two angles $\theta$ and $\varphi$.

Generating an appropriate electrostatic gate control voltage signal, the angle $\theta$ of the quantum state of a quantum structure can be controlled. Applying an appropriate control voltage to an interface device generates a corresponding electrostatic field in the quantum structure functions to control the angle $\varphi$.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a method of controlling an angle $\theta$ of a quantum state of a quantum interaction gate incorporating a target qubit having at least two qdots and a control gate fabricated therebetween, the method comprising generating an electrostatic gate control voltage signal in accordance with a desired angle $\theta$, and applying said classic electrostatic gate control voltage signal to said control gate to control the angle $\theta$ of the quantum state of the target qubit thereby.

There is also provided in accordance with the invention, a method of controlling an angle $\theta$ of a quantum state of a semiconductor quantum interaction gate incorporating a target qubit having at least two qdots and a control gate fabricated therebetween, the method comprising providing a control qubit, placing said control qubit in close proximity to the target qubit to elicit quantum interaction therebetween, said control qubit having at least two qdots and a control gate fabricated therebetween, controlling the quantum state of the control qubit so as to impact the quantum state of the target qubit thereby controlling the angle $\theta$ of the target qubit.

There is further provided in accordance with the invention, a method of controlling an angle $\theta$ of a quantum state of a semiconductor quantum interaction gate incorporating a target qubit having at least two qdots and a control gate fabricated therebetween, the method comprising generating a electrostatic gate control voltage in accordance with a desired angle $\theta$, providing a control qubit, placing said control qubit in close proximity to the target qubit to elicit quantum interaction therebetween, said control qubit having at least two qdots and a control gate fabricated therebetween, and controlling the quantum state of the control qubit so as to impact the quantum state of the target qubit and applying said electrostatic gate control voltage to said control gate, both of which combined control the angle $\theta$ of the target qubit thereby.

BRIEF DESCRIPTION OF THE DRAWINGS

FIG. 15G is a diagram illustrating a seventh stage of an example quantum interaction gate particle interaction;

FIG. 15H is a diagram illustrating an eighth stage of an example quantum interaction gate particle interaction;

FIG. 16A is a diagram illustrating an example semiconductor qubit using tunneling through a separate layer planar structure;

FIG. 16B is a diagram illustrating an example semiconductor qubit using tunneling through a local depleted well planar structure;

FIG. 16I is a diagram illustrating a first example quantum interaction gate with interaction between two particles in different continuous wells;

FIG. 16J is a diagram illustrating a second example quantum interaction gate with interaction between two particles in different continuous wells;

FIG. 16K is a diagram illustrating a second example quantum interaction gate with interaction between two particles in different continuous wells;

FIG. 31C is a diagram illustrating an example pulsed rotation gate;

FIG. 31D is a diagram illustrating an example pulsed repeater gate;

FIG. 37A is a diagram illustrating an example quantum processing unit incorporating a combined amplitude and timing circuit;

FIG. 37B is a diagram illustrating an example quantum processing unit incorporating separate amplitude and timing circuits;

FIG. 38B is a diagram illustrating a second example control gate signal;

FIG. 38C is a diagram illustrating a third example control gate signal;

FIG. 38D is a diagram illustrating a fourth example control gate signal;

FIG. 38E is a diagram illustrating a fifth example control gate signal;

FIG. 38F is a diagram illustrating a sixth example control gate signal;

FIG. 38G is a diagram illustrating a seventh example control gate signal;

FIG. 38H is a diagram illustrating an eighth example control gate signal;

FIG. 38I is a diagram illustrating a ninth example control gate signal;

FIG. 38J is a diagram illustrating a tenth example control gate signal;

FIG. 38K is a diagram illustrating an eleventh example control gate signal;

FIG. 38L is a diagram illustrating a twelfth example control gate signal;

FIG. 38M is a diagram illustrating a thirteenth example control gate signal;

Figure 38A:
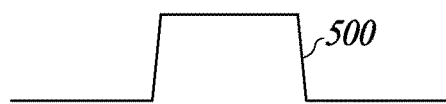
FIG. 38A is a diagram illustrating a first example control gate signal.
Figure 38B:
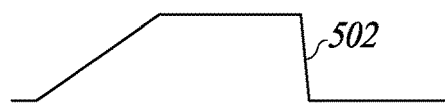
Figure 38C:
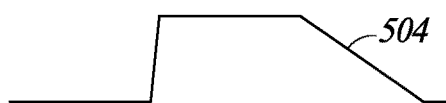
Figure 38D:
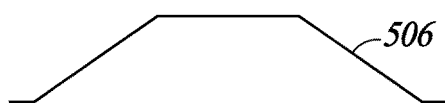
Figure 38E:
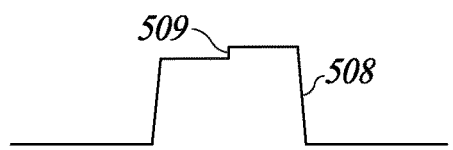
Figure 38F:
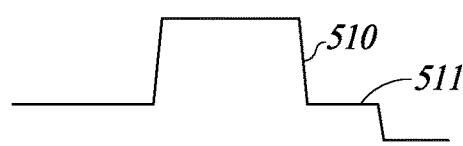
Figure 38G:
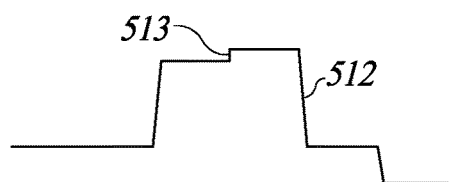
Figure 38H:
Figure 38I:
Figure 38J:
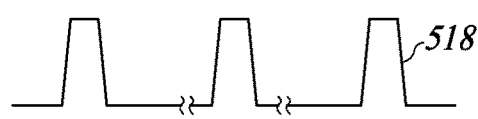
Figure 38K:
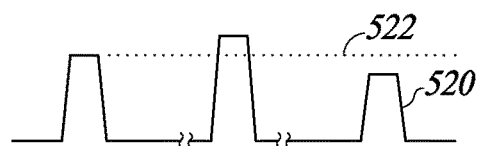
Figure 38L:
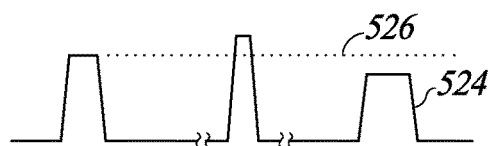
Figure 38M:
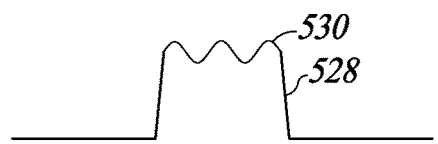
Figure 38N:
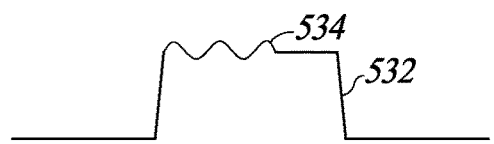
Figure 38O:
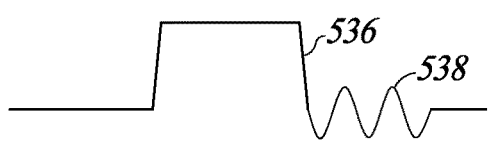
Figure 38P:
Figure 38Q:
Figure 38R:
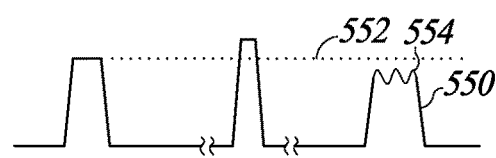
Figure 39A:
Figure 39A:
Figure 39B:
Figure 39B:
Figure 39C:
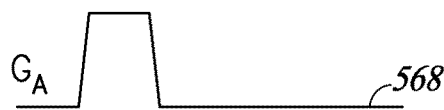
Figure 39C:
Figure 39D:
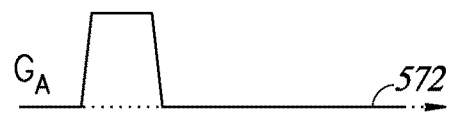
Figure 39D:
Figure 39E:
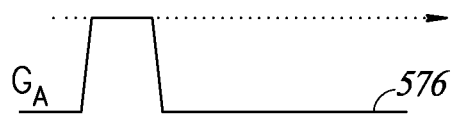
Figure 39F:
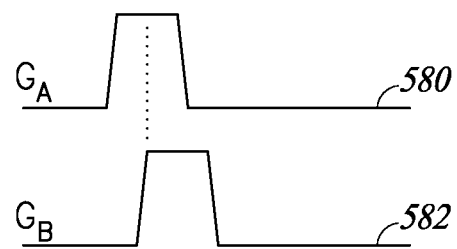
Figure 39G:
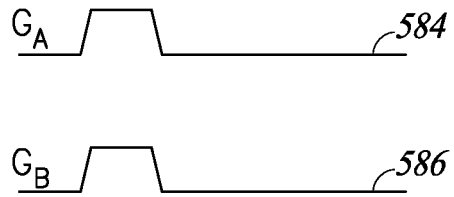
Figure 39H:
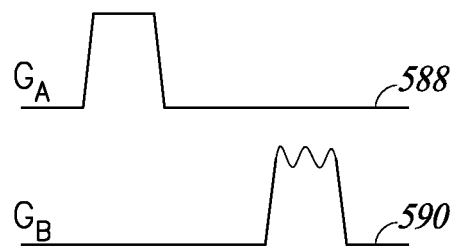
Figure 39I:
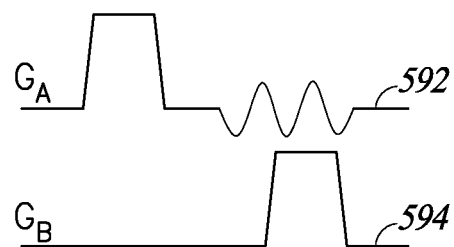
Figure 40A:
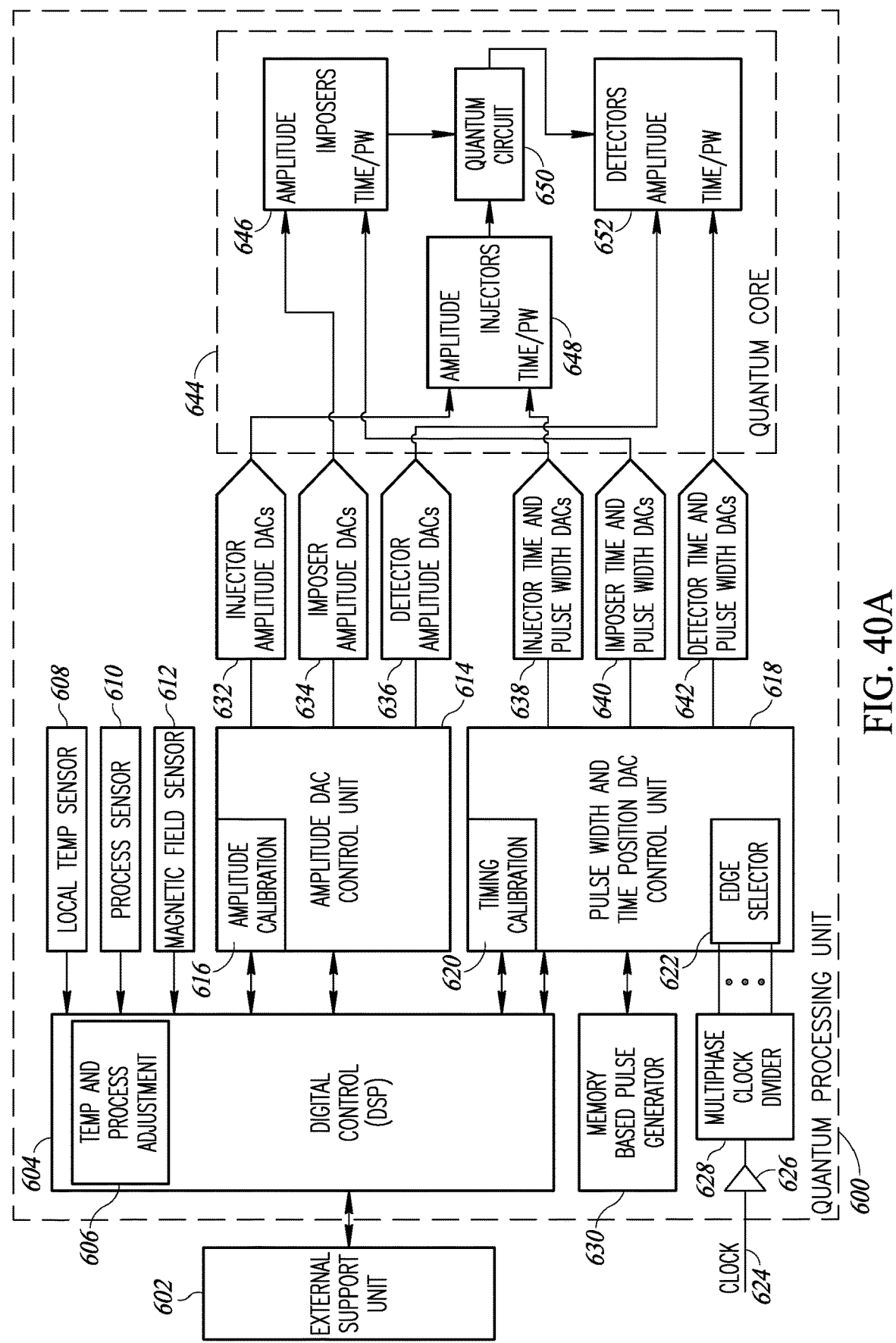
Figure 40B:
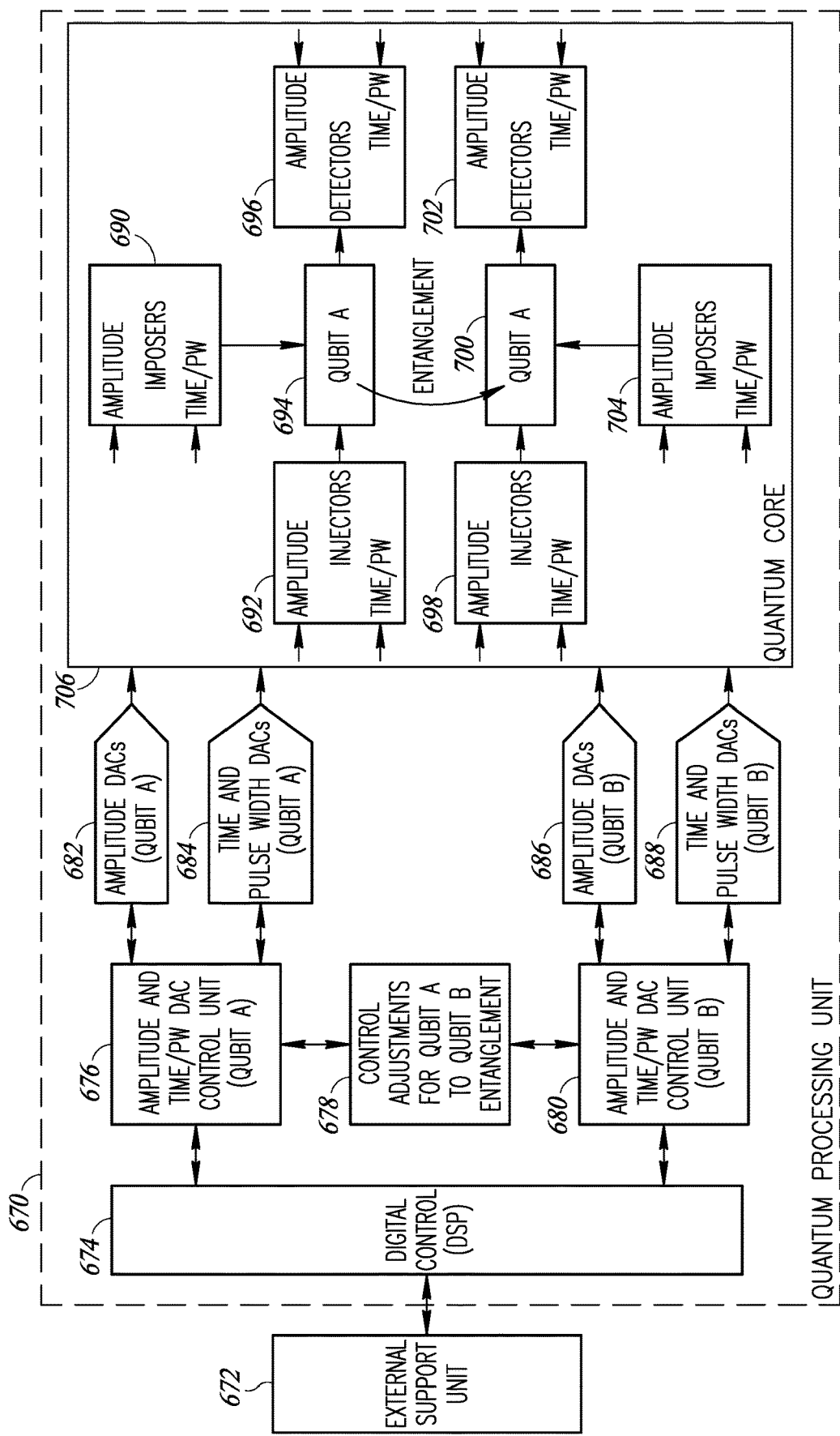
Figure 41A:
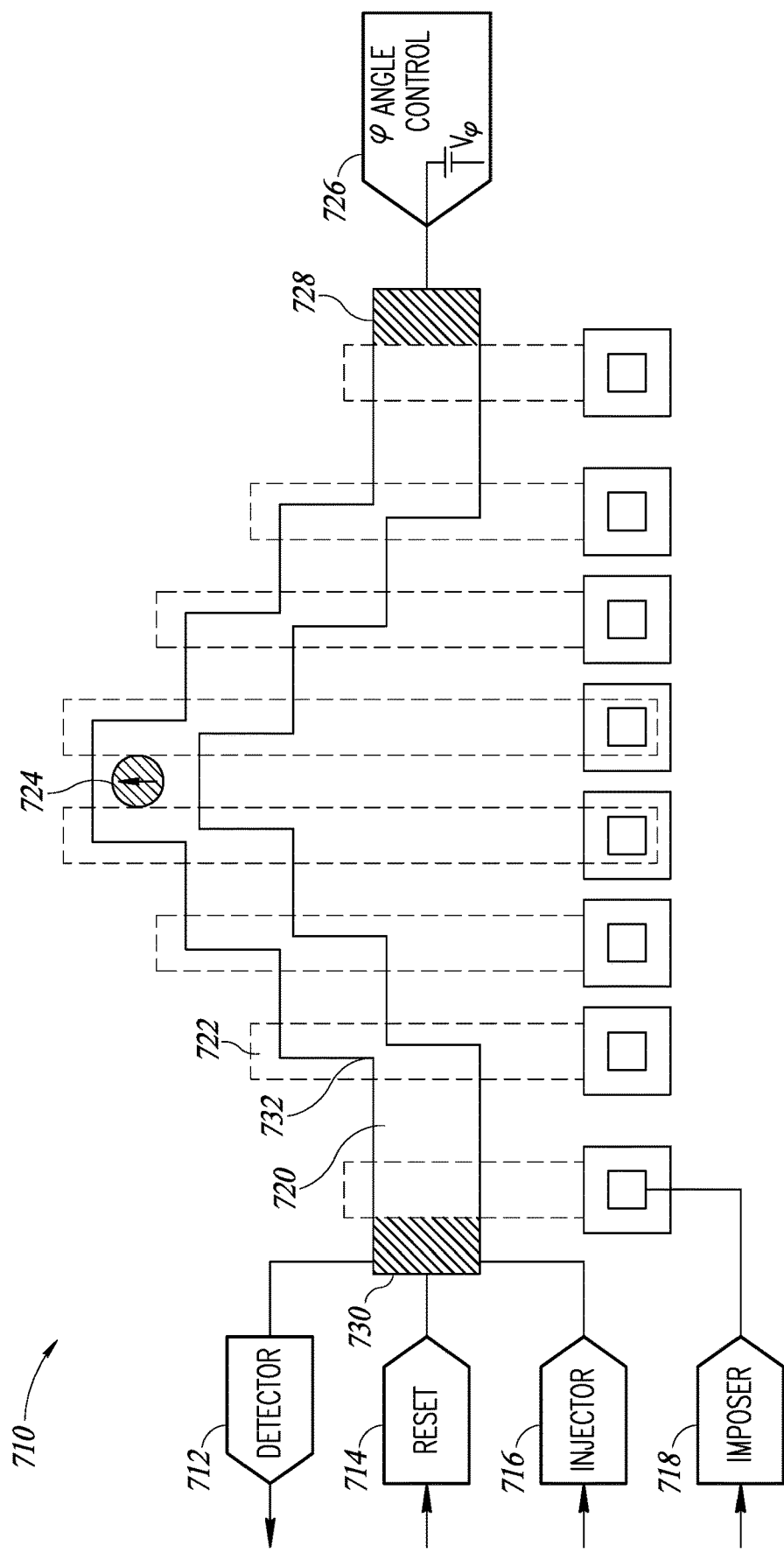
Figure 41B:
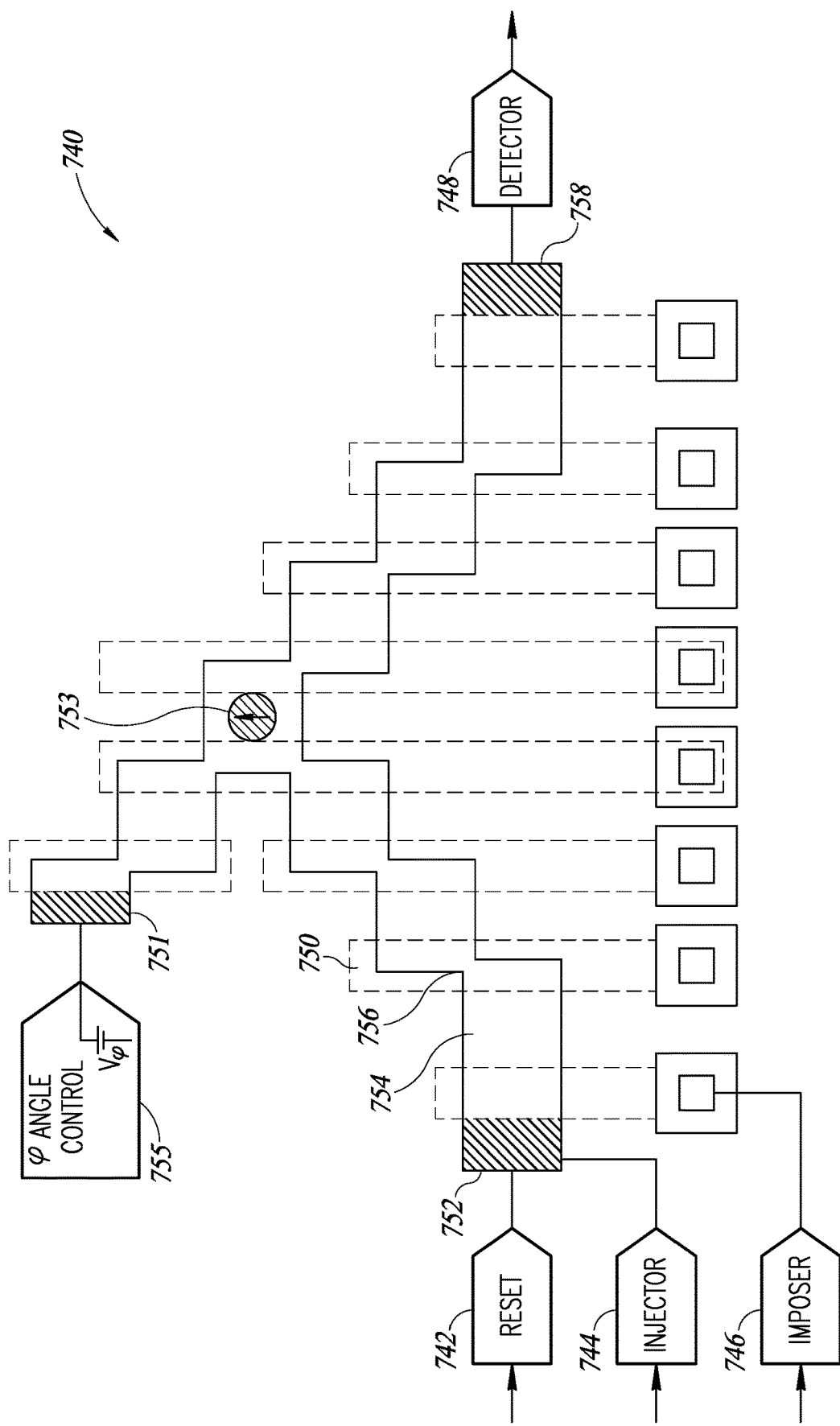
Figure 41C:
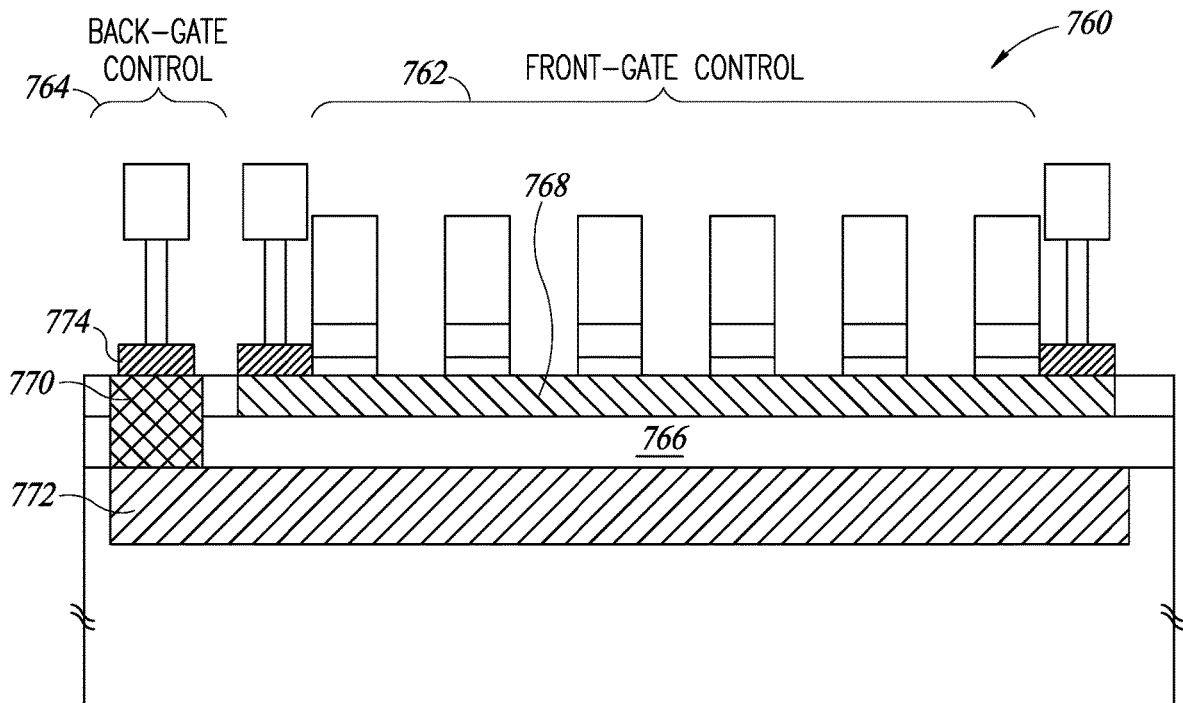
Figure 41D:
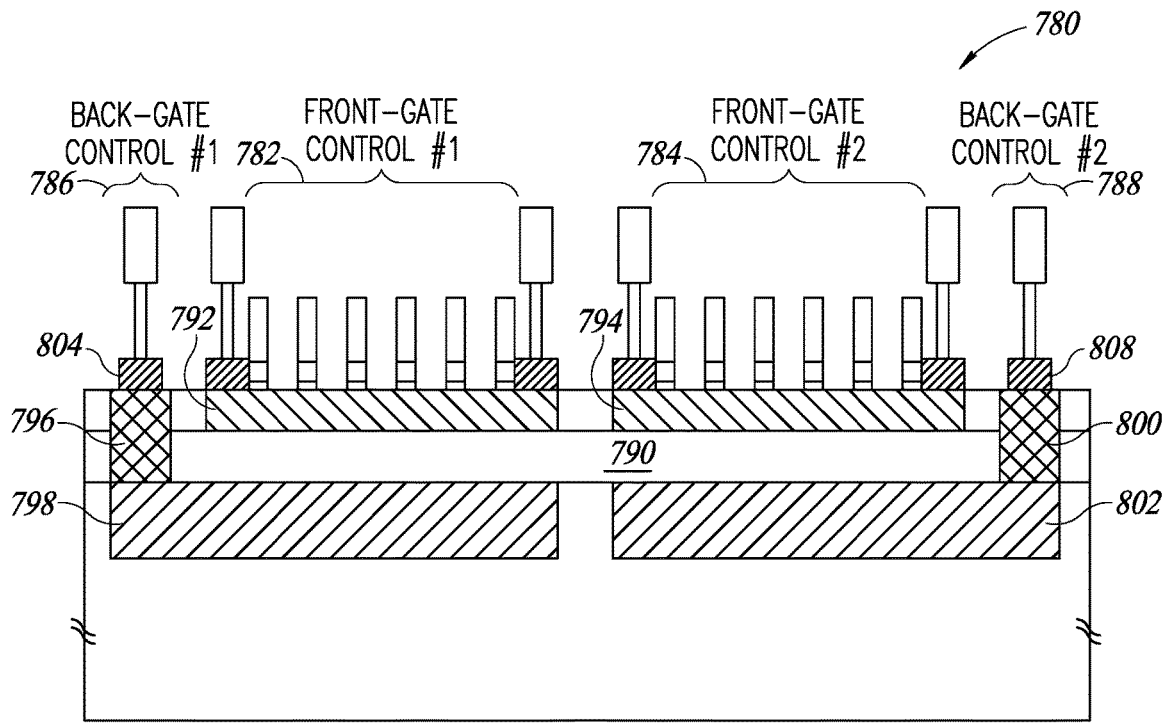

FIG. 38N is a diagram illustrating a fourteenth example control gate signal;

FIG. 38O is a diagram illustrating a fifteenth example control gate signal;

FIG. 38P is a diagram illustrating a sixteenth example control gate signal;

FIG. 38Q is a diagram illustrating a seventeenth example control gate signal;

FIG. 38R is a diagram illustrating an eighteenth example control gate signal;

FIG. 39A is a diagram illustrating a first example pair of control gate signals $G_A$ and $G_B$;

FIG. 39B is a diagram illustrating a second example pair of control gate signals $G_A$ and $G_B$;

FIG. 39C is a diagram illustrating a third example pair of control gate signals $G_A$ and $G_B$;

FIG. 39D is a diagram illustrating a fourth example pair of control gate signals $G_A$ and $G_B$;

FIG. 39E is a diagram illustrating a fifth example pair of control gate signals $G_A$ and $G_B$;

FIG. 39F is a diagram illustrating a sixth example pair of control gate signals $G_A$ and $G_B$;

FIG. 39G is a diagram illustrating a seventh example pair of control gate signals $G_A$ and $G_B$;

FIG. 39H is a diagram illustrating an eighth example pair of control gate signals $G_A$ and $G_B$;

FIG. 39I is a diagram illustrating a ninth example pair of control gate signals $G_A$ and $G_B$;

FIG. 40A is a diagram illustrating an example quantum processing unit with separate amplitude and time position control units;

FIG. 40B is a diagram illustrating an example quantum processing unit with separate amplitude and time position control units and control adjustments for qubit entanglement;

FIG. 41A is a diagram illustrating a first example qubit with φ angle control;

FIG. 41B is a diagram illustrating a second example qubit with φ angle control;

FIG. 41C is a diagram illustrating a third example qubit with φ angle control; and FIG. 41D is a diagram illustrating an example pair of qubits with φ angle control.

DETAILED DESCRIPTION

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle may be split and present in multiple quantum dots. Thus, a reference to a particle also includes split particles.

In quantum computing, the qubit is the basic unit of quantum information, i.e. the quantum version of the classical binary bit physically realized with a two-state device. A qubit is a two state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other. Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical FET gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a low doped or undoped continuous depleted semiconductor well that functions to contain quantum particles in a qubit or qudit. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

Throughout this document, a representation of the state of the quantum system in spherical coordinates includes two angles θ and φ. Considering a unitary sphere, as the Hilbert space is a unitary state, the state of the system is completely described by the vector Ψ. The vector Ψ in spherical coordinates can be described in two angles θ and φ. The angle θ is between the vector Ψ and the z-axis and the angle φ is the angle between the projection of the vector on the XY plane and the x-axis. Thus, any position on the sphere is described by these two angles θ and φ. Note that for one qubit angle θ representation is in three dimensions. For multiple qubits θ representation is in higher order dimensions.

Quantum Computing System

Figure 1:
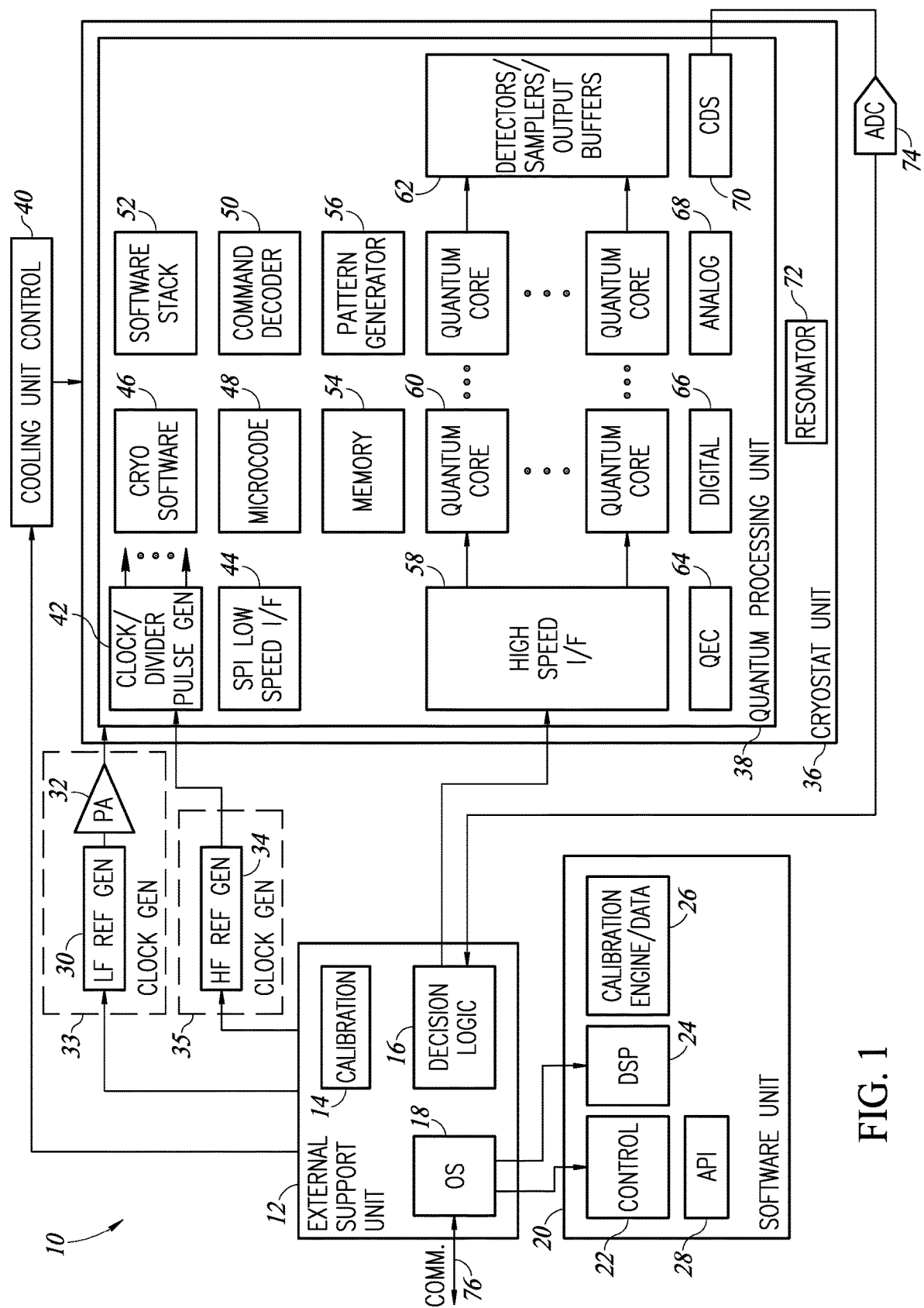
FIG. 1 is a high level block diagram illustrating an example quantum computer system constructed in accordance with the present invention.

A high-level block diagram illustrating a first example quantum computer system constructed in accordance with the present invention is shown in FIG. 1. The quantum computer, generally referenced 10, comprises a conventional (i.e. not a quantum circuit) external support unit 12, software unit 20, cryostat unit 36, quantum processing unit 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum processing unit 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum processing unit 38 further comprises serial peripheral interface (SPI) low speed interface 44, cryostat software block 46, microcode 48, command decoder 50, software stack 52, memory 54, and pattern generator 56. The clock generator 33 comprises low frequency (LF) generator 30 and power amplifier (PA) 32, the output of which is input to the quantum processing unit (QPU) 38. Clock generator 33 also functions to aid in controlling the spin of the quantum particles in the quantum cores 60.

The cryostat unit 36 is the mechanical system that cools the QPU down to cryogenic temperatures. Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it is made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows, MacOS, Linux, QNX, NetBSD, etc. The software stack includes the API, the calibration and management of the data, and all the necessary controls to operate the external support unit itself.

The clock generated by the high frequency clock generator 35 is input to the clock divider 42 that functions to generate the signals that drive the QPU. Low frequency clock signals are also input to and used by the QPU. A slow serial/parallel interface (SPI) 44 functions to handle the control signals to configure the quantum operation in the QPU. The high speed interface 58 is used to pump data from the classic computer, i.e. the external support unit, to the QPU. The data that the QPU operates on is provided by the external support unit.

Non-volatile memory may include various removable/non-removable, volatile/nonvolatile computer storage media, such as hard disk drives that reads from or writes to non-removable, nonvolatile magnetic media, a magnetic disk drive that reads from or writes to a removable, non-volatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java, Smalltalk, C++, C # or the like, conventional procedural programming languages, such as the "C" programming language, and functional programming languages such as Python, Hotlab, Prolog and Lisp, machine code, assembler or any other suitable programming languages.

Also shown in FIG. 1 is the optional data feedback loop between the quantum processing unit 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the QPU.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Figure 2:
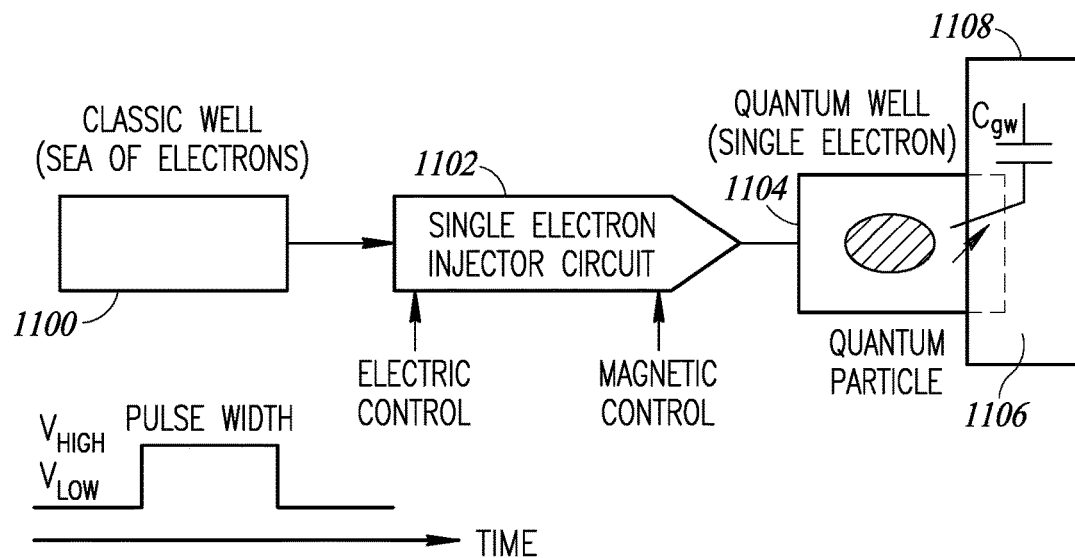
FIG. 2 is a diagram illustrating an example initialization configuration for a quantum interaction structure using tunneling through gate-well oxide layer.

A diagram illustrating an example initialization configuration for a quantum interaction structure using tunneling through gate-well oxide layer is shown in FIG. 2. The circuit comprises a classic well 1100, single particle (e.g., electron) injector circuit 1102, quantum well 1104, and control gate 1108. The circuit is operative to separate a quantum behaving electron from the sea of electrons present on the surrounding classic semiconductor structures, such as well 1100. The single electron injection circuit 1102 takes only one electron from the classic well situated on its left side and injects it into the quantum well when the proper control signal is applied. In general, there are several ways to control the quantum structure: (1) using electric signals only, (2) using magnetic signals only, or (3) using a combination of electric and magnetic signals. The electric control signal preferably has specified amplitude levels (Vlow/Vhigh) and given pulse width. The magnetic control signal is preferably of appropriate strength.

Note that the magnetic field control can be used to select an electron with a given spin orientation. This uses the property of electrons to orient their spin depending on the direction of the magnetic field at the time when the single electron was isolated from the classic sea of electrons. The direction of the magnetic field can be changed and thus the two spin orientations can be individually selected.

In order to perform a quantum operation in a given quantum structure having two or more qdots, the quantum system first needs to be initialized into a known base state. One or more electrons can be injected into the multi-qdot quantum structure. These single electrons are injected only into some of the qdots of the overall quantum structure. Next, control imposing signals are applied that determine the quantum evolution of the state and perform a certain desired quantum operation.

In general, the quantum operation performed depends on the specific control signals applied. In the case of a single position/charge qubit including two qdots that can realize a generalized phase rotation of the quantum state, the rotation angle is dependent on the pulse width of the control signal applied as compared to the Rabi (or occupancy state) oscillation period.

In a two qdot quantum system, if the tunneling barrier is lowered and kept low, a quantum particle starting from one of the qdots will begin tunneling to the next qdot. At a given time of half the Rabi oscillation period the particle will be completely on the second qdot, after which it will start tunneling back to the first qdot. At a certain time, the particle will have returned to the first qdot, after which the process repeats itself. This process is called the Rabi or occupancy oscillation and its period is named the Rabi or occupancy oscillation period. The phase rotation in a two qdot system will depend on the control signal pulse width as related to the Rabi oscillation period.

Figure 3:
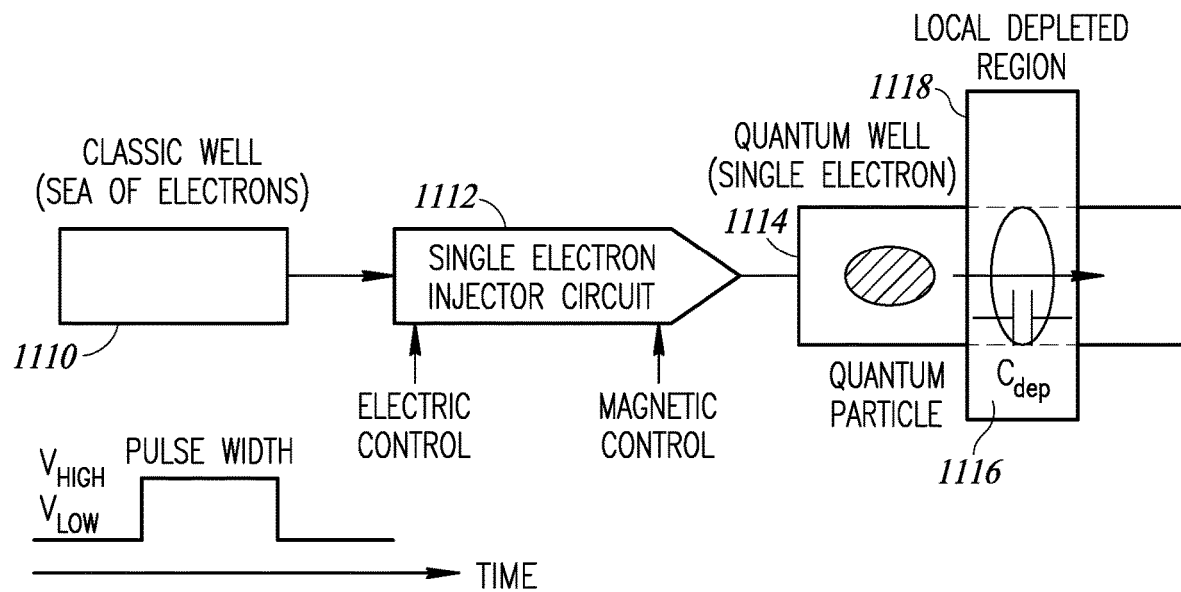
FIG. 3 is a diagram illustrating an example initialization configuration for a quantum interaction structure using tunneling through local depleted region in a continuous well.

A diagram illustrating an example initialization configuration for a quantum interaction structure using tunneling through a local depleted region in a continuous well is shown in FIG. 3. The circuit comprises a classic well 1110, single particle (e.g., electron) injector circuit 1112, quantum well 1114, and control gate 1118. The quantum structure comprises two qdots (additional qdots are possible) on either side of the control gate 1118, and a tunneling path (represented by the arrow) that has a partial overlap with the qdots. The quantum operation is controlled by a control gate (or control terminal) 1118 situated in close proximity of the tunneling path.

In one embodiment, the qdots are implemented by semiconductor wells, while the tunneling path is realized by a polysilicon layer that partially or completely overlaps the two wells. The tunneling appears vertically over the thin oxide layer between the semiconductor well and the polysilicon layer. The control terminal is realized with another well or another polysilicon layer placed in close proximity in order to exercise reasonable control over the tunneling effect.

In another embodiment, a semiconductor quantum processing structure is realized using lateral tunneling in a local depleted well. The two qdots are linked by a region that is locally depleted where the tunneling occurs (represented by the arrow). The control terminal typically overlaps the tunneling path in order to maintain well-controlled depletion of the entire linking region between the two qdots. This prevents direct electric conduction between the two qdots.

In another embodiment, the two qdots of the quantum structure are realized by a single semiconductor well having a control polysilicon layer on top. The tunneling occurs laterally/horizontally through the depleted region that isolates the two qdots.

It is noted that quantum structures can be implemented in semiconductor processes using various tunneling effects. One possible tunneling is the through a thin oxide layer. In most semiconductor processes the thinnest oxide is the gate oxide, which can span several atomic layers. In some processes, the oxide layer used by the metal-insulator-metal (MIM) capacitance is also very thin. Another example is the tunneling through a depleted region between two semiconductor well regions. Such a local depleted region may be induced by a control terminal into an otherwise continuous drawn well or fin.

Figure 4A:
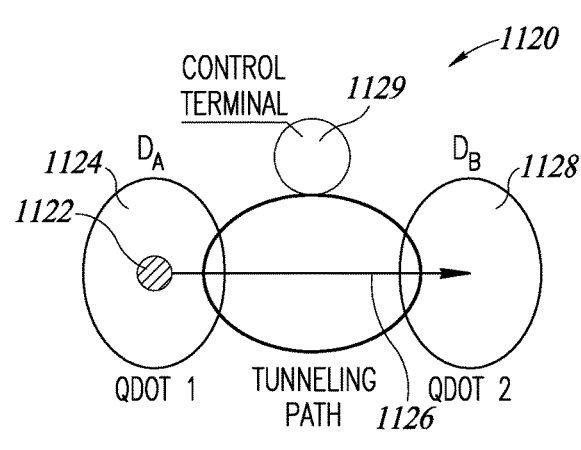
FIG. 4A is a diagram illustrating an example planar semiconductor quantum structure using tunneling through oxide layer.

A diagram illustrating an example planar semiconductor quantum structure using tunneling through oxide layer is shown in FIG. 4A. The semiconductor qubit, generally referenced 1120, comprises two qdots 1124, 1128, partial overlapped polysilicon gate 1129 and vertical thin oxide tunneling 1126, and can contain a particle 1122.

Figure 4B:
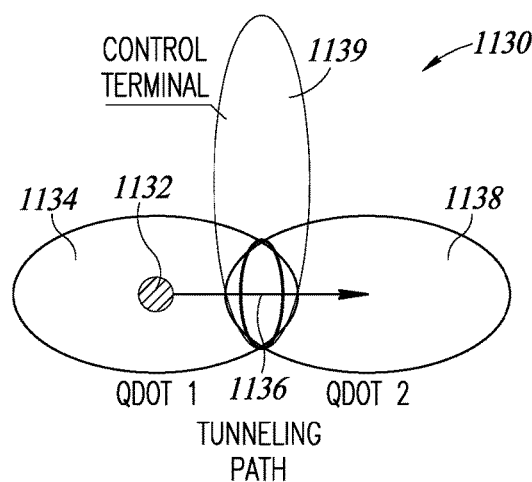
FIG. 4B is a diagram illustrating an example planar semiconductor quantum structure using tunneling through local depleted well.

A diagram illustrating an example planar semiconductor quantum structure using tunneling through local depleted well is shown in FIG. 4B. The semiconductor qubit, generally referenced 1130, comprises two qdots 1134, 1138, control gate 1139, and horizontal local depleted well tunneling 1136, and can contain a particle 1132.

Figure 4C:
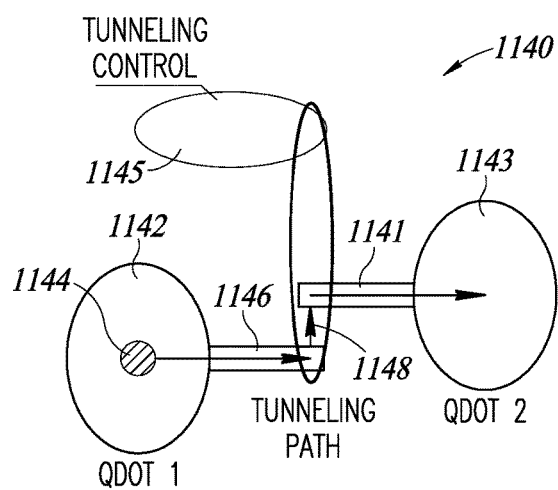
FIG. 4C is a diagram illustrating an example 3D process semiconductor quantum structure using tunneling through oxide layer.

Note that there are numerous types of semiconductor processes. Some are planar, while others are used to fabricate 3D structures (e.g., FinFET). A diagram illustrating an example 3D process semiconductor quantum structure using tunneling through oxide layer is shown in FIG. 4C. The semiconductor qubit, generally referenced 1140, comprises two qdots 1142, 1143, control gate 1145, 3D fins 1146, 1141, and partial fin-to-gate overlap and vertical thin oxide tunneling 1148, and can contain a particle 1144.

Figure 4D:
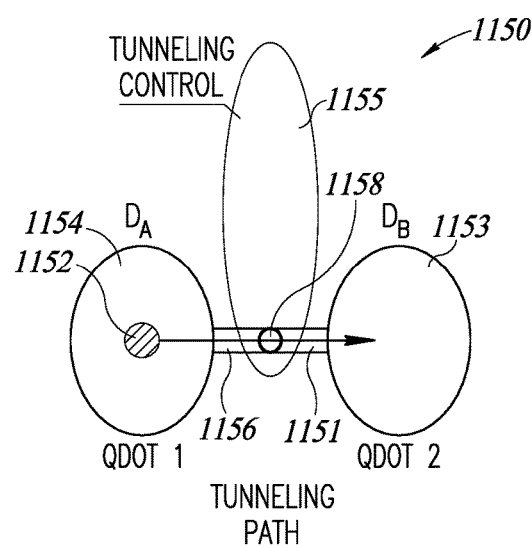
FIG. 4D is a diagram illustrating an example 3D process semiconductor quantum structure using tunneling through local depleted well.

A diagram illustrating an example 3D process semiconductor quantum structure using tunneling through local depleted well is shown in FIG. 4D. The 3D semiconductor qubit, generally referenced 1150, comprises two qdots 1154, 1153, control gate 1155, 3D fins 1156, 1151, and horizontal local depleted fin tunneling 1158, and can contain a particle 1152.

In one embodiment, controlled-NOT (CNOT) quantum gates can be realized with any of the above described qubit structures implemented in either planar or 3D semiconductor processes.

Figure 5A:
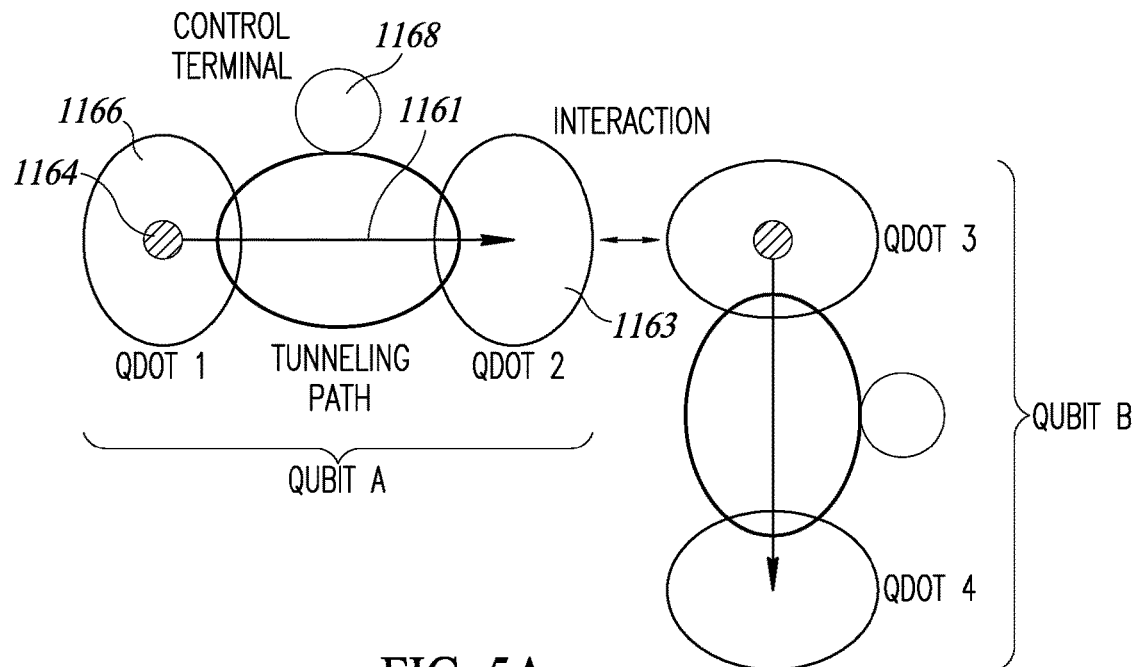
FIG. 5A is a diagram illustrating an example CNOT quantum interaction gate using tunneling through oxide layer implemented in planar semiconductor processes.

A diagram illustrating an example CNOT quantum interaction gate using tunneling through oxide layer implemented in planar semiconductor processes is shown in FIG. 5A. The quantum interaction gate comprises two qubits, qubit A and qubit B, with each qubit comprising two qdots 1166, 1163, tunneling path 1161, and control terminal 1168. Qdots 1 and 2 of qubit A and qdots 3 and 4 of qubit B are arranged such that qdots 2 and 3 are close enough for (possibly present there) particles 1164 to interact, for example, in an electrostatic manner.

Figure 5B:
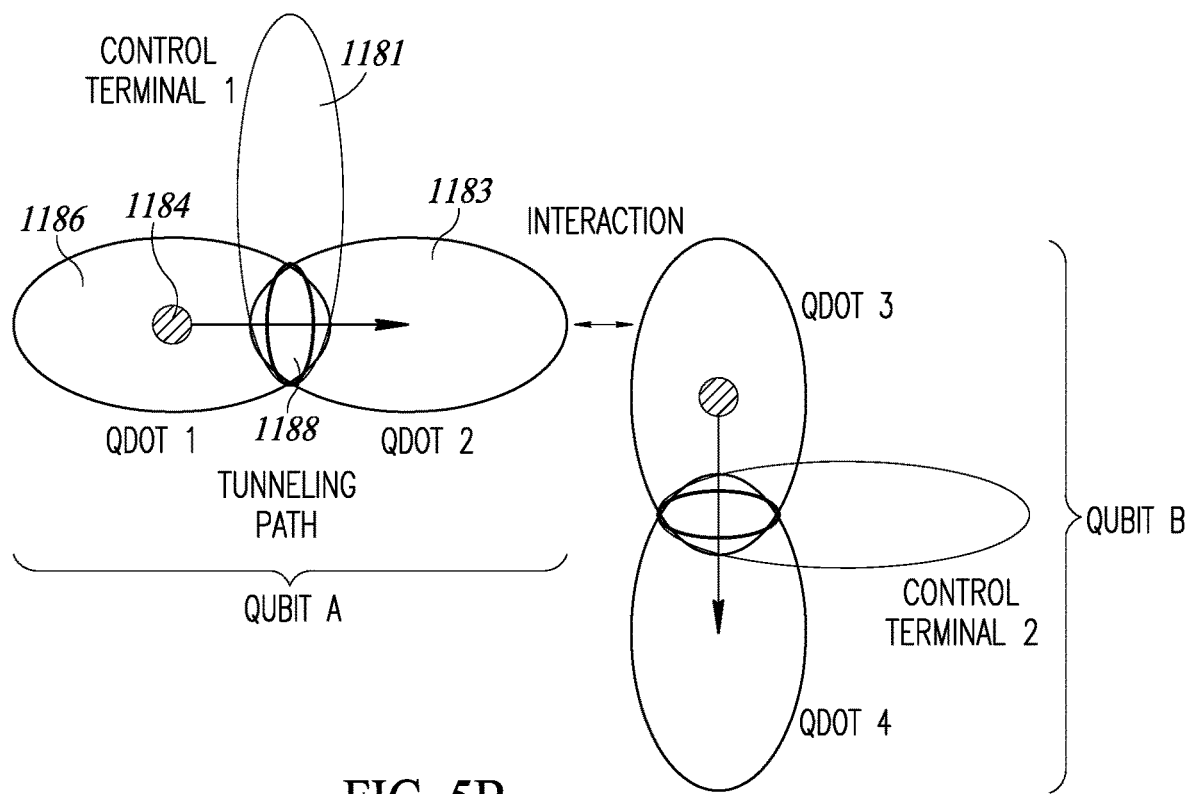
FIG. 5B is a diagram illustrating an example CNOT quantum interaction gate using tunneling through local depleted well implemented in planar semiconductor processes.

A diagram illustrating an example CNOT quantum interaction gate using tunneling through local depleted well implemented in planar semiconductor processes is shown in FIG. 5B. The quantum interaction gate comprises two qubits, qubit A and qubit B, with each qubit comprising two qdots 1186, 1183, tunneling path 1188, and control terminal 1181. Qdots 1 and 2 of qubit A and qdots 3 and 4 of qubit B are arranged such that qdots 2 and 3 are close enough for particles 1184 to interact.

Figure 5C:
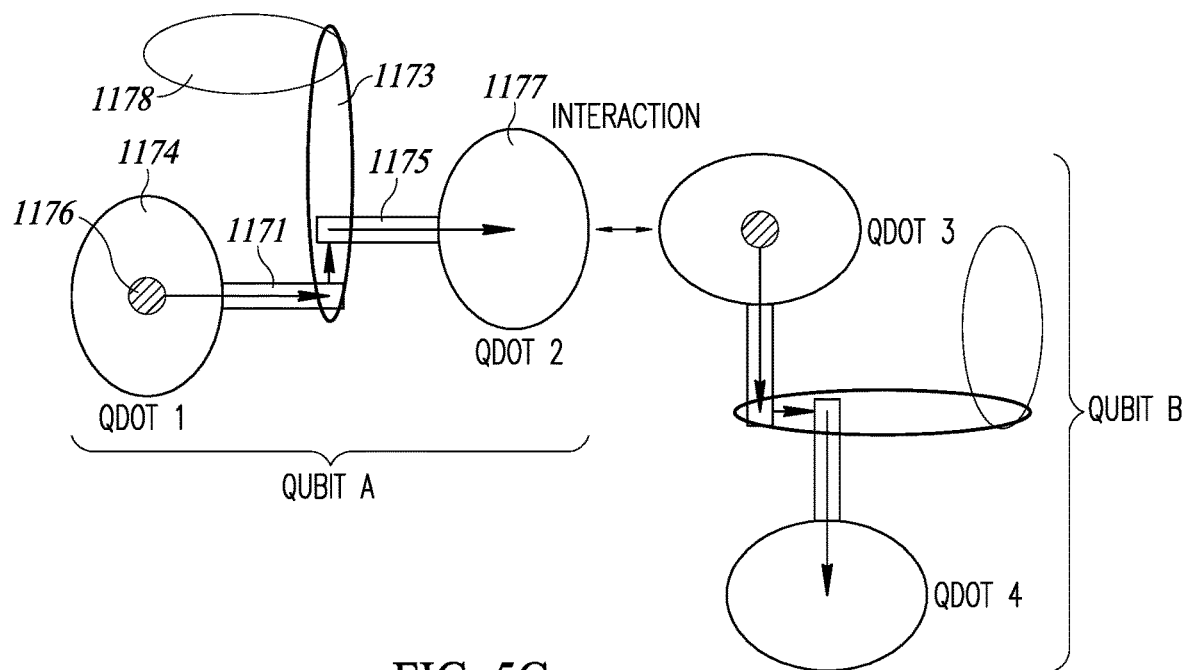
FIG. 5C is a diagram illustrating an example CNOT quantum interaction gate using tunneling through oxide layer implemented in 3D semiconductor processes.

A diagram illustrating an example CNOT quantum interaction gate using tunneling through oxide layer implemented in 3D semiconductor processes is shown in FIG. 5C. The quantum interaction gate comprises two qubits, qubit A and qubit B, with each qubit comprising two qdots 1174, 1177, tunneling path 1171, 1173, 1175, and control terminal 1178. Qdots 1 and 2 of qubit A and qdots 3 and 4 of qubit B are arranged such that qdots 2 and 3 are close enough for particles (if present there) 1176 to interact.

Figure 5D:
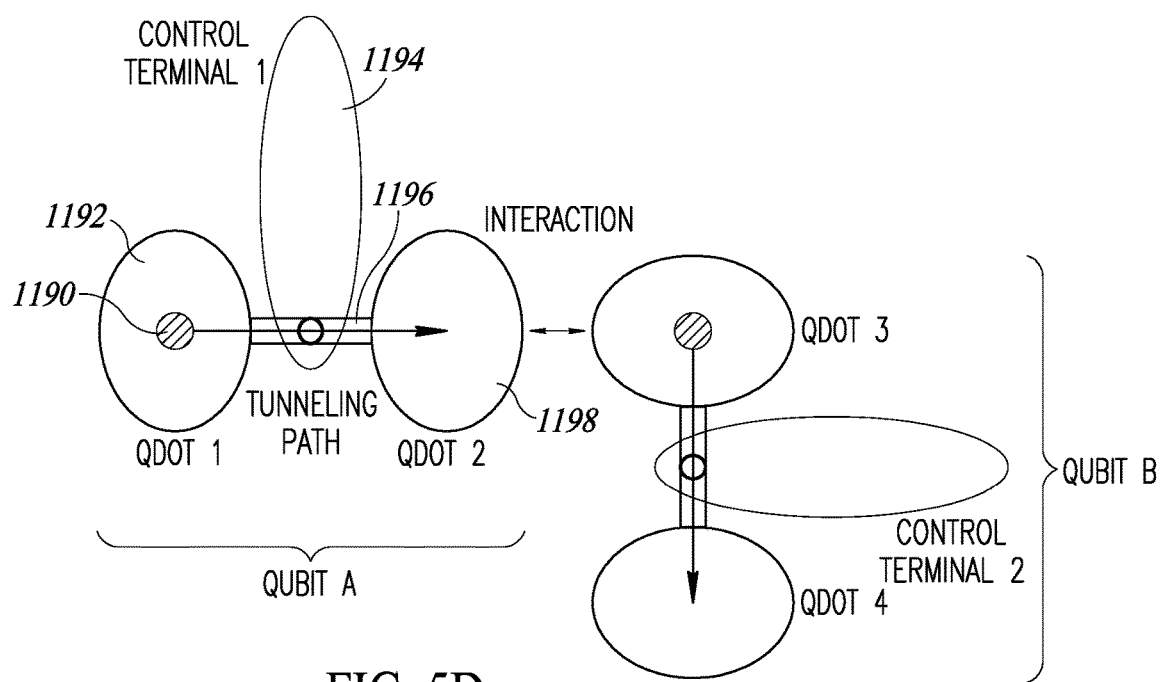
FIG. 5D is a diagram illustrating an example CNOT quantum interaction gate using tunneling through local depleted fin implemented in 3D semiconductor processes.

A diagram illustrating an example CNOT quantum interaction gate using tunneling through local depleted fin implemented in 3D semiconductor processes is shown in FIG. 5D. The quantum interaction gate comprises two qubits, qubit A and qubit B, with each qubit comprising two qdots 1192, 1198, tunneling path 1196, and control terminal 1194. Qdots 1 and 2 of qubit A and qdots 3 and 4 of qubit B are arranged such that qdots 2 and 3 are close enough for particles 1190 to interact.

Quantum Interaction

Quantum computing is based on the interaction between two or more individual particles that have been separated from a collectivity and which follow the laws of quantum mechanics. In order for two particles to interact, they generally need to be brought in close proximity. Particles that are relatively far away from one another have a small or negligible interaction.

Each particle carries information in its position and/or spin. Position/charge qubit based quantum computing uses the position to encode information, while spin qubit based quantum computing uses the spin of the particles to encode information. Hybrid qubits use both the position and the spin to encode information.

The two or more particles that need to interact and thus make an exchange of information need to be separately initialized in their corresponding quantum state. The separation may be either in distance, ensuring a negligible interaction of the particles as they are initialized, or in time when the particles are initialized at different time instances. In some embodiments both space and time separation may be used to ensure isolation between the two or more starting quantum states.

When two or more quantum particles/states are brought in close proximity, they interact with one another and in the process exchange information. We call the particles entangled as each of the particles carry information from all particles that have interacted. After the entanglement has occurred, the particles are moved at large distance and they still carry the entire information contained initially by the distinct initialized states. If measurement/detection is perform on one of the particles from the entangled ensemble, the corresponding quantum state will be collapsed. By measuring, for example, a charge qubit it is determined whether the particle is present or not in a given qdot. When one qubit is measured the corresponding component from the other qubits that are part of the entangled ensemble will also collapse.

In the case of semiconductor quantum structures based on tunneling through a local depletion region induced in a continuous well under the control of a gate terminal, the tunneling current is the quantum physics effect that governs the operation of the structure. The tunneling effect/current is dependent on one side on the tunnel barrier height, which in turn depends on the signal level applied at the control terminal. A second element that impacts the tunnel barrier and thus the tunneling effect is the presence of any other particle (one or more) in proximity of the target qubit. The presence or absence of another particle will change the Rabi oscillation frequency of a given target qubit. In a double qdot system when the control terminal determines a lowering of the tunnel barrier, the quantum particle will start tunneling forth and back between the two qdots. The precise position of the particle will depend on the pulse width of the control signal that enables the Rabi oscillation.

Figures 6A, 6B:
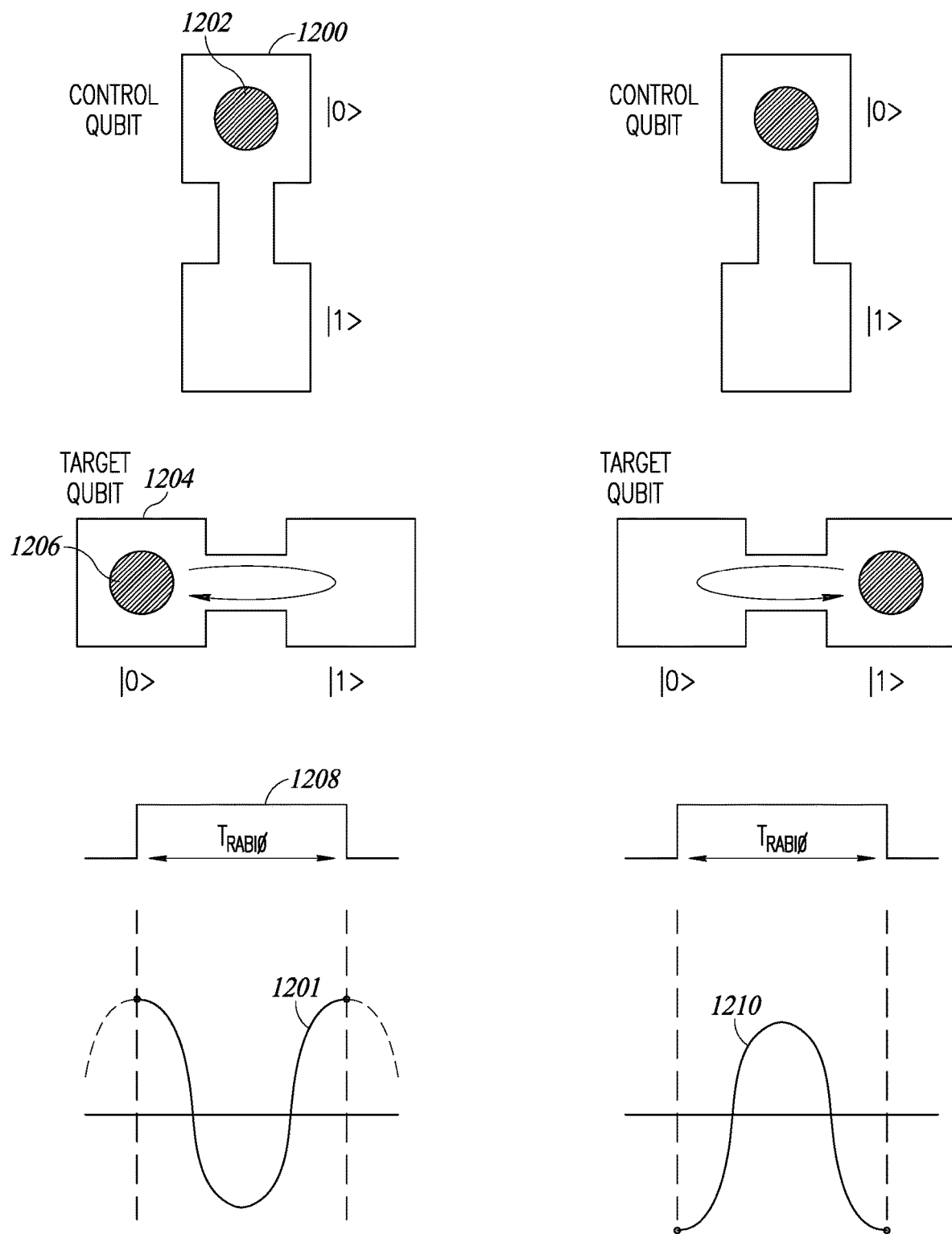
FIG. 6A is a diagram illustrating a first example controlled NOT double qubit structure and related Rabi oscillation.
FIG. 6B is a diagram illustrating a second example controlled NOT double qubit structure and related Rabi oscillation.

In order to get interaction between two particles present in their respective qubits, a semiconductor system with at least four qdots is needed as shown in FIG. 6A. There are multiple ways of operating a two qubit quantum structure, depending on how and what control signals are applied. In one embodiment of the quantum interaction gate, one of the two qubits may be designated as the "target" qubit and the other as the "control" qubit. The state evolution of the target qubit will be impacted by the state of the control qubit. The control qubit stays fixed during the interaction and only the target qubit will change its measured state. In the interaction process, however, both particles will entail changes as a result of their entanglement. In the position/charge qubit implementation, the spin of the control qubit may change as a result of the interaction, while the position of the target qubit will change as a result of the interaction. Any combination of position and spin changes are possible for the target and control qubits. In this embodiment, only the target qubit control terminal receives a pulse. Various quantum gates can be constructed in this way, including the controlled-NOT quantum gate, the Toffolli (control-control-NOT) quantum gate, the controlled rotation quantum gate, and the ancillary quantum gate.

Moving the quantum particles/states to and from given quantum gates is performed with quantum shift registers. Their length and orientation are preferably such that it links the different quantum gates into a corresponding quantum circuit based on a particular quantum algorithm.

In yet another embodiment of the quantum interaction gate, both (or all) qubits are allowed to change in their measured state (position, spin, or both). To achieve this both (or all) control terminals are pulsed. As a result, both (or all) particles that enter entanglement will have their measured state changed (position, spin, or both). As a byproduct of the entanglement, the other non-measured dimension may experience changes as well, e.g., the spin in a position qubit or the position in a spin qubit.

A diagram illustrating a first example controlled NOT double qubit structure and related Rabi oscillation is shown in FIG. 6A. The top control qubit 1200 comprises two qdots which can contain particle 1202. The lower target qubit 1204 comprises two qdots and can contain particle 1206. In one example, the control qubit may have a vertical orientation of its double qdot, while the target qubit may have a horizontal orientation of its double qdot. Other orientation combinations are possible, including angled or slanted.

In operation, when the particle 1202 of the control qubit is in its further away position we denote this quantum state as $|0\rangle$. The Rabi oscillation frequency 1201 (or period) of the target qubit has a first value. If a control signal 1208 is applied to the target qubit that has a pulse width equal to the Rabi period, the particle will tunnel forward and back to its initial position resulting in keeping its original state. This is valid for both base quantum states when the particles are not in split states. For example, if the particle is initially present in the left qdot of the target qubit (we can arbitrarily denote this state as $|0\rangle$) at the beginning of the control signal pulse, the particle will be back in the left qdot at the end of the pulse and thus the state $|0\rangle$ is preserved. If the particle was initially in the right qdot of the target qubit (we denote that state as $|1\rangle$) as shown in FIG. 6B, the state is again preserved at the end of the control pulse equal to the Rabi period 1210 when the control particle is further away.

Figures 6C, 6D:
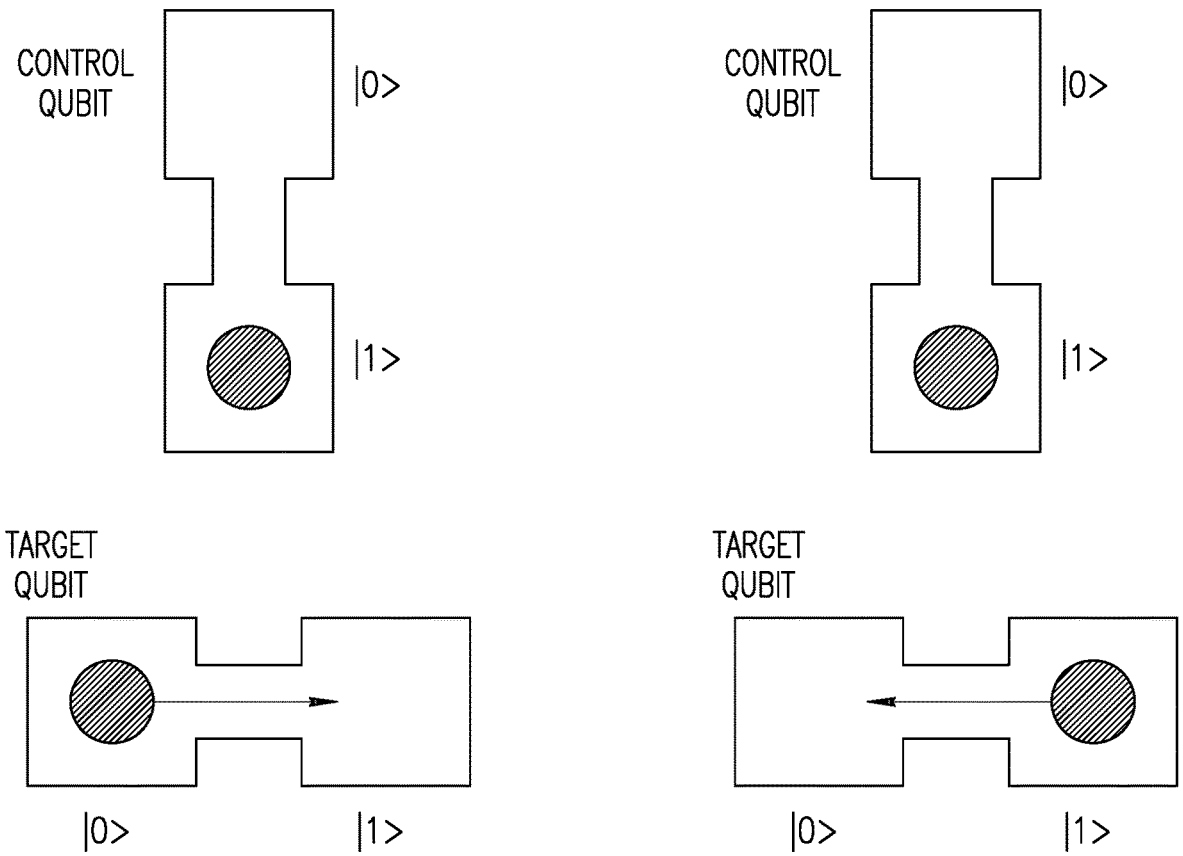
FIG. 6C is a diagram illustrating a third example controlled NOT double qubit structure and related Rabi oscillation.
FIG. 6D is a diagram illustrating a fourth example controlled NOT double qubit structure and related Rabi oscillation.

Now if the particle of the control qubit is moved to the closer-in position (which we denote by the quantum state $|1\rangle$), as shown in FIG. 6C, the Rabi oscillation frequency and period will be modified as a result of the interaction between the two particles. In one example, the Rabi oscillation frequency of the target qubit is decreased as compared to dashed curve 1214 and its corresponding Rabi oscillation period 1212 is increased. If the same control pulse width is applied as before, the particle no longer has enough time to tunnel forward and back to its initial position. In this case the pulse width of the control signal is just enough for the particle to tunnel from the left qdot to the right qdot. This corresponds to an inversion or a NOT operation.

In FIG. 6C the particle that was initially in the left qdot (state $|0\rangle$) has time to fully go to the right qdot (state $|1\rangle$) with Rabi oscillation period 1212. In FIG. 6D the particle that was initially in the right qdot (state $|1\rangle$) has time to fully go to the left qdot (state $|0\rangle$) with Rabi oscillation period 1216. This corresponds to a controlled quantum inversion operation, hence the name controlled-NOT.

Figure 7:
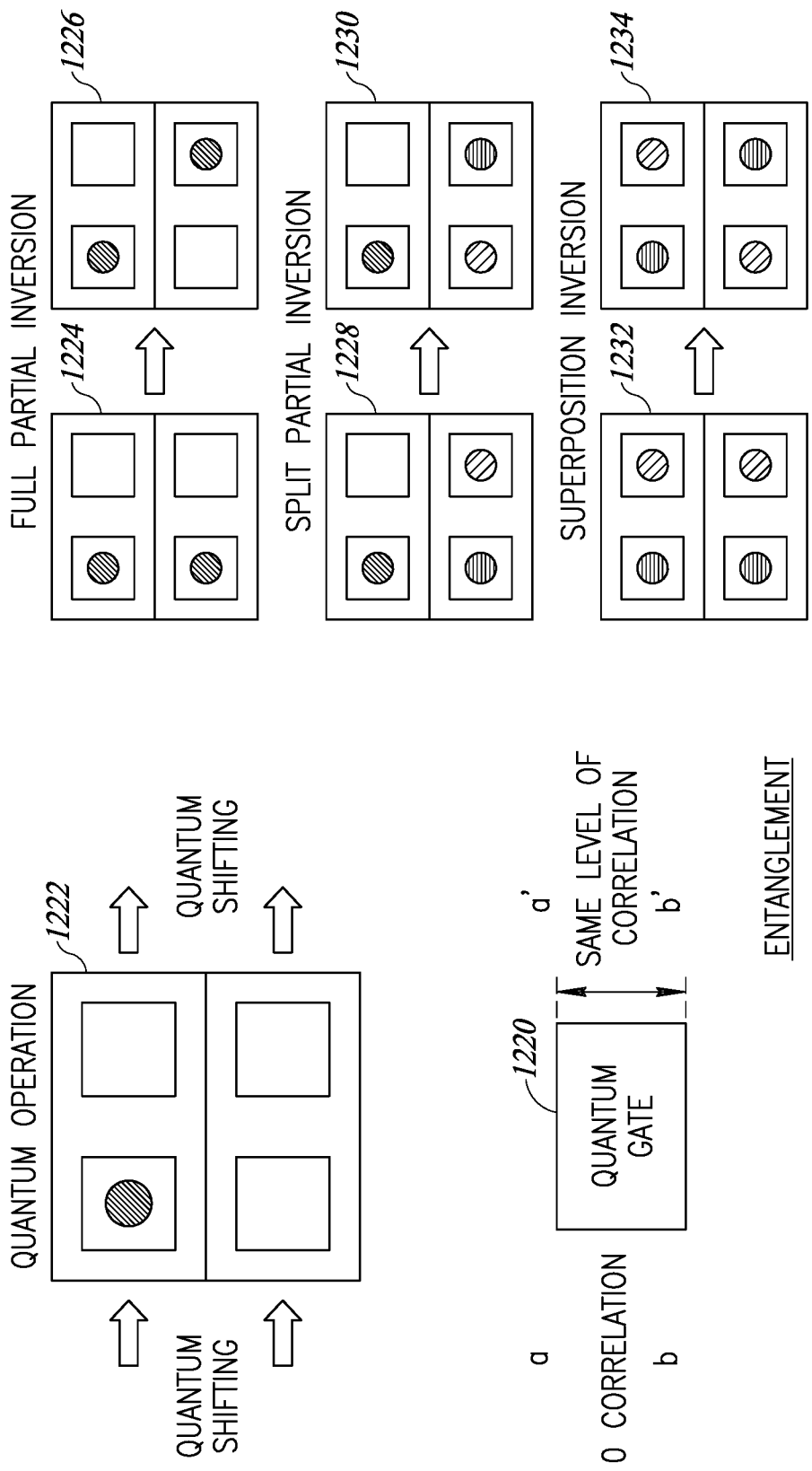
FIG. 7 is a diagram illustrating a controlled NOT quantum interaction gate for several control and target qubit states.

In the controlled-NOT quantum operation, the inversion applies not only to the base states $|0\rangle$ results in $|1\rangle$ and $|1\rangle$ results in $|0\rangle$, but also applies to any superposition of quantum state a $|0\rangle+b|1\rangle$ which goes to $b|0\rangle+a|0\rangle$. Such an operation 1222 for the quantum gate 1220 is shown in FIG. 7. The CNOT operation for full particle inversion is shown on the top right for two base state qubits. Both target and control qubits are in base states/full particle operation. In the state 1224 before inversion, the particles of both control and target qubits are in left positions. In the state 1226 after invention, the particle of the target qubit is in the right position.

In the middle is illustrated the CNOT operation for split particle inversion. In the state 1228 before inversion, the control qubit is in a base state, while the target qubit is in a split state. In the state 1230 after inversion, the target qubit state is inverted.

In the bottom is illustrated the CNOT operation for superposition inversion. In the state 1232 before inversion, both the control and the target qubits are in split states. In the state 1234 after inversion, the target qubit state is inverted. This is the more general quantum CNOT operation case.

Note that the controlled-NOT quantum gate together with the Hadamard gate form a fundamental quantum set, which means that any quantum algorithm can be built with a given combination of these two fundamental quantum gates.

To precisely obtain the functionality of a quantum CNOT, the distance between the four qdots is preferably such that when the control qubit/particle changes its position from the $|0\rangle$ to the $|1\rangle$ base state, the corresponding Rabi oscillation period of the target qubit is doubled (i.e. the frequency is halved). The control signal of the target qubit is also preferably equal to the Rabi period in the state $|0\rangle$ of the control qubit.

If these conditions are not satisfied, the quantum interaction gate will not have a CNOT operation, but a different controlled rotation operation. In this case, the two particles still interact and the corresponding Rabi oscillation period is changed, but not to a double value for the CNOT operation, but to some other value that results in a different particle splitting/rotation.

In real life implementations of such semiconductor quantum gates/structures, there are process variations (e.g., distances, thicknesses, dimensions, etc.) and also variability of the control signals (e.g., pulse width variabilities) which result in different amounts of Rabi oscillation period modifications. In one embodiment, a calibration procedure of the semiconductor quantum gate is applied to achieve CNOT functionality. An advantage of the semiconductor quantum implementation is that the integrated circuits approach allows the individual calibration of each quantum gate in the system. This compensates both for the random and the deterministic components of the variability.

Figure 8A:
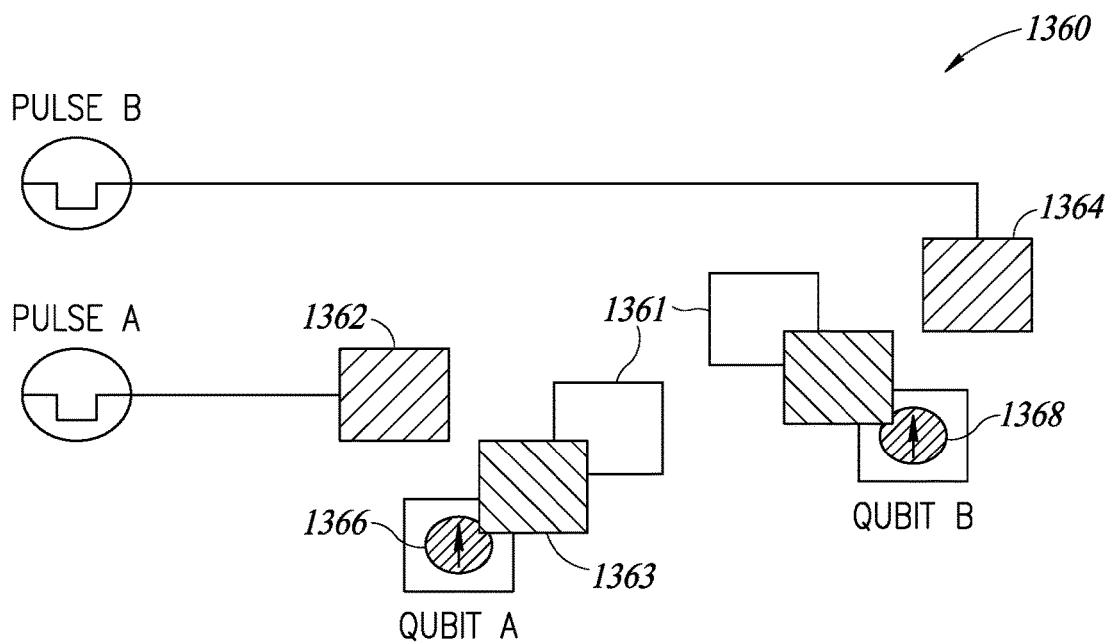
FIG. 8A is a diagram illustrating an example controlled NOT quantum interaction gate using square layers with partial overlap.

A diagram illustrating an example controlled NOT quantum interaction gate using square layers with partial overlap and tunneling through oxide layer is shown in FIG. 8A. The CNOT quantum interaction gate, generally referenced 1360, comprises imposers 1362, 1364 each with separate control pulses, PULSE A and PULSE B, control gates 1363, and qdots 1361. Particles 1366, 1368 interact to provide the CNOT functionality. Note that only two chain paths have been used in this case. It is appreciated that other shapes, e.g., rectangle, etc., may be used.

Figure 8B:
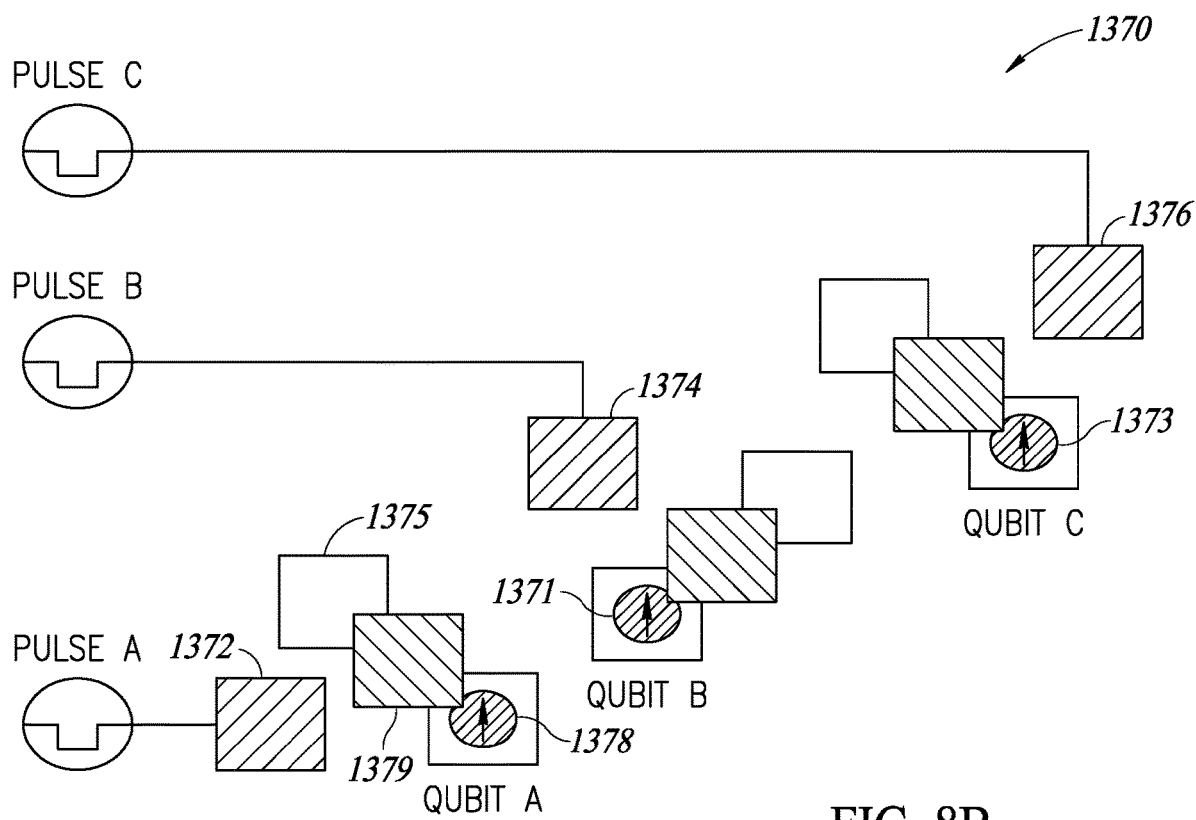
FIG. 8B is a diagram illustrating an example Toffoli quantum interaction gate using square layers with partial overlap.

A diagram illustrating an example Toffoli quantum interaction gate using square layers with partial overlap is shown in FIG. 8B. The controlled-controlled NOT (CCNOT) quantum interaction gate (or Toffoli gate), generally referenced 1370, comprises imposers 1372, 1374, 1376 each with separate control pulses, control gates 1379, and qdots 1375. Particles 1378, 1371, 1373 interact to provide the CCNOT functionality. It is appreciated that other shapes, e.g., rectangle, etc., may be used.

Figure 8C:
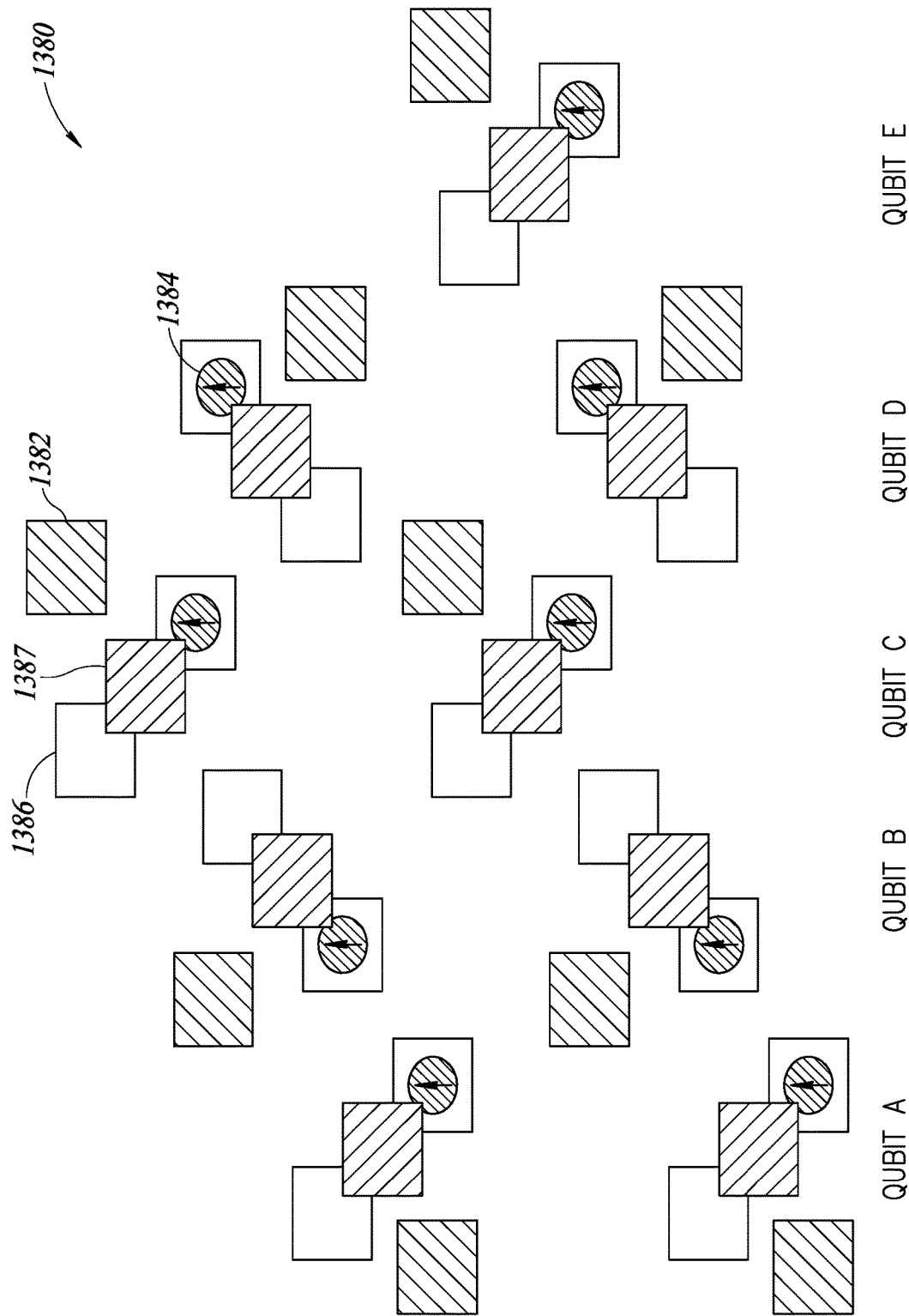
FIG. 8C is a diagram illustrating an example higher order controlled NOT quantum interaction gate using square layers with partial overlap.

A diagram illustrating an example higher order controlled NOT quantum interaction gate using square layers with partial overlap is shown in FIG. 8C. In a similar manner, higher order quantum interaction gates can be constructed. The semiconductor nth order CNOT (n-CNOT) using square layers with partial overlap, generally referenced 1380, comprises a plurality of qdots 1386 making up multiple qubits, imposers 1382, control gates 1387, and particles 1384. It is appreciated that other shapes, e.g., rectangle, etc., may be used.

Figure 9A:
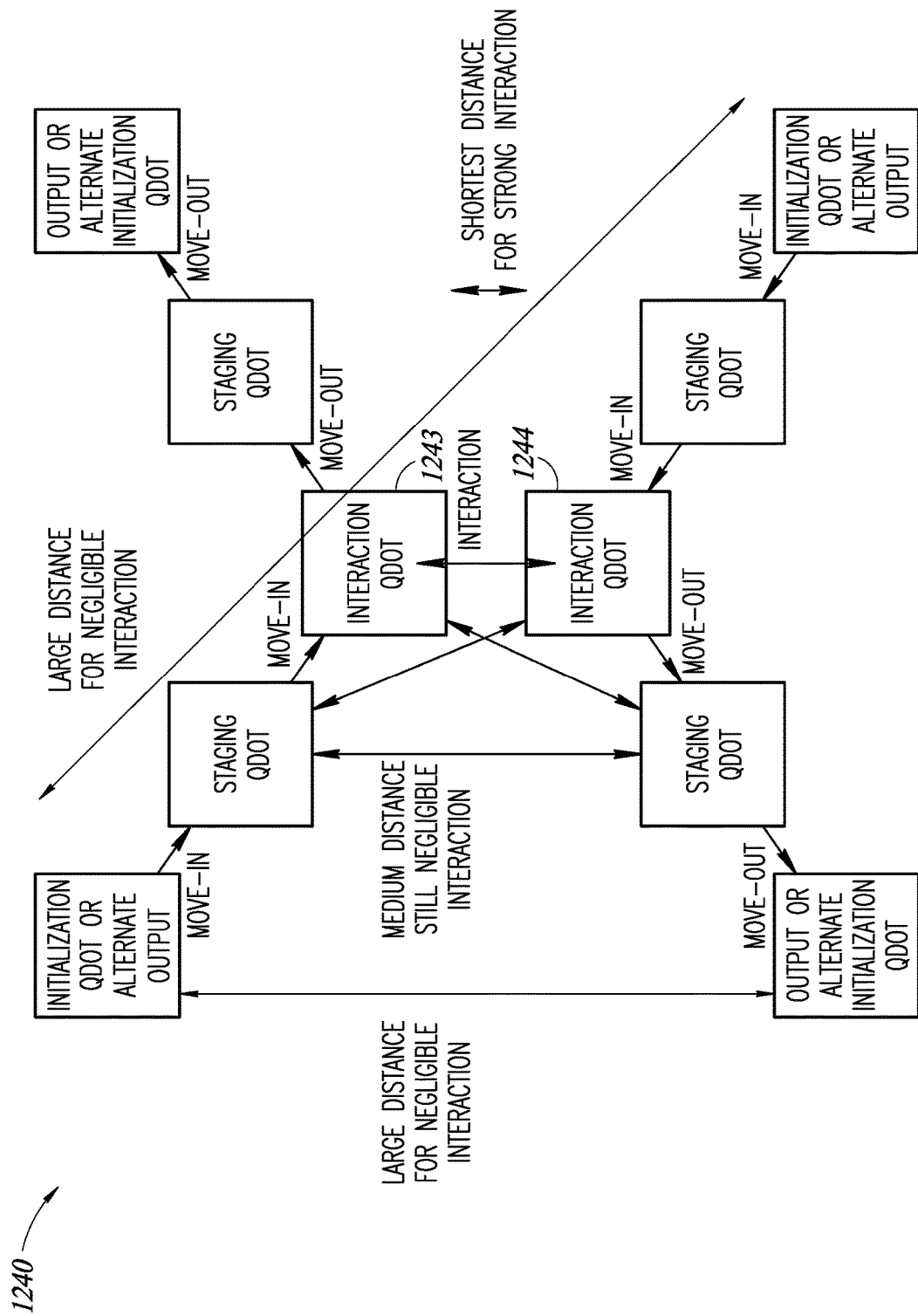
FIG. 9A is a diagram illustrating a first example of semiconductor entanglement quantum interaction gate including initialization, staging, interaction, and output locations.

A diagram illustrating a first example of semiconductor entanglement quantum interaction gate including initialization, staging, interaction, and output locations is shown in FIG. 9A. The quantum interaction gate, generally referenced 1240, in the shape of double V comprises two qubits in close proximity and gradual increasing of the distance between the staging and initialization/detection or output locations to minimize parasitic interaction. Other shapes are also possible, while achieving large distance when interaction is not desired and close distance when interaction is desired. Interaction occurs between the two interaction qdots 1243, 1244.

Figure 9B:
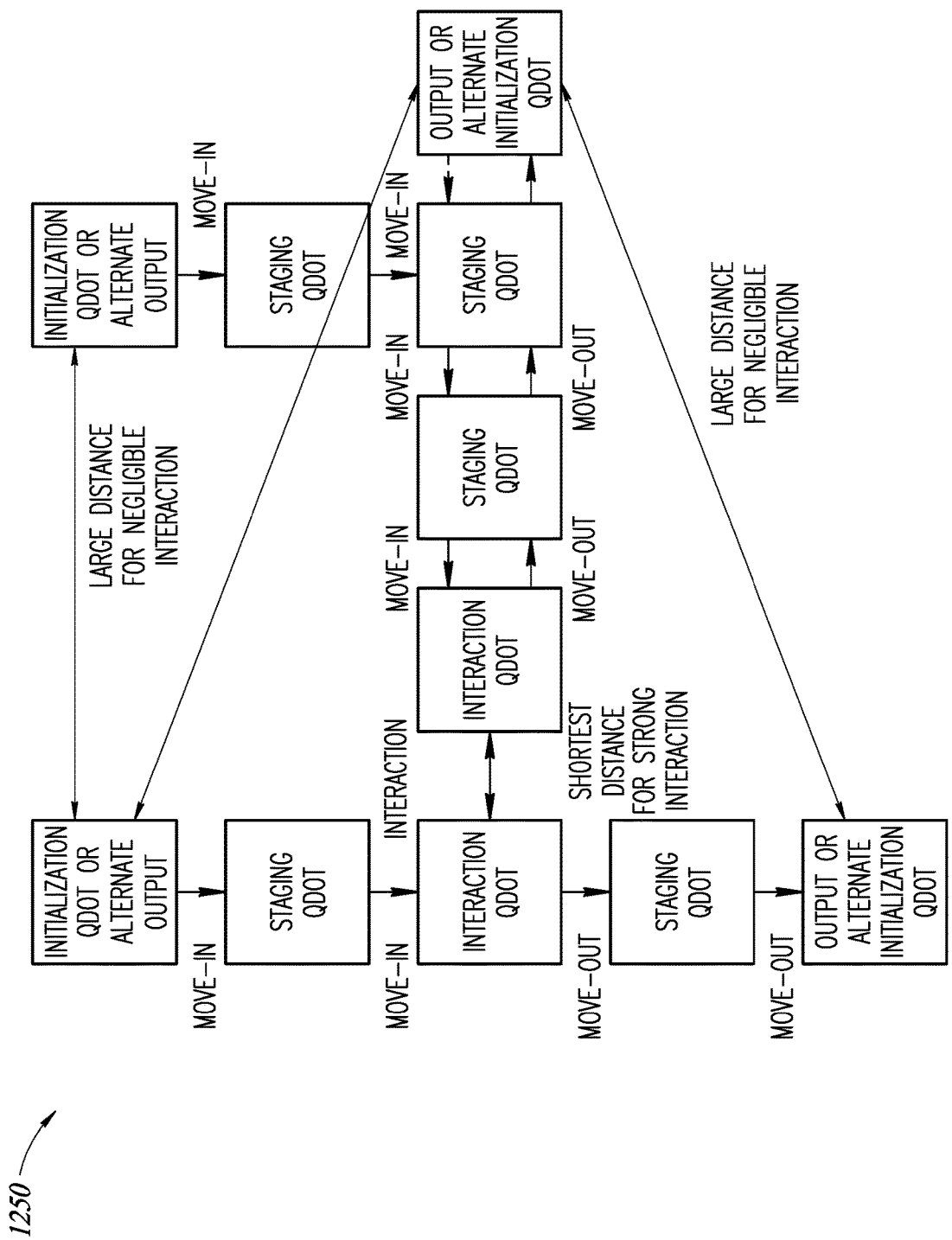
FIG. 9B is a diagram illustrating a second example of semiconductor entanglement quantum interaction gate including initialization, staging, interaction, and output locations.

A diagram illustrating a second example of semiconductor entanglement quantum interaction gate including initialization, staging, interaction, and output locations is shown in FIG. 9B. The quantum interaction gate, generally referenced 1250, in the shape of T comprises two qubits in close proximity and gradual increasing of the distance between the staging and initialization/detection or output locations to minimize parasitic interaction. Other shapes are also possible, while achieving large distance when interaction is not desired and close distance when interaction is desired. Interaction occurs between the two interaction qdots.

Figure 9C:
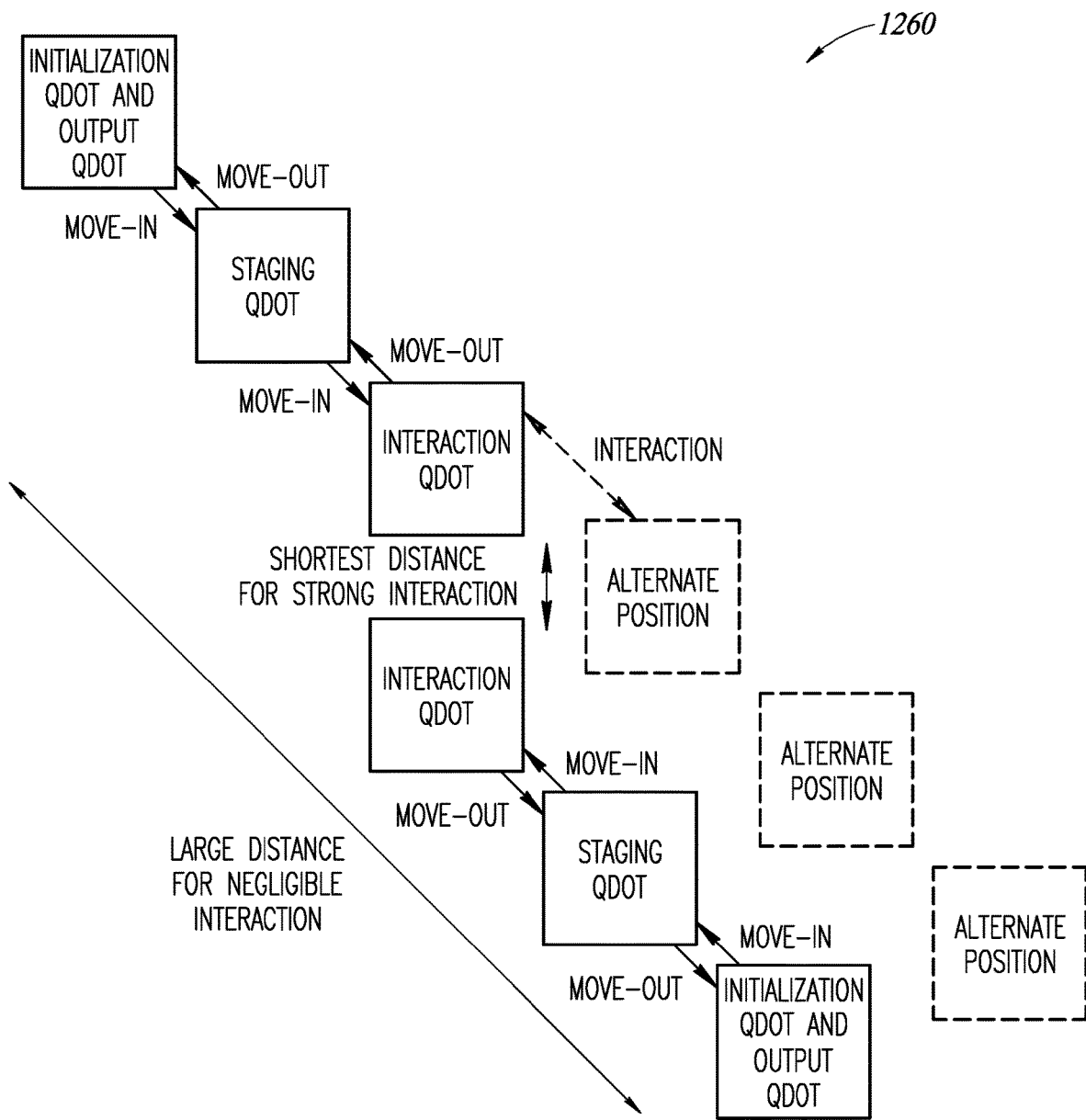
FIG. 9C is a diagram illustrating a third example of semiconductor entanglement quantum interaction gate including initialization, staging, interaction, and output locations.

A diagram illustrating a third example of semiconductor entanglement quantum interaction gate including initialization, staging, interaction, and output locations is shown in FIG. 9C. The quantum interaction gate, generally referenced 1260, comprises two qubits whose interaction qdots are situated in close proximity and gradual increasing the distance between the staging and initialization/detection or output locations to minimize parasitic interaction. In this case, the particles are shifted forward and back through the same qdots. This structure is called the I-interaction structure. It has the same main characteristics as the double-V structure, but particles are traveling through the same qdots forward and back, instead of different loading (move-in) and de-loading (move-out) paths, like in FIG. 9A.

Figure 9D:
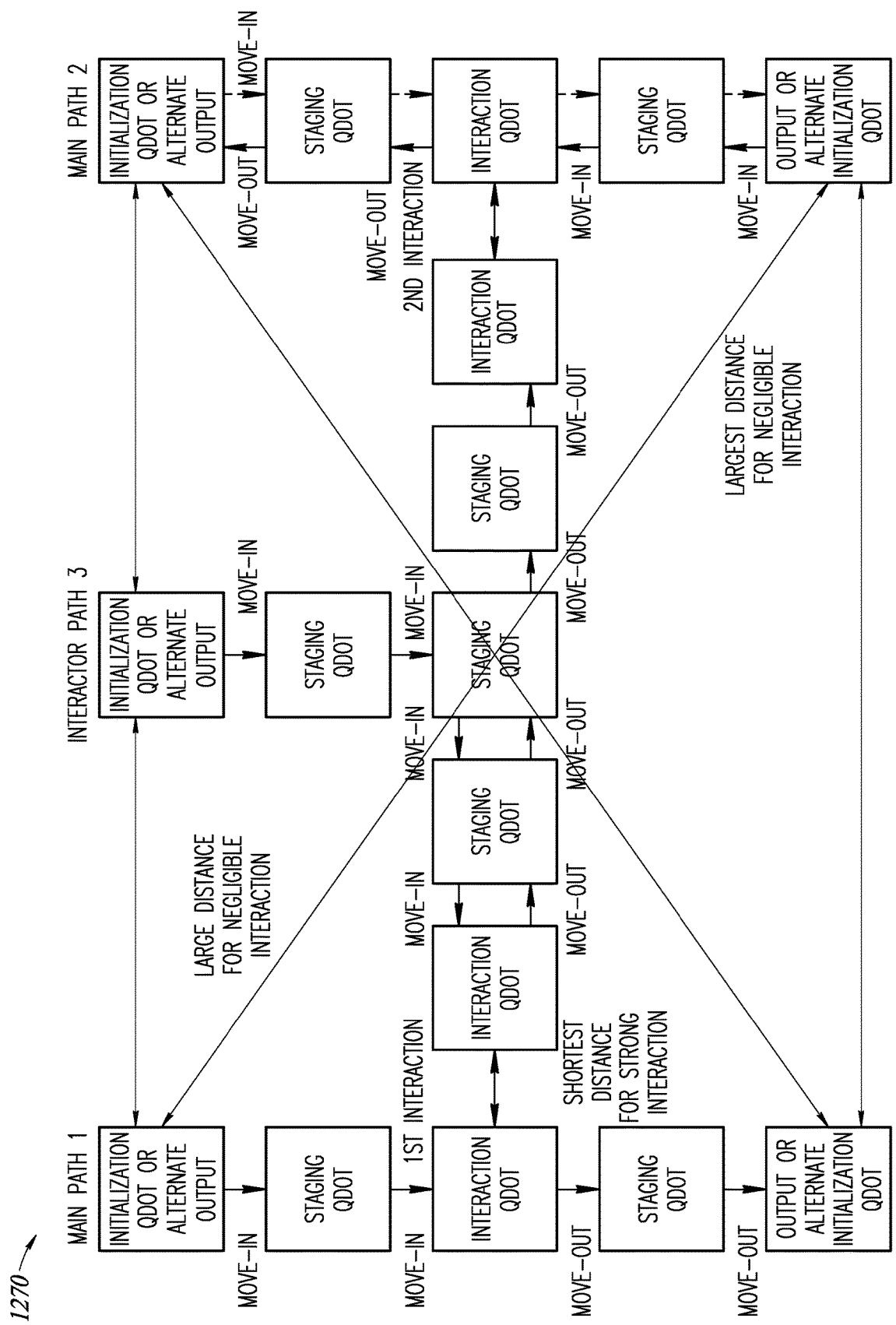
FIG. 9D is a diagram illustrating a fourth example of semiconductor entanglement quantum interaction gate including initialization, staging, interaction, and output locations.

A diagram illustrating a fourth example of semiconductor entanglement quantum interaction gate including initialization, staging, interaction, and output locations is shown in FIG. 9D. The quantum interaction gate, generally referenced 1270, in the shape of H comprises three qubits forming main paths 1 and 2, and interactor path 3, in close proximity with gradual increasing of the distance between the staging and initialization/detection or output locations to minimize parasitic interaction. Other shapes are also possible, while achieving large distance when interaction is not desired and close distance when interaction is desired. First and second interaction occurs between the two pairs of interaction qdots.

In a quantum core, a large number of interactions between the different quantum states/particles needed to be performed. Using the double-V and multiple-V quantum interaction structures a quantum core with relatively parallel quantum paths can be realized.

Figure 10A:
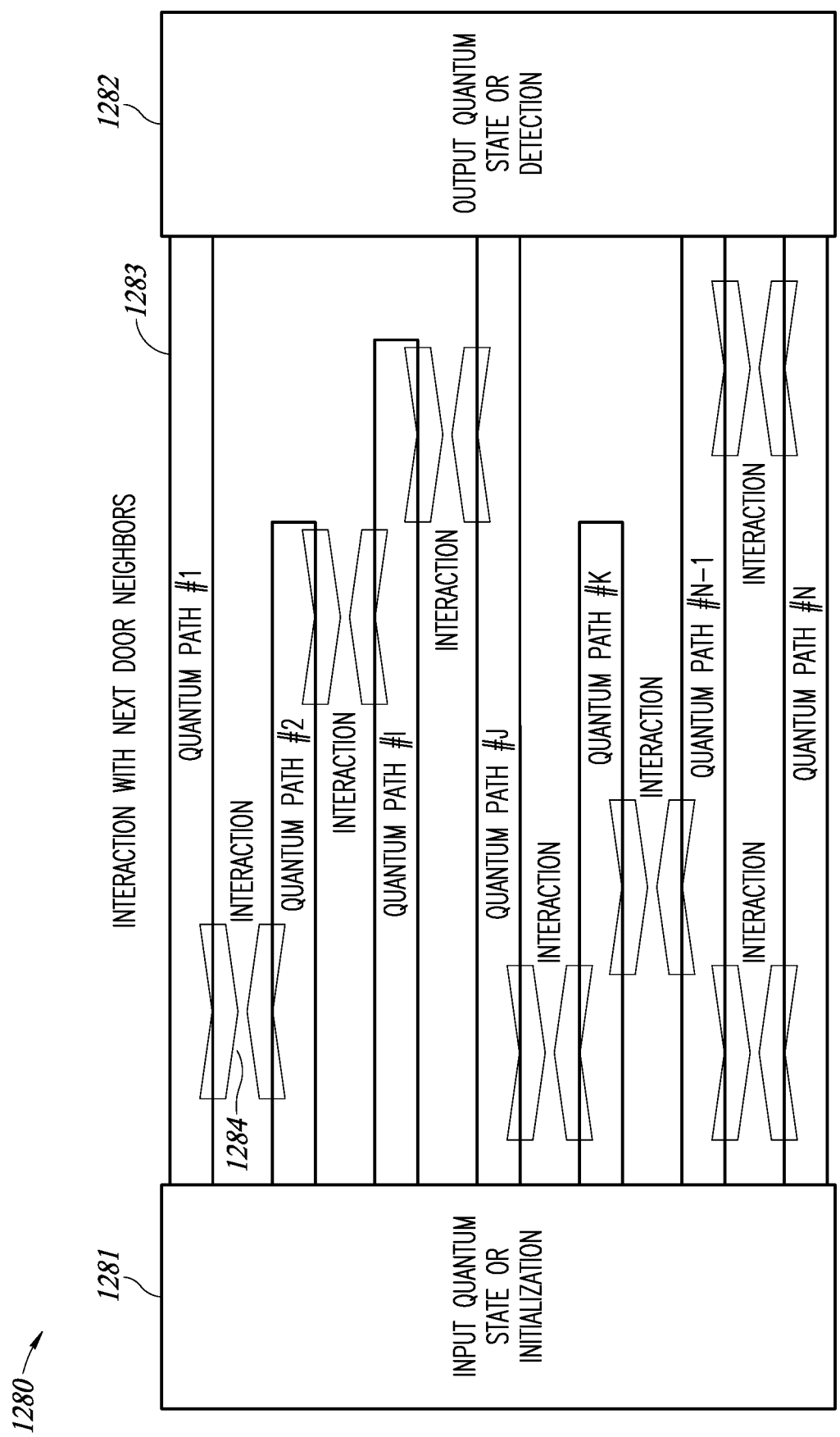
FIG. 10A is a diagram illustrating an example quantum interaction gate using double V interaction between neighboring paths.

A diagram illustrating an example quantum interaction gate using double V interaction between neighboring paths is shown in FIG. 10A. The quantum interaction gate, generally referenced 1280, comprises close-by interaction qdots and further-away qdots for negligible parasitic interaction, input quantum state 1281, output quantum 1282, a plurality of N quantum paths 1283, and double V interaction 1284 between paths where the interactions are allowed between neighboring quantum paths.

Figure 10B:
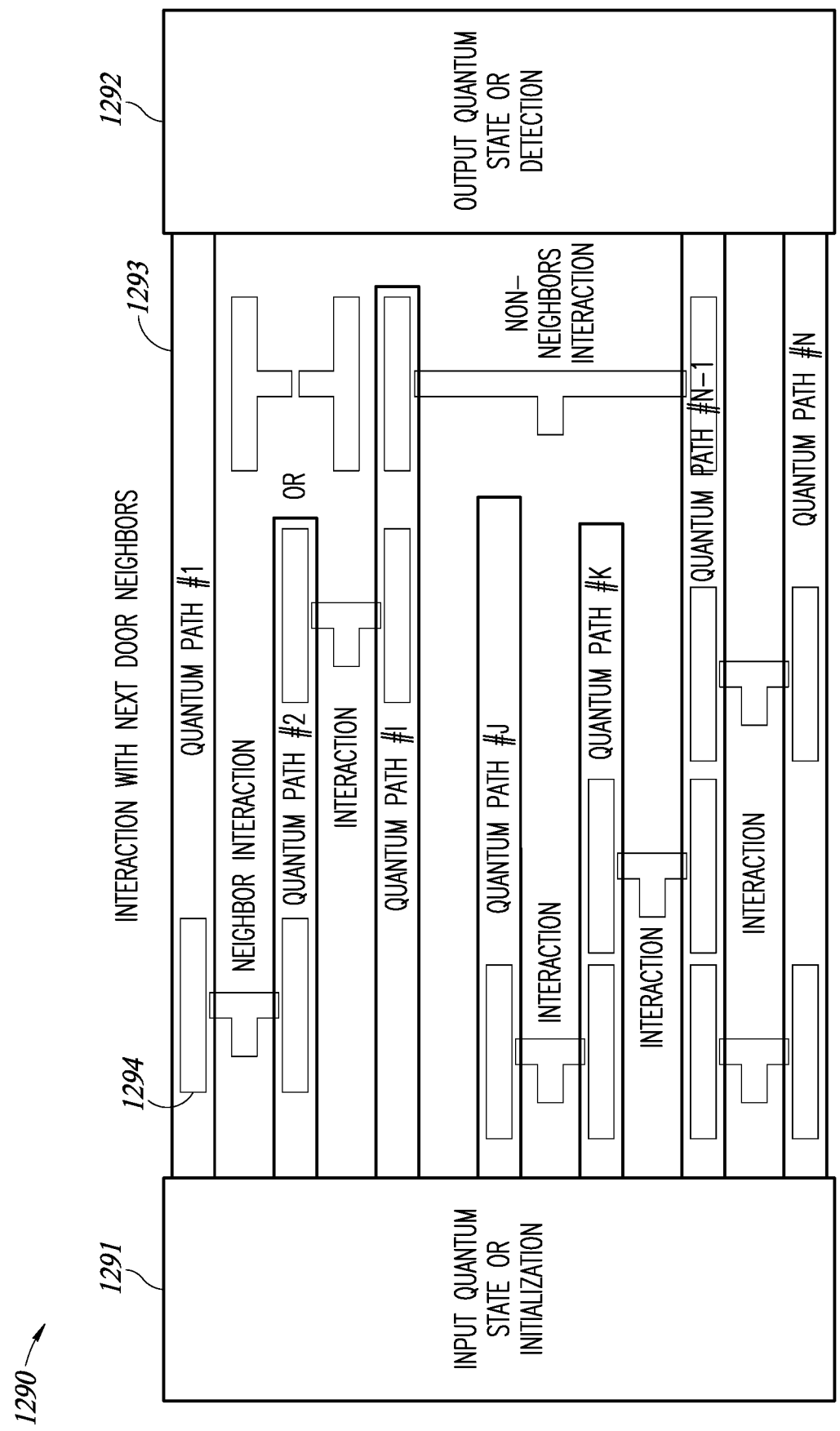
FIG. 10B is a diagram illustrating an example quantum interaction gate using H interaction between neighboring paths.

A diagram illustrating an example quantum interaction gate using H interaction between neighboring paths is shown in FIG. 10B. The quantum interaction gate, generally referenced 1290, comprises close-by interaction qdots and further-away qdots for negligible parasitic interaction, input quantum state 1291, output quantum state 1292, a plurality of N quantum paths 1293, and H shaped interaction 1294 between paths where the interactions are allowed between neighboring quantum paths.

Figure 10C:
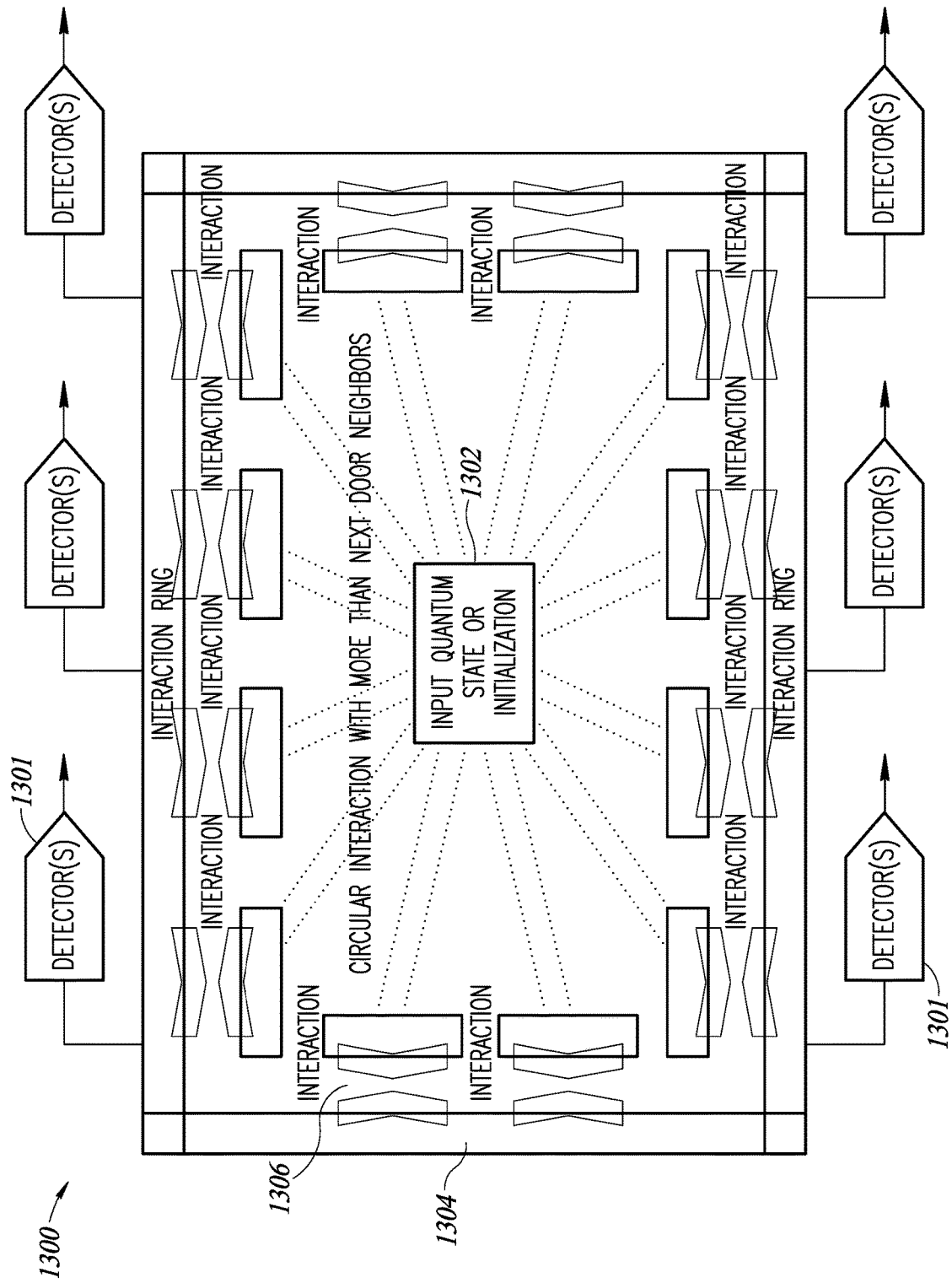
FIG. 10C is a diagram illustrating an example quantum interaction ring with star shaped access and double V interaction with multiple next door neighbors.

In some cases, it may be desirable to perform interactions not only between neighboring paths or qdots. A diagram illustrating an example quantum interaction ring with star shaped access and double V interaction with multiple next door neighbors (with multiple detection points) is shown in FIG. 10C. The quantum interaction ring (or hub), generally referenced 1300, comprises interaction ring 1304, input quantum state 1302, a plurality of double V interactions 1306, and a plurality of detectors 1301. Any of the quantum states in the spokes of the ring configuration can be moved into the ring to interact with another quantum state.

Figure 10D:
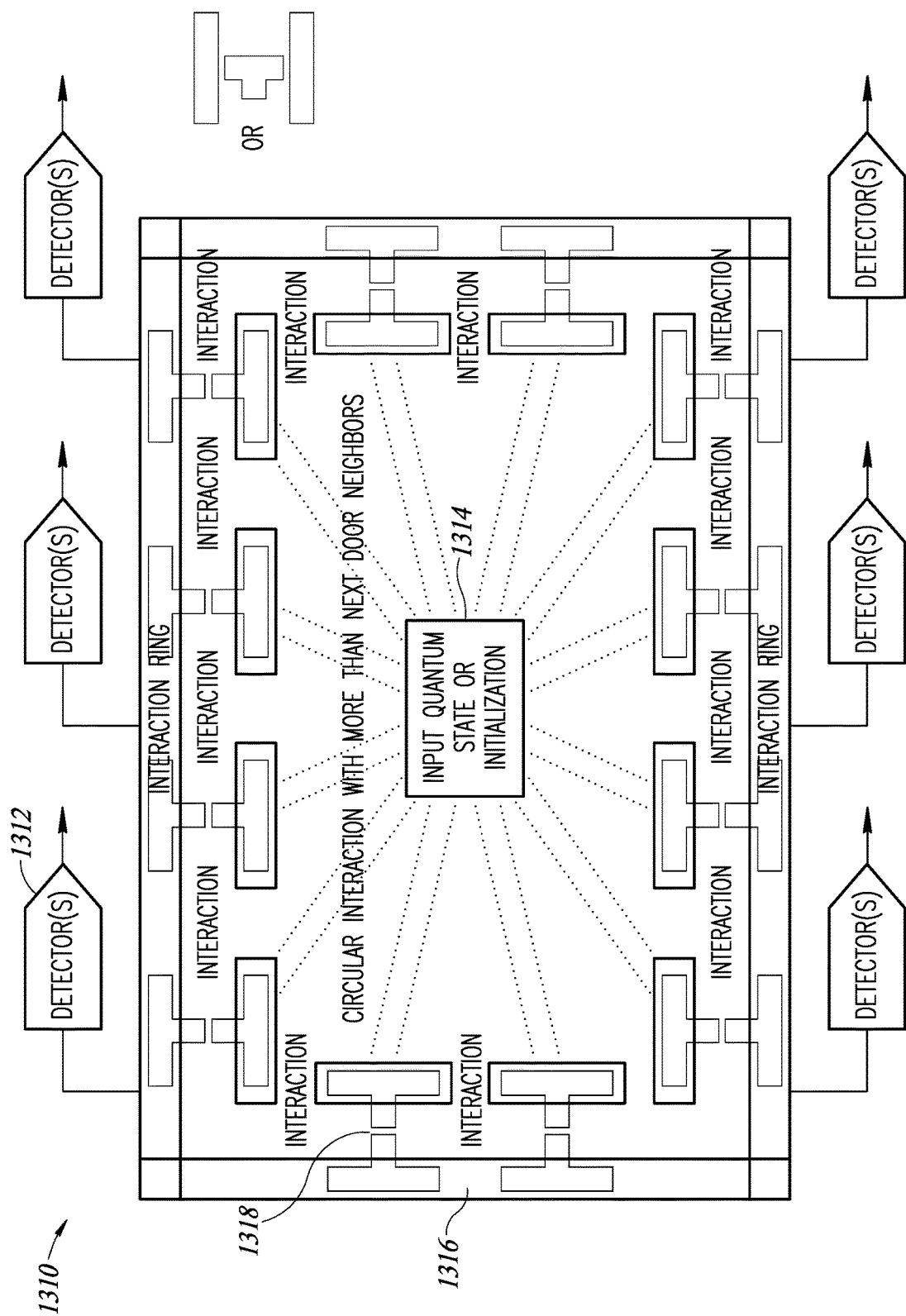
FIG. 10D is a diagram illustrating an example quantum interaction ring with star shaped access and H interaction with multiple next door neighbors.

A diagram illustrating an example quantum interaction ring with star shaped access and H interaction with multiple next door neighbors is shown in FIG. 10D. The quantum interaction ring, generally referenced 1310, comprises interaction ring 1316, input quantum state 1314, a plurality of H shaped interactions 1318, and plurality of detectors 1312. Any of the quantum states available in the star configuration can be brought to the ring to interact with another state.

Figure 11A:
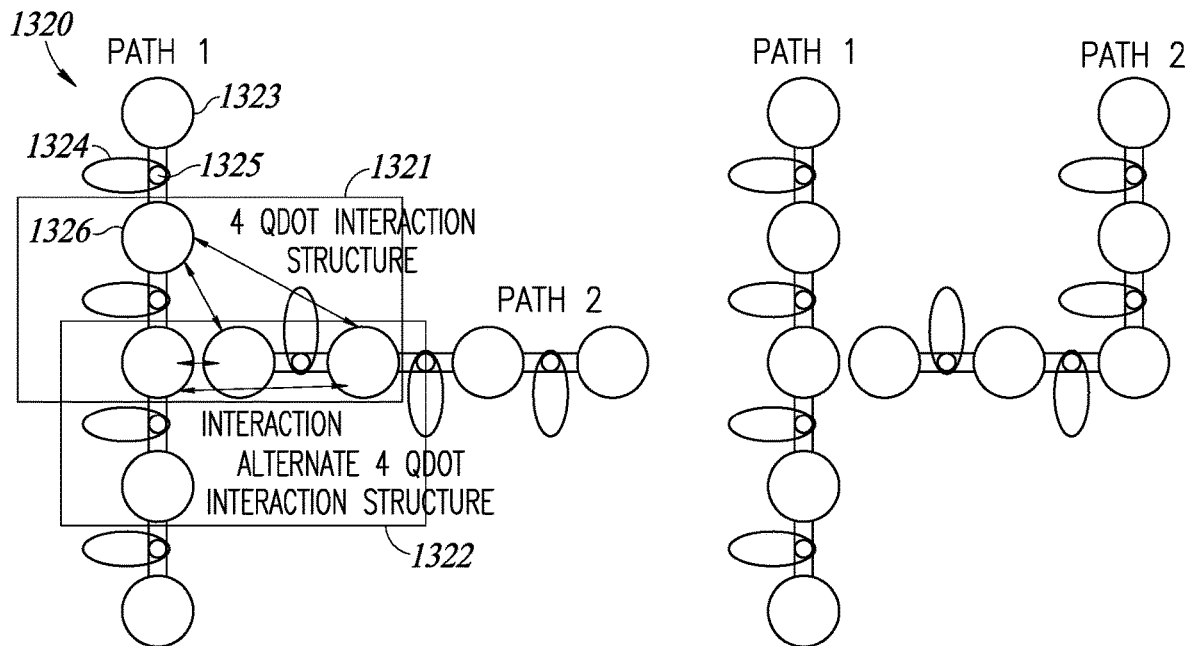
FIG. 11A is a diagram illustrating an example T shape quantum interaction gate using tunneling through a local depleted well for interaction between two qubits.

Numerous shapes can be used to implement CNOT quantum interaction gates. A diagram illustrating an example T shape quantum interaction gate using tunneling through a local depleted well for interaction between two qubits is shown in FIG. 11A. The quantum interaction gate, generally referenced 1320, comprises two qubit paths labeled 1 and 2. The CNOT gate allows interaction between two particles implemented using structures with tunneling 1325 through a local depleted well and T-shape chains. The qubits comprise a plurality of qdots 1323, 1326, and control gate 1324. A four qdot interaction structure 1321 shows the possible interaction between the two qubits. An alternative four qdot interaction structure 1322 is also possible. Alternatively, the T shape CNOT quantum interaction gate, generally referenced 1327, can be constructed with paths 1 and 2, where path 2 is L shaped.

Figure 11B:
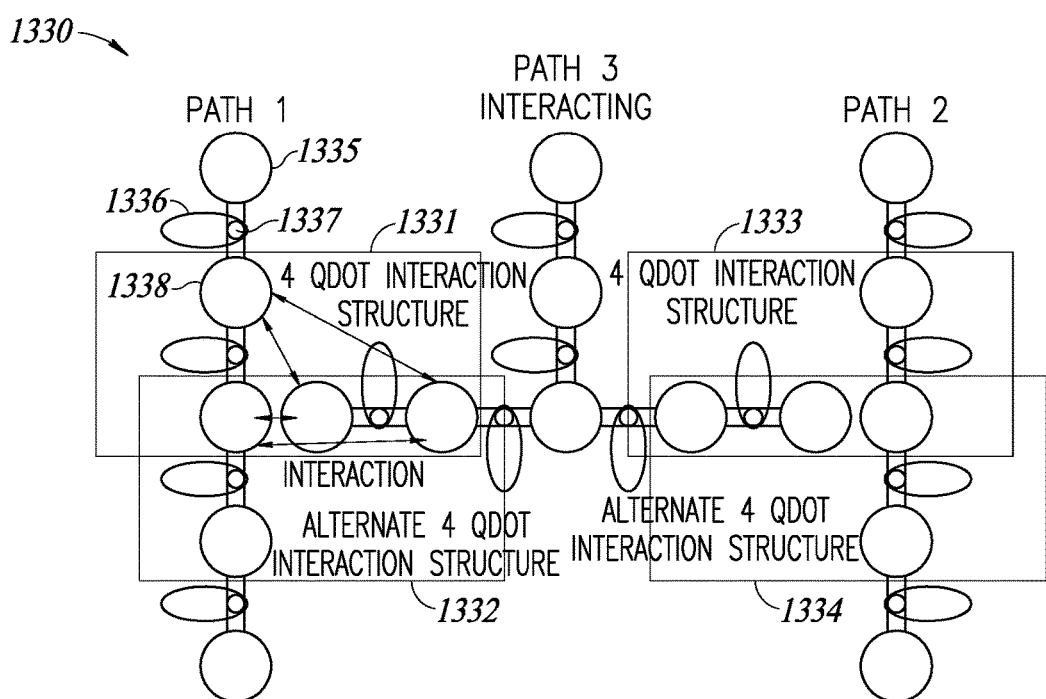
FIG. 11B is a diagram illustrating an example H shape quantum interaction gate using tunneling through a local depleted well for interaction between two qubits.

A diagram illustrating an example H shape quantum interaction gate using tunneling through a local depleted well for interaction between three qubits is shown in FIG. 11B. The quantum interaction gate, generally referenced 1330, comprises three qubits paths, namely 1, 2, and 3 which include quantum shift registers. Each qubit comprises a plurality of qdots 1335, 1338, control gate 1336, and tunneling through a local depleted well 1337. Note that other shapes such as I-shape, T-shape, L-shape can also be realized. Both orthogonal (i.e. vertical and horizontal) and angled structures can be used. Several possible qdot interaction structures are possible including four qdot interaction structures 1331, 1332, 1333, 1334.

Figure 11C:
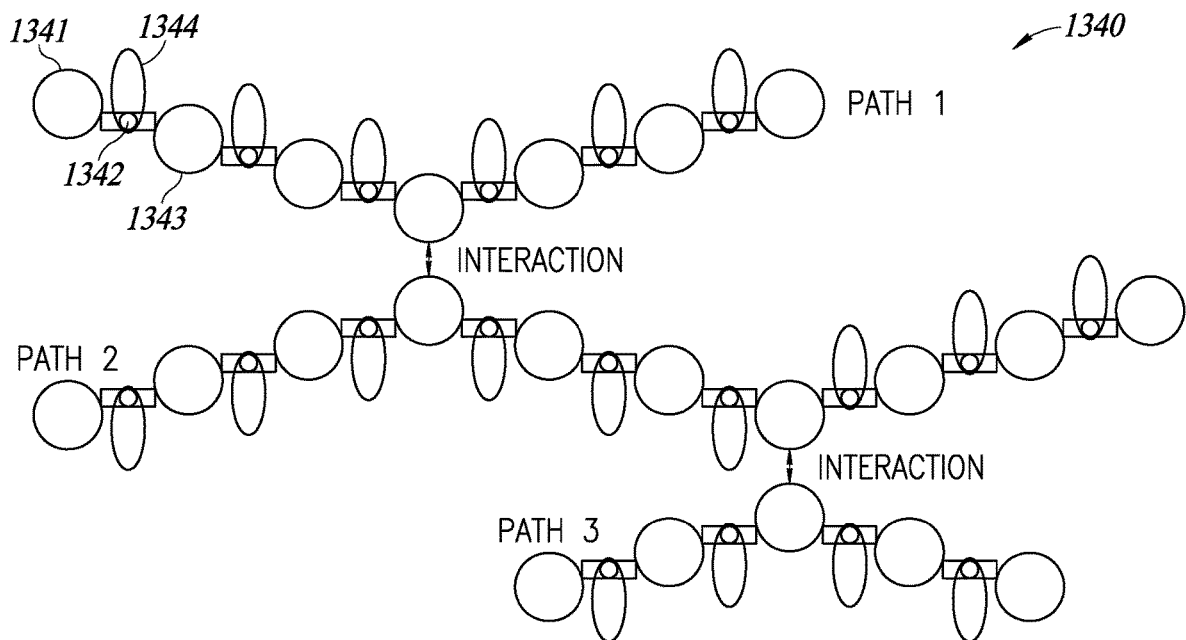
FIG. 11C is a diagram illustrating an example of a triple V shape quantum interaction gate using tunneling through a local depleted well for interaction between three qubits.

A diagram illustrating an example of a triple V shape quantum interaction gate is shown in FIG. 11C. The quantum interaction gate, generally referenced 1340, comprises a plurality of qdots 1341, 1343, control gates 1344, and tunneling through a local depleted well 1342 for interaction between three qubit paths or qudits (paths 1, 2, and 3). The triple-V interaction structure allows the entanglement of three particles using two consecutive two-particle entanglement.

Note that if more than two particles need to interact, it is not needed to bring them simultaneously in close proximity. Multiple V-paths can be used to bring together pairs of particles/states to interact. In some cases, it is desired to achieve interaction/entanglement between multiple particles/states. A triple-V quantum structure (or in general a multi-V structure) can be used to achieve this. There are two interaction locations: (1) between the first and second V-shape quantum structure, and (2) between the second and the third V-shape quantum structure. In this case, an even larger number of quantum shift registers are used to transport the quantum particles/states between, to, and from the interaction locations.

Figure 11D:
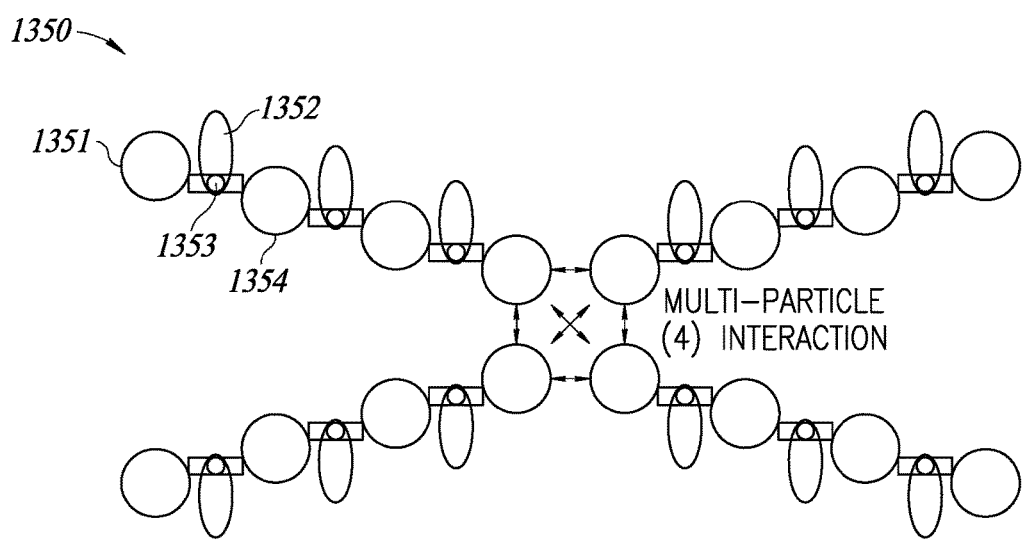
FIG. 11D is a diagram illustrating an example double V shape quantum interaction gate using tunneling through a local depleted well for interaction between two qubits.

Another example of interaction shape is X or star-shape. A diagram illustrating an example double V shape quantum interaction gate using tunneling through a local depleted well for interaction between two qubits is shown in FIG. 11D. The X shaped quantum interaction gate, generally referenced 1350, comprises a plurality of qdots 1351, 1354, control gates 1352, and local depleted well 1353. The X-interaction structure allows entanglement of four particles, either simultaneously or at consecutive times), where each well has bidirectional particle transport. Note that the X-shape (or star-shape) is a version of double-V quantum interaction in which the two V-shapes are split in the middle. This allows the interaction between a larger number of particles.

Figure 12A:
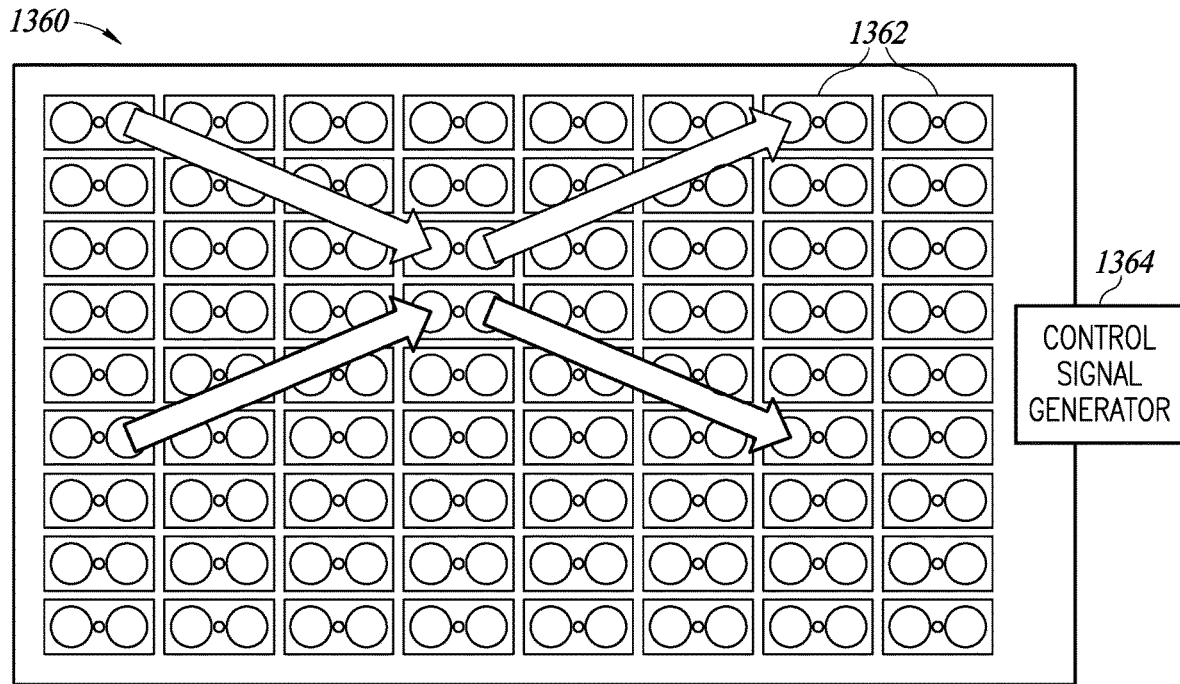
FIG. 12A is a diagram illustrating a first example CNOT quantum interaction gate within a grid array of programmable semiconductor qubits.

One of the most efficient ways to build a quantum core is using a grid configuration in which the qdots are arranged in rows and columns. A diagram illustrating a first example CNOT quantum interaction gate within a grid array of programmable semiconductor qubits is shown in FIG. 12A. The re-configurable grid-based quantum computing structure, generally referenced 1360, comprises a plurality of qubits 1362 arranged in rows and columns and associated control circuitry including control signals generator 1364. As an example, a double-V interaction structure is shown programmed as indicated by the four arrows. Note that the grid array of qubits can be re-programmed to implement other structures and configurations.

Figure 12B:
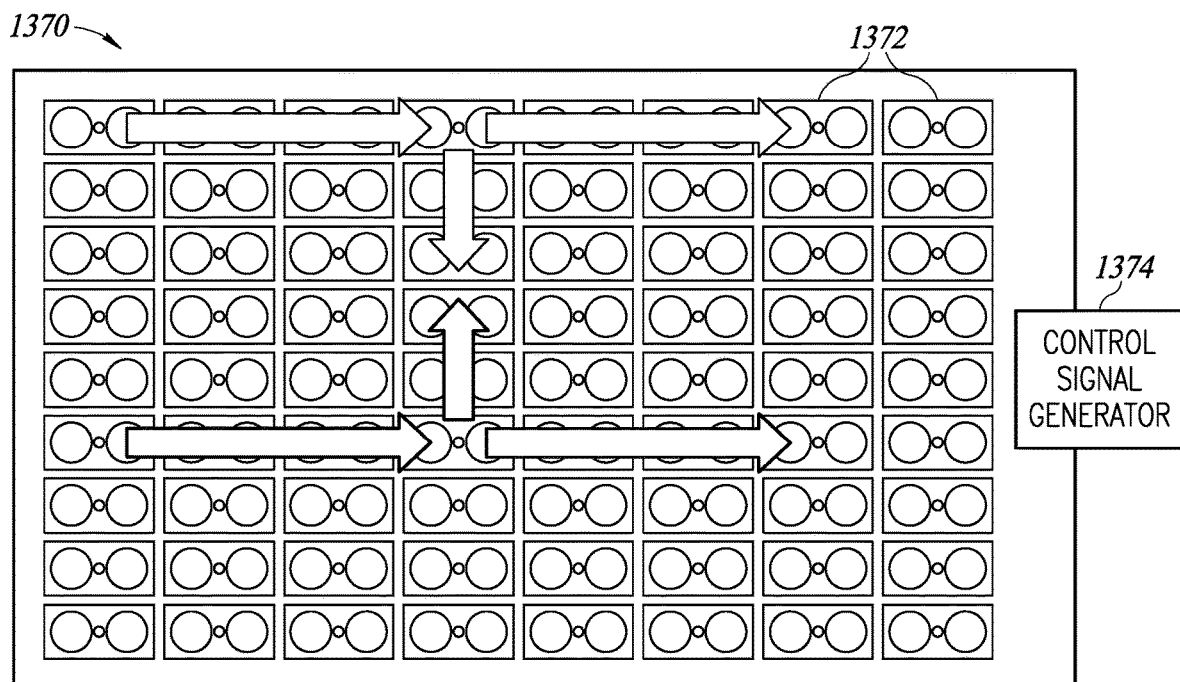
FIG. 12B is a diagram illustrating a second example CNOT quantum interaction gate within a grid array of programmable semiconductor qubits.

A diagram illustrating a second example CNOT quantum interaction gate within a grid array of programmable semiconductor qubits is shown in FIG. 12B. The re-configurable grid-based quantum computing structure, generally referenced 1370, comprises a plurality of qubits 1372 arranged in rows and columns and associated control circuitry including control signals generator 1374. As an example, a double-V interaction structure is shown programmed as indicated by the four arrows. Note that the grid array of qubits can be re-programmed to implement other structures and configurations.

Figure 13:
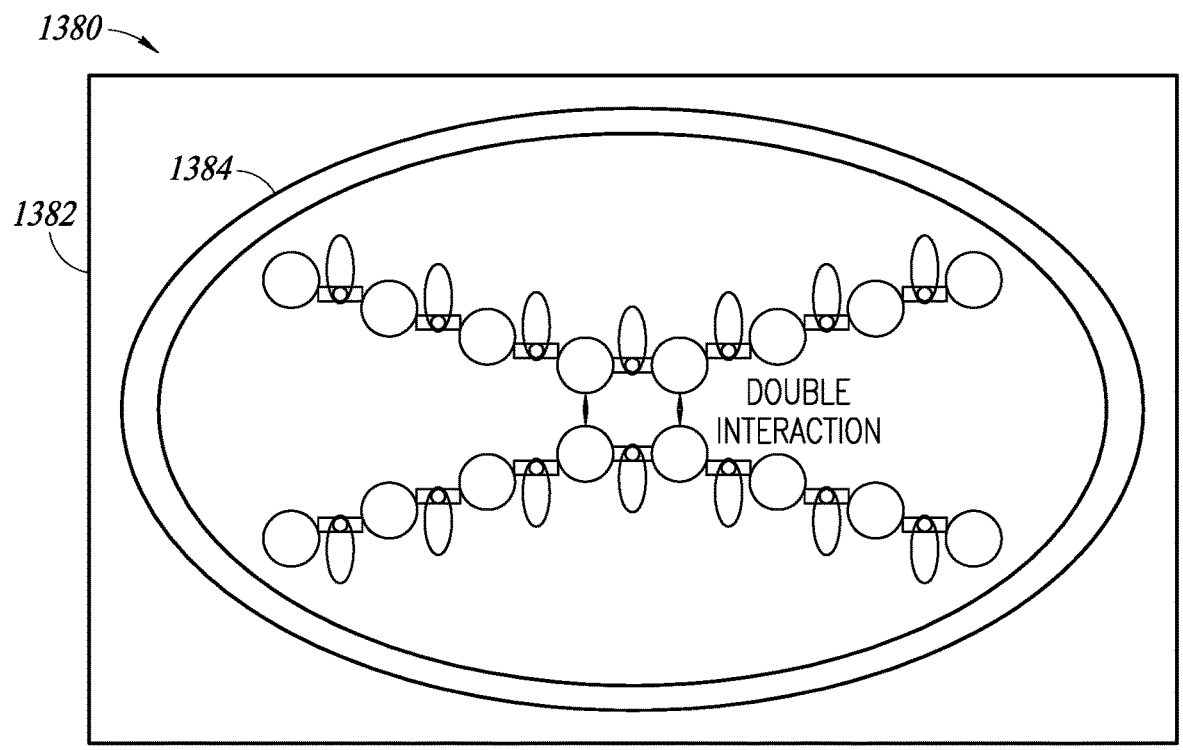
FIG. 13 is a diagram illustrating an example quantum interaction gate constructed with both electric and magnetic control.

Most of the structures described supra use charge qubits and qdots that are electrically controlled via an electric field. A more general quantum structure can use hybrid electric and magnetic control. The magnetic field can be generated with an inductor or a resonator. A diagram illustrating an example quantum interaction gate constructed with both electric and magnetic control is shown in FIG. 13. The structure, generally referenced 1380, comprises a quantum interaction gate located within a magnetic control 1384, and electric control 1382. In this example, the hybrid electric and magnetic control is applied to a double-V structure using tunneling through local depleted regions. One or more gates can be under the control of a magnetic field generation structure. In one embodiment, given a focused magnetic field, the control is local if only one interaction structure is covered by the strong magnetic field from the inductor (or resonator). Note that the size and shape of the magnetic field generator can vary.

Figure 14:
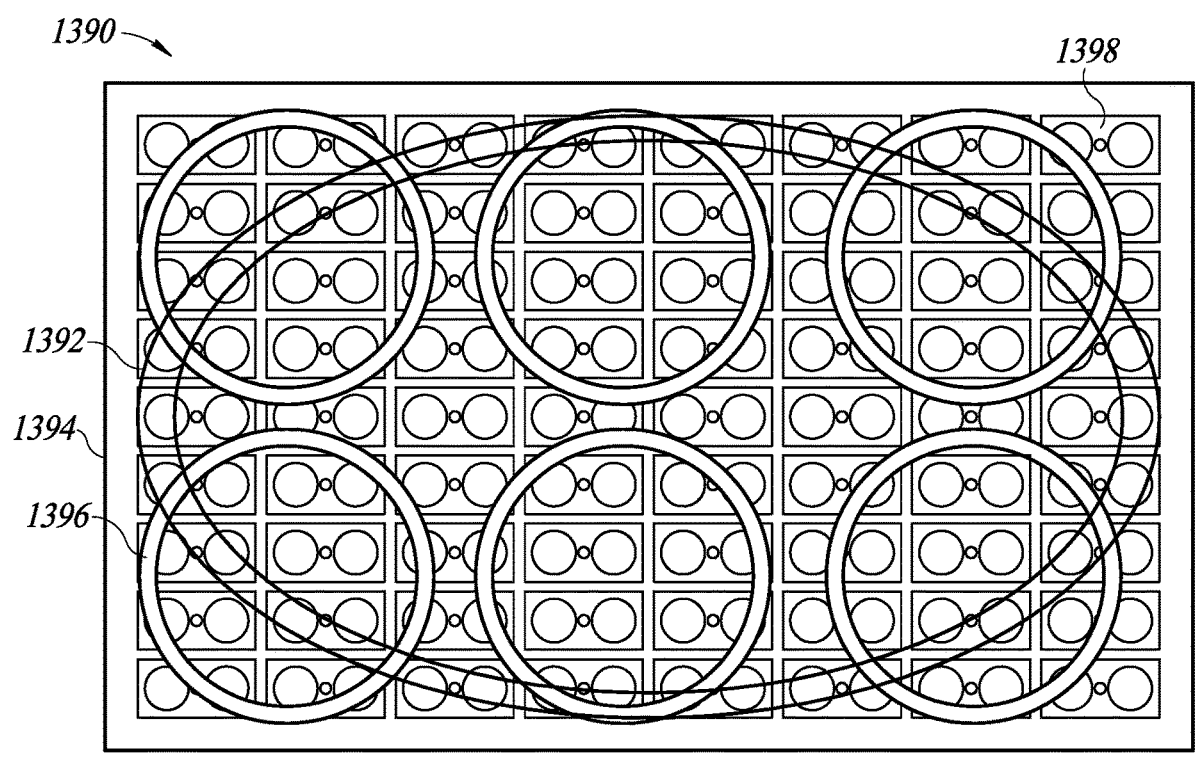
FIG. 14 is a diagram illustrating an example grid array of programmable semiconductor qubits with both global and local magnetic.

In the case of a larger quantum core, multiple inductors can be used to create local magnetic control fields. Alternatively, a global magnetic control can be used, which impacts two or more quantum structures at a time. A diagram illustrating an example grid array of programmable semiconductor qubits with both global and local magnetic control fields is shown in FIG. 14. The structure, generally referenced 1390, comprises a plurality of qubits 1398 arranged in rows and columns, a plurality of local magnetic controls 1396 (per quantum gate), a global magnetic control 1392, and an electric control 1394. With global magnetic control, multiple quantum structures are controlled by the same magnetic field. One example use for the magnetic field is to select the spin orientation of the particles that are loaded in the quantum structures/core.

Figure 15A:
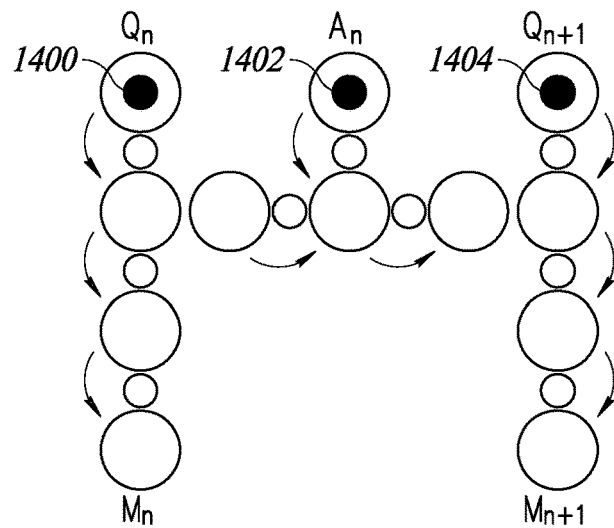
FIG. 15A is a diagram illustrating a first stage of an example quantum interaction gate particle interaction.
Figure 15B:
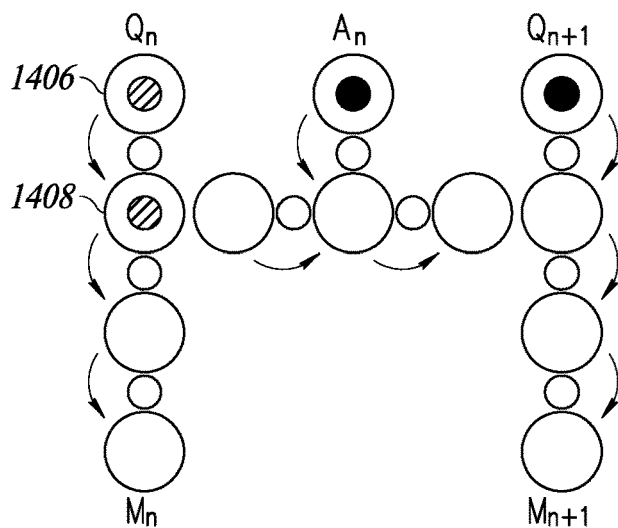
FIG. 15B is a diagram illustrating a second stage of an example quantum interaction gate particle interaction.

First through eighth stages of an example quantum interaction gate particle interaction are shown in FIGS. 15A through 15H, respectively. FIG. 15A illustrates the initializing of an H-style quantum interaction gate with injecting particles 1400, 1402, 1404. All particles can be injected at the same time. In this case, however, some particles may stay in qdots for long time intervals before they undergo processing. This results in loss of quantum accuracy due to decoherence. It is thus advantageous to load the particles only as they are needed in the quantum computation flow. In FIG. 15B, the splitting of particle into 1406 and 1408, and spatial entanglement are shown.

Figure 15C:
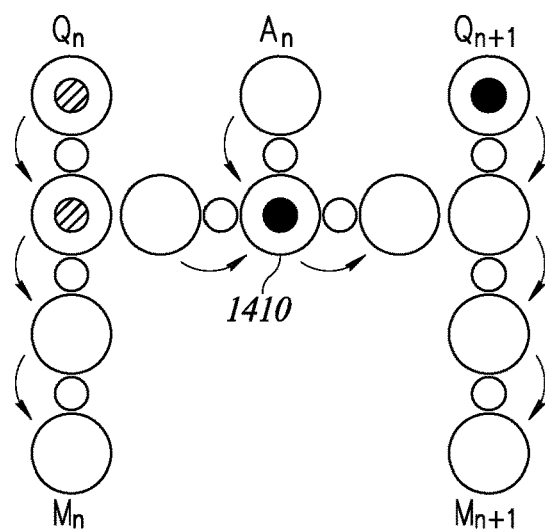
FIG. 15C is a diagram illustrating a third stage of an example quantum interaction gate particle interaction.
Figure 15D:
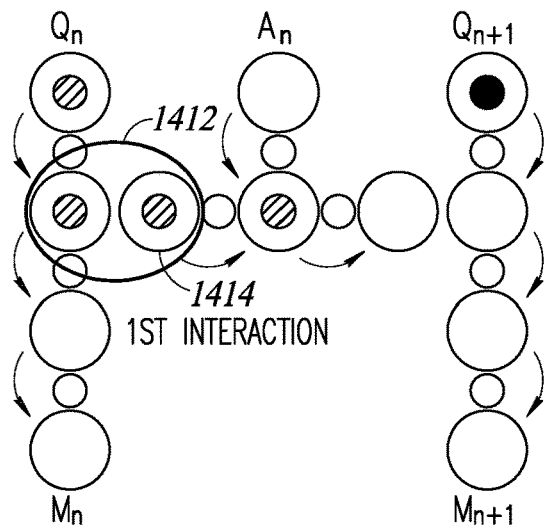
FIG. 15D is a diagram illustrating a fourth stage of an example quantum interaction gate particle interaction.
Figure 15E:
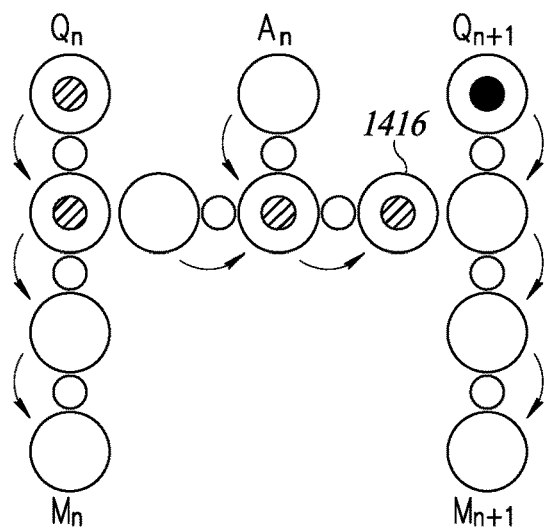
FIG. 15E is a diagram illustrating a fifth stage of an example quantum interaction gate particle interaction.
Figure 15F:
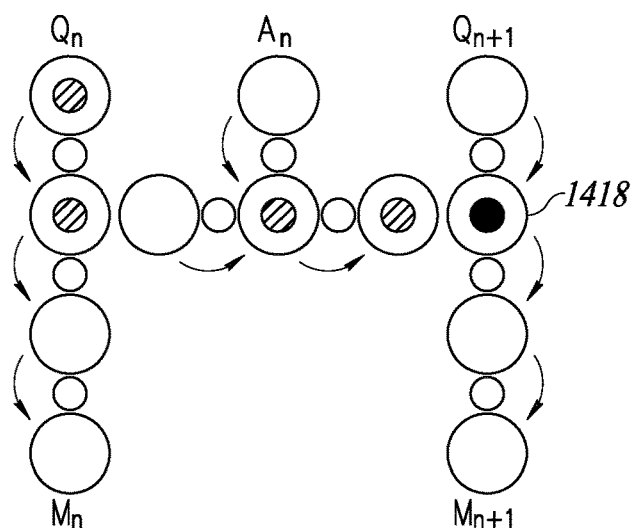
FIG. 15F is a diagram illustrating a sixth stage of an example quantum interaction gate particle interaction.

Once the particles are injected, they can be split as shown in FIG. 15C and transported to the interaction qdots. In the H-style interactor, the interactor particle 1410 is moved around to realize the desired interactions. The interactor particle is split 1414 and the interaction 1412 between the first path and the interactor path occurs as shown in FIG. 15D. FIG. 15E illustrates the transport of the interactor particle 1416 towards the second main path on the right side of the H structure. FIG. 15F illustrates the transporting of the particle 1418 in the second main path towards the interaction position.

FIG. 15G illustrates the performing of the second interaction 1420 of the split particle 1422 between the second main path and the interactor path. In this manner, the first main path interacts with the second main path via the interactor. Subsequently, the states are shifted away from the interacting position towards the output qdots 1424, 1426 where detectors are located. FIG. 15H illustrates the detecting process and thus the collapsing of the quantum states.

A diagram illustrating an example semiconductor double qdot qubit using tunneling through a separate layer planar structure is shown in FIG. 16A. The planar semiconductor qubit, generally referenced 1430, uses thin gate oxide tunneling and comprises qdots 1434, 1438, control gate 1432, and polysilicon or oxide 1436.

A diagram illustrating an example planar semiconductor double qdot qubit using tunneling through a local depleted well planar structure is shown in FIG. 16B. The planar semiconductor qubit, generally referenced 1440, uses tunneling 1448 through a local depletion region inside a continuous well, and comprises qdots 1444, 1441, control gate 1446, and contact 1442.

Figure 16C:
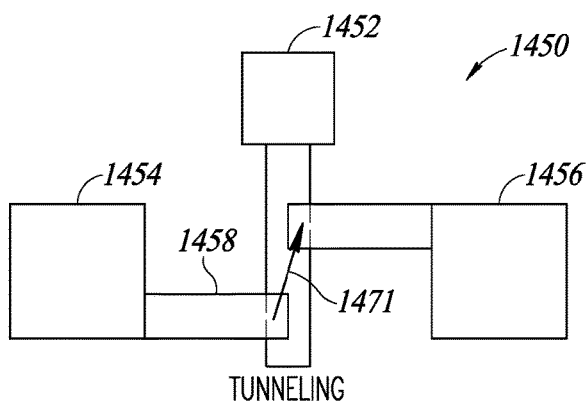
FIG. 16C is a diagram illustrating an example semiconductor qubit using tunneling through a separate layer 3D FIN-FET structure.

A diagram illustrating an example 3D semiconductor qubit using tunneling through a separate gate oxide layer 3D FIN-FET structure is shown in FIG. 16C. The 3D semiconductor qubit with fin-to gate tunneling 1471, generally referenced 1450, comprises qdots 1454, 1456, fins 1458, and control gate 1452.

Figure 16D:
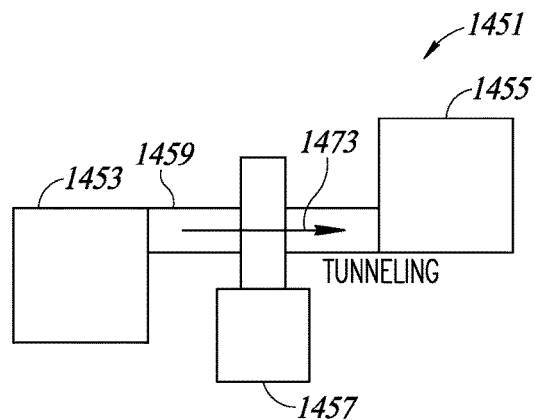
FIG. 16D is a diagram illustrating an example semiconductor qubit using tunneling through a local depleted well 3D FIN-FET structure.

A diagram illustrating an example 3D semiconductor qubit using tunneling through a local depletion in a fin structure is shown in FIG. 16D. The 3D semiconductor qubit with local depleted fin tunneling 1473, generally referenced 1451, comprises qdots 1453, 1455, fins 1459, and control gate 1457.

Figure 16E:
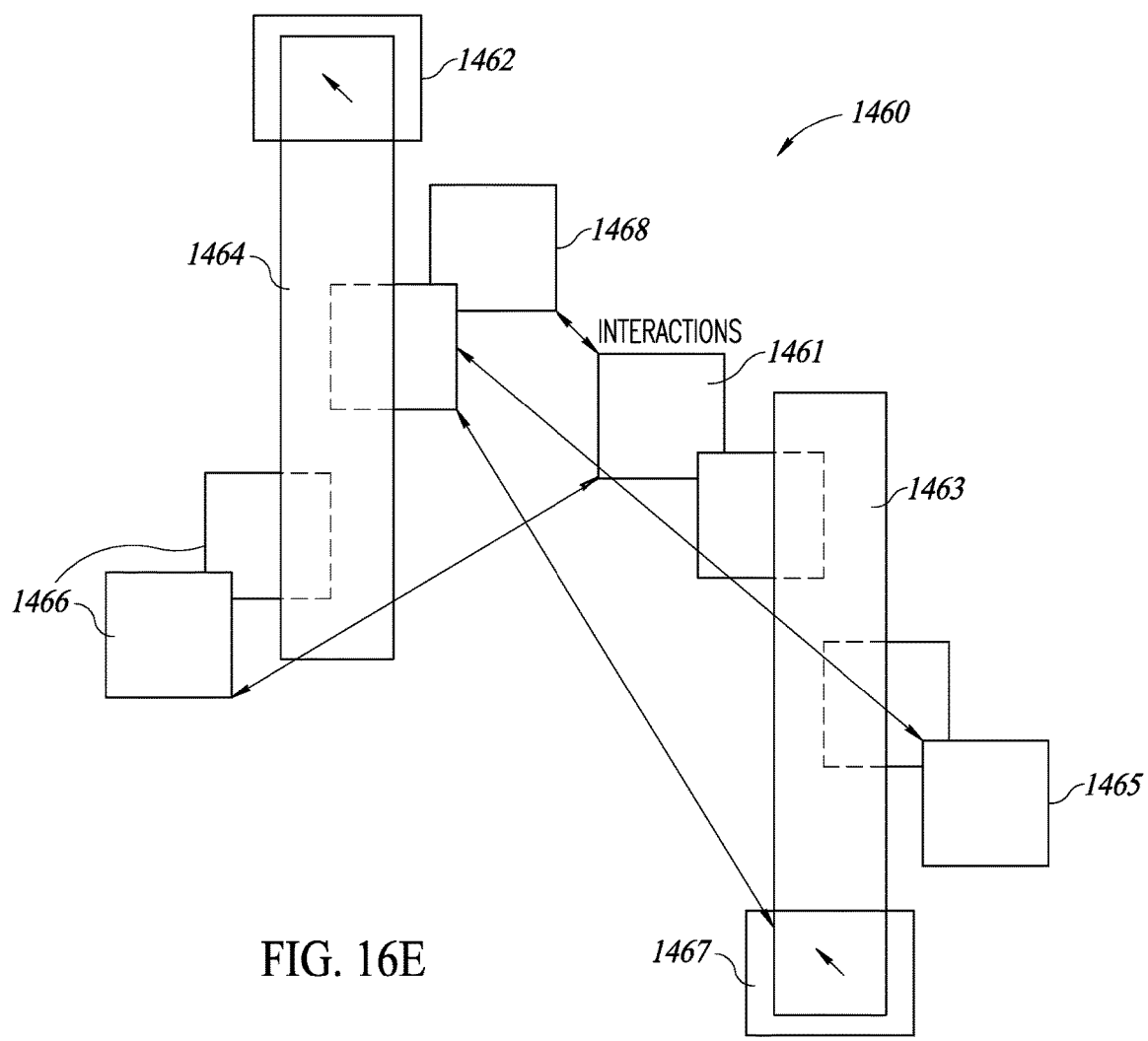
FIG. 16E is a diagram illustrating a semiconductor CNOT quantum interaction gate using two qubit double qdot structures with tunneling through a separate structure planar structure.

A diagram illustrating a semiconductor CNOT quantum interaction gate using two qubit double qdot structures with tunneling through a separate planar structure is shown in FIG. 16E. The CNOT quantum interaction gate, generally referenced 1460, comprises a first qubit having a plurality of qdots 1466, control gate 1464, and metal layer 1462 above the control gate 1464. A second qubit comprises a plurality of qdots 1465, control gate 1463, and contact 1467. The two qubits are located in close proximity so that interaction occurs between qdots 1468 and 1461. Other interactions may occur as indicated by the arrows but these are much weaker since the qdots are further away from each other.

Semiconductor CNOT gates can be built using tunneling through a depletion region. Several different positions for getting interaction between two or more particles inside the same continuously drawn well will now be described. In this case, the two interacting particles are not on separate chain structures, but inside the same chain structure.

Figure 16F:
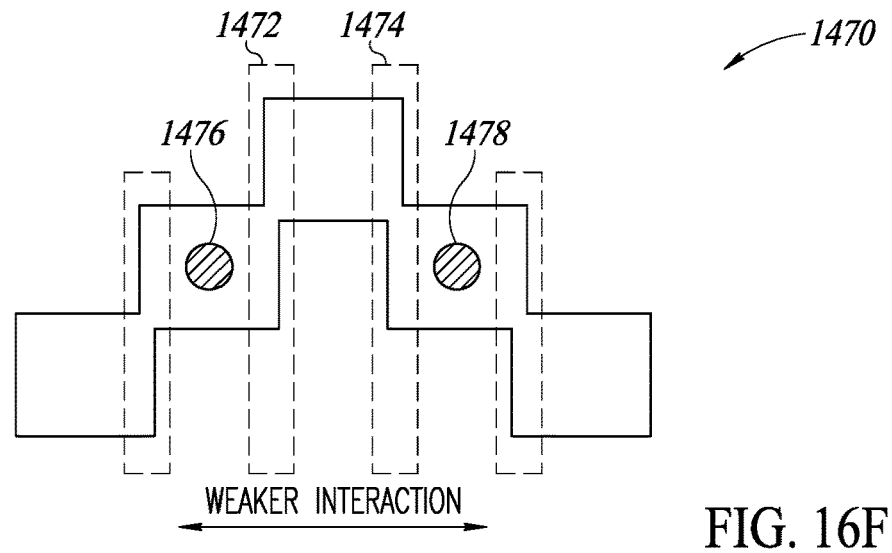
FIG. 16F is a diagram illustrating a first example quantum interaction gate with interaction between two particles in the same continuous well.

A diagram illustrating a first example quantum interaction gate with interaction between two particles in the same continuous well is shown in FIG. 16F. The quantum interaction gate, generally referenced 1470, comprises a plurality of qdots in the same continuous well, two particles 1476, 1478, and control gates 1472, 1474. Since the two particles are separated by the top qdot, the interaction in this example is weaker.

Figure 16G:
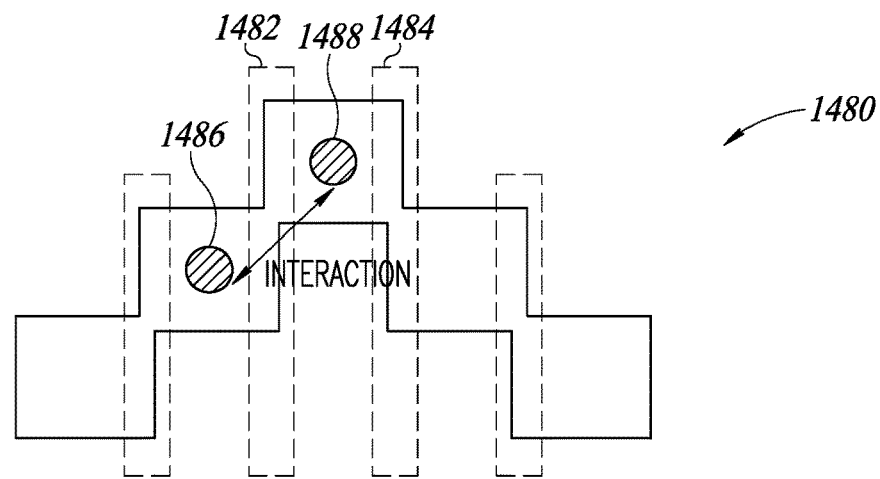
FIG. 16G is a diagram illustrating a second example quantum interaction gate with interaction between two particles in the same continuous well.

A diagram illustrating a second example quantum interaction gate with interaction between two particles in the same continuous well is shown in FIG. 16G. The quantum interaction gate, generally referenced 1480, comprises a plurality of qdots in the same continuous well, two particles 1486, 1488, and control gates 1482, 1484. Since the two particles are in adjacent qdots, the interaction in this example is stronger.

Figure 16H:
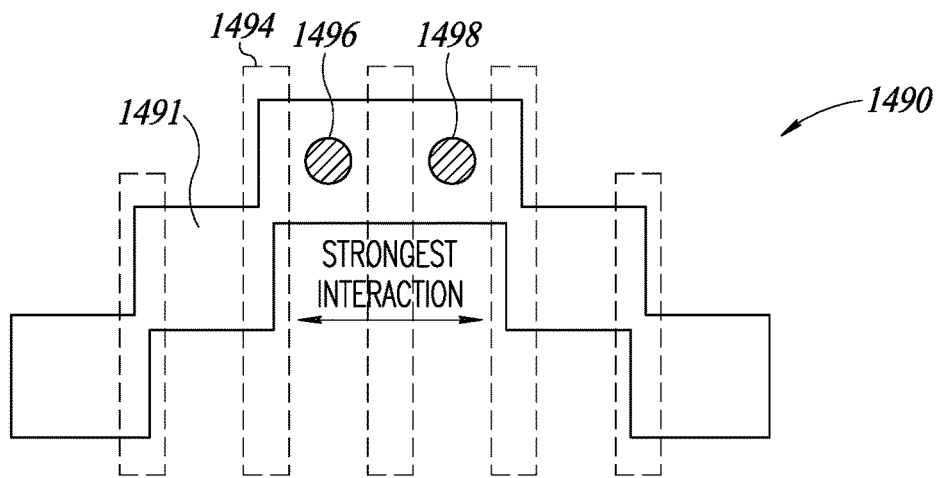
FIG. 16H is a diagram illustrating a third example quantum interaction gate with interaction between two particles in the same continuous well.

A diagram illustrating a third example quantum interaction gate with interaction between two particles in the same continuous well is shown in FIG. 16H. The quantum interaction gate, generally referenced 1490, comprises a plurality of qdots in the same continuous well 1491, two particles 1496, 1498, and control gates 1494. Since the two particles are in adjacent parallel qdots, the interaction in this example is the strongest.

In an alternate embodiment the two particles that will interact can be hosted by two different chain structures. A diagram illustrating a first example quantum interaction gate with interaction between two or more particles in different continuously drawn wells is shown in FIG. 16I. The quantum interaction gate, generally referenced 1500, comprises two qubits with shared control gates 1502, and two particles 1506, 1508. The qubits are located in close proximity to permit strong interaction between the particles.

A diagram illustrating a second example quantum interaction gate with interaction between two particles in different continuous wells is shown in FIG. 16J. The quantum interaction gate, generally referenced 1510, comprises two qubits with separate control gates 1512, 1514 and two particles 1516, 1518. The qubits are not located in close proximity thus resulting in a weaker interaction between the particles.

A diagram illustrating a second example quantum interaction gate with interaction between two particles in different continuous wells is shown in FIG. 16K. The quantum interaction gate, generally referenced 1520, comprises two qubits with shared control gates 1522, 1524 and two particles 1526, 1528. Although the qubits are located in close proximity, the particles are not in adjacent qdots thus resulting in a weaker interaction between the particles.

Figure 16L:
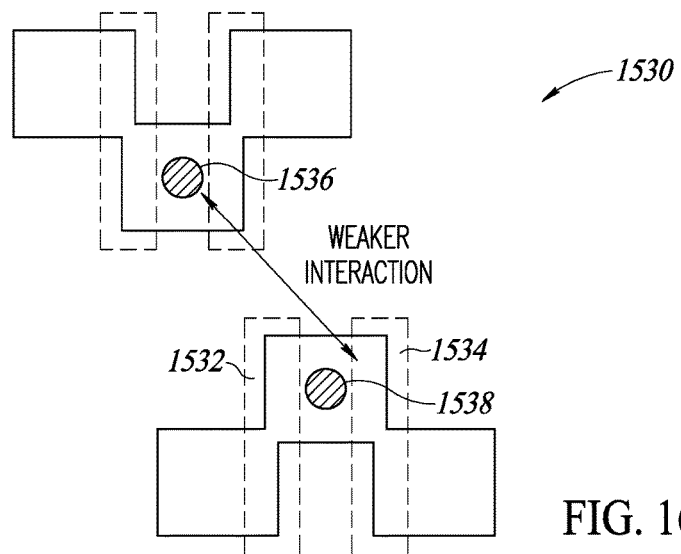
FIG. 16L is a diagram illustrating a second example quantum interaction gate with interaction between two particles in different continuous wells.

A diagram illustrating a second example quantum interaction gate with interaction between two particles in different continuous wells is shown in FIG. 16L. The quantum interaction gate, generally referenced 1530, comprises two qubits each with separate control gates 1532, 1534, and two particles 1536, 1538. Although the qubits are located at the pinnacle of their respective V structures, the two qubits are skewed from each other thus resulting in weaker interaction between the particles.

Figure 17A:
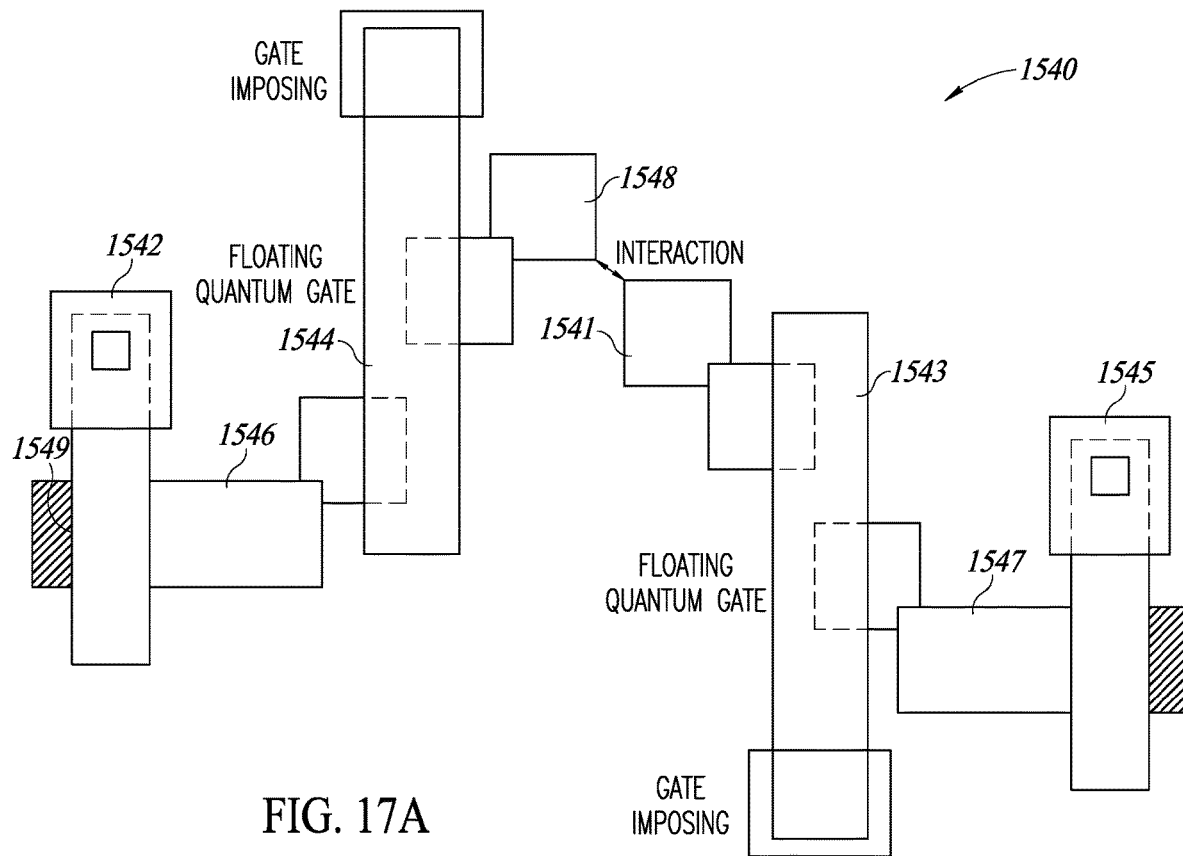
FIG. 17A is a diagram illustrating a CNOT quantum interaction gate using two qubit double qdot structures with tunneling through a separate structure planar structure with gating to classic circuits.

Note that to get the full operation of the CNOT quantum interaction gate, the gate needs to be initialized and at the end measured. Additional layers are needed to perform such operations. The gate may be operated by itself (interconnect directly to the classic world), or it may be interconnected with other quantum gates. A diagram illustrating a CNOT quantum interaction gate using two qubit double qdot structures with tunneling through a separate oxide layer (partial overlapped gate) implemented in a planar process with gating to classic circuits is shown in FIG. 17A. In particular, the gating to the classic electronic circuits is shown including reset, injection, imposing, and detection. The imposers use indirect floating potential imposing. The CNOT quantum interaction gate, generally referenced 1540, comprises two qubits spaced in close proximity to each other such that qdots 1548 and 1541 can interact electrostatically. The first qubit comprises qdot 1546, gate 1542, floating gate 1544 and interface 1549 to classic (i.e. non-quantum) circuitry. The second qubit comprises gate 1545, floating gate 1543, qdot 1547, and an interface to classic circuitry.

Figure 17B:
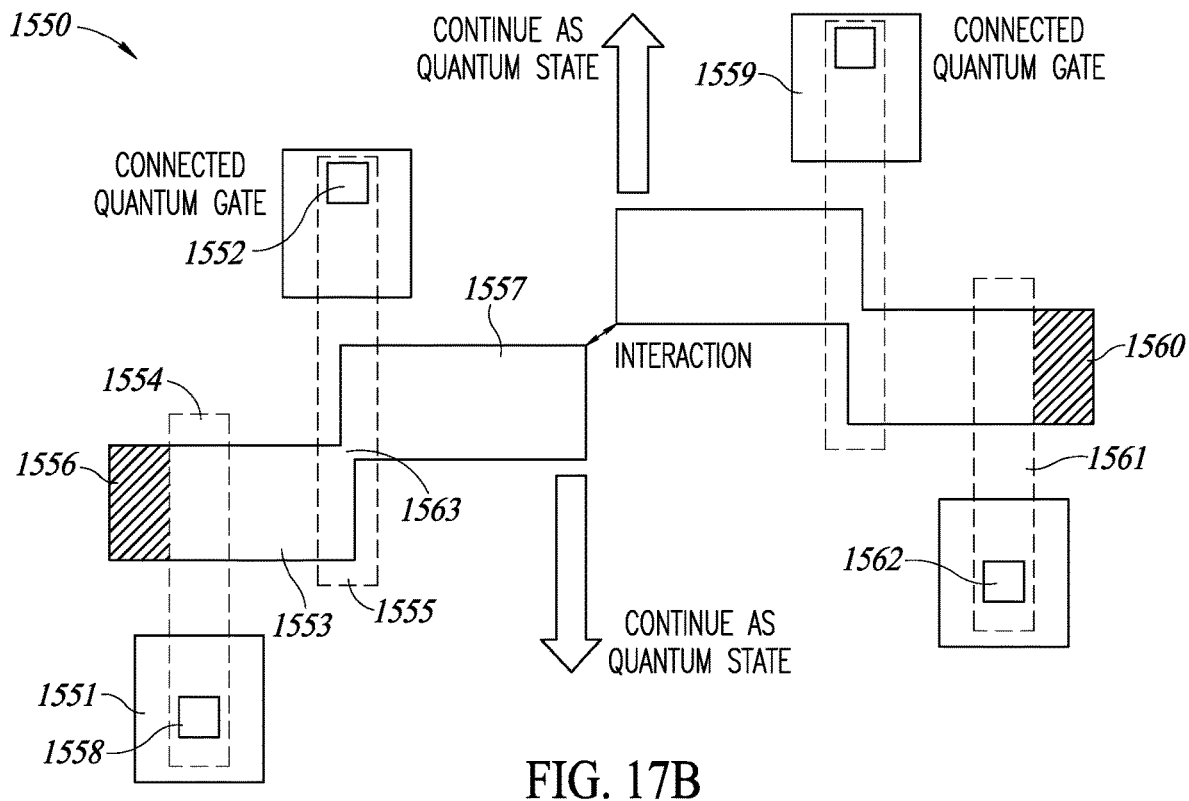
FIG. 17B is a diagram illustrating a CNOT quantum interaction gate with tunneling through a local depleted well using voltage driven gate imposing and gating to classic circuits.

A diagram illustrating a CNOT quantum interaction gate with tunneling through a local depleted well using voltage driven gate imposing and gating to classic circuits is shown in FIG. 17B. The CNOT quantum interaction gate, generally referenced 1550, comprises two qubits each having a continuous well divided into two qdots 1553, 1557, depletion region 1563, two gates 1554, 1555, contacts 1552, 1558, 1562, and interface device 1556, 1560 to classic circuitry. The CNOT semiconductor quantum interaction gate uses direct voltage potential imposing. It has tunneling through a local depleted well using voltage driven gate imposing. It also features gating to classic electronic circuits.

Figure 17C:
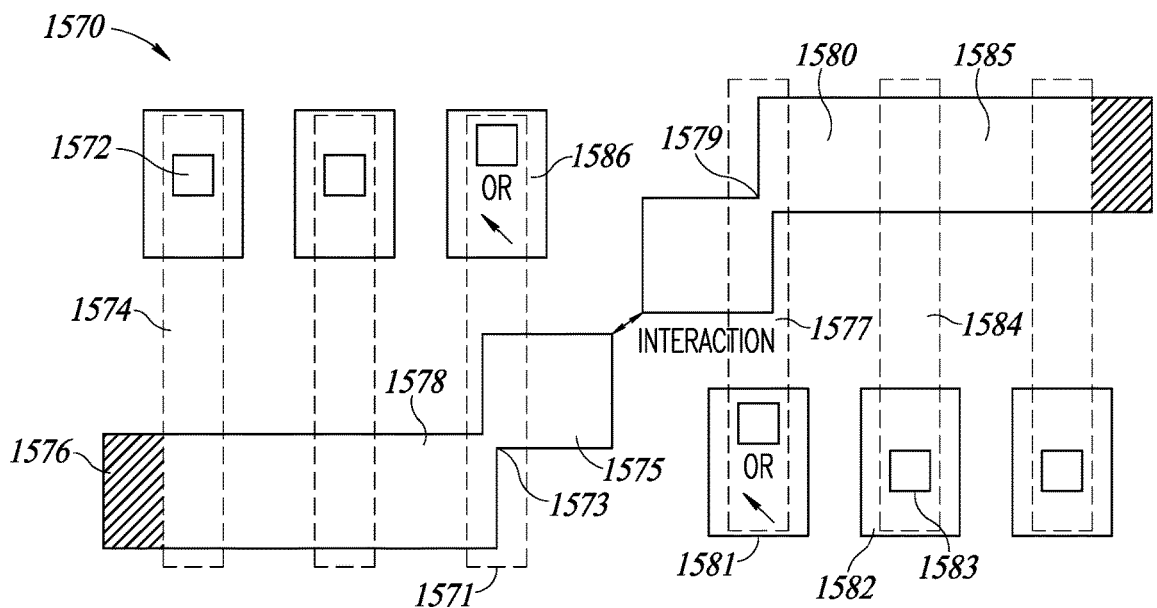
FIG. 17C is a diagram illustrating a CNOT quantum interaction gate with tunneling through a local depleted well using voltage driven gate imposing and multiple gating to classic circuits.

A diagram illustrating a CNOT semiconductor quantum interaction gate with tunneling through a local depleted well using voltage driven gate imposing and multiple gating to classic circuits is shown in FIG. 17C. The CNOT quantum interaction gate, generally referenced 1570, comprises two qubits with tunneling through a local depleted well using voltage driven gate imposing, having multiple gates towards the classic electronic circuits. Each qubit comprises continuous well 1578 divided into three qdots, a plurality of imposer control gates 1574 with contacts 1572, depletion region 1573, and interface 1576 to classic circuitry. The qubits are located in close proximity to permit interaction between particles. It has more Qdots separated by imposer gates that overlap the linear section of the well.

Figure 17D:
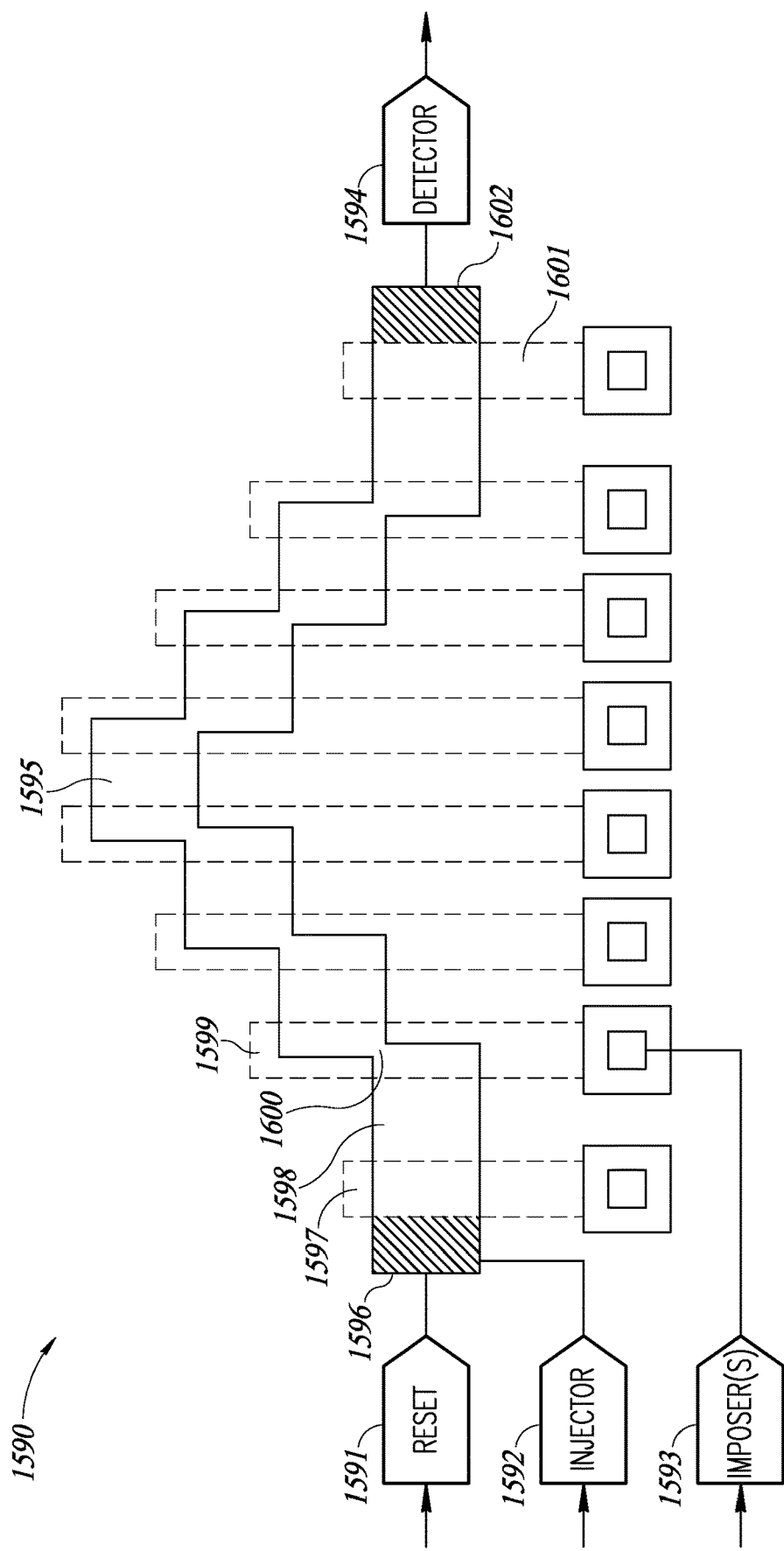
FIG. 17D is a diagram illustrating an example quantum interaction gate with continuous well incorporating reset, inject, impose, and detect circuitry.

A diagram illustrating an example quantum interaction gate with continuous well incorporating reset, inject, impose, and detect circuitry is shown in FIG. 17D. The quantum interaction gate, generally referenced 1590, comprises a continuous well 1598 with a plurality of control gates 1599, 1601, depletion regions 1600, interfaces 1596, 1602 to classic circuitry, reset circuit 1591, injector circuit 1592, imposer(s) circuits 1593, and detector circuit 1594. In this case, the imposers that isolate the adjacent qdots overlap the folded side of the continuous well.

Figure 18A:
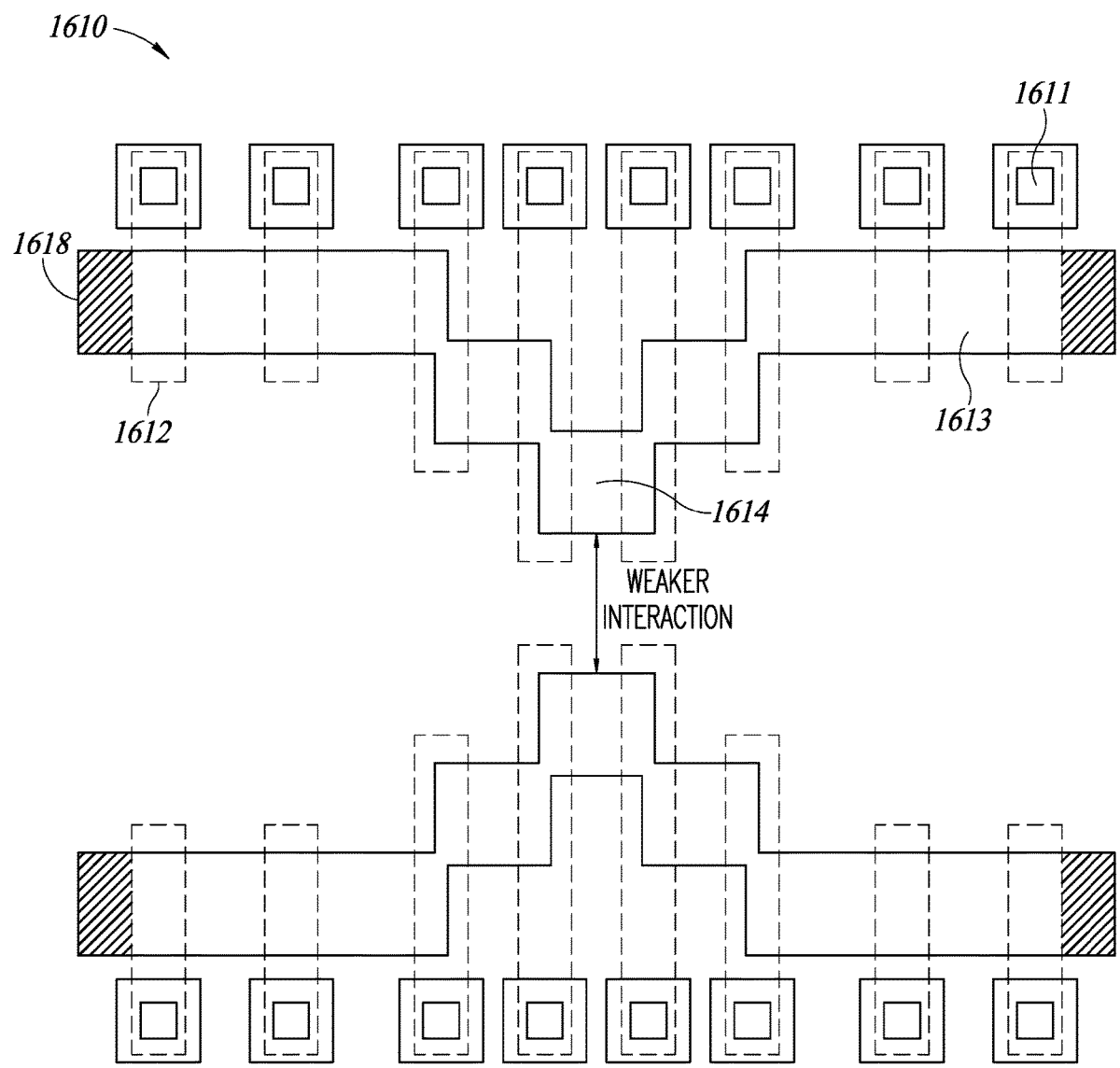
FIG. 18A is a diagram illustrating an example double V CNOT quantum interaction gate using separate control gates that mandates larger spacing resulting in a weaker interaction.

A diagram illustrating an example double V CNOT quantum interaction gate using separate control gates that mandates larger spacing resulting in a weaker interaction is shown in FIG. 18A. In this structure, no common gates are used thus the distance between the two wells that host the two particles that will interact are forced to be at a larger distance from each other. The quantum interaction gate, generally referenced 1610, comprises two qubits arranged in a double V configuration. Each qubit comprising a continuous well 1613 divided into a plurality of qdots by control gates 1612 having contacts 1611, interface 1618 to classic circuitry, and interaction qdot 1614. The two qubits use tunneling through local depleted well and separate control gates that result in larger spacing and further away placement resulting in a weaker interaction.

Figure 18B:
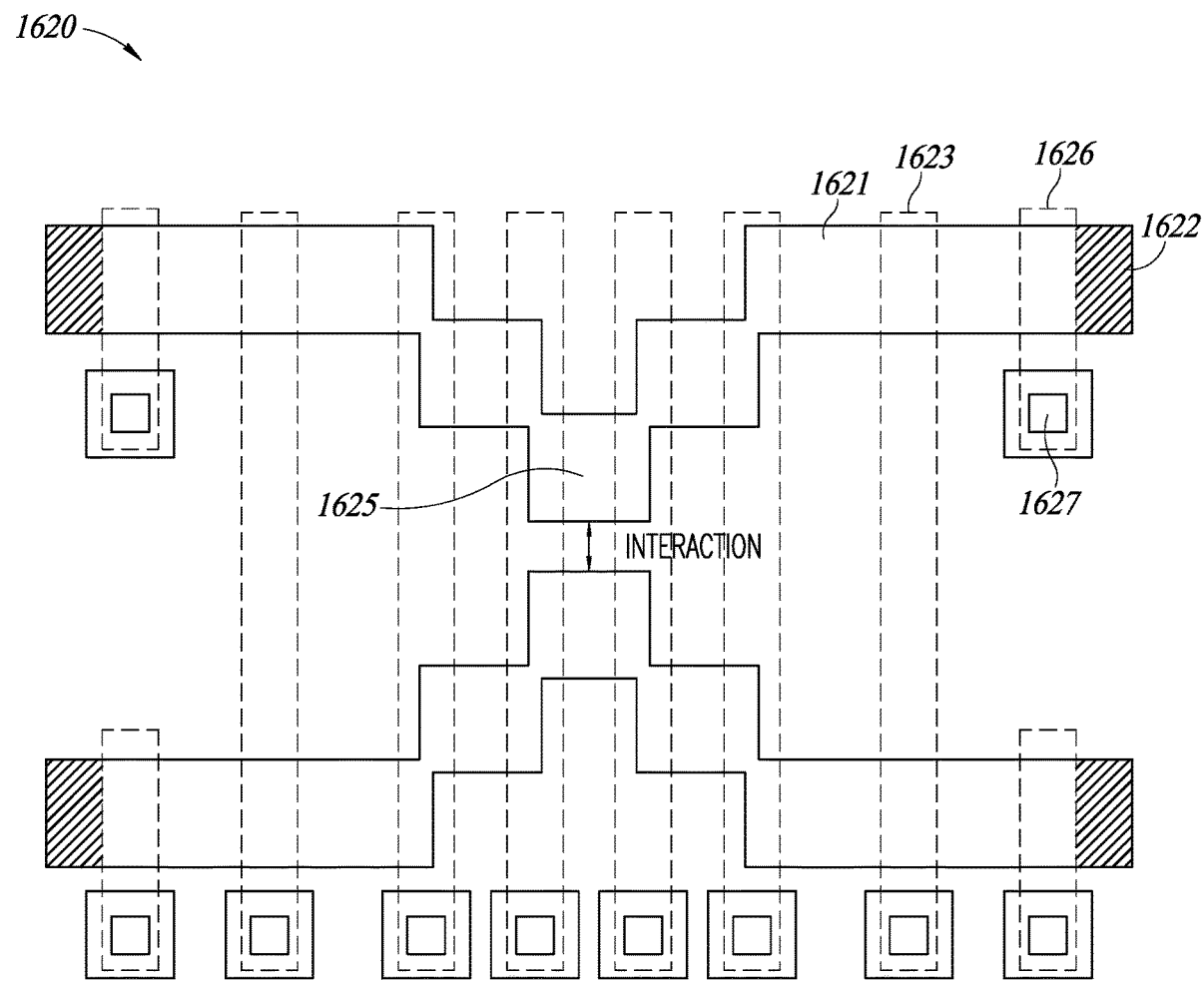
FIG. 18B is a diagram illustrating an example double V CNOT quantum interaction gate using common control gates for sections in closer proximity to permit smaller spacing and stronger interaction.

A diagram illustrating an example double V CNOT quantum interaction gate using common control gates for sections in closer proximity to permit smaller spacing and stronger interaction is shown in FIG. 18B. The quantum interaction gate, generally referenced 1620, comprises two qubits arranged in a double V configuration. Each qubit comprising a continuous well 1621 divided into a plurality of qdots by common control gates 1623 having contacts 1624 and separate control gates 1626 having contacts 1627, interface 1622 to classic circuitry, and interaction qdot 1625. The two qubits use tunneling through local depleted well and shared control gates that result in closer placement and thus stronger interaction.

Figure 18C:
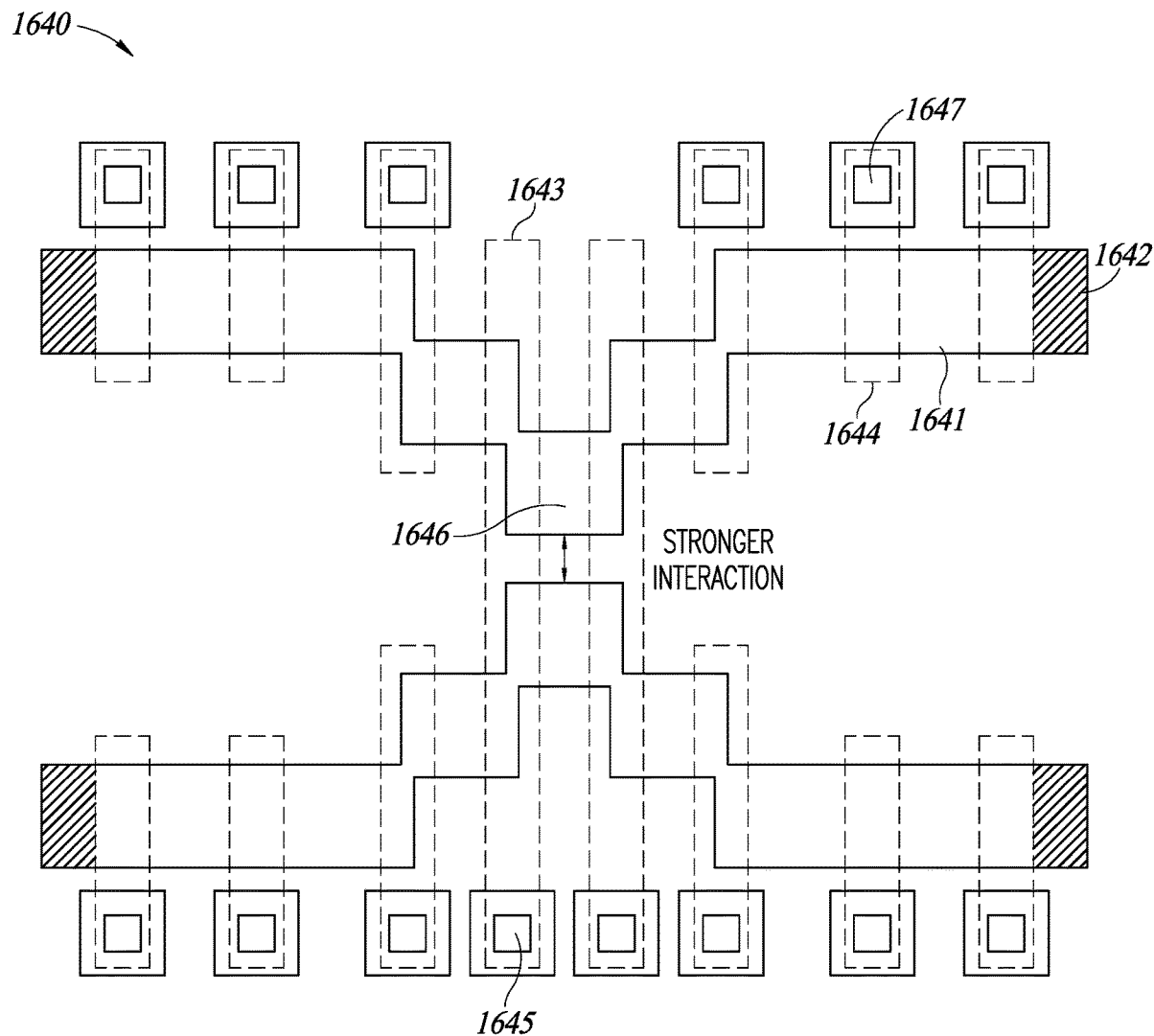
FIG. 18C is a diagram illustrating an example double V CNOT quantum interaction gate using common control gates for two control gates on both sides of the interacting qdots.

The entanglement of the particles depends strongly on the distance the two or more particles are brought together. The closer the particles are, the higher the level of interaction between them. A diagram illustrating an example double V CNOT quantum interaction gate using common control gates for two control gates on both sides of the interacting qdots is shown in FIG. 18C. The double-V CNOT uses common control gates for the sections that are in closer proximity in order to allow a smaller spacing and thus a stronger interaction. To be able to bring the two wells at the minimum distance allowed by the process, all gates adjacent to the wells that are at the minimum distance are shared. This is because the gate-to-gate spacing is increasing the well-to-well minimum separation. The gates that are further away can be separate.

The larger the number of common gates between the two or more wells, the more constraints exist in the operation of the quantum gate (i.e. the particles are not moving independently but their move is correlated due to the common gate control). The quantum interaction gate, generally referenced 1640, comprises two qubits arranged in a double V configuration. Each qubit comprising a continuous well 1641 divided into a plurality of qdots by common control gates 1643 having contacts 1645 and separate control gates 1644 having contacts 1647, interface 1642 to classic circuitry, and interaction qdot 1646. This structure uses common control gates only for the two control gates on both sides of the qdots that are interacting. These two gates are the most important since they set the minimum spacing between the wells. The two qubits use tunneling through local depleted wells and common control gates that result in the closest placement for strong interaction. This restricts the operation somewhat, but allows for a much stronger interaction, due to the closer position of the interaction qdots.

Figure 18D:
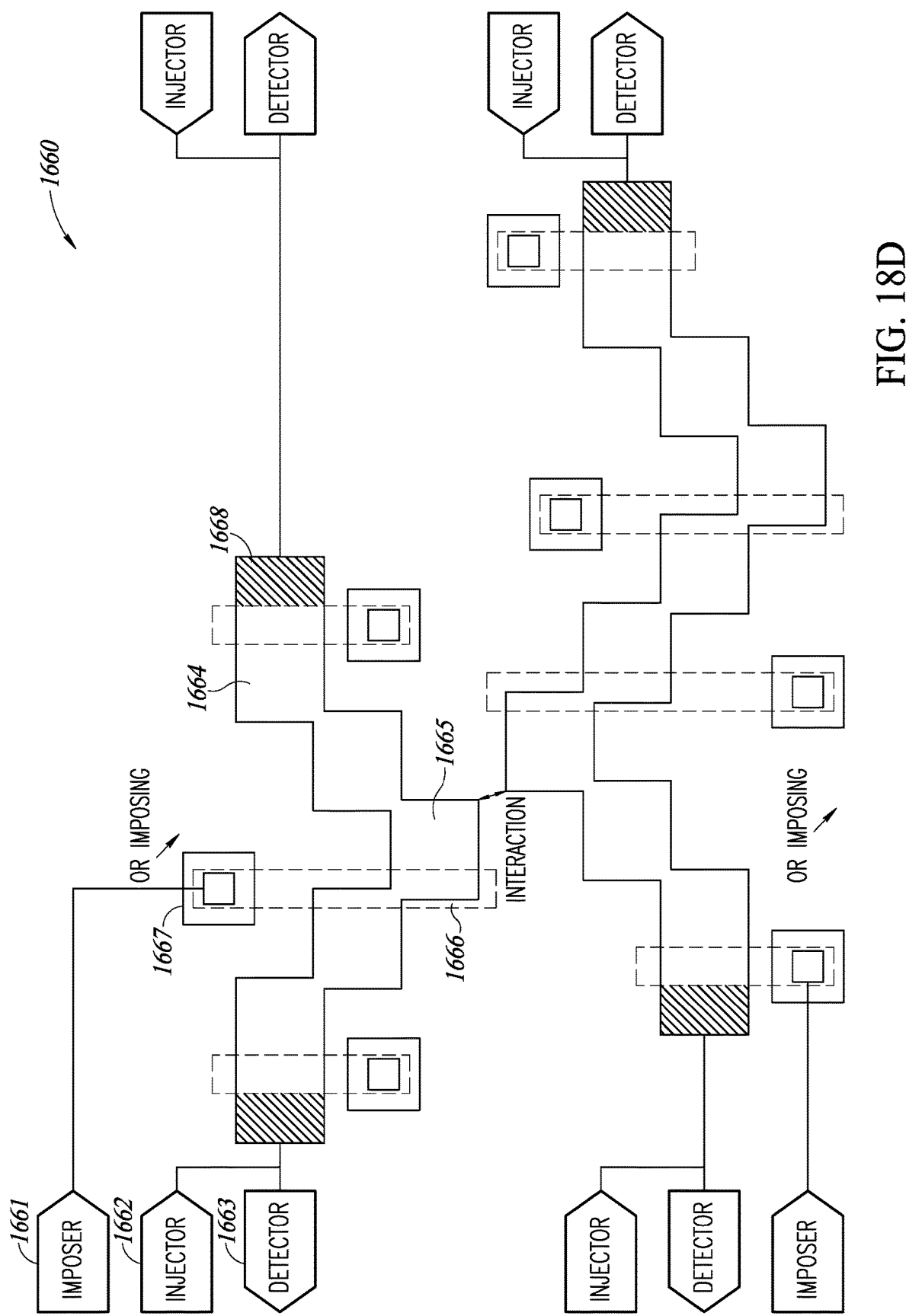
FIG. 18D is a diagram illustrating an example double V CNOT quantum interaction gate incorporating inject, impose, and detect circuitry.

A diagram illustrating an example double V CNOT quantum interaction gate incorporating inject, impose, and detect circuitry is shown in FIG. 18D. The quantum interaction gate, generally referenced 1660, comprises two qubits arranged in a double V configuration. Each qubit comprising a continuous well 1664 divided into a plurality of qdots by separate control gates 1666 having contacts, interface 1668 to classic circuitry, imposer circuit 1661, injector circuit 1662, detector circuit 1663, and interaction qdot 1665. The two qubits are skewed and use tunneling through local depleted well and separate control gates that result in moderate interaction.

Figure 19A:
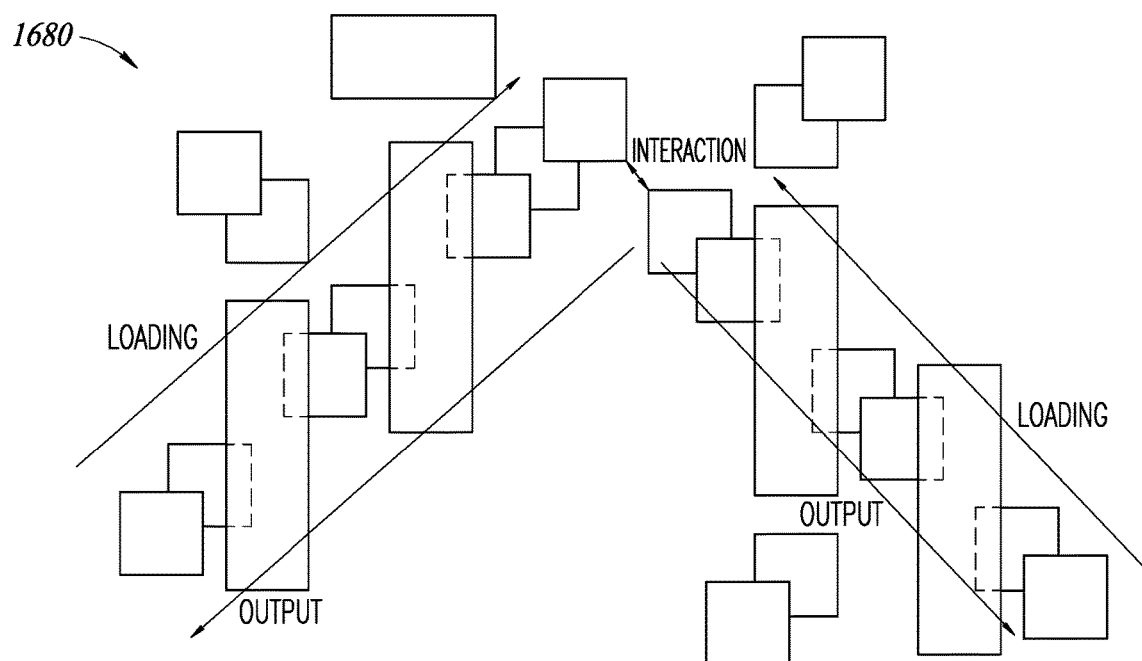
FIG. 19A is a diagram illustrating a first example z shift register quantum interaction gate using planar process with partial overlap of semiconductor well and control gate.

A diagram illustrating a first example z quantum shift register quantum interaction gate using planar semiconductor process with partial overlap of semiconductor well and control gate is shown in FIG. 19A. The quantum interaction gate, generally referenced 1680, has a double V shape, comprises a zig zag quantum shift register, and uses half gate length side overlap with hangover.

Figure 19B:
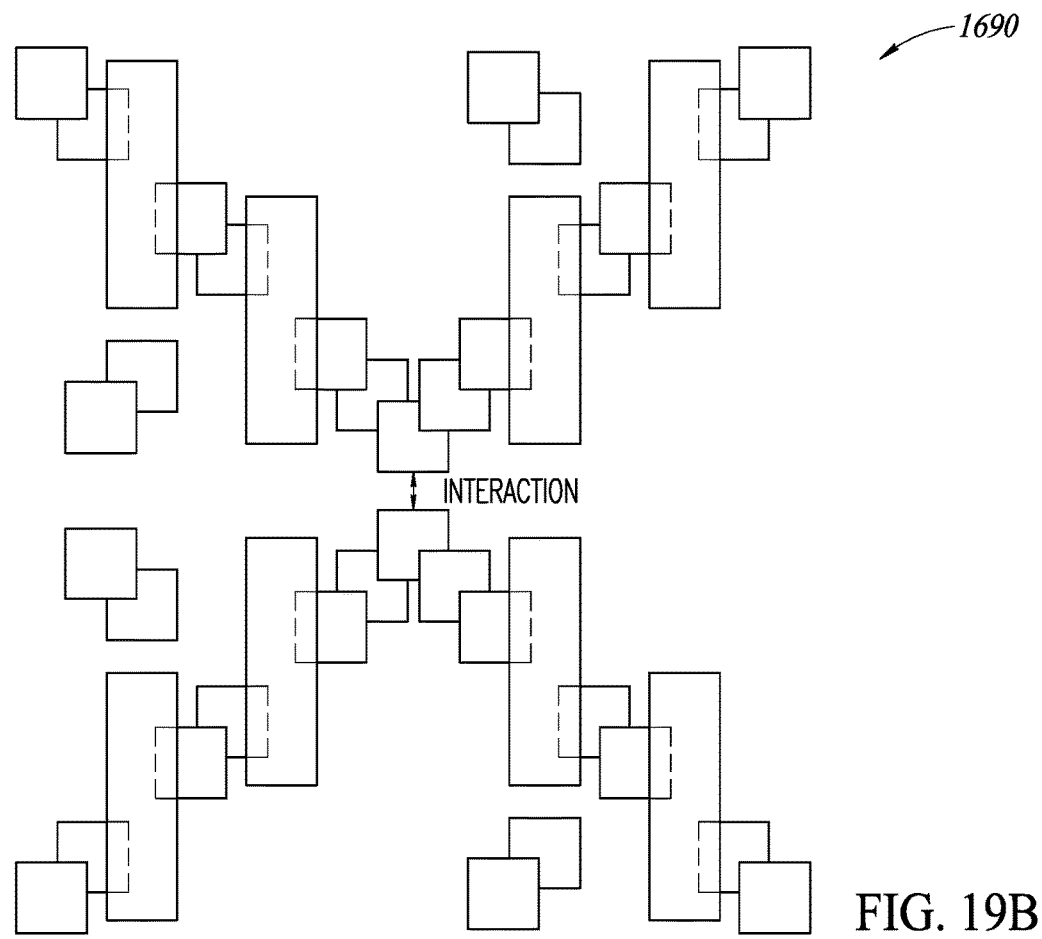
FIG. 19B is a diagram illustrating a second example z shift register quantum interaction gate using planar process with partial overlap of semiconductor well and control gate.

Double-V and multi-V quantum interaction structures can be also implemented with qubits and qdots with tunneling through an oxide layer. A diagram illustrating a second example z quantum shift register quantum interaction gate using planar process with partial overlap of semiconductor well and control gate is shown in FIG. 19B. The quantum interaction gate, generally referenced 1690, comprises a zig zag quantum shift register and uses half gate length side overlap with hangover.

Figure 19C:
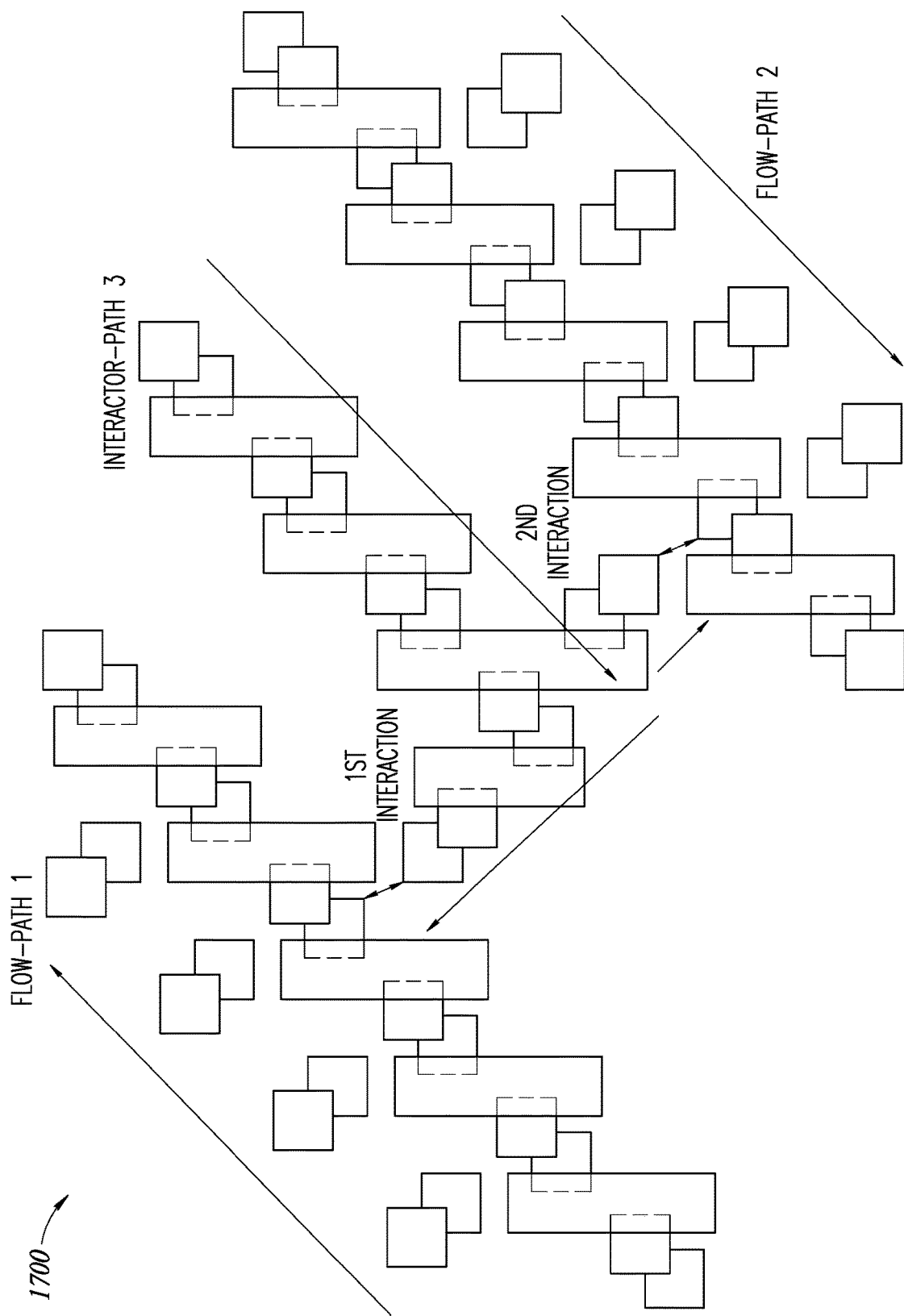
FIG. 19C is a diagram illustrating an example of H-style quantum interaction gate implemented with planar semiconductor qdots using tunneling through oxide layer with partial overlap of semiconductor well and control gate.

A diagram illustrating an example of H-style quantum interaction gate implemented with planar semiconductor qdots using tunneling through oxide layer (the H-structure is rotated at an angle) with partial overlap of semiconductor well and control gate is shown in FIG. 19C. The quantum interaction gate uses tunneling through oxide layer. The multi-V quantum interaction gate, generally referenced 1700, comprises a zig zag quantum shift register, multiple flow paths, an interactor path, multiple interactions, and uses half gate length side overlap with hangover. The quantum computation path in this case has more complex shapes, not just linear.

Figure 19D:
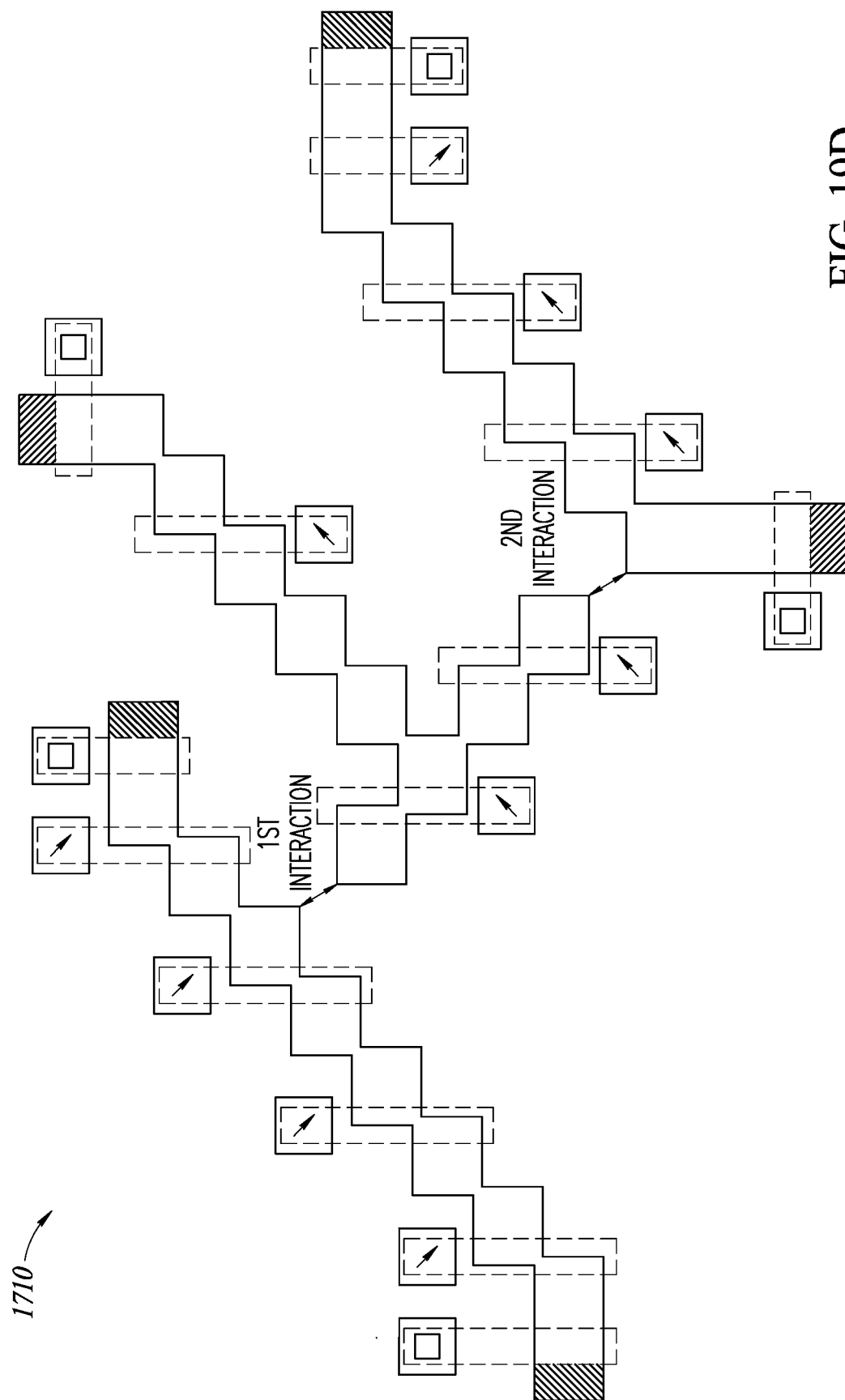
FIG. 19D is a diagram illustrating an example of H-style quantum interaction gate implemented with planar semiconductor qdots using tunneling through local depleted region in continuous wells.

Other types of tunneling can be used to build semiconductor quantum interaction gates. A diagram illustrating an example of H-style quantum interaction gate (the H-structure is rotated at an angle and gates with multiple orientations) implemented with planar semiconductor qdots using tunneling through local depleted region in continuous wells is shown in FIG. 19D. The quantum interaction gate, generally referenced 1710, comprises two main quantum paths that are approximately linear in shape (at a certain angle) and one interactor path with a T-shape, which has an interaction qdot with each of the two main paths.

Figure 20A:
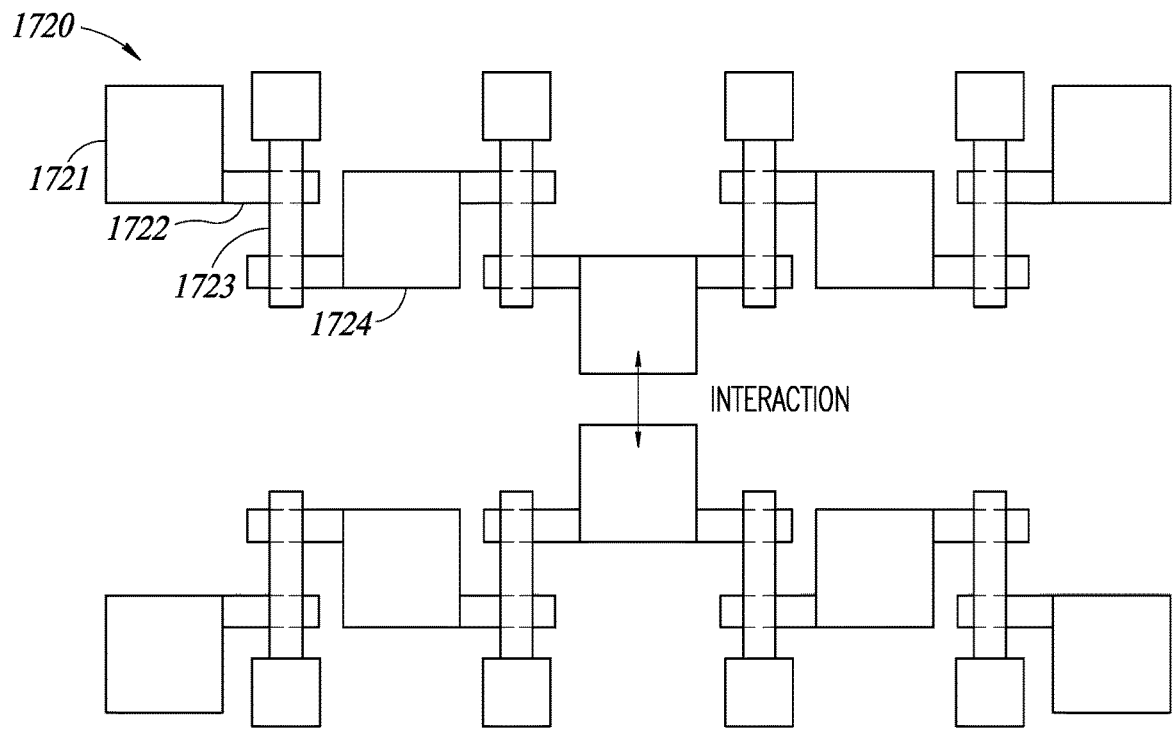
FIG. 20A is a diagram illustrating a first example CNOT quantum interaction gate using 3D FIN-FET semiconductor process with tunneling through separate layer and interaction from enlarged well islands allowing smaller spacing and stronger interaction.

Controlled-NOT and higher order quantum gates realized in planar semiconductor processes have been disclosed supra. Similar quantum structures can be realized in three-dimensional semiconductor processes. A diagram illustrating a first example CNOT quantum interaction gate using 3D FIN-FET semiconductor process with tunneling through separate layer and interaction from enlarged well islands allowing smaller spacing and stronger interaction is shown in FIG. 20A. The quantum interaction gate, generally referenced 1720, comprises two qubits each including a plurality of qdots 1721, 1724, control gates 1723 and 3D FIN FET structures 1722. A complete overlap between gate and fin-well was used.

Figure 20B:
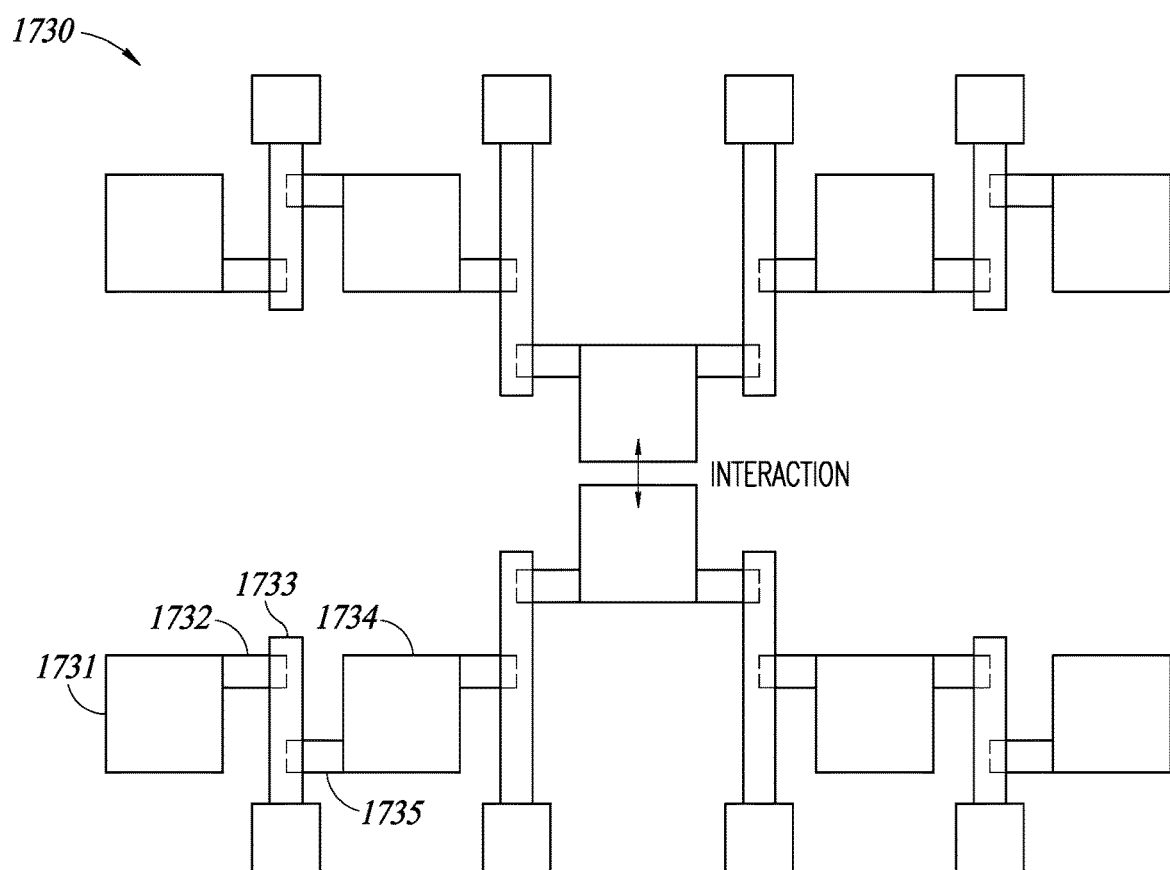
FIG. 20B is a diagram illustrating a second example CNOT quantum interaction gate using 3D FIN-FET semiconductor process with tunneling through separate layer and interaction from enlarged well islands allowing smaller spacing and stronger interaction.

By reducing the overlap between gate and fin-well the overall capacitance of the structure is reduced, increasing the Coulomb blockade voltage. A diagram illustrating a second example CNOT quantum interaction gate using 3D FIN-FET semiconductor process with tunneling through separate oxide layer, partial overlap between gate and fin-well, and interaction from enlarged well islands allowing smaller spacing and stronger interaction is shown in FIG. 20B. The quantum interaction gate, generally referenced 1730, comprises two qubits each including a plurality of qdots 1731, 1734, control gates 1733 and 3D FIN FET structures 1732. The interaction is realized between enlarged well islands allowing a smaller spacing and thus a stronger interaction.

Figure 20C:
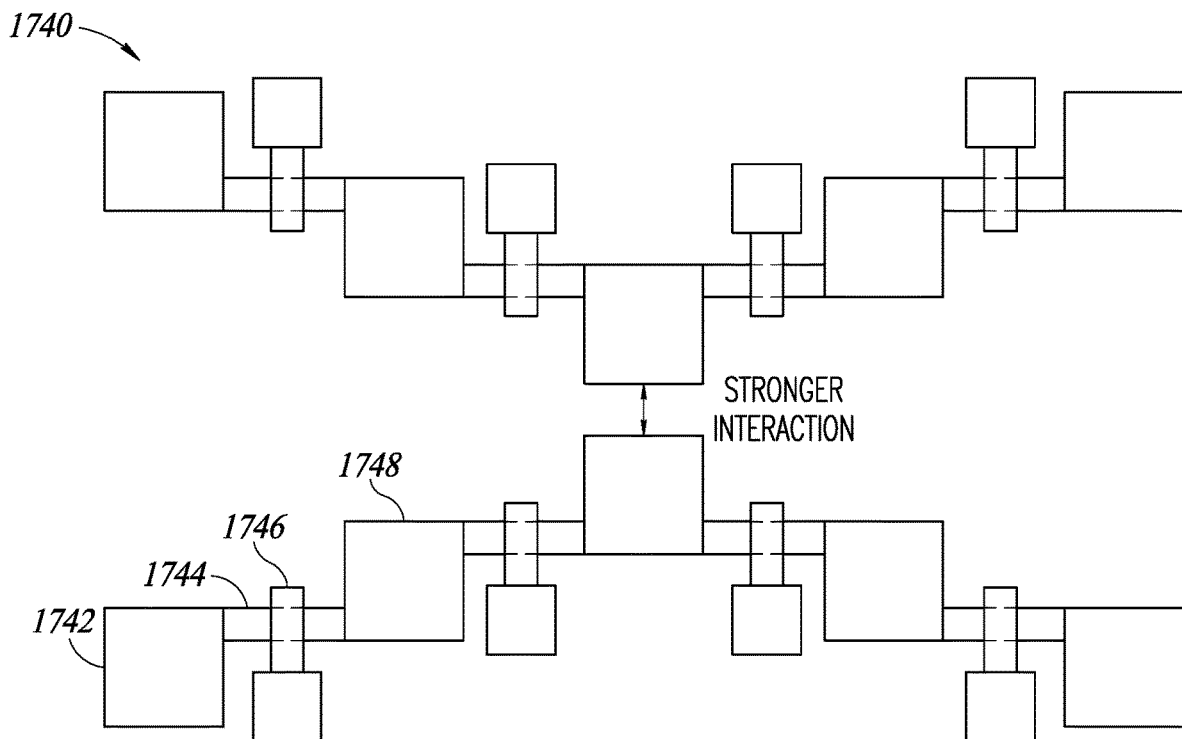
FIG. 20C is a diagram illustrating a third example CNOT quantum interaction gate using 3D FIN-FET semiconductor process with interaction from enlarged well islands allowing smaller spacing and stronger interaction.

Semiconductor quantum interaction gates can be realized in 3D processes using tunneling through fin local depletion regions induced in semiconductor fins. A diagram illustrating a third example CNOT quantum interaction gate using 3D FIN-FET semiconductor process with interaction from enlarged well islands allowing smaller spacing and stronger interaction is shown in FIG. 20C. The quantum interaction gate, generally referenced 1740, comprises two qubits each including a plurality of qdots 1742, 1748, control gates 1746 and 3D FIN FET structures 1744. Note that for CNOT function two semiconductor chains are implemented. For higher order gates more than two semiconductor chains can be used.

Figure 20D:
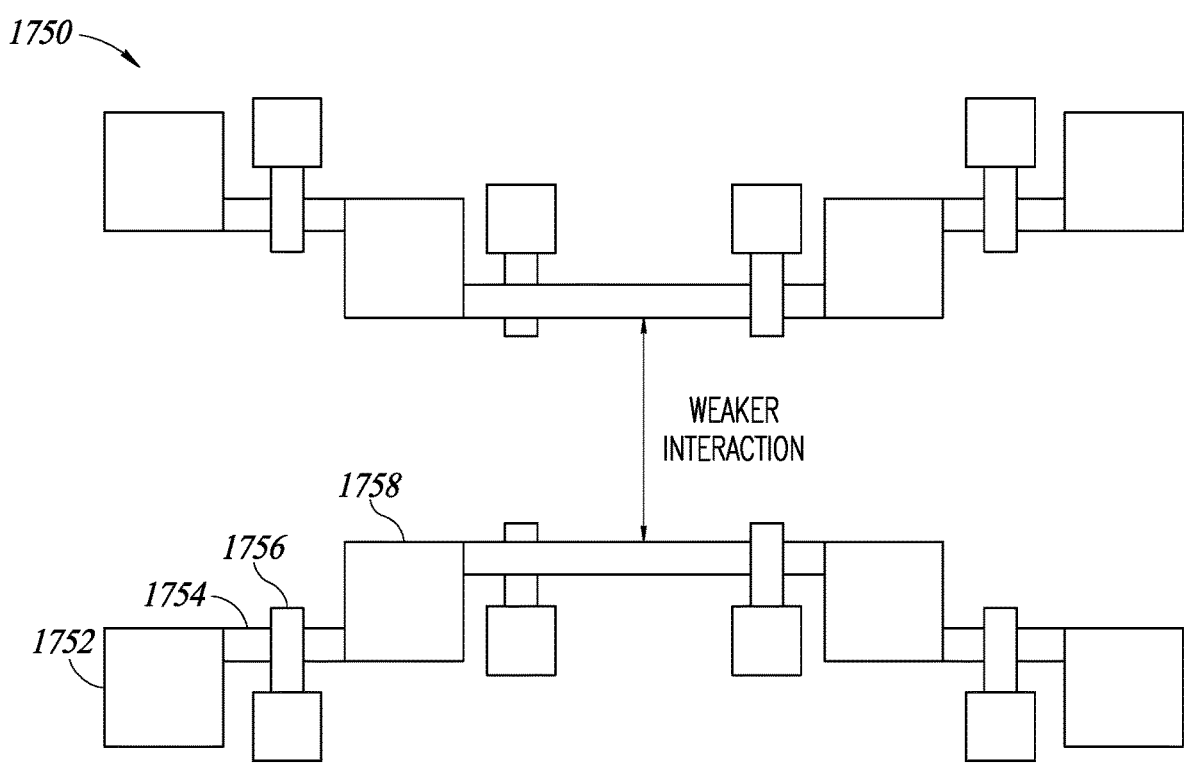
FIG. 20D is a diagram illustrating a fourth example CNOT quantum interaction gate using 3D FIN-FET semiconductor process with fin to fin interaction mandating larger spacing and weaker interaction.

Interaction between wells can result in tighter spacing and thus stronger interaction between quantum particles. Interaction, however, can be achieved between particles located in semiconductor fins. A diagram illustrating a fourth example CNOT quantum interaction gate using 3D FIN-FET semiconductor process with fin to fin interaction mandating larger spacing resulting in weaker interaction is shown in FIG. 20D. The quantum interaction gate, generally referenced 1750, comprises two qubits each including a plurality of qdots 1752, 1758, control gates 1756 and 3D FIN FET structures 1754.

Quantum Annealing Interaction Gate

A quantum gate is a circuit/structure operating on a relatively small number of qubits: one, two, three, four and rarely more. A gate operating on two or more qubits or qudits is referred to as an interaction gate. The type of quantum gate is given both by the physical/geometrical structure of the gate and by the corresponding control signal. A given geometrical structure may perform different quantum gate functions depending on the control signals that are applied, i.e. their shape, amplitude, duration, position, etc. One such example is the double-V quantum interaction gate which can implement a controlled-NOT, a controlled-Rotation (controlled-Pauli), controlled-Swap and even quantum annealing functions. The same applies to the H-shape quantum interaction gate, the X-shape quantum interaction gate, L-shape quantum interaction gate, I-shape quantum interaction gate, etc.

Quantum annealing is an operation of finding the minima of a given function over a given set of candidate solutions using a quantum fluctuation method. The system is started from a superposition of all possible states with equal weighting and it evolves following the time dependent Schrodinger equation. If the rate of change is slow, the system stays close to its ground state of the instantaneous Hamiltonian (total energy of the ensemble) resulting in Adiabatic Quantum Computing (AQC). The AQC is based on the well-known adiabatic theorem to perform computations. A simple Hamiltonian can be initialized and a slow change of the system towards a more complex Hamiltonian is performed. If the change is slow, the system starts from the ground state of the simple Hamiltonian and evolves to the ground state of the complex Hamiltonian, representing the solution that is pursued.

The time needed for an adiabatic change is dependent on the gap in energy between the Eigenvalues of the Hamiltonian and thus depends on the Rabi oscillation period. The change needs to be slow (longer) when compared with the period of the Rabi oscillation. Because the system is maintained all the time close to the ground state in the quantum annealing process, it is less susceptible to interaction with the outside world. This is one of the advantages of quantum annealing. A necessary condition is that the energy coming from the outside world is lower than the energy gap between the ground states and the next higher energy excited states.

Figure 21:
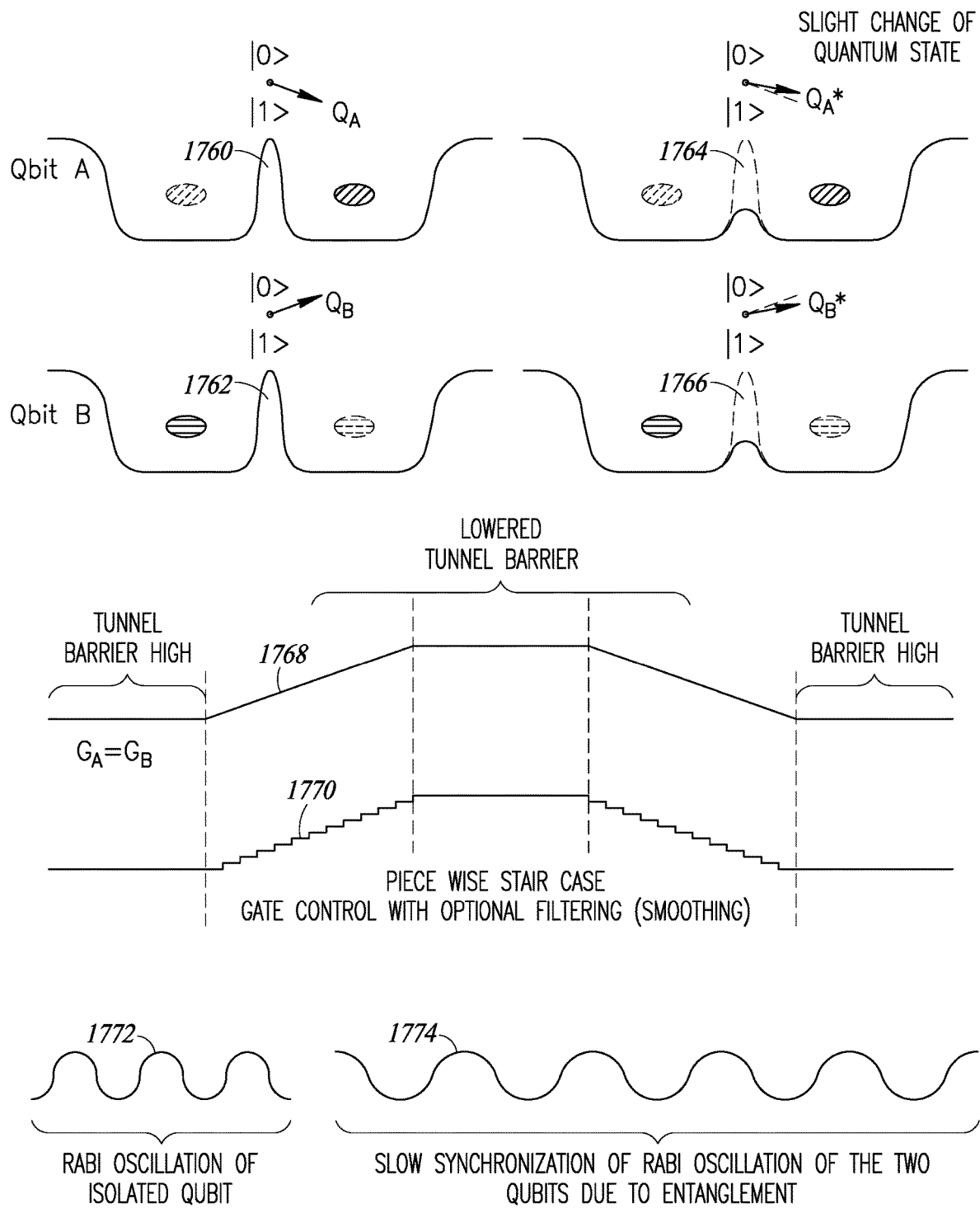
FIG. 21 is a diagram illustrating example operation of a quantum annealing interaction gate structure.

A diagram illustrating quantum annealing applied to a double-qubit semiconductor quantum interaction structure using charged carriers (electrons or holes) is shown in FIG. 21. In the general case, quantum annealing can be applied to an arbitrarily large number of qubits. For simplicity we show the two-qubit case, but a higher number of qubits is also possible. In its simplest form the double-qubit annealing can be realized in a structure having four quantum dots. A similar process, however, can be realized in structures having six or higher number of qdots. We assume that the quantum structure was prepared with two different and independent qubits: $Q_A$ and $Q_B$. To avoid interaction between $Q_A$ and $Q_B$ they can be prepared at some larger distance from the interaction location and then be quantum shifted in position inside the quantum interaction structure. Assume that initially the tunnel barriers 1760, 1762 are high and there is no Rabi oscillation established. Each of the two qubits has its own corresponding Rabi oscillation from the moment the tunnel barrier at their initialization was lowered until the Rabi oscillation was stopped.

To achieve quantum annealing the corresponding control signals are varied very slowly in order not to perturb the system with the shape of the control signal. In contrast with the controlled-NOT or controlled-Rotation gates when fast control pulse are applied, in the case of quantum annealing the control gates $Q_A$ and $Q_B$ of the two qubits are very slowly changed when compared with the period of the corresponding Rabi oscillations as shown in the center of FIG. 21. Assuming that $Q_A$ and $Q_B$ had a given split initially as shown in the top left side of FIG. 21, by slowly raising the gate control 1770 the tunnel barrier 1768 is slowly lowered and will allow the interaction between the two qubits (1764, 1766). If we look at the vector representation of the quantum state in the Bloch sphere of the |0> and |1> base states, the result of the quantum annealing is to slightly change the position of the corresponding vectors from $Q_A$ and $Q_B$ to $Q_A^*$ and $Q_B^*$. When the tunnel barrier is lowered in both qubits, Rabi oscillations will be enabled in both double qdot structures. While the Rabi oscillations 1772 of the two qubits are initially non-synchronized if the two qubits are not entangled, during the slow annealing process the Rabi oscillations 1774 of the two qubits will become synchronized.

When the qubits are independent the system can be factorized, while after the entanglement of the qubits the system can no longer be factorized. It will be described by a global Hamiltonian that grows in dimensions when compared with the Hamiltonian of the independent qubits. Once entangled, the information is present simultaneously in both qubits. This is represented with the fact that after the entanglement the vectors of the two qubits have both been slightly shifted to take into account the interaction of the other qubit. Once entangled, if one qubit is measured and its state is collapsed, the other qubit will also be collapsed, or at least the component corresponding to the entanglement.

An advantage of the quantum annealing is that it can perform the search in parallel over a large space of solutions. In a system with a large number of qubits at initialization a superposition of all possible solutions is loaded and through the quantum annealing process the system will evolve to the single solution that corresponds to the lowest minima. This is very useful in problems where there are multiple local minima, but the absolute lowest minima is the goal of the search.

The control signal for a quantum annealing process in a semiconductor quantum interaction gate can be generated by a classical electronic circuit. It can be an analog or a mixed-signal control signal generation. A digitally controlled system can be implemented in which the amplitude of time position of the control signals is prescribed with corresponding Digital-to-Analog Converters (DAC). A staircase signal shape can be generated by the DACs. The signal can be smoothed using optional filtering circuitry.

Controlled Quantum-Swap Interaction Gate

There exist a large number of different quantum operation gates. When implementing a quantum computer it is preferable to have a universal set of quantum gates implemented since many quantum algorithms can be implemented using a specific number and interconnection of such universal gates. The SWAP gate corresponds to a classic Boolean logic operation. A controlled quantum gate is an interaction gate where the specified operation is performed only in the presence of a control signal or a control qubit. The SWAP gate is the circuit that permutes the incoming states. The quantum SWAP gate is the corresponding quantum gate that operates on quantum superposed states. The controlled SWAP gate is universal with respect to all the classic Boolean operations. A quantum computing machine using controlled SWAP quantum gates can implement any classic algorithm.

Figure 22:
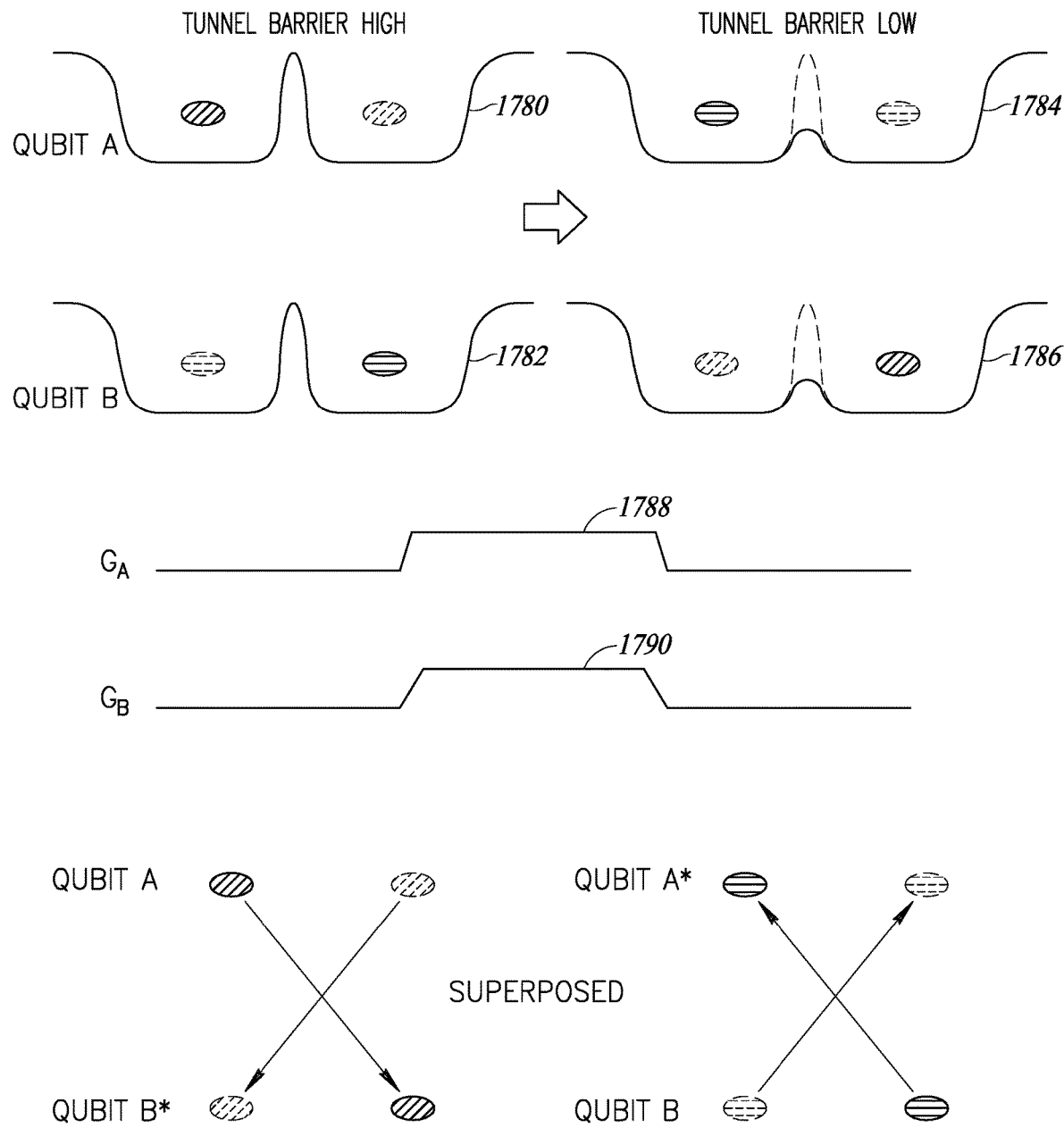
FIG. 22 is a diagram illustrating example operation of a controlled SWAP quantum interaction gate structure.

FIG. 22 illustrates the operation of the controlled SWAP quantum gate. The operation can be controlled by a control signal or by the presence of another control qubit. The controlled SWAP gates in the general case is a three qubit quantum gate.

If the control gate signals applied are sufficiently fast the quantum system will leave the ground state. This is in contrast with the quantum annealing adiabatic control (slow with respect to the corresponding Rabi oscillation frequencies). A controlled SWAP quantum gate differs from the controlled-NOT and controlled Rotation gates, since both gate control signals are exercised. As such both tunnel barriers of qubit A and qubit B are lowered, allowing the two qubits to interact. This gate results in large perturbations from the ground state and can result in large rotations of the quantum state corresponding vectors in the Bloch sphere.

It is assumed that qubit A and qubit B are initialized with two different quantum states (they can be both base states or split/superposed states, as shown in FIG. 22 with potential diagrams 1780, 1782). The initialization of qubit A and qubit B is preferably done at large distance between the qubits, such that the parasitic interaction between them at initialization is minimized. After initialization the qubits are quantum shifted into position inside the quantum interaction gate. Both $G_A$ and $G_B$ gate control signals 1788, 1790 are pulsed high at the same time (FIG. 22 center) allowing the two qubits to interact. The initial qubit A will tend to have the impact on qubit B in the direction of changing it to qubit B* that is a mirror version of qubit A. Similarly, the initial qubit B will tend to have the impact on qubit A in the direction of changing it to qubit A* that is a mirror of qubit B, as shown on the bottom of FIG. 22. Both these actions happen simultaneously resulting in a swap of the two quantum qubits. As a result, the outcome of qubit A* becomes the initial qubit B and the outcome of qubit B* becomes the initial qubit A. The amplitude of the control signals $G_A$ and $G_B$ is preferably commensurate with the lowering of the tunneling barrier to allow the interaction and the change of the qubits, while the duration of the control pulses is preferably commensurate with the corresponding Rabi oscillations. Note that the lowering of the barrier enables tunneling within a qubit and not between qubits.

Note that the control SWAP quantum gate operation can be realized by a number of physical geometrical implementations of the quantum interaction semiconductor gate. This includes the double-V or multiple-V structure, the X, T, L, I-shape interaction structures and any combination thereof.

Controlled Pauli Quantum Rotation Interaction Gates

Pauli quantum gates are single qubit gates that perform rotation about the z, y, and x axis of the Bloch sphere. To aid in understanding their operation we consider the Bloch sphere representation of the quantum states using the unitary sphere. Any quantum state can be represented by a vector on the Bloch sphere. There are two angular coordinates in the Bloch sphere: (1) the θ angle representing the co-latitude versus the z-axis; and (2) the φ angle representing the longitude versus the x-axis. These angles (i.e. rotation) correspond to the superposition of the |0> and |1> base states in the given quantum state. Note that it is not possible to measure both the θ and φ angles simultaneously. The φ quantum phase cannot be independently measured, but it can be evidenced with a quantum interaction gate. This is because the result of a quantum interaction depends on both θ and φ angles that represent the quantum structure, not just the θ quantum superposition angle.

Figure 23:
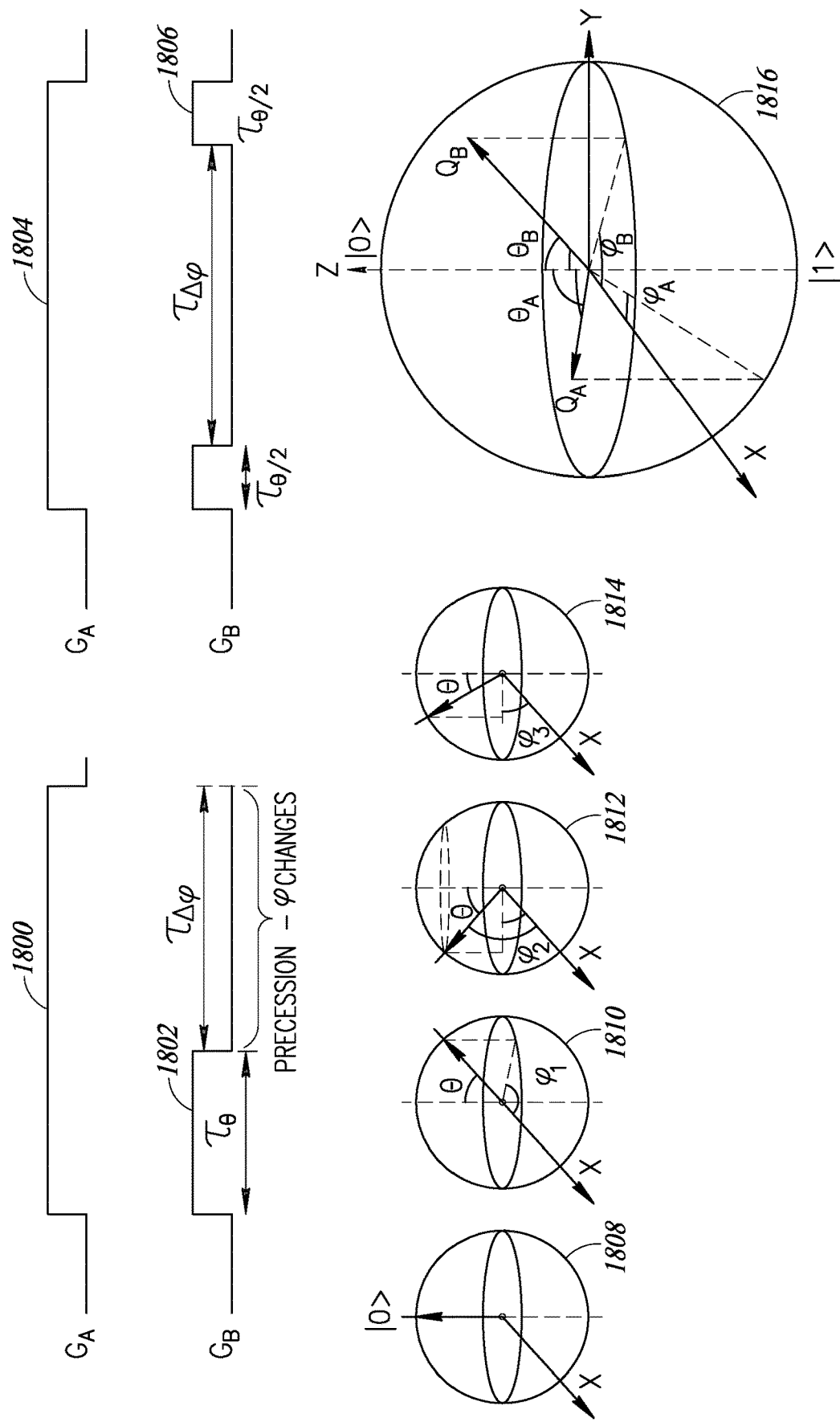
FIG. 23 is a diagram illustrating example operation of a controlled Pauli quantum interaction gate structure.

With reference to FIG. 23, the position of the vector on the Bloch sphere 1816, which represents the given quantum state of the system, is set by the parameters of the control gate signal. The duration of the control gate pulse that lowers the tunneling barrier determines the θ rotation since it sets the split superposition of the two base states |0> and |1>. The θ rotation with respect to the z-axis is what can be measured directly. In the case of a charge qubit this corresponds to the presence or absence of the carrier from the measurement qdot. The outcome of the measurement is binary, for example 0 denoting absence and 1 denoting presence. If a number of successive measurements are performed, however, the probability of the 0 and 1 measured states represent the splitting of the superposed quantum state.

From the Bloch sphere perspective, the measurement corresponds to the projection of the quantum state on the base state axis, e.g., the z-axis. During such measurement of a single qubit the information on the quantum angle φ is lost. While the absolute angle φ of a quantum state cannot be measured, the difference in φ angle between two quantum states can be measured. A two qubit case having $Q_A$ and $Q_B$ vectors is illustrated on the right side of FIG. 23. The $\varphi_A$ and $\varphi_B$ quantum angles cannot be measured by the difference between them since it will impact the outcome of the quantum interaction between the two qubits. As such, the outcome of a quantum interaction depends not only on the $\theta_A$ and $\theta_B$ superposition angles of the two qubits, but also on the difference between their quantum angles $\varphi_A$, $\varphi_B$. Therefore, we can indirectly measure the difference in the quantum angle φ with the outcome of a quantum interaction gate.

Consider a two-qubit quantum structure, for example the double-V, or H, X, T, L, I-shape quantum interaction structure, and the two gate control signals $G_A$ and $G_B$ 1800, 1802, 1804, 1806. Qubit A acts as a control qubit in the sense that the designated quantum operation occurs only when qubit A is |1>. Qubit B is the one that undergoes the rotation action. The θ angle (i.e. latitude) is set by the $\tau_\theta$ time (i.e. pulse width) when the quantum state is rotated about the z-axis. The $\tau_\varphi$ time that the vector performs a precession around the z-axis is the time period that determines the quantum angular rotation about the x-axis. Having a gate control $G_A$ that sets the time of z-rotation and the z-precession can generate an arbitrary rotation in the x, y, z coordinates. Note that the gate control signal $G_B$ may include multiple pulses. For example, the pulse can be split into two to create a θ rotation. Each pulse may, for example, result in a θ/2 rotation about the z-axis. The time interval between the two pulses is when the precession around the z-axis happens, without changing the θ angle that is directly observable in the quantum measurement. This time determines the φ angle value.

In a two qubit system as in the example provided herein, the $\Delta_\varphi$ angle can be measured because the difference in quantum angle φ impacts the result of the entangled state between qubit A and qubit B.

By applying the appropriate control signals to a double qubit structure a controlled-Pauli quantum gate can be implemented in which the Pauli rotation is enabled by the control qubit of the structure.

For example, if no rotation θ about the z-axis is desired, two pulses with the combined duration equal to the Rabi period is applied. In such case, the resulting vector has the same angle θ as it had at the beginning. Now, by changing the time distance between the two pulses that add up to the Rabi period a precession of the quantum state is enabled and the angle φ is changed. By changing the angle φ a rotation about both the x and y-axis is realized. Combining rotation about z-axis with rotation about the x-axis and the y-axis a generalized quantum rotation operation is generated by the proposed semiconductor quantum interaction gate. The difference between the number of controlled quantum rotation gates that can be implemented is given by the nature of the control signals. The controlled-NOT (CNOT) quantum gate is in fact the controlled-Z (cZ) Pauli gate. Any generalized controlled quantum rotation can be generated by the double qubit structure. Qubit A functions as the control qubit that enables the operation, while qubit B is the target qubit whose state undergoes the generalized rotation in the Bloch sphere.

Quantum Ancillary Interaction Gate

In classical computing any memory bit can be set to 0 and 1 at any time and used as such in computations. Furthermore, classic bits can be copied and they will be an exact copy of the initial bit. This is not possible in quantum computing. First, a qubit cannot be copied. Since the qubit is represented by both the θ and φ angular phase in the Bloch sphere and any measurement of a qubit results only in a projection of the qubit on the axis of the base states, the internal φ quantum phase cannot be accessed and thus cannot be copied. Second, a memory bit cannot be simply set or reset in a reversible quantum computing machine, since this results in losing the information that the qubit had before.

In a quantum computation algorithm or in its hardware implementation it is not possible to deterministically place a qubit in a given prescribed state unless the algorithm/machine has access to qubits whose value is unknown. Such qubits that have their value unknown a priori are called ancilla qubits. The Hadamard equal distribution quantum state is an example of an unknown state.

In quantum computing algorithms and corresponding hardware, machine implementation of quantum catalyst uses ancilla qubits to store entangled states that enable performing states which will not be possible with local operations and classic communication structures. A quantum ancillary gate stores such an entangled state from an initial target quantum state.

Figure 24:
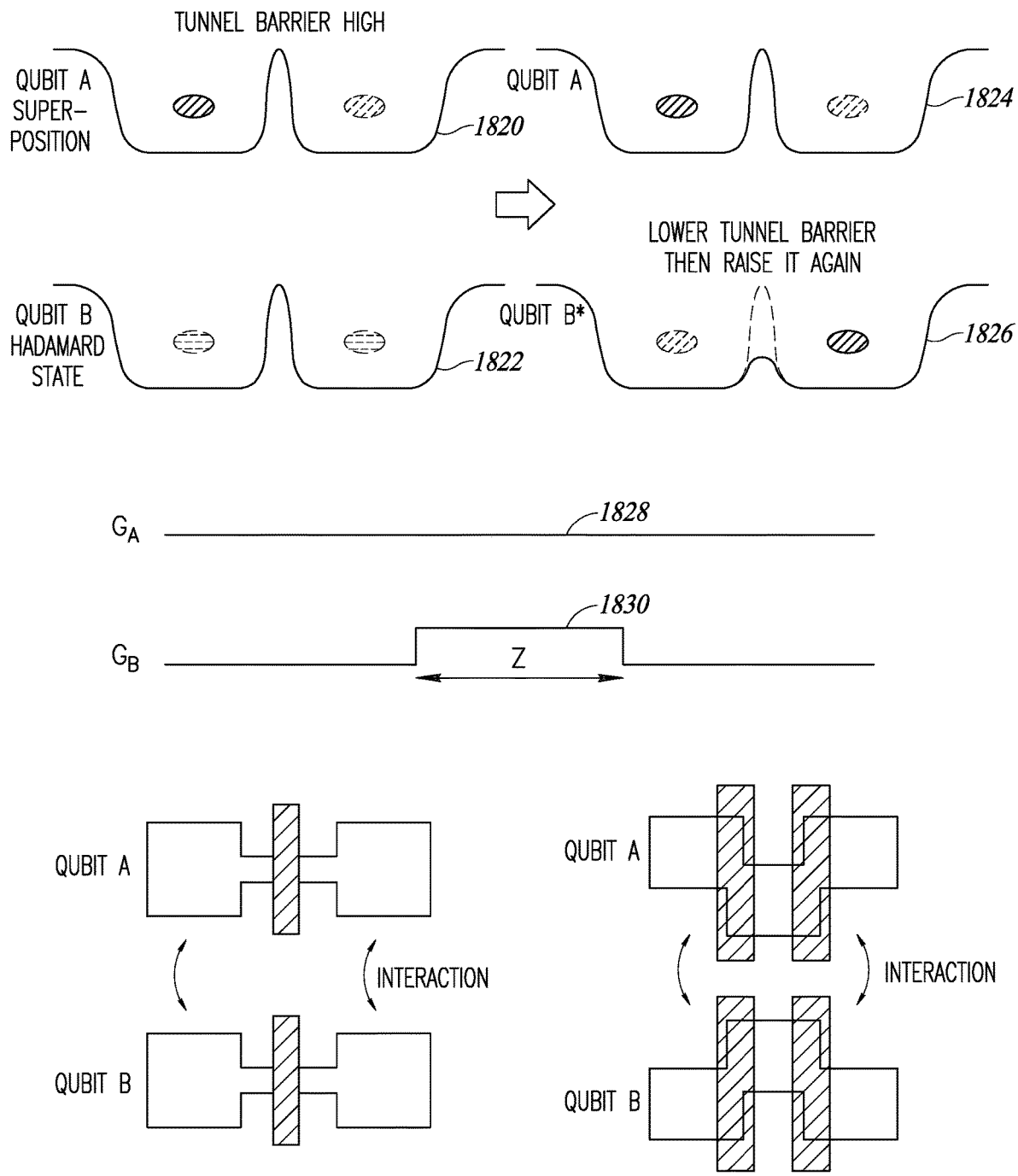
FIG. 24 is a diagram illustrating example operation of an ancillary quantum interaction gate structure.

FIG. 24 illustrates one embodiment in which a quantum ancillary interaction gate can be implementing using a semiconductor quantum interaction gate. The operation of the ancillary gate is to store an entangled state originated from an initial target qubit A. To do so a double qubit structure is used. The physical implementation of the quantum ancillary gate can be any of the embodiments of the semiconductor quantum interaction gate disclosed herein, including the double-V, the H-shape, the X-shape, the T or L-shape, the I-shape or any combinations thereof.

The operation of the quantum ancillary interaction gate starts with the preparation of a Hadamard equal distribution state in qubit B, which is the target qubit to store the entangled state. It is important to first prepare the Hadamard state since it needs to have no other qubit in close proximity with which it can parasitically interact. It will not be possible to load the qubit A first and then initialize the Hadamard state in qubit B, since qubit B will interact with qubit A.

Once the Hadamard state is initialized in qubit B, the interaction gate can proceed with the ancillary action. There are multiple ways to initialize a Hadamard state in qubit B. For example, a base state can be loaded first by injecting a single electron into one of the two qdots of qubit B. Next, a gate control pulse $G_B$ having a width equal to half the Rabi oscillation period is used which results in an equal split of the state with a 50-50% superposition of the |0> and |1> base states. At the end of the Hadamard preparation phase the tunnel barriers are all high, thereby preventing tunneling (see potential diagrams 1820, 1822).

Next, the quantum state of qubit A is moved into the ancillary gate. Because qubit B is in an equally distributed state, qubit A will not be impacted by the presence of qubit B. Note that this is not the case, however, if qubit A is loaded first and then qubit B is attempted to be placed in the Hadamard state.

In the second phase of the ancillary interaction gate operation the tunneling barrier of qubit B is lowered by applying a corresponding $G_B$ gate control signal 1830 to target qubit B. Qubit A and qubit B will then interact and result in an entangled state (see potential diagrams 1824, 1826). The state of qubit B* will be pushed towards the mirror state of qubit A. If the length of the pulse $G_B$ is equal to the Rabi oscillation period of the ensemble, then there is no actual rotation from the gate control signal and all quantum rotation comes from the entanglement of the two qubits.

Note that qubit B* is not a copy of qubit A (this is not possible in quantum computing), but it is an entangled state originated from qubit A that can be stored and used in other operations.

An example application and use of the ancilla bits and ancillary gates is in quantum error correction circuits that calculate the syndrome code of the errors that were injected.

Note that there are many physical implementations of the ancillary gate. Preferably they have at least four qdots, but can have a larger number. Two exemplary embodiments are illustrated in the bottom of FIG. 24. On the left side is shown a double qdot interaction gate using the "dog-bone" described supra, while on the right side is shown a double-V structure using six qdots out of which four are active. For the ancillary gates it is preferable to have good symmetry between the two double qdots such that the stored entangled state does not have an offset bias of the state due to the imbalance in the interaction.

Note that FIG. 24 illustrates a two qubit ancillary gate. It is appreciated that higher order ancillary gates using a larger number of qdots are contemplated as well and can be used to store higher order quantum states. In addition, the Hadamard equal probability split may be achieved using more than two qubits: e.g., three, four or more qubits. In this manner, entangled states of a larger number of qubits can be stored.

Figure 25:
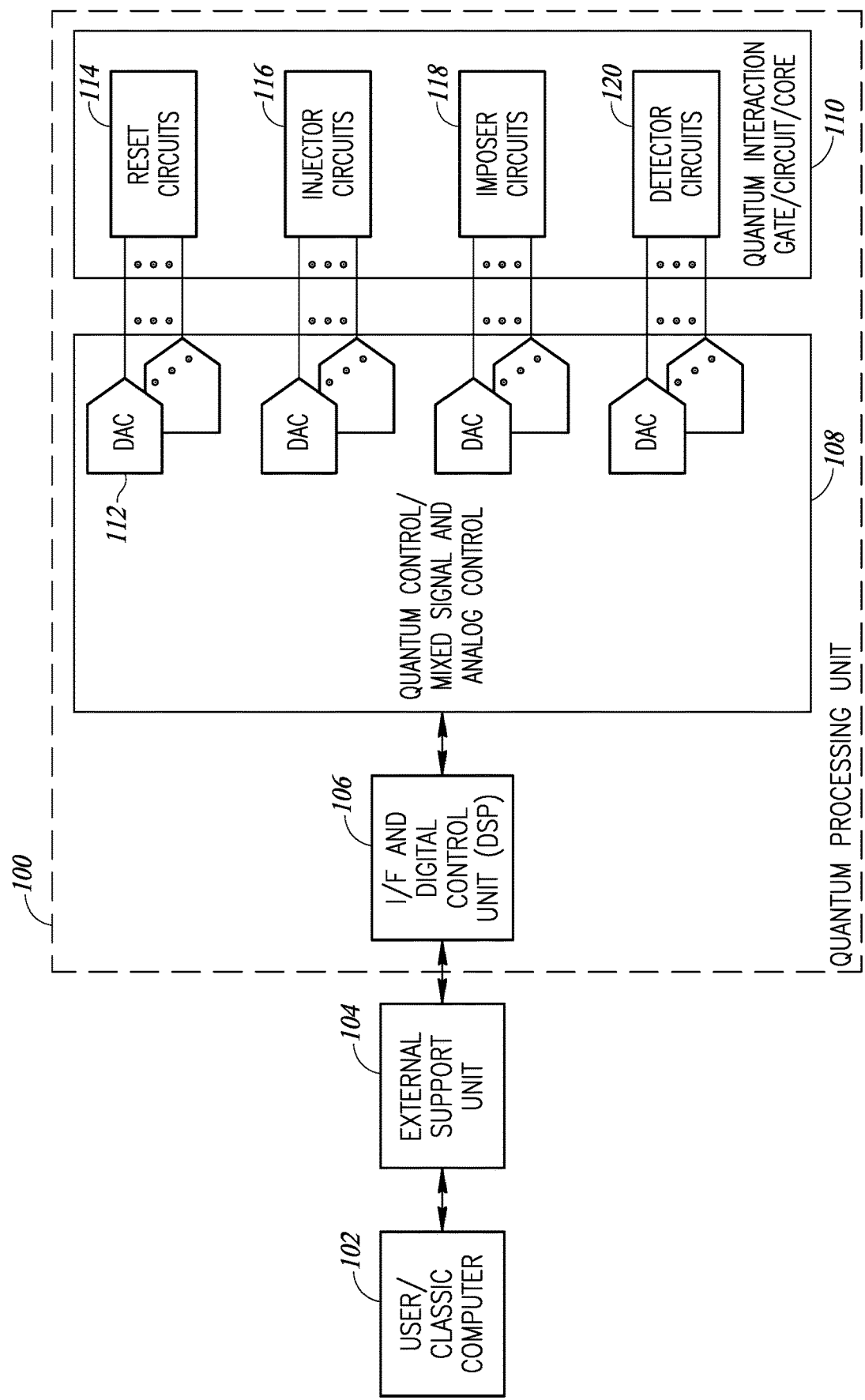
FIG. 25 is a diagram illustrating an example quantum processing unit incorporating a plurality of DAC circuits.

A diagram illustrating an example quantum processing unit incorporating a plurality of DAC circuits is shown in FIG. 25. The quantum processing unit, generally referenced 100, comprises interface and digital control unit (DSP) 106, quantum control/mixed signal and analog control block 108 having a plurality of DACs 112, and quantum interaction gate, circuit, or core 110 including reset circuits 114, injector circuits 116, imposer circuits 118, and detector circuits 120. The quantum processing unit is operative to receive control information from the external support unit 104 which is in communication with a user computing device 102 typically comprising a classic computer.

Note that the digital control unit 106 combined with the mixed signal and analog control circuit 108 provide a reprogrammable capability to the quantum interaction gates/circuits/cores 110. Thus, using the same physical structure realized in the circuitry different types of quantum operations can be achieved by changing the electronic control signals generated by the DACs 112. The quantum processing unit 100 can be appropriately programmed via software to realize numerous quantum operations depending on the particular application, similar to software that controls classic computers where a software stack determines multiple functionality operation of the computer circuit.

In one embodiment, the reset, injector, imposer, and detector circuits of the quantum interaction gate/circuit/core are controlled by analog signals generated by a plurality of digital to analog converters (DACs) 112. The digital command data that feed the DACs are generated by the quantum control/mixed signal and analog control circuit 108 in accordance with commands received from the external support unit 104 which are interpreted and processed by the I/F and digital control unit 106.

Figure 26:
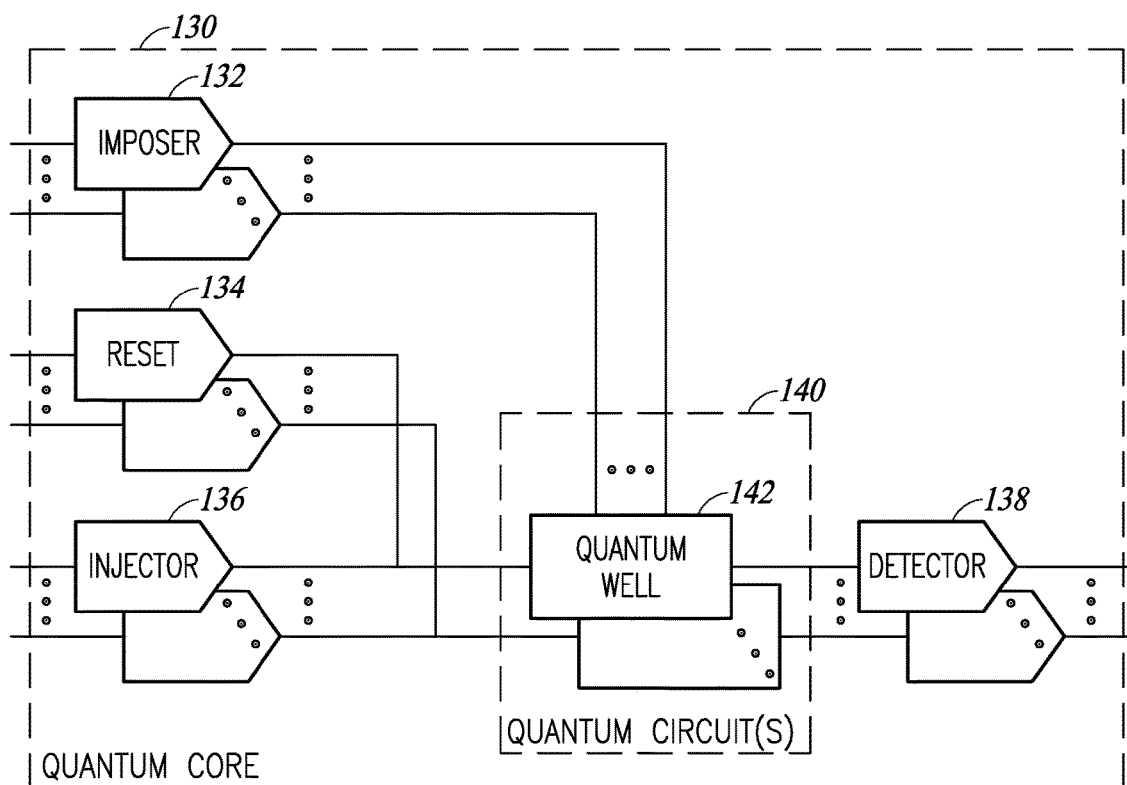
FIG. 26 is a diagram illustrating an example quantum core incorporating one or more quantum circuits.

A diagram illustrating an example quantum core incorporating one or more quantum circuits is shown in FIG. 26. The quantum core, generally referenced 130, comprises one or more quantum circuits 140 each comprising one or more quantum wells 142. Each quantum circuit has corresponding reset circuitry 134, injector circuitry 136, imposer circuitry 132, and detector circuitry 138 that together electronically control the operation of the semiconductor quantum circuit.

Figure 27:
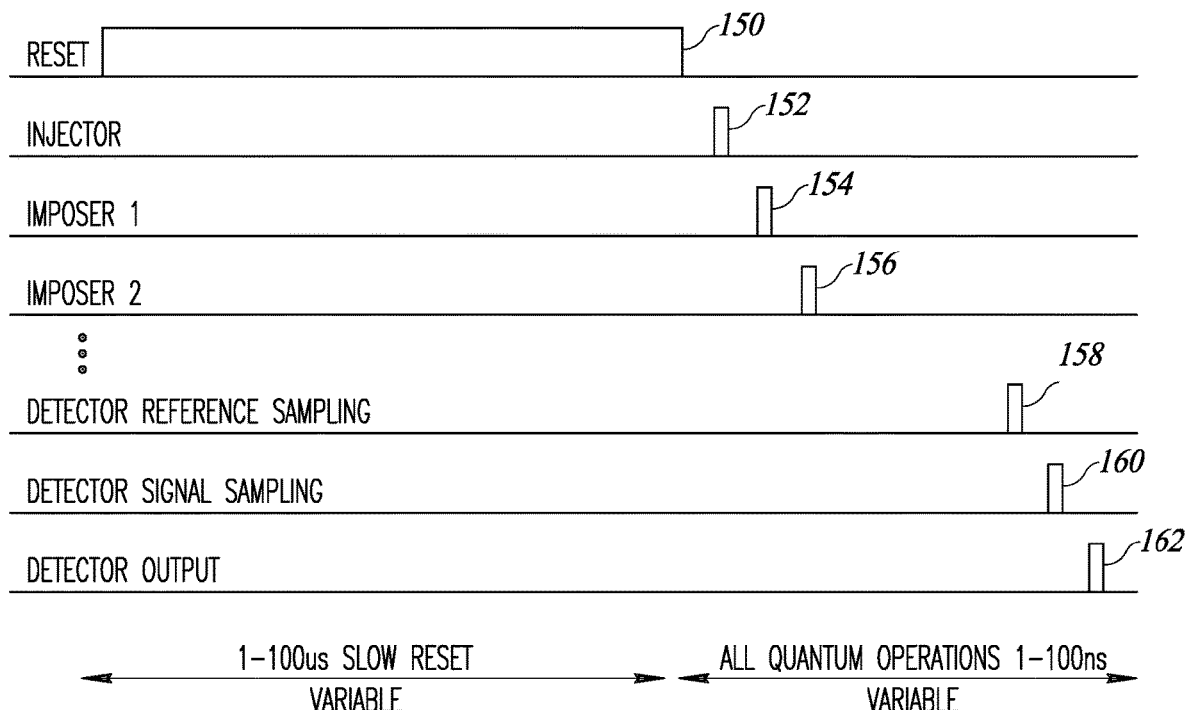
FIG. 27 is a diagram illustrating a timing diagram of n example reset, injector, imposer, and detection control signals.

A diagram illustrating a timing diagram of example reset, injector, imposer, and detection control signals is shown in FIG. 27. As described supra, the quantum circuits generally require reset, injecting, imposing, and detecting control signals to achieve the desired quantum operation. In one embodiment, the reset control signal 150 comprises a variable pulse that is between 1 and 100 microseconds. The reset pulse is followed by the injector pulse 152 that is typically operative to inject a single particle into the quantum circuit. One or more imposer pulses 154, 156 functions to move the particle to and from interaction qdots. Detector reference sampling pulse 158, detector signal sampling pulse 160, and detector output pulse 162 function to control the detection process that determines the presence or absence of a particle at the output of the quantum circuit.

Figure 28A:
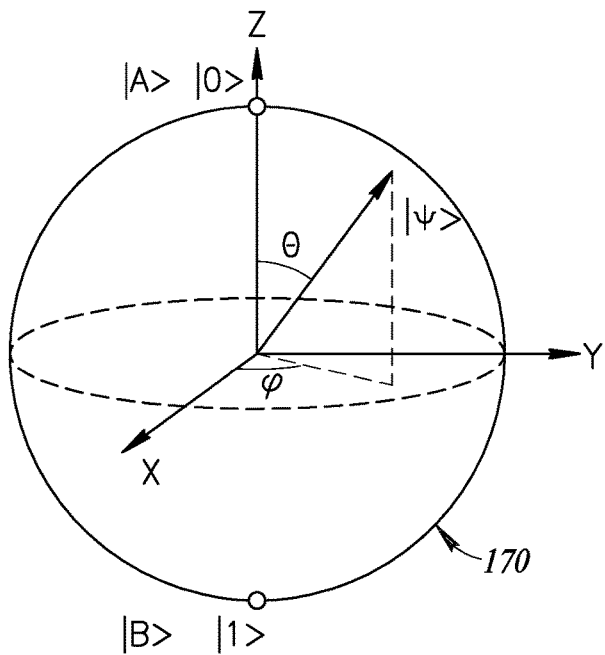
FIG. 28A is a diagram illustrating an example Bloch sphere.

A diagram illustrating an example Bloch sphere is shown in FIG. 28A. In quantum mechanics, the Bloch sphere 170 is a geometrical representation of the pure state of a two-level quantum system or qubit. The space of pure states of a quantum system is given by the one-dimensional subspaces of the corresponding Hilbert space. The north and south poles of the sphere correspond to the pure states of the system, e.g., |0> or |A> and |1> or |B>, whereas the other points on the sphere correspond to the mixed states. The Hilbert space is the mathematical space where operations are performed in the system. In general, the system can be described graphically by a vector in the x, y, z spherical coordinates. A representation of the state of the system in spherical coordinates includes two angles θ and φ. Considering a unitary sphere, as the Hilbert space is a unitary state, the state of the system is completely described by the vector Ψ. The vector Ψ in spherical coordinates can be described in two angles θ and φ. The angle θ is between the vector Ψ and the z-axis and the angle φ is the angle between the projection of the vector on the XY plane and the x-axis. Thus, any position on the sphere is described by these two angles θ and φ.

Note that to represent a multi-dimensional Hilbert space of a quantum system of two or more qubits, a graphical representation can no longer be used as four or more dimensions are difficult to visualize graphically. The precise position or the precise state in the Hilbert space cannot be determined. Consider the Heisenberg uncertainty law which states that you cannot know for sure both the position and the spin (or momentum) of an electron or a carrier. Thus, both the position and the spin of the electron cannot be determined simultaneously. Either the position can be known separately or the spin separately, but both cannot be known at the same time. Fundamentally, this means that there is no complete observability of a quantum system.

Figure 29A:
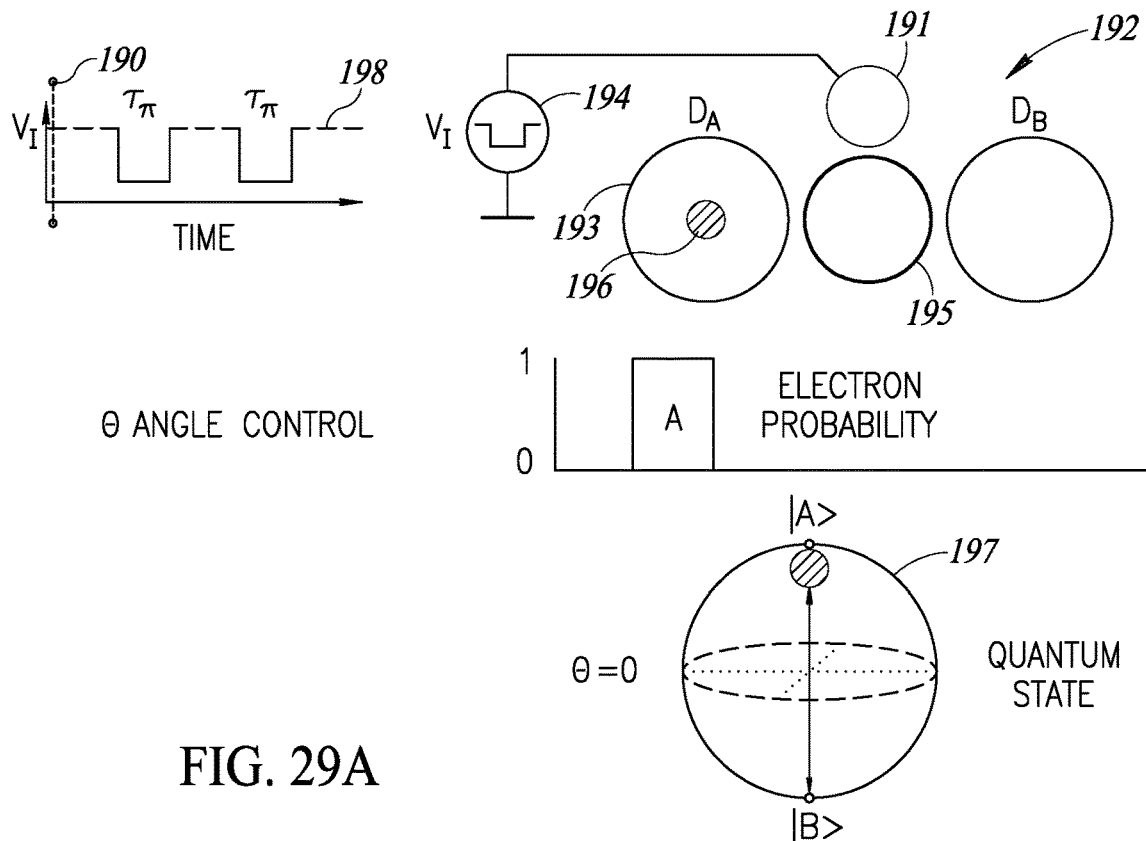
FIG. 29A is a diagram illustrating an example qubit with θ=0 angle control.

Consider a quantum structure that has two or more qdots such as shown in FIG. 29A. The qubit 192 comprises two qdots 193 $D_A$ and $D_B$, a control terminal 191, and depleted tunneling path 195. The qubit, which can be implemented using any kind of technology, planar, 3D, etc., also comprises an injector (not shown) and a detector (not shown) and an attempt is made to detect whether an electron (or a hole) is present or not. The quantum superposition space is created by superposing two base states. There is one state which means that the electron is present in the left qdot and there is another state where the electron is present in the right qdot.

Note that whenever the quantum state is detected, the entire complex functionality or description of a quantum state cannot be measured. Only the projection of the Ψ vector on the |0> and |1> points of the z-axis can be determined. Thus, a measurement means projecting the Ψ vector onto the z-axis, which is the axis of the pure states or the base states of the quantum system.

The electron can be present on the left qdot $D_A$ or it can be present in the right qdot $D_B$. By adjusting the control voltage 198 provided by control pulse generator $V_1$ 194 applied to the control terminal, the tunneling barrier is modulated. If the barrier is high (at the time indicator line 190) then the electron will be locked into a given position, for example, in the left qdot $D_A$ as indicated by the electron probability graph showing a probability of one for the electron to be in qdot $D_A$. The corresponding Bloch sphere 197 is also shown representing the electron 196 in the base state |A> for θ=0 degrees.

Figure 29B:
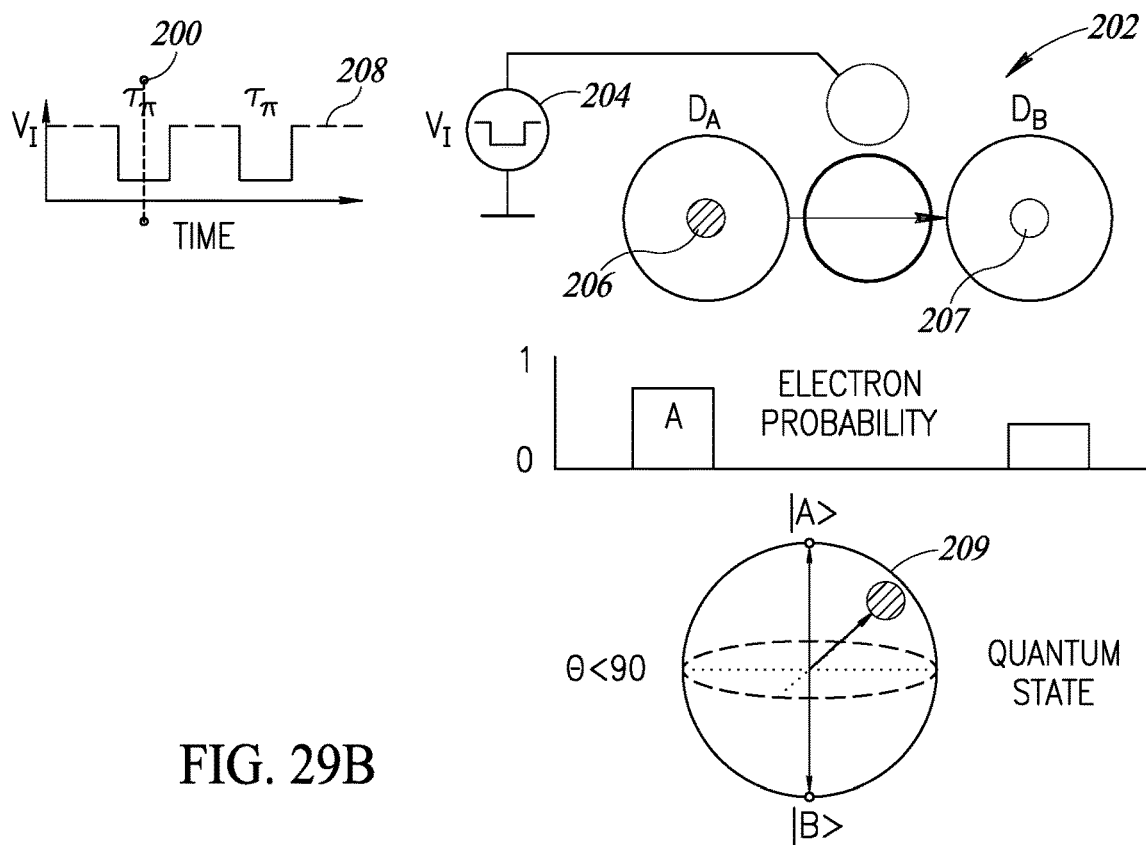
FIG. 29B is a diagram illustrating an example qubit with θ<90 angle control.

As shown in FIG. 29B, as the tunneling barrier of the qubit 202 is lowered via the control voltage 208 provided by control pulse generator $V_1$ 204, the electron starts tunneling. Lowering the tunnel barrier causes the electron to start moving from the left qdot to the right qdot. The corresponding Bloch sphere 209 is also shown representing the electron 206/207 in a split quantum state for θ<90 degrees. How much and how fast the electron moves depends on the qubit geometry and two parameters of the control signal that controls the control terminal: amplitude and pulse width. In this example, a lower amplitude corresponds to a larger decrease of the tunnel barrier and the electron will tunnel faster. This means that it will go from one side to another faster. This also means that the Rabi oscillation frequency will be higher. If the voltage is such that the tunnel barrier is not that low, in a moderate position, then the tunneling current between the two qdots will be lower and the electron will travel slower. The Rabi oscillation frequency is also lower, depending on the amplitude. Thus, how much the electron travels from one qdot to the other depends on the height of the tunnel barrier. If the tunnel barrier is lowered only a little bit, then only a little bit of the electron will tunnel to the other side within an allotted time. Given enough time, more electrons will tunnel to the other side and if the port is wide, the entire electron will go to the other side, i.e. to $D_B$. Thus, the amount of splitting of the electrons between the two qdots depends both on the amplitude and on the pulse width. The invention provides a semiconductor quantum structure comprising an electronic control that controls the amplitude and the pulse width of the control signal which determines exactly what happens with the quantum state and the electron, i.e. how much it's wavefunction will be split between the two qdots.

Figure 29C:
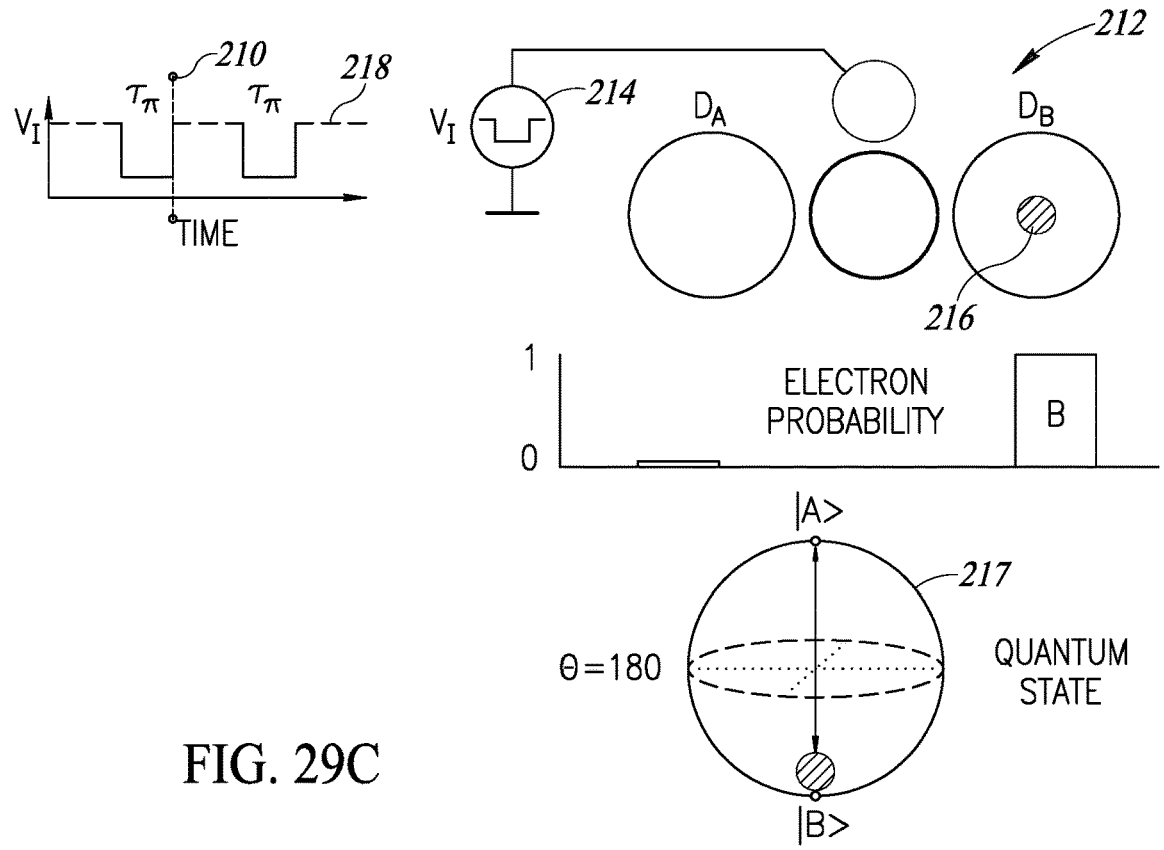
FIG. 29C is a diagram illustrating an example qubit with θ=180 angle control.

Note that the electron tunnels only when the tunnel barrier is low. When the tunnel barrier is high, the electron cannot tunnel and it stays in whatever state it was left before the tunnel barrier was raised. If a control pulse is applied that is equal to the Rabi oscillation period, which is 2π, then the electron starts from the left side $D_A$, tunnels to $D_B$ and will come back to $D_A$. If a control pulse equal to π is applied, i.e. half the Rabi oscillation, the electron will travel from the left side to the right side, as shown in FIG. 29C. If control pulse $\tau_\pi$ provided by control pulse generator $V_1$ 214 is applied to the control terminal that lowers the tunnel barrier for half the Rabi oscillation, the electron will go from the left side to the right side of the qubit 212. Any other values uneven to the half-period will result into a splitting of the electron. The Bloch sphere 217 shows the electron 216 in the base state |B> for θ=180 degrees as indicated by the electron probability graph showing probability of one for the electron 216 to be in qdot $D_B$.

Figure 29D:
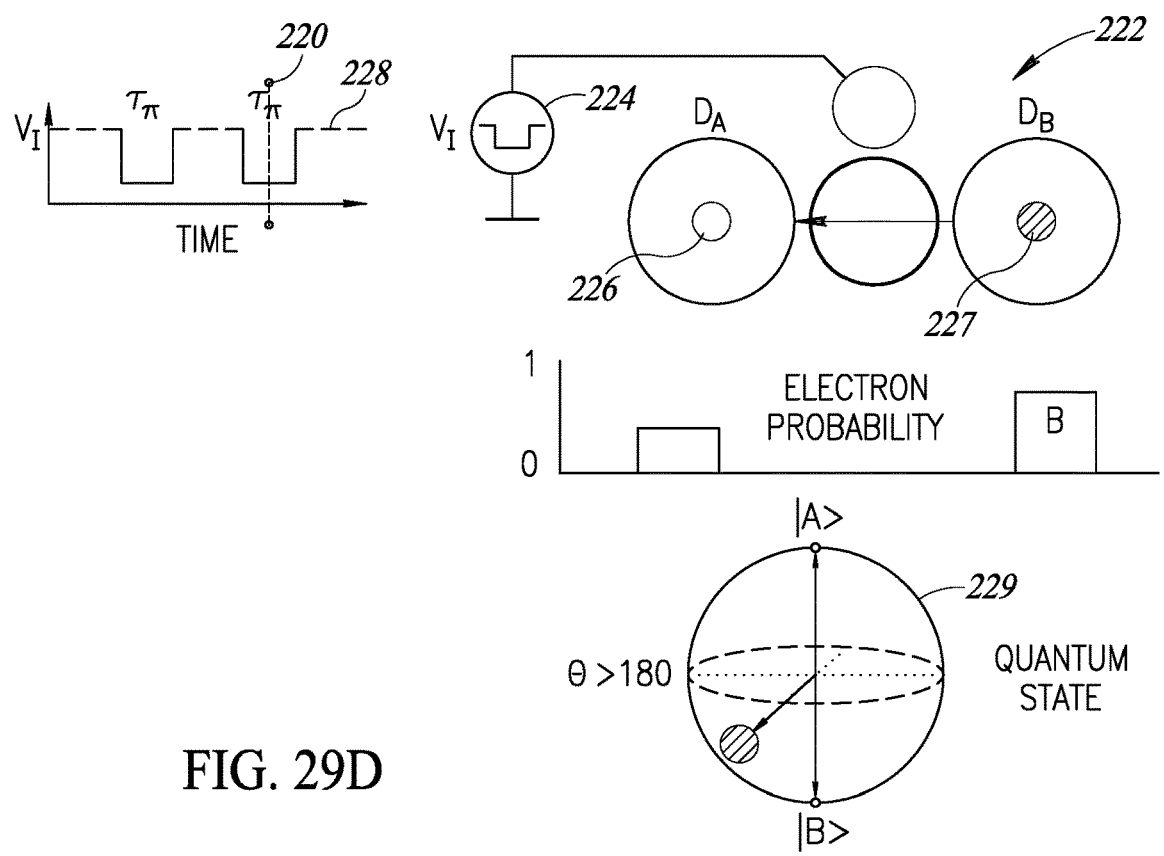
FIG. 29D is a diagram illustrating an example qubit with θ>180 angle control.

Note that the control described herein works both on full electrons, which are called pure states, as well as on split states. Considering a qubit 222 in a split state, as shown in FIG. 29D, e.g., 25% on the left and 75% on the right, if a control pulse of $\tau_\pi$ provided by control pulse generator $V_1$ 224 is applied to the control terminal, the electron in the two qdots will be split, i.e. 75% on the left and 25% on the right. The Bloch sphere representation 229 shows the electron 226/227 in a split state for θ>180 degrees. Thus, this type of control works not only with separated full electrons, it works with any kind of split electron which means a quantum state.

The control can be applied to single qubits as well as multiple qubits making up a quantum interaction gate, circuit or core. In this case, a control signal is supplied for each control terminal in the structure. And for each of those control signals, the amplitude and the pulse width is controlled in a given fashion to create a given functionality for the quantum structure.

With reference to the Bloch sphere, whether the electron is in the left or right qdot is determined by the θ angle which is the single angle that can be detected externally, although sometimes multiple measurements might be needed. Thus, if one puts a detector on the $D_B$ qdot in FIG. 29A, it can be detected that the electron is not present in the $D_A$ qdot. If the detector is placed on qdot $D_B$ in FIG. 29C, presence of the electron will be detected. In the split case, the split electron is only a quantum description. Whenever it is detected, the state collapses to a classic state. For example, considering FIG. 29B, qdot $D_A$ is detected as a split electron where 75% of the time it is detected, but whenever it is detected, an electron will be present or not present. Performing a large number of measurements consecutively, 75% of the time an electron will be present and 25% of the time it will not be present. With a larger number of detections, the results converge towards the probability split of the quantum state.

Figure 28B:
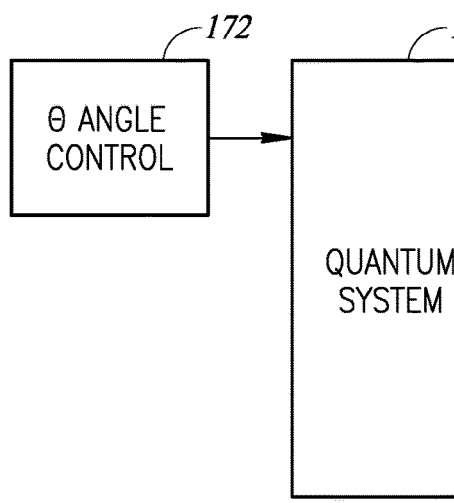
FIG. 28B is a diagram illustrating an example θ angle control circuit.
Figure 28C:
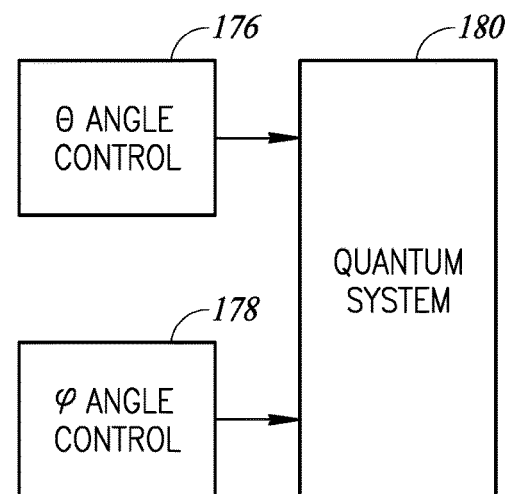
FIG. 28C is a diagram illustrating an example θ angle control and φ angle control circuits.
Figure 28F:
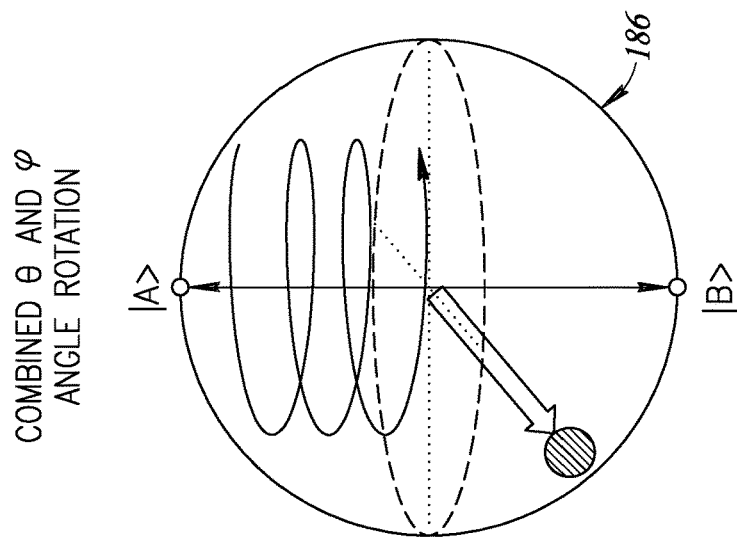
FIG. 28F is a diagram illustrating a Bloch sphere with combined θ and φ angle rotation.
Figure 28E:
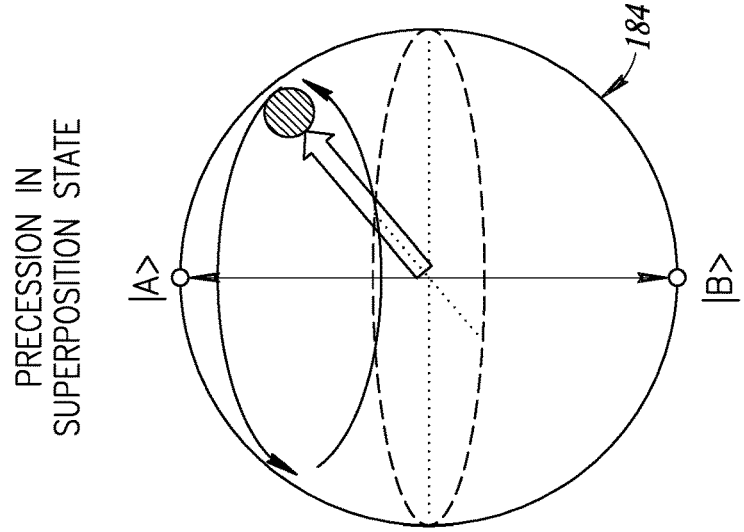
FIG. 28E is a diagram illustrating a Bloch sphere with precession in a superposition state.
Figure 28D:
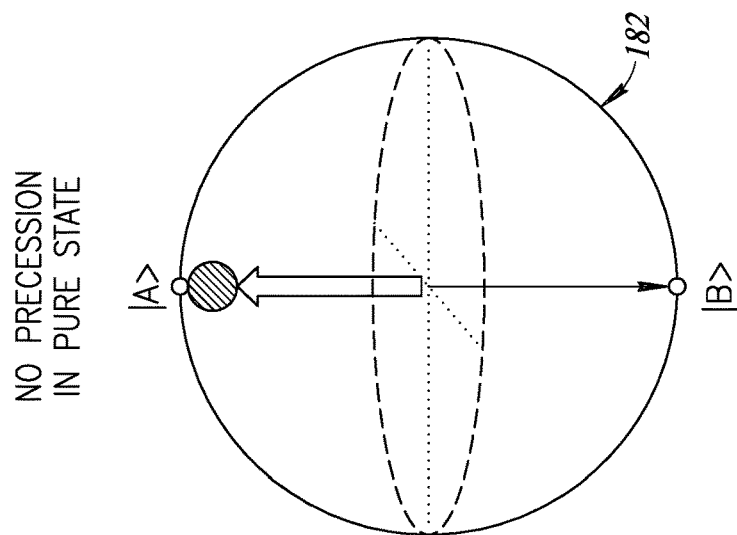
FIG. 28D is a diagram illustrating a Bloch sphere with no precession in a pure state.

Regarding notation for the pure or base states, when the electron is in the left side of the qubit, this is referred to as state 0 or A and it is represented by a vector that goes to the north pole as shown in FIG. 28D in Bloch sphere 182. When the electron is in the right qdot, this is referred to as state 1 or B and it is represented by a vector that goes to the south pole. By looking to the projection of a generalized quantum state it can be concluded if the state is completing on the left side or completing on the right side, which would be either the 0 or 1 state, or if it is a superposed case, it can be determined what percentage is in state 0 and what percentage is in state 1. This is the projection of the Ψ quantum vector onto the z-axis in the Bloch sphere.

Note that the angle φ cannot be directly measured. The φ angle comes from the full complex Hilbert description of the quantum state. And it is a representation of the ground state in the quantum system. Having a ground state energy means that the energy level of the electron evolves over time although the projection on the z-axis is the same.

The electron is in one of the pure states as shown in FIG. 28D either A or B, 0 or 1 then the vector will stay fixed all the time. If the electron is in a superposed position, i.e. a percentage in state A and a percentage in state B, this means that the vector will be inclined at an angle as shown in FIG. 28E. In this case, what happens in time is the state in the Bloch sphere 184 will have a procession which is a rotation around the z-axis. The projection of the vector Ψ on the z-axis is the same all the time so the electron for example is split in a given way. From the quantum representation in the Bloch sphere, however, it is rotated around the state which means that the angle φ varies in time.

Consider starting from the state shown in FIG. 28E where the angle is rotated and it is desired to move to a different angle, which is the angle θ shown in FIG. 28F. What does not happen is that the electron simply jumps from one state to the other. Rather, the time representation of the state evolves over time which changes both the angle θ and the angle φ. This is represented on the Bloch sphere 186 as a spiral. Starting from the state in FIG. 28E, the electron proceeds to procession about the z-axis but at the same time the θ angle changes. The particle travels around the z-axis several times on a procession until arriving in the final desired state.

Similarly, this is what happens in the quantum interaction structures described herein. Applying a control signal to the control terminal, the electron splits meaning that the electron will go from one θ angle to another but at the same time performs a procession around the z-axis. The invention provides a quantum system with a means of controlling just the θ angles which from a position or a charge qubit is sufficient if the location of the electron is known. FIG. 28B shows a quantum system 174 with θ angle control 172 only. In this case, the φ angle is unimportant.

Alternatively, a quantum system is provided where both the θ and φ angles are controlled. This is shown in FIG. 28C which includes quantum system 180 with θ angle control 176 as well as φ angle control 178. Note that considering a single qubit, the φ angle typically is not critical because detection of a single electron yields the same results undifferentiated with respect to φ. The projection on the z-axis of the state vector with angle θ will always be the same regardless of where exactly in the procession the electron is. This is not the case, however, with a two or more qubit state. In this case, the φ angles of each of the states matter. The absolute value angle φ cannot be known or measured, but for two qubits, for example, the difference between φ1 and φ2 is important because it impacts the projection on the z-axis and therefore the final result. Thus, either the angle θ can be controlled or both θ and φ can be controlled.

Figure 30A:
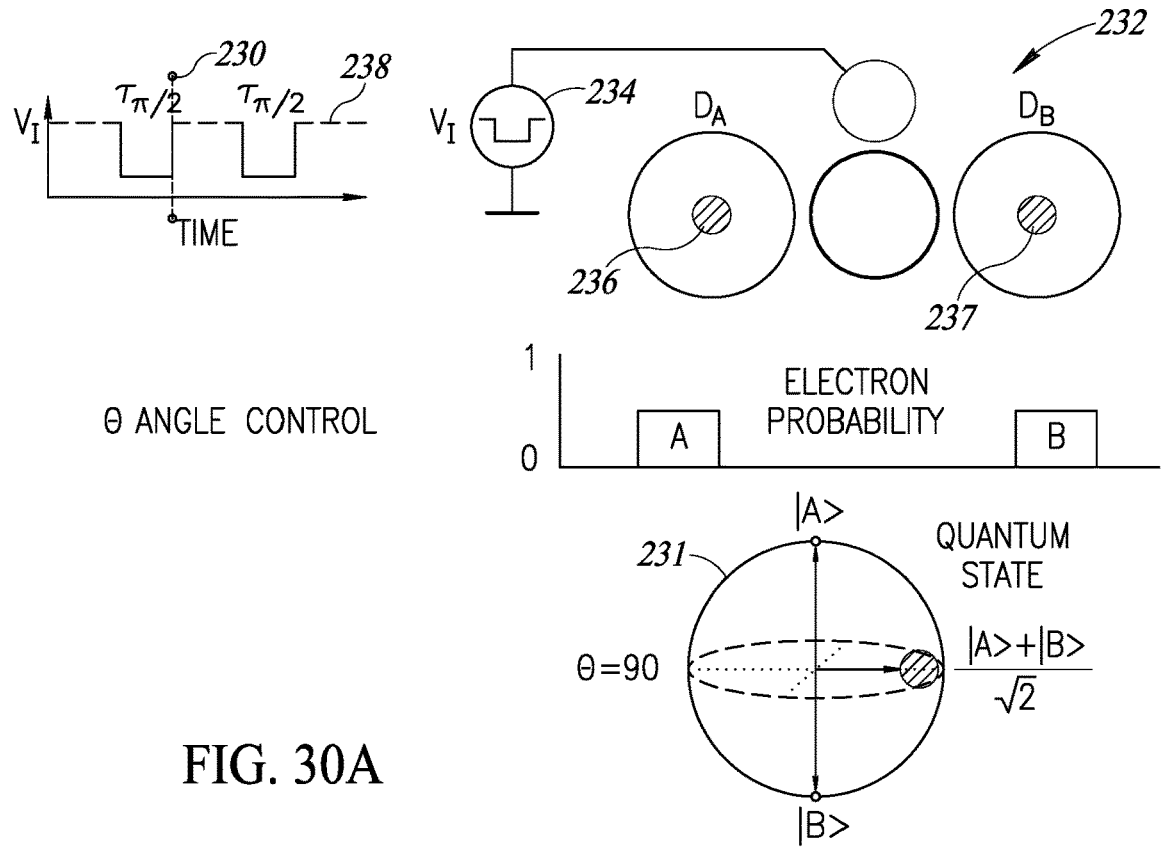
FIG. 30A is a diagram illustrating an example qubit with θ=90 angle control.

A diagram illustrating an example qubit with θ=90 degree angle control is shown in FIG. 30A. The qubit 232 comprises a left qdot $D_A$ and a right qdot $D_B$ with control pulse generator $V_1$ 234 providing a control signal 238 to the control terminal. The Bloch sphere representation 231 also shows the equal distribution state. As described supra, the electron can be in other than a base state. There is a middle point when the electron is equally split between the two sides. It is appreciated, however, that the electron 236, 237 is present all the time in both qdots or multiple qdots. It is only that the probability is split 50-50. When the electron is split 50-50 this is called a Hadamard gate result which is widely used in quantum computing. The Hadamard gate takes an electron and places it in an equal probability distribution. The Hadamard state is represented by a vector that is at 90 degrees. Since the Hadamard state is a split state, it also has a precession. The state travels on the Bloch sphere 231 all the time. And the speed of traveling is the speed of precession which is dependent on the base energy level. The higher the tunnel barrier energy the higher the procession speed. The lower the energy the lower the precession speed.

For the Hadamard gate, the pulse width $\tau_{\pi/2}$ of the control signal 238 applied is a quarter of the Rabi oscillation. With reference to FIGS. 29A, 29B, 29C, and 29D, the control signal pulse that was half the Rabi oscillation period was applied. Applying pulses that are half the Rabi oscillation period causes the electron to go from one side to the other. Applying pulses that are a quarter of the Rabi oscillation, causes the electron to pass through those states half-way and then stop. So for example, after the first π/2 pulse the electron is split equally 50-50 and is locked because the tunnel is stopped. This can then be used in the quantum computation such as in calculating quantum error correction.

Figure 30B:
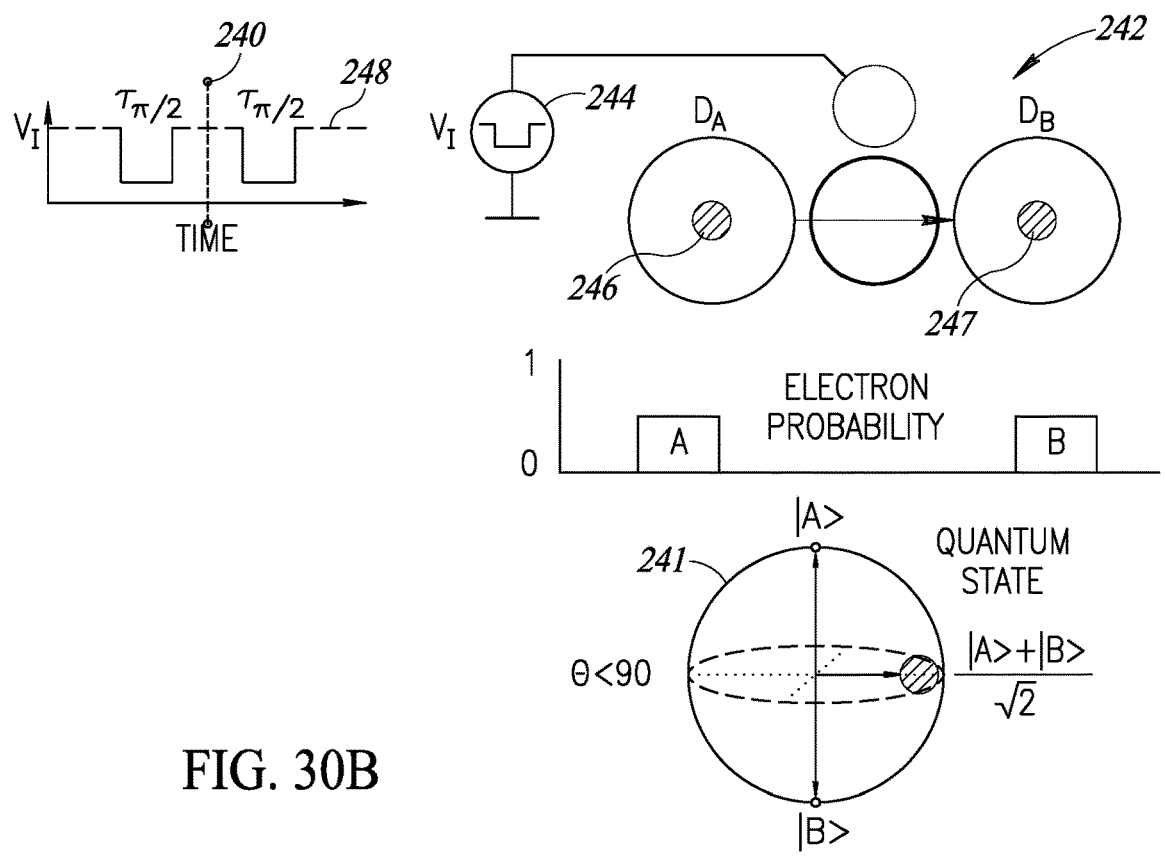
FIG. 30B is a diagram illustrating an example qubit with θ<90 angle control.

A diagram illustrating an example qubit state at the time instance 240 is shown in FIG. 30B. The qubit 242 comprises a left qdot $D_A$ and a right qdot $D_B$ with control pulse generator $V_1$ 244 providing a control signal 248 to the control terminal. Since the tunnel barrier is still high, the electron 246, 247 remains since the time instance 230 in the equal distribution state as indicated in the Bloch sphere 241.

Figure 30C:
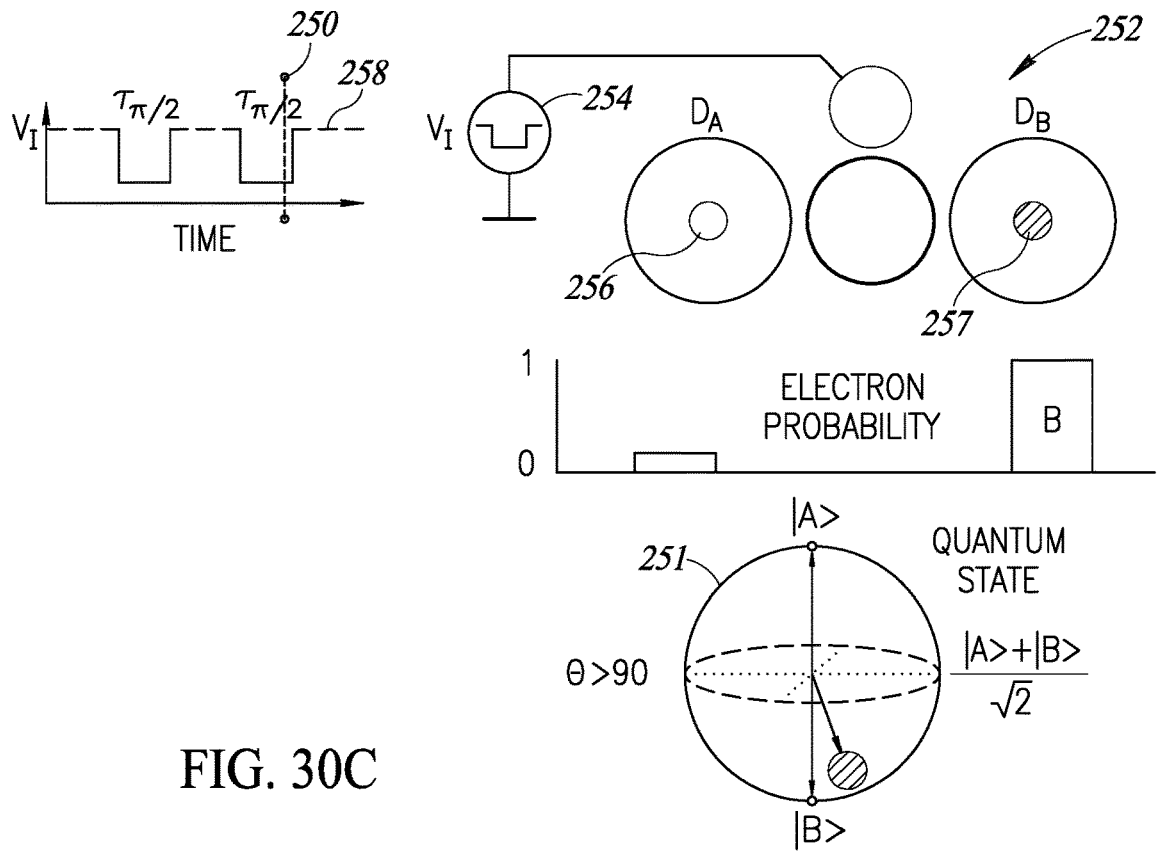
FIG. 30C is a diagram illustrating an example qubit with θ>90 angle control.

A diagram illustrating an example qubit state at the time instance 250 is shown in FIG. 30C. The qubit 252 comprises a left qdot $D_A$ and a right qdot $D_B$ with control pulse generator $V_1$ 254 providing a control signal 258 to the control terminal. Since the time instance 240, the tunnel barrier got lowered and so in this case, the probability for the electron 256, 257 is split 15-85 as shown in the electron probability graph and the Bloch sphere representation 251.

Figure 30D:
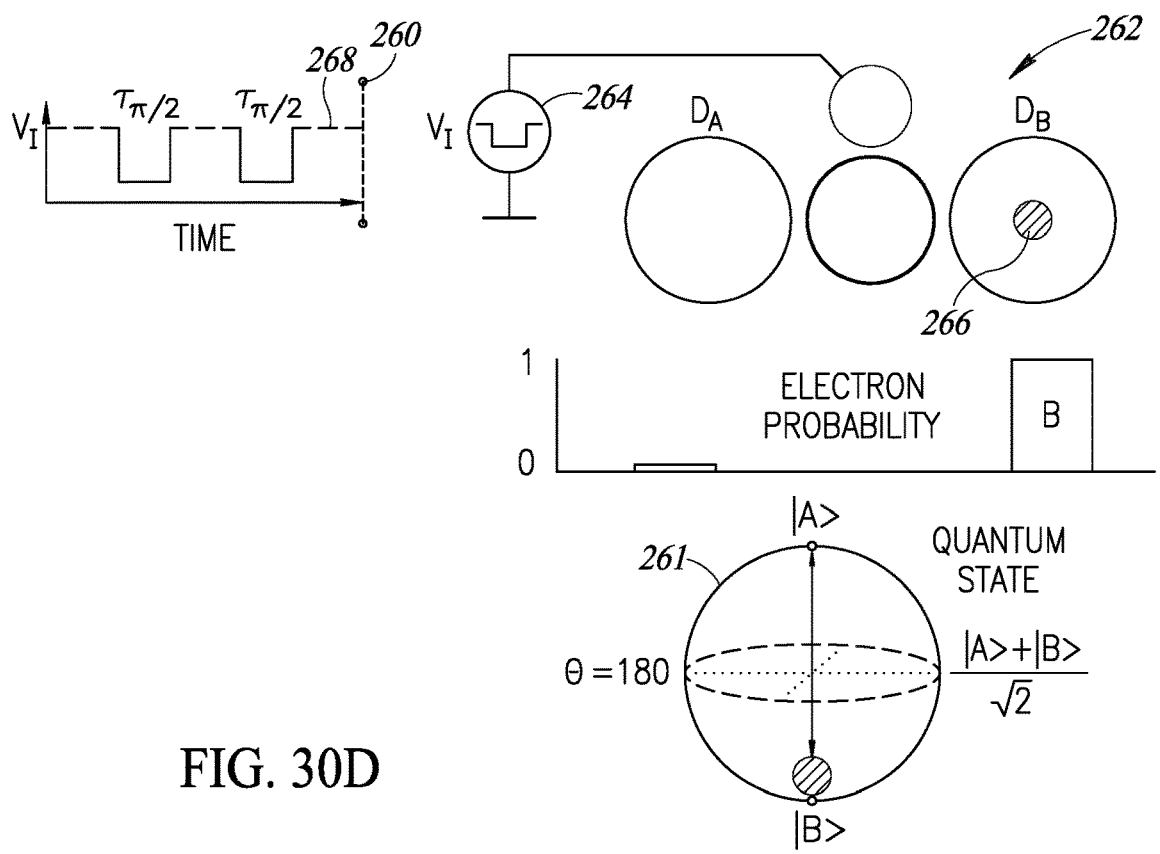
FIG. 30D is a diagram illustrating an example qubit with θ=180 angle control.

A diagram illustrating an example qubit state at time instance 260 is shown in FIG. 30D. The qubit 262 comprises a left qdot $D_A$ and a right qdot $D_B$ with control pulse generator $V_1$ 264 providing a control signal 268 to the control terminal. The tunnel barrier was raised again after the time instance 250 and so in this case, the electron 266 is in the base state |B> as shown in the electron probability graph and the Bloch sphere representation 261.

Figure 31A:
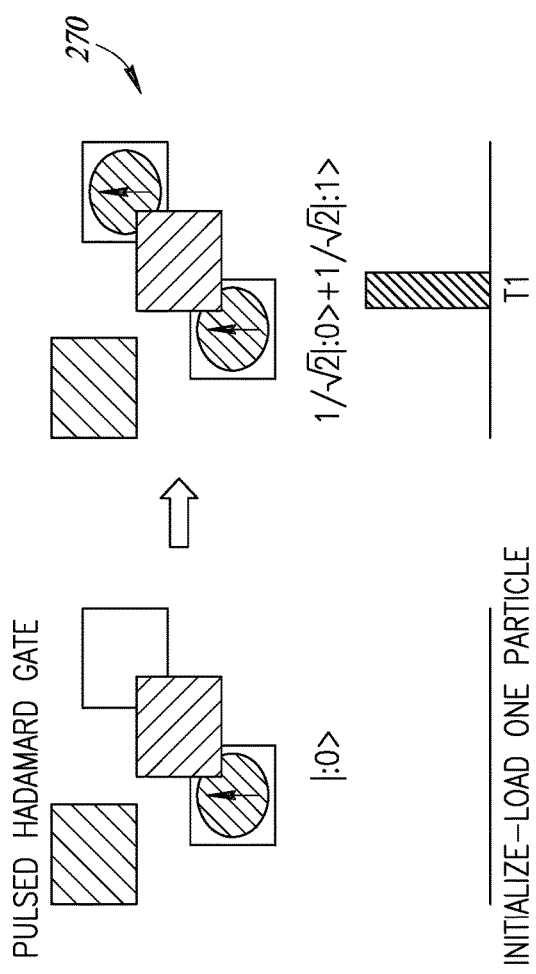
FIG. 31A is a diagram illustrating an example pulsed Hadamard gate.
Figure 31A:
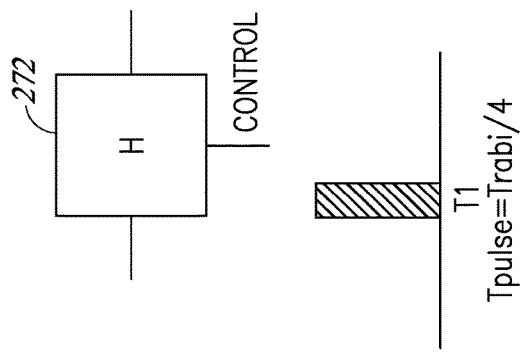

Several different types of quantum interaction gates will now be described. A diagram illustrating an example pulsed Hadamard gate is shown in FIG. 31A. The Hadamard gate, generally referenced 270, as described supra represents the 50-50 equal distribution quantum state. It is represented by the notation "H" 272. A control pulse has a pulse width of one quarter of the Rabi oscillation and places the gate into the Hadamard state.

Figure 31B:
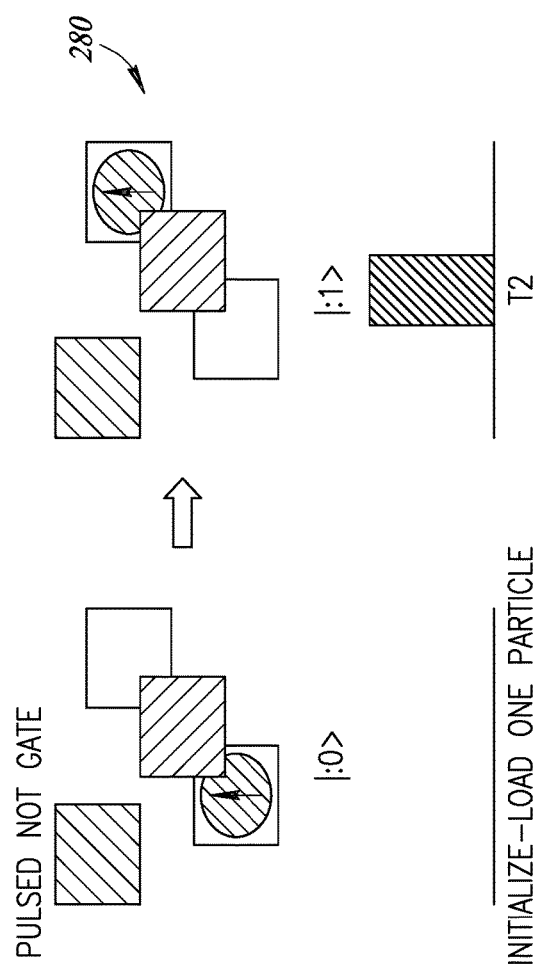
FIG. 31B is a diagram illustrating an example pulsed NOT gate.
Figure 31B:

A diagram illustrating an example pulsed NOT gate is shown in FIG. 31B. The pulsed NOT gate, generally referenced 280, flips the initial base state from |0> to |1> or vice versa. It is represented by the notation "NOT" 282. A control pulse having a pulse width of one half the Rabi oscillation provides the pulsed NOT gate functionality.

A diagram illustrating an example pulsed rotation gate is shown in FIG. 31C. The pulsed rotation gate, generally referenced 290, functions to apply a rotation to the initial state. It is represented by the notation "R" 292. A control pulse having a pulse width not exactly equal to $n*T_{Rabi/4}$, where n is a positive integer, provides the pulsed rotation gate functionality.

A diagram illustrating an example pulsed repeater gate is shown in FIG. 31D. The pulsed repeater gate, generally referenced 300, maintains the initial state. It is represented by the notation "Rep" 302. A control pulse having a pulse width equal to the Rabi oscillation provides the pulsed repeater gate functionality.

A target semiconductor quantum interaction gate is defined as the quantum interaction gate that is to be controlled. A quantum interaction gate is generally a quantum structure having several qubits, e.g., one, two, three, four, etc. A semiconductor quantum interaction gate can be just a single qubit that can be controlled multiple ways. In one embodiment, an electric field provides the control that is created, for example, by a voltage applied to a control terminal. Note that there can be multiple electric control fields. In this case, there are multiple control terminals where different voltages are applied to each of them. In another embodiment, multiple quantum interaction gates can be used where the control terminals are appropriately controlled to realize different quantum functions.

A second way of controlling the quantum interaction gates is by using an inductor or resonator. In one embodiment, an electric field functions as the main control and an auxiliary magnetic field provides additional control on the control gate. The magnetic field is used to control different aspects of the quantum structure. The magnetic field has an impact on the spin of the electron such that the spin tends to align to the magnetic field. This means that applying a magnetic field to a charge qubit quantum gate can determine the carriers, e.g., the electrons, that are processed and what kind of spin orientation they have. Considering the position and the spin of the particle, both cannot be determined but each can be determined one at a time. If the spin of the electron is changed, however, that also impacts its position. In addition, changing the position of an electron impacts the spin although it cannot be measured.

Figure 32A:
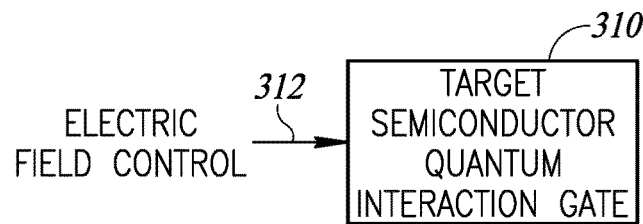
FIG. 32A is a diagram illustrating a target semiconductor quantum gate with electric field control.

A diagram illustrating a target semiconductor quantum gate with electric field control is shown in FIG. 32A. In one embodiment, electric field control 312 is applied to the target semiconductor quantum gate 310.

Figure 32B:
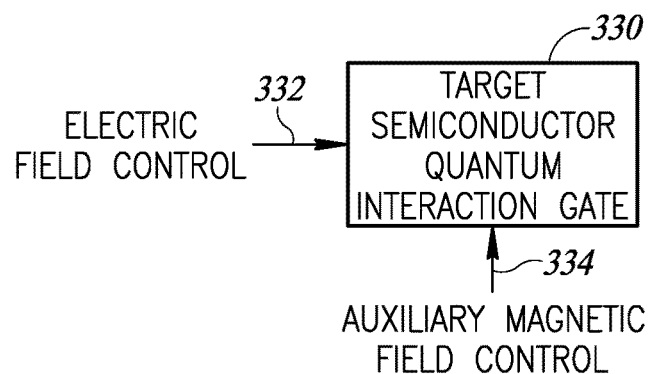
FIG. 32B is a diagram illustrating a target semiconductor quantum gate with electric and magnetic field control.

A diagram illustrating a target semiconductor quantum gate with electric and magnetic field control is shown in FIG. 32B. In another embodiment, electric field control 332 as well as auxiliary magnetic field control 334 are applied to the target semiconductor quantum gate 330.

Figure 32C:
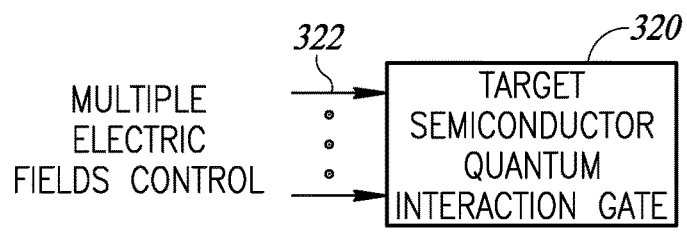
FIG. 32C is a diagram illustrating a target semiconductor quantum gate with multiple electric field control.

A diagram illustrating a target semiconductor quantum gate with multiple electric field control is shown in FIG. 32C. In another embodiment, multiple electric field controls 322 are applied to the target semiconductor quantum gate 320.

Figure 32D:
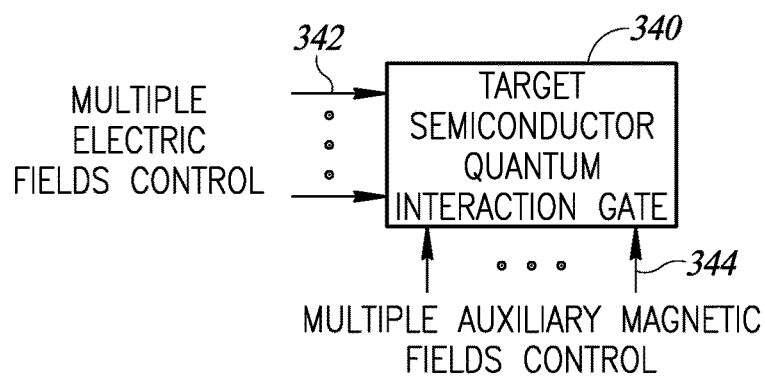
FIG. 32D is a diagram illustrating a target semiconductor quantum gate with multiple electric and multiple magnetic field control.

A diagram illustrating a target semiconductor quantum gate with multiple electric and multiple magnetic field controls is shown in FIG. 32D. In another embodiment, multiple electric field controls 342 as well as multiple auxiliary magnetic field controls 344 are applied to the target semiconductor quantum gate 340.

With reference to the target semiconductor quantum interaction gate, besides electric and magnetic field controls, there are additional two ways in which an electron can be controlled: classically and by another quantum state. Classical control uses, for example, a control voltage that is generated by a classic electronic circuit. A voltage is imposed that impacts the behavior of the electrons. Besides classic control, an electron can also be controlled by another electron. If that electron is in a quantum state, then the electron can be controlled using another quantum state. In addition, both classic and quantum control can be used at the same time.

Figure 33A:
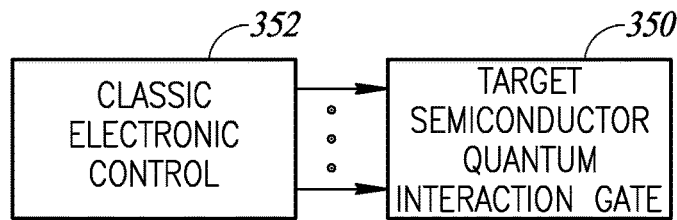
FIG. 33A is a diagram illustrating a target semiconductor quantum gate with classic electronic control.

A diagram illustrating a target semiconductor quantum gate with classic electronic control is shown in FIG. 33A. In one embodiment, classic electronic control 352 alone is used to control the target semiconductor quantum interaction gate 350.

Figure 33B:
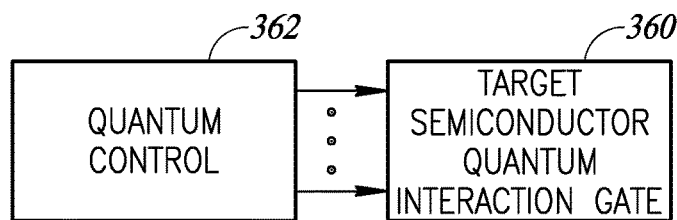
FIG. 33B is a diagram illustrating a target semiconductor quantum gate with quantum control.

A diagram illustrating a target semiconductor quantum gate with quantum control is shown in FIG. 33B. In another embodiment, quantum control 362 alone is used to control the target semiconductor quantum interaction gate 360.

Figure 33C:
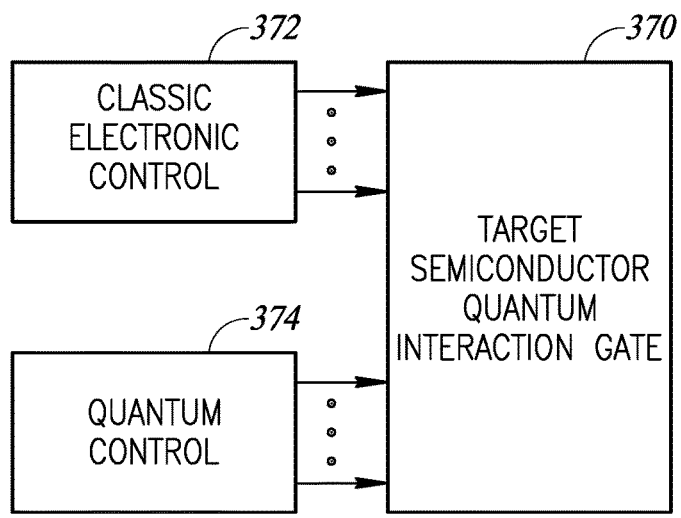
FIG. 33C is a diagram illustrating a target semiconductor quantum gate with both classic electronic control and quantum control.

A diagram illustrating a target semiconductor quantum gate with both classic electronic control and quantum control is shown in FIG. 33C. In another embodiment, both classic electronic control 372 as well as quantum control 374 are used to control the target semiconductor quantum interaction gate 370. In this case, the target semiconductor quantum gate comprises, for example, both a control gate for controlling the tunneling barrier but also uses quantum control whereby one or more additional electrons provide control. As described supra, the control voltage applied to the control gate impacts the Rabi oscillation frequency. In addition, bringing an electron into proximity of the target electron, also impacts the Rabi oscillation frequency.

Note that the way in which the quantum control NOT control gate as well as of other common types of control gates, e.g., ancillary, Pauli, SWAP, etc. are realized, electrons are brought into close proximity along with use of classic electronic control circuits providing the control signal on the gate. It is also possible to control these gates with a quantum state of an electron.

Figure 34A:
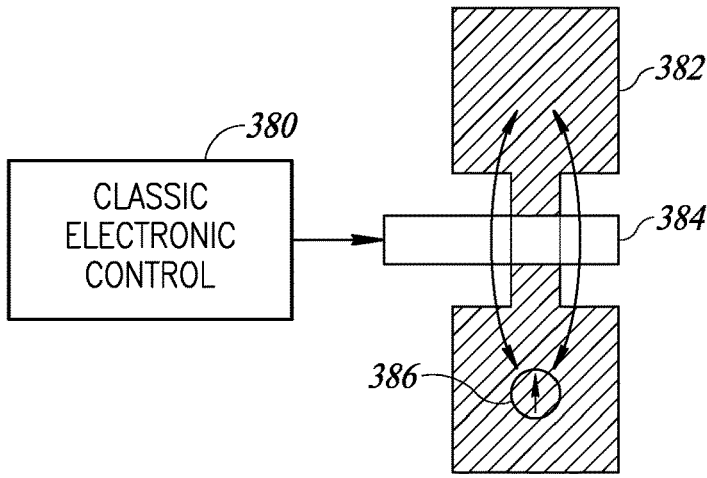
FIG. 34A is a diagram illustrating an example qubit with classic electronic control.

A diagram illustrating an example qubit with classic electronic control is shown in FIG. 34A. The qubit comprises two qdots 382 in a 'dog bone' configuration, particle 386, control gate 384 coupled to a classic electronic control circuit 38O. As discussed supra, in one embodiment, a classic electronic circuit controls the voltage on the control gate of a qubit which changes its Rabi or occupancy oscillation thus impacting how fast the electron tunnels back and forth. Note that Rabi oscillation is the interference between two very high frequency eigenfunctions.

Figure 34B:
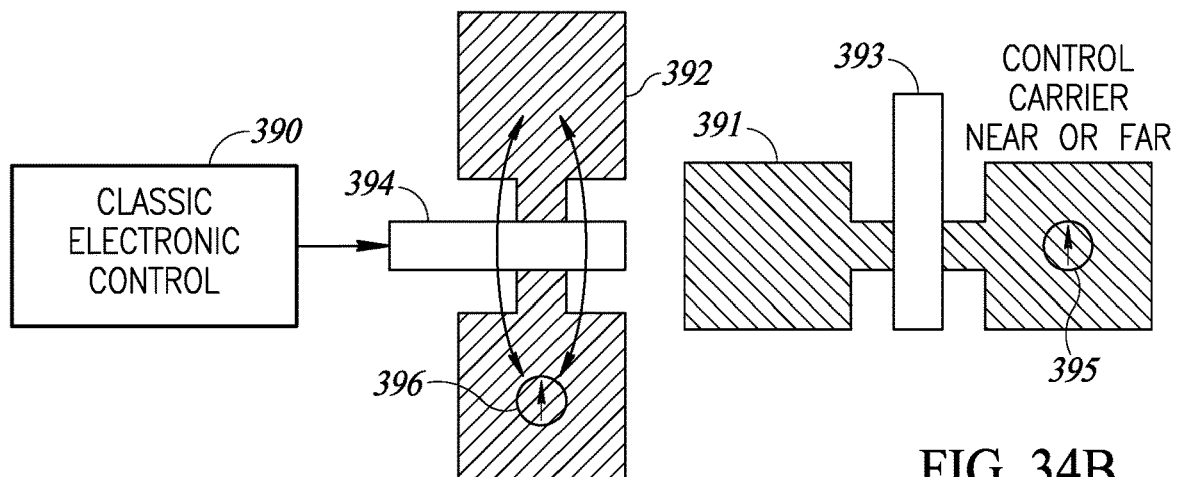
FIG. 34B is a diagram illustrating an example qubit with both classic electronic control and quantum control.

A diagram illustrating an example qubit with both classic electronic control and quantum control is shown in FIG. 34B. The target qubit comprises two qdots 392, particle 396, control gate 394 coupled to a classic electronic control circuit 390. In addition, a second qubit (control) having two qdots 391, particle 395, and control gate 393 is in relatively close proximity to the target qubit. The particle in the target qubit tunnels back and forth at the Rabi oscillation under the classic electronic control. Now, however, a control electron 395 is brought into proximity. If the electron is sufficiently far away, then the Rabi oscillation is faster. If the control electron is brought relatively close like it is in the case shown in FIG. 34C, the Rabi oscillation becomes slower (frequency $F_1$). Thus, the Rabi oscillation of the target qubit can be controlled by the proximity of another electron.

In one embodiment, classic electronic control means controlling the amplitude and pulse width of the control signal applied to the control gate. In another embodiment, this can be achieved without using any direct electronic control. The proximity of the neighboring control electron to the target qubit is used to control it. Note that this assumes the potential on the control gate of the target qubit is not floating but such that the tunneling barrier is lowered and the electron is free to move between the qdots. If the control gate voltage is stable, the electronic control does not impact the operation and just the quantum control dominates, i.e. the other electron impacts the operation of the target qubit. Thus, any combination of electronic control only, quantum control only, or both of them can be used.

Figure 34C:
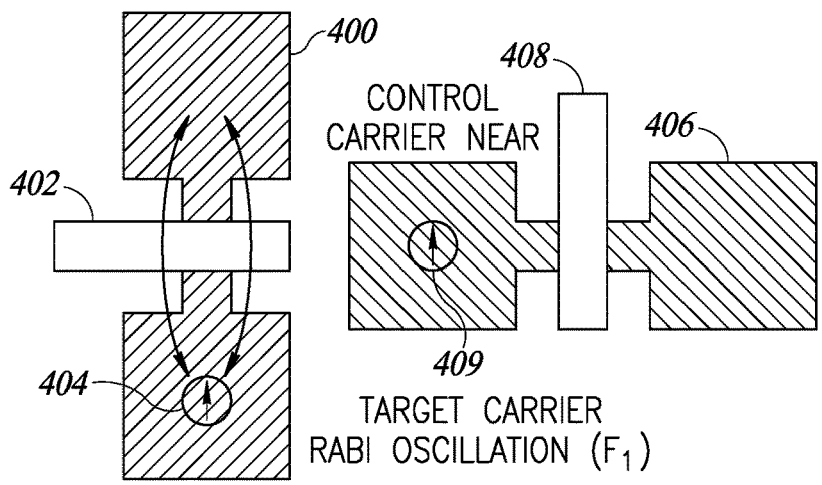
FIG. 34C is a diagram illustrating an example qubit having quantum control with the control carrier at a close distance.

A diagram illustrating an example qubit having quantum control with the control carrier at a close distance is shown in FIG. 34C. The target qubit comprises two qdots 400, particle 404, control gate 402 coupled to a classic electronic control circuit (not shown). In addition, a second qubit having two qdots 406, particle 409, and control gate 408 is in relatively close proximity to the target qubit. In this case, the control carrier is near the target qubit and provides control thereof.

Figure 34D:
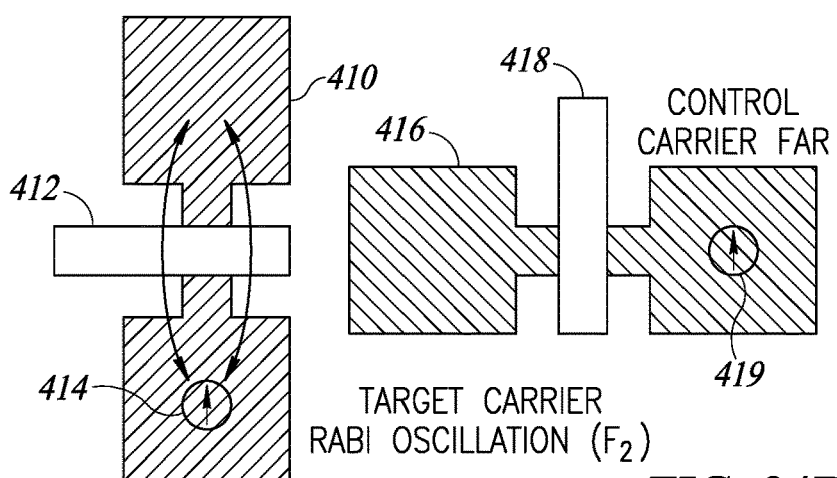
FIG. 34D is a diagram illustrating an example qubit having quantum control with the control carrier at a far distance.

A diagram illustrating an example qubit having quantum control with the control carrier at a far distance is shown in FIG. 34D. The target qubit comprises two qdots 410, particle 414, control gate 412 coupled to a classic electronic control circuit (not shown). In addition, a second qubit having two qdots 416, particle 419, and control gate 418 is in relatively far from the target qubit. In this case, the control carrier is far from the target qubit and has less impact thereon. In this case, the resultant Rabi oscillation is faster (frequency $F_2$).

Figure 35A:
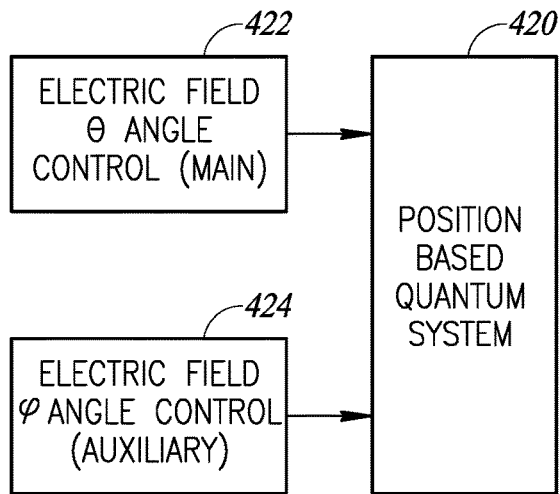
FIG. 35A is a diagram illustrating an example position based quantum system with θ angle and φ angle electric field control.

As described supra, a quantum state can be described by the two angles θ and φ. The angle θ determines the split between the two base states where θ represents the actual state of the electron, i.e. where it's probabilities are versus the two qdots of a qubit for example. The angle φ represents the procession movement in the Bloch sphere. A diagram illustrating an example position based quantum system with θ angle and φ angle electric field control is shown in FIG. 35A. In this embodiment, a more precise description of the system is provided, where in a position based quantum interaction system 420 an electric field is used to control the angle θ (block 422) and an electric field is used to control the angle φ (block 424). Note that it is preferable to use electric fields for control because electric fields are generated by voltages and signals are transported on wires which can be easily produced by integrated circuits.

Figure 35B:
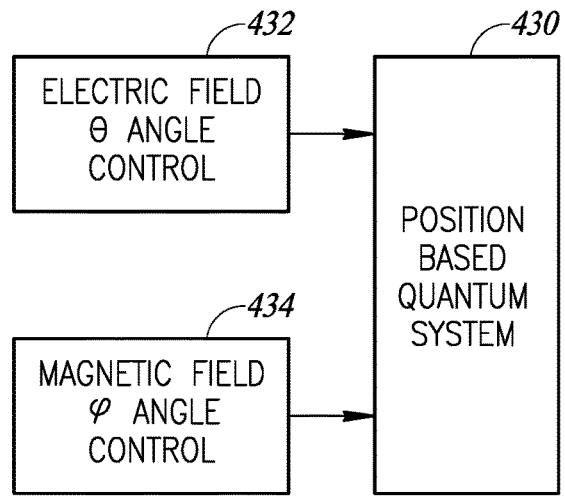
FIG. 35B is a diagram illustrating an example position based quantum system with θ angle electric field control and φ angle magnetic field control.

Inductors that create magnetic fields can also be fabricated in integrated circuits. A diagram illustrating an example position based quantum system with θ angle electric field control and φ angle magnetic field control is shown in FIG. 35B. In this embodiment, an electric field is used to control the angle θ, i.e. the position of the electron (block 432) and an auxiliary magnetic field is used to control the angle φ of the quantum state (block 434) of a position based quantum interaction system 430.

Figure 35C:
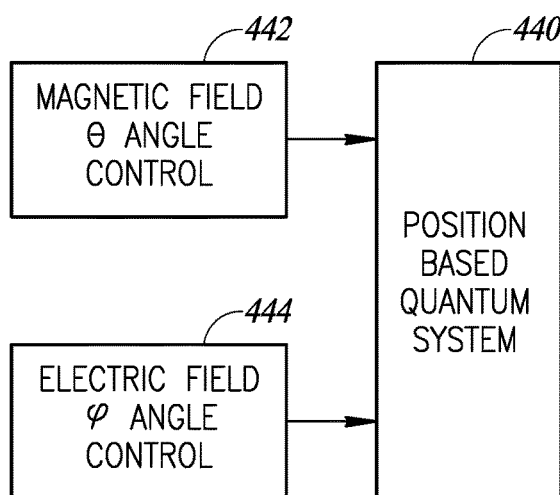
FIG. 35C is a diagram illustrating an example position based quantum system with θ angle magnetic field control and φ angle electric field control.

A diagram illustrating an example position based quantum system with θ angle magnetic field control and φ angle electric field control is shown in FIG. 35C. The flip case is also possible where a magnetic field is used to control the angle θ, i.e. the position of the electron (block 442) and an electric field is used to control the angle φ of the quantum state (block 444) of a position based quantum interaction system 440.

Figure 35D:
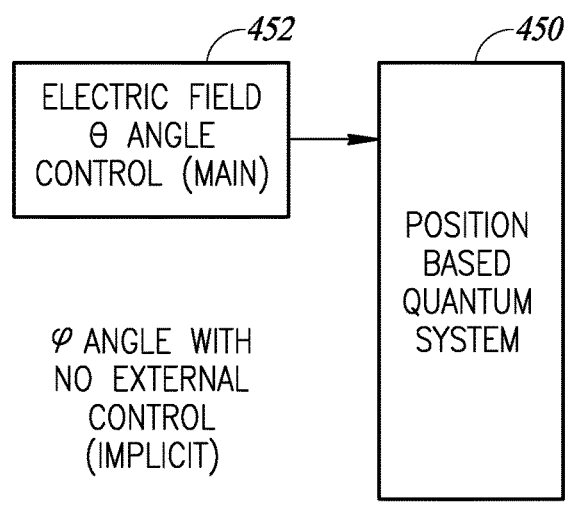
FIG. 35D is a diagram illustrating an example position based quantum system with θ angle electric field control and no φ angle external control.

A diagram illustrating an example position based quantum system with θ angle electric field control and no φ angle external control is shown in FIG. 35D. In this embodiment, an electric field is used to control the angle θ (block 452) and no external control is used to control the angle φ of a position based quantum interaction system 450. It is implied that angle φ will be whatever the quantum system yields at a given point. Note that the angle φ is not random but multiple qubits interacting may result in phases that are not synchronized. Thus, the difference φ1 minus φ2 between the electrons changes over time and this will impact the solution or the outcome of the quantum operation.

Figure 35E:
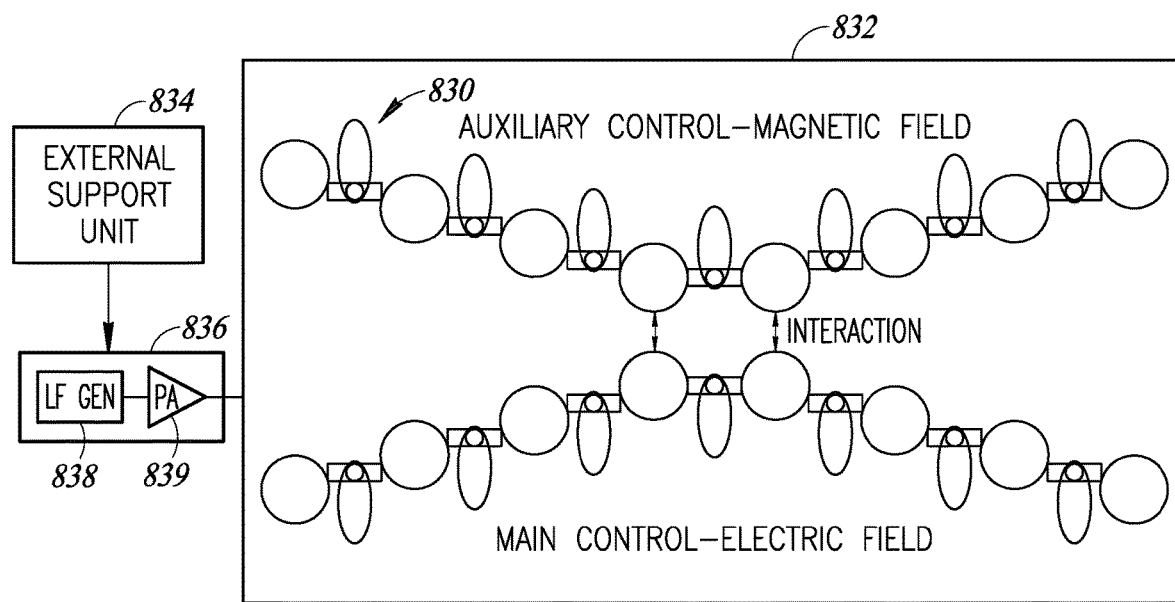
FIG. 35E is a diagram illustrating an example quantum interaction gate with electric field main control and magnetic field auxiliary control.

Most of the structures described supra use charge qubits and qdots that are electrically controlled via an electric field. A more general quantum structure can use hybrid electric and magnetic control. The magnetic field can be generated with an inductor or a resonator. A diagram illustrating an example quantum interaction gate with electric field main control and magnetic field auxiliary control is shown in FIG. 35E. The structure comprises a quantum interaction gate 830 located within an auxiliary magnetic control 832. The main control is electric. In this example, the hybrid electric and magnetic control is applied to a double-V structure using tunneling through local depleted regions. One or more gates can be under the control of a magnetic field generation structure. The control is local since only one interaction structure sees the strong magnetic field from the inductor (or resonator). Note that the size and shape of the magnetic field generator can vary. Note that the control for the electric and magnetic field generator is provided by the external support unit 834 and clock generator circuit 836 which includes a low frequency (LF) reference generator circuit 838 and power amplifier (PA) 839.

Figure 35F:
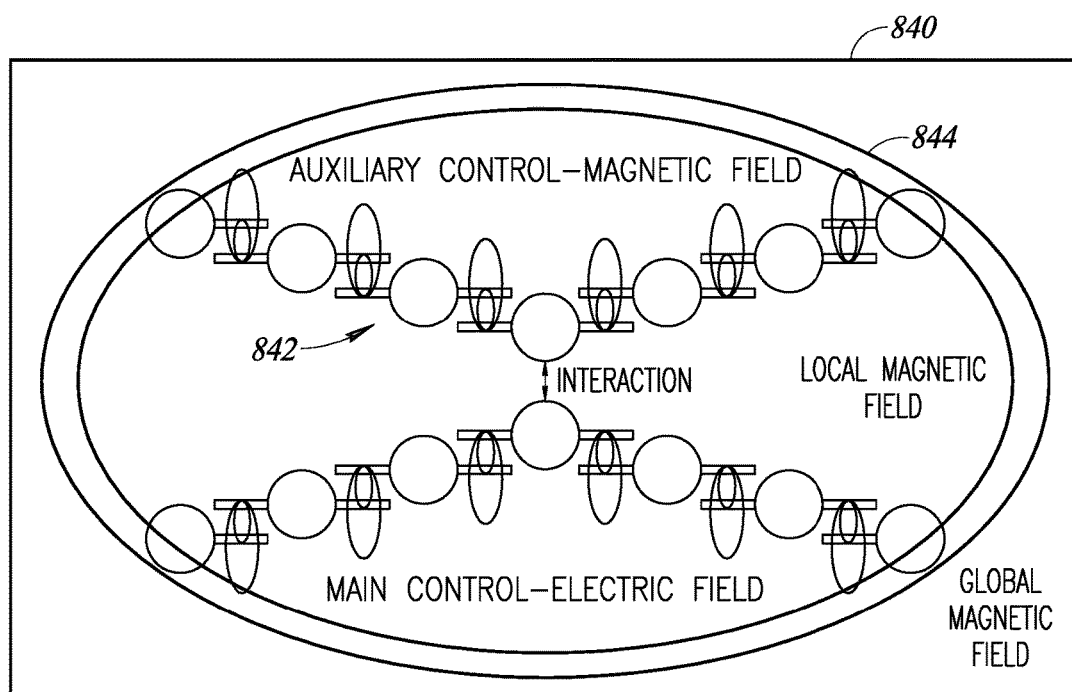
FIG. 35F is a diagram illustrating an example quantum interaction gate with electric field main control and local and global magnetic field auxiliary control.

A diagram illustrating an example quantum interaction gate with electric field main control and local and global magnetic field auxiliary control is shown in FIG. 35F. The structure comprises a quantum interaction gate 842 located within a magnetic control 844, and electric control 840. In this example, the hybrid electric and magnetic control is applied to a double-V structure using tunneling through local depleted regions with partial fin-to-gate overlap. One or more gates can be under the control of a magnetic field generation structure. The control is local since only one interaction structure is seeing the strong magnetic field from the inductor (or resonator). Note that the size and shape of the magnetic field generator can vary. Note that for clarity sake the external support unit and clock generation circuit are not shown but included in the circuit as in FIG. 35E.

Figure 35G:
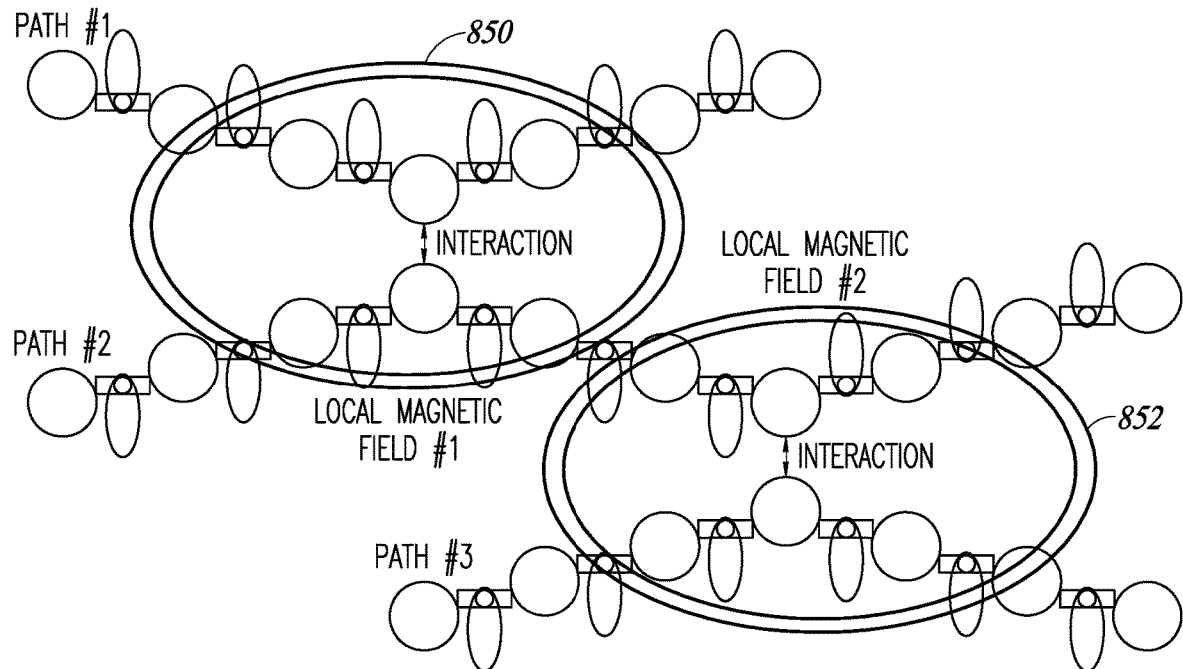
FIG. 35G is a diagram illustrating an example quantum interaction gate with local magnetic field control.

A diagram illustrating an example quantum interaction gate with local magnetic field control is shown in FIG. 35G. The structure comprises a quantum interaction gate with two local magnetic controls 850, 852 covering different portions of the interaction gate. In this example, both local magnetic controls are applied to a multiple-V structure using tunneling through local depleted regions. One or more gates can be under the control of a magnetic field generation structure. The control is local since only one interaction structure is seeing the strong magnetic field from the inductor (or resonator). Note that the size and shape of the magnetic field generator can vary. Note that for clarity sake the external support unit and clock generation circuit are not shown but included in the circuit as in FIG. 35E.

Figure 35H:
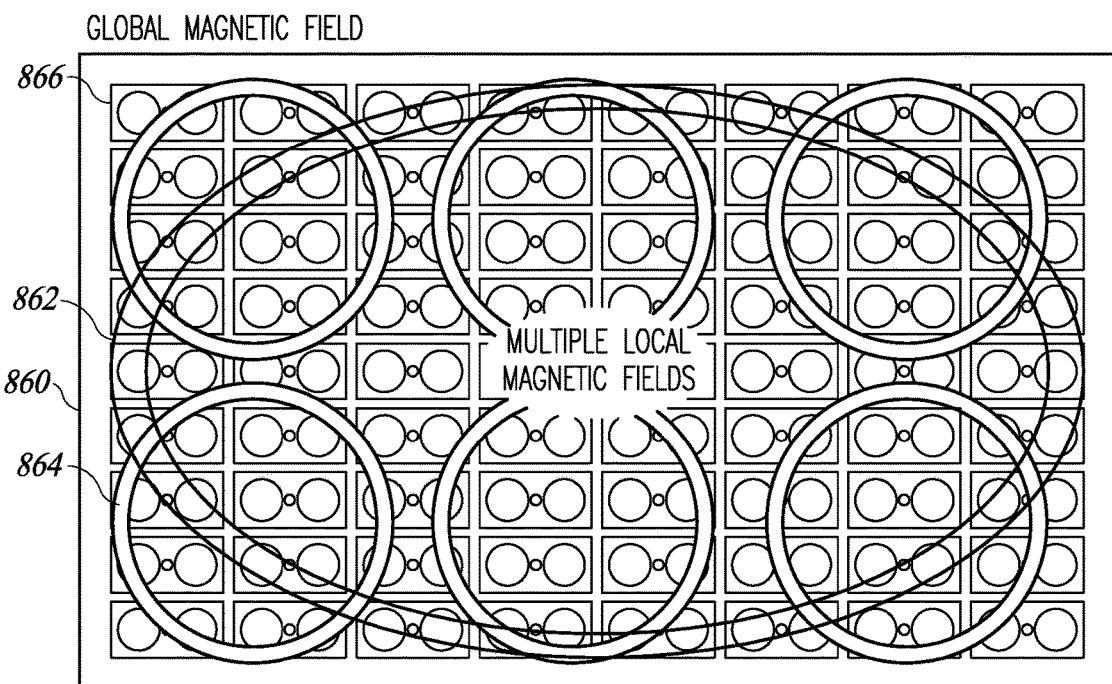
FIG. 35H is a diagram illustrating an example quantum interaction gate with global magnetic field control and a plurality of local magnetic fields control.

In the case of a larger quantum core, multiple inductors can be used to create local magnetic control fields. Alternatively, a global magnetic control can be used, which impacts two or more quantum structures at a time. A diagram illustrating an example grid array of programmable semiconductor qubits with both global and local magnetic fields is shown in FIG. 35H. The structure comprises a plurality of qubits 866 arranged in rows and columns, a plurality of local magnetic field controls 864 (per quantum gate or a small group of quantum gates), a global magnetic field control 862, and an electric control 860. With global magnetic control, multiple quantum structures are controlled by the same magnetic field. One example use for the magnetic field is to select the spin orientation of the particles that are loaded in the quantum structures/core.

Figure 36A:
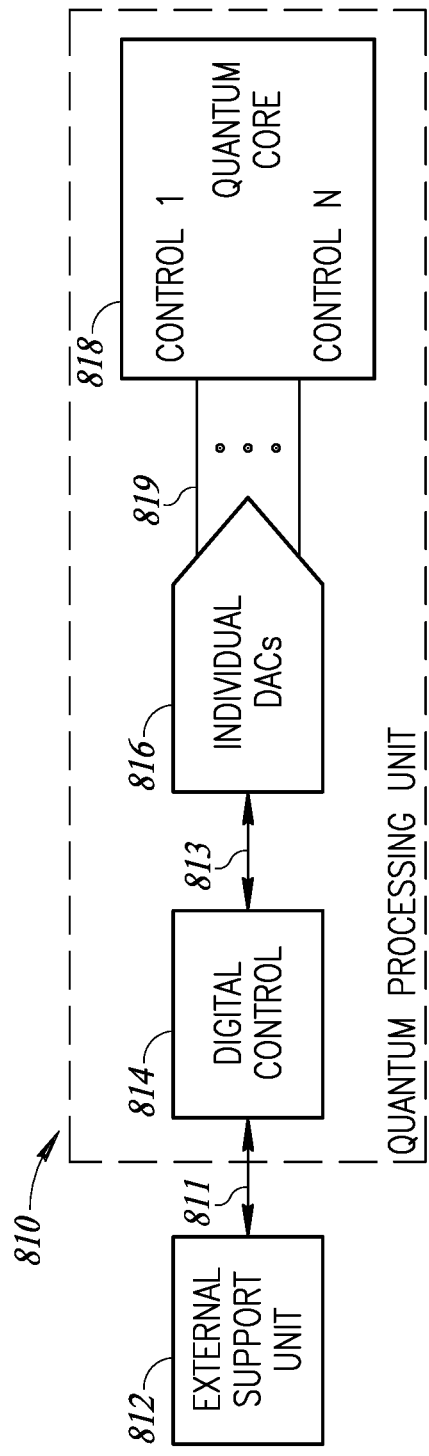
FIG. 36A is a diagram illustrating an example quantum processing unit incorporating a plurality of individual control signal DACs.

A diagram illustrating an example quantum processing unit incorporating a plurality of individual control signal DACs is shown in FIG. 36A. The quantum processing unit, generally referenced 810, comprises a digital control circuit 814, a plurality of individual DACs 816 whose analog control signal outputs are input to n control gates in quantum core 818. In operation, the quantum processing unit communicates with the external world via the external support unit 812. The external support unit may comprise a PC, a computer, an FPGA board, or any other kind of external electronic system or computing device. The external support unit interacts with the digital control 814. The quantum core 818 comprises a plurality of quantum circuits with quantum interaction gates and quantum wells with associated control terminals. A control signal for each control terminal is provided. This includes, for example, the control gates of the imposers, gates in the sources and the drains of the interface devices, etc. These circuits all need to have dedicated control signals which are generated in this embodiment by individual DACs 816.

Figure 36B:
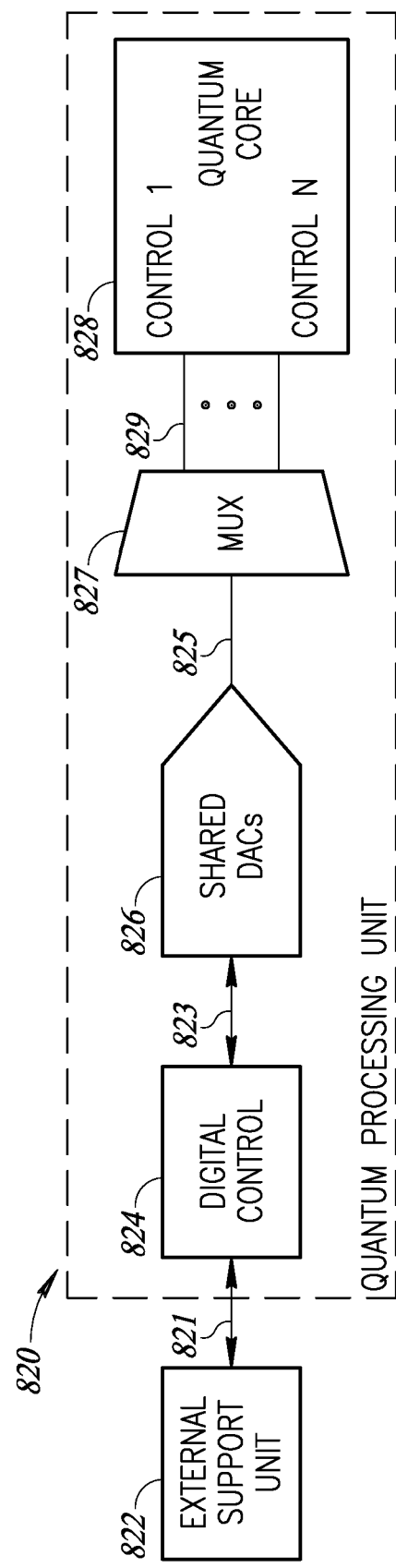
FIG. 36B is a diagram illustrating an example quantum processing unit incorporating shared control signal DACs.

A diagram illustrating an example quantum processing unit incorporating shared control signal DACs is shown in FIG. 36B. The quantum processing unit, generally referenced 820, comprises a digital control circuit 824, a plurality of shared DACs 826 whose analog control signal outputs are input via a multiplexer 827 to n control gates in quantum core 828. In this embodiment, the DACs are shared among the control gates in the quantum core. The digital control (e.g., DSP) functions to compute the controls needed which are converted to analog via an analog controller including the shared DACs. The result is a plurality of analog signals that go to the different control lines of the quantum core. Due to the relatively high number of control lines needed, the control circuit is shared between two or more ports thereby reducing the number of control signals.

In one example embodiment, 32 control circuits are required to control the different aspects of a single qubit. For two qubits, the number of control circuits doubles to 64. In the case of a thousand qubits, the number balloons to 32,000 control circuits. With higher numbers of qubits the control circuitry grows very quickly. Thus, sharing control circuits between different nodes using the same hardware is advantageous. Note that any control signals that must be controlled simultaneously cannot be shared. There is, however, some spatial distribution of quantum interaction gates whereby not all control signals need to be controlled at the same time.

A diagram illustrating an example quantum processing unit incorporating a combined amplitude and timing circuit is shown in FIG. 37A. The quantum processing unit, generally referenced 460, comprises interface (I/F) and digital control unit (DSP) 464, quantum control block 466 including combined amplitude and timing (pulse width) circuit 468, and quantum interaction gate, circuit, or core 469. The quantum processing unit 460 interfaces with the outside world via the external support unit 462. The digital control unit functions to calculate the different control signals needed to create a given quantum operation. In one embodiment, the digital control unit is programmable. The interface receives commands that determine what kind of control signals and circuits are to be generated. Once determined, the digital control unit instructs the combined amplitude and timing control circuit 468 to generate the analog control signals required to perform the particular quantum operation in the quantum interaction gate, circuit, or core. The precise amplitude and timing (i.e. pulse width) is calculated for each control signal. Note that in this embodiment, the amplitude as well as the timing for the control signals are generated together via circuit 468.

Alternatively, the amplitude and timing can be generated separately. A diagram illustrating an example quantum processing unit incorporating separate amplitude and timing circuits is shown in FIG. 37B. The quantum processing unit, generally referenced 470, comprises interface (I/F) and digital control unit (DSP) 474, quantum control block 476 including separate amplitude control circuit 478 and timing control (i.e. pulse width) circuit 479, and quantum interaction gate, circuit, or core 477. The quantum processing unit 470 interfaces with the outside world via the external support unit 472. The digital control unit functions to calculate the different control signals needed to create a given quantum operation. In one embodiment, the digital control unit is programmable. The interface receives commands that determine what kind of control signals and circuits are to be generated. Once determined, the digital control unit instructs the separate amplitude control 478 and timing control 479 circuits to generate the analog control signals required to perform the particular quantum operation in the quantum interaction gate, circuit, or core. The precise amplitude and timing (i.e. pulse width) is calculated for each control signal.

A description of the various types of control signals that can be applied to the control terminals will now be presented. A diagram illustrating a first example control gate signal is shown in FIG. 38A. The control signal 500 has a low value and a high value and transitions very quickly from low to high and high to low. Such control signals are useful for quantum switching operations and quantum switching machines. A diagram illustrating a second example control gate signal is shown in FIG. 38B. The control signal 502 has low and high values but a slow rise time and a quick fall time. A diagram illustrating a third example control gate signal is shown in FIG. 38C. The control signal 504 has low and high values but a quick rise time and a slow fall time. A diagram illustrating a fourth example control gate signal is shown in FIG. 38D. The control signal 506 has low and high values and slow rise and fall times. Control signals with slow rise and/or fall times are useful in realizing annealing quantum interaction gates and quantum machines.

A mixture of control signals 500 and 506 can be used in quantum machines that do both annealing and switching operations, but not at the same time for a given qubit. Some qubits may be switching and some annealing. In addition a single qubit may have a hybrid operation using the control signals 502, 504. A slow rising edge means an adiabatic state change as Rabi oscillation tunneling is achieved. Stopping the Rabi oscillation, stops the tunneling sharply. So one edge is fast when one edge is slow. The opposite case is also possible, i.e. the rising edge is fast and the falling edge is slow. Enabling the Rabi oscillation quickly obviates adiabatic but switching it off enables adiabatic. Thus, control signals 500, 502, 504, 506 are four main control signals suitable for a switched quantum computer (500), annealing quantum computer (506), and hybrid switched annealing quantum computers (502, 504).

A diagram illustrating a fifth example control gate signal is shown in FIG. 38E. The control signal 508 comprises a pulse with quick rising and falling edges and a step 509 in the 'on' portion. As described supra, quantum tunneling is exponentially dependent on the tunneling barrier. If amplitude in the on state is changed even slightly this can impact the frequency of the Rabi oscillation quite significantly and therefore the frequency of the tunneling which can change the outcome of the quantum operation. The slight step 509 in the amplitude thus slightly impacts the frequency of the Rabi oscillation.

A diagram illustrating a sixth example control gate signal is shown in FIG. 38F. The control signal 510 in this case comprises a step 511 in the 'off' state. In this case, the on state is constant in amplitude but the off state changes. This is performed, for example, because the quantum system is very sensitive in the on state and very insensitive when in the off state. Thus, much higher amplitude changes in the off state are required to make any kind of change in the state of the system. A diagram illustrating a seventh example control gate signal is shown in FIG. 38G. The control signal may include changes in amplitude both for the on and off states. The control signal 512 in this case is a combination of the two control signals 508, 510 with a step 513 in the on state as well as a step 515 in the off state.

A diagram illustrating an eighth example control gate signal is shown in FIG. 38H.

The control signal 514 comprises two pulses where the pulse widths are different. Thus, the control signal may comprise two or more pulses but they do not necessarily have to be the same width. Multiple pulses of different widths may be used.

A diagram illustrating a ninth example control gate signal is shown in FIG. 38I. The control signal 516 comprises two pulses in this case. The amplitude and pulse width set in accordance with the desired quantum operation. A diagram illustrating a tenth example control gate signal is shown in FIG. 38J. The control signal 518 in this case comprises a plurality of pulses.

A diagram illustrating an eleventh example control gate signal is shown in FIG. 38K. The control signal 520 comprises a train of pulses where the amplitude of each may be different. The dotted line 522 highlights the different amplitudes of the pulses.

A diagram illustrating a twelfth example control gate signal is shown in FIG. 38L. The control signal 524 comprises a train of pulses where the amplitude and pulse width of each may be different. The dotted line 526 highlights the different amplitudes of the pulses. This pulse train can be viewed as the most generalized pulse control signal.

A diagram illustrating a thirteenth example control gate signal is shown in FIG. 38M. The control signal 528 comprises a pulse having fast rising and falling edges and a sine wave 530 in the on portion of the pulse. In this case, the sine wave is in the on portion of the pulse but is not limited to this. In one embodiment, the sine wave is used to control the angle φ of a quantum interaction gate and a quantum structure. The base energy of a quantum state can be changed by having an oscillatory excitation for the control signal. Thus, using a sine wave an average of zero can be obtained or any desired average depending on how many cycles are selected.

A diagram illustrating a fourteenth example control gate signal is shown in FIG. 38N. The control signal 532 comprises a pulse having fast rising and falling edges and a sine wave 534 in a portion of the on state of the pulse. Note that the angle φ can be manipulated by using an oscillatory signal either on the entire state (control signal 528) or a part thereof (control signal 532).

A diagram illustrating a fifteenth example control gate signal is shown in FIG. 38O. The control signal 536 comprises a pulse with fast rise and fall times for the on state. An oscillatory signal 538, e.g., sine wave, is inserted in the off state.

A diagram illustrating a sixteenth example control gate signal is shown in FIG. 38P. The control signal 540 comprises two pulses each with fast rise and fall for the on states and an oscillatory signal 542 in the off state between them.

A diagram illustrating a seventeenth example control gate signal is shown in FIG. 38Q. The control signal 544 comprises two pulses where one has an oscillatory signal 546 in the on state of one of the pulses and an oscillatory signal 548 in the off state as well.

A diagram illustrating an eighteenth example control gate signal is shown in FIG. 38R. The control signal 550 comprises a plurality of pulses of different amplitudes and pulse widths where one or more pulses has an oscillatory signal 554 in the on state.

Note that the frequency of the oscillatory signals may vary from signal to signal and pulse to pulse. In addition, the control pulses may have different amplitudes and different widths. Further, any combinations of the above control signal features may be generated.

In the case where a quantum interaction gate comprises two qubits, typically two control signals are required, rather than one. The control signals are typically what determines the functionality of the quantum circuit. A diagram illustrating a first example pair of control gate signals $G_A$ and $G_B$ is shown in FIG. 39A. Control signal $G_A$ 560 comprises a pulse with fast rising and falling edges and control signal $G_B$ 562 remains static in the off state at least for the time that is observed. These control signals provide a control NOT functionality to the two qubits.

A diagram illustrating a second example pair of control gate signals $G_A$ and $G_B$ is shown in FIG. 39B. Control signal $G_A$ 564 comprises a pulse with fast rising and falling edges and control signal $G_B$ 566 comprises a pulse with fast rising and falling edges but skewed in time from $G_A$. Each gate of the qubits is pulsed one at a time.

A diagram illustrating a third example pair of control gate signals $G_A$ and $G_B$ is shown in FIG. 39C. Control signal $G_A$ 568 comprises a pulse with fast rising and falling edges and control signal $G_B$ 570 also comprises a pulse with fast rising and falling edges simultaneous with $G_A$. These control signals provide a quantum SWAP gate. Note that if both qubits are pulsed at the same time but with slow edges the quantum annealing structure can be realized.

A diagram illustrating a fourth example pair of control gate signals $G_A$ and $G_B$ is shown in FIG. 39D. Control signal $G_A$ 572 comprises a pulse with fast rising and falling edges and a first amplitude and control signal $G_B$ 574 comprises a pulse with fast rising and falling edges and a second different amplitude and simultaneous with $G_A$. The arrows in the x-direction indicate that the low state is the same for the two control signals. The amplitudes, however, are different. This means that the tunneling speed of the $G_A$ qubit will be different from the tunneling speed of $G_B$ qubit.

A diagram illustrating a fifth example pair of control gate signals $G_A$ and $G_B$ is shown in FIG. 39E. Control signal $G_A$ 576 comprises a pulse with fast rising and falling edges and a first off state amplitude and control signal $G_B$ 578 comprises a pulse with fast rising and falling edges and a second different off state amplitude, simultaneous with $G_A$. In this case, the arrows in the x-dimension indicate that the on state amplitude of the two control signals are the same. The amplitude of the off state, however, is different. Thus, $G_A$ and $G_B$ fall differently, $G_A$ goes lower while $G_B$ goes less lower. This is called asymmetric control where the control signals are not the same.

A diagram illustrating a sixth example pair of control gate signals $G_A$ and $G_B$ is shown in FIG. 39F. Control signal $G_A$ 580 comprises a pulse with fast rising and falling edges and control signal $G_B$ 582 comprises a pulse with fast rising and falling edges with different timing than $G_A$. The two control signals partially overlap in time. This causes an initial phase shift when $G_A$ goes high. As $G_B$ quickly switches on it overlaps with $G_A$ resulting in a quantum SWAP operation. $G_A$ then finishes and $G_B$ continues resulting in another phase shift.

A diagram illustrating a seventh example pair of control gate signals $G_A$ and $G_B$ is shown in FIG. 39G. Control signal $G_A$ 584 comprises a pulse with fast rising and falling edges and control signal $G_B$ 586 comprises a pulse with fast rising and falling edges, simultaneous with $G_A$. Note that large amplitude control signals are needed to achieve proper tunneling between quantum states. In this example, however, rather than achieve full tunneling, only a slight change of the angle of the state is achieved by applying a lower amplitude for both $G_A$ and $G_B$. This can be used, for example, in quantum error correction. Consider a quantum state where the electrons are interacting with each other. All the information is in the entangled quantum state, but errors occurred due to noise in the system, etc. Raising the gate voltages of the different gates by a small amount allows the state to readjust itself to compensate for the errors that were created but it does not change it fundamentally.

A diagram illustrating an eighth example pair of control gate signals $G_A$ and $G_B$ is shown in FIG. 39H. Control signal $G_A$ 588 comprises a pulse with fast rising and falling edges and control signal $G_B$ 590 comprises a pulse skewed in time from $G_A$ with fast rising and falling edges and an oscillatory signal in the on state. In this example, the control signals provide a control NOT operation followed by an oscillatory signal on $G_B$ where the angle φ of rotation of one of the qubits or both of them is corrected.

A diagram illustrating a ninth example pair of control gate signals $G_A$ and $G_B$ is shown in FIG. 39I. Control signal $G_A$ 592 comprises a pulse with fast rising and falling edges with an oscillatory signal in the off state and control signal $G_B$ 594 comprises a pulse skewed in time from $G_A$ with fast rising and falling edges. In this example, the control signals provide a control NOT operation followed by an oscillatory signal on $G_B$ where the angle φ of rotation of one of the qubits or both of them is corrected.

A diagram illustrating an example quantum processing unit with separate amplitude and time position control units is shown in FIG. 40A. The quantum processing unit 600 comprises digital signal processing control (DSP) circuit 604, amplitude DAC control unit 614, pulse width and time position DAC control unit 618, injector amplitude DACs 632, imposer amplitude DACs 634, detector amplitude DACs 636, injector time and pulse width DACs 638, imposer time and pulse width DACs 640, detector time and pulse width DACs 642, and quantum core 644. The quantum core 644 comprises a quantum circuit 650, imposers 646, injectors 648, and detectors 652.

The quantum computing core 644 has a certain structure depending on the desired application along with injector, imposer, detector, and reset (not shown) circuits. The required control signals to these circuits are generated by the DACs electronic circuits in this example. It is appreciated that they can be generated not only with digital to analog control circuits but by using pure analog circuitry as well. Regardless of the mechanism, ultimately, analog control is required. The pulse shaping can be performed by an analog circuit, digital circuit, or a combination thereof.

Thus, a plurality of DACs provide the control signals that are input to the quantum structure. In one embodiment, 32 control signals, i.e. 32 DACs, are required for each qubit. Although the amplitude and timing can be controlled together, it is typically easier to control them separately as shown in FIG. 40A. Therefore, some DACs are dedicated to controlling amplitude and others are dedicated to controlling timing of the signals.

The quantum processing unit interfaces to the outside world via the digital control (DSP) 604 and the external support unit 602. In addition, each of the amplitude DAC control unit and the pulse width and time position DAC control unit comprise calibration circuits 616, 620, respectively. In one embodiment, calibration circuits (also referred to as calibration loops) are used to compensate for variations in the circuits and to enable generation of precise amplitude and timing. Without the calibration loops, the amplitude and timing of the control signals may be inaccurate due to process variability, temperature variability, and other environmental variabilities resulting in inaccuracies in the quantum structure.

In addition, the quantum processing unit receives a high frequency clock 624 that is provided externally. The clock is input to a clock buffer 626 followed by a multiphase clock divider 628. Using an edge selector 622, the multi-phase signal is used to create pulses that have various pulse widths and positions in time. A memory based pulse generator 630 functions to select a sequence to use for each of the control pulses.

Moreover, the quantum processing unit comprises several sensors, including a local temperature sensor 608, process sensor 610 to detect process corners for the chip, and magnetic field sensor 612 to detect the magnetic field of the earth or other perturbing electromagnetic fields in proximity, all connected to the digital control 604. For example, if a perturbation on the system is detected, a temperature process adjustment or an environmental adjustment that changes the digital control can be performed. This, in turn, will change the amplitude and the timing that goes into the DACs thereby changing the signals input to the quantum structure to compensate for those external factors.

A diagram illustrating an example quantum processing unit with separate amplitude and time position control units and control adjustments for qubit entanglement is shown in FIG. 40B. The quantum processing unit, generally referenced 670, comprises digital control (DSP) circuit 674, amplitude and time/pulse width (PW) DAC control unit for qubit A 676, amplitude and time/pulse width (PW) DAC control unit for qubit B 680, control adjustment circuit 678 for qubit A to qubit B entanglement, amplitude DACs 682 for qubit A, time and pulse width DACs 684 for qubit A, amplitude DACs 686 for qubit B, time and pulse width DACs 688 for qubit B, and quantum core 706. The quantum core 706 in this example comprises two qubits, namely qubit A 694 and qubit B 700. Associated with qubit A are injector circuits 692, imposer circuits 690, and detector circuits 696. Associated with qubit B are injector circuits 698, imposer circuits 704, and detector circuits 702. In addition, the digital control circuit 674 communicates with the external support unit 672. Note that for clarity sake, individual DACs for the injector, imposer, and detector circuits for both qubits as well as other circuitry are not shown in FIG. 40B. It is understood, however, that the quantum processor unit 670 is constructed similarly to the quantum processor unit 600 of FIG. 40A.

Note that the voltage of the control signals and timing levels for a single qubit are relatively known and have a certain value. Given two qubits, however, that are entangled, the voltage level needed to obtain a Rabi oscillation with multiple entangled electrons is slightly different from that for a separate electron. This is because the separate electron behaves differently but in a predictable way from entangled electrons. In addition, calibration of the system is generally straightforward for a single electron. With entangled electrons performing control adjustment is based on the number of qubits that are entangled. The control circuit 678 functions to change slightly the amplitude and the timing of the control signals to compensate for the fact that the two qubits are in entangled states.

As described supra, the quantum state can be represented by two phases $\theta$ and $\varphi$. The $\theta$ angle gives the split of the electron's wavefunction between two or more qubits. The $\varphi$ angle cannot be measured externally but can be impacted externally and thus be changed. Although $\varphi$ cannot be measured in a single qubit it can be measured in a two-qubit interaction resulting from the impact of the difference between the two $\varphi$ angles.

A diagram illustrating a first example qubit with $\varphi$ angle control is shown in FIG. 41A. The quantum interaction gate, generally referenced 710, is shown for illustration purposes only. It is appreciated that numerous other quantum structures may be used as well. The interaction gate comprises a continuous well 720, plurality of control gates 722, local depletion regions 732 for tunneling, interface devices/wells 730, 728, particle 724 which can be in the full or split state, reset circuit 714, injector circuit 716, imposer circuit 718, detector circuit 712, and $\varphi$ angle control circuit 726.

The angle $\varphi$ of the quantum state can be changed by applying an additional static voltage or potential $V_\varphi$. The $\varphi$ angle control circuit 726 provides a potential that is applied at one end of the quantum structure. Via the control gates this potential is propagated in close proximity to the particle. Note that the potential should come in close proximity to be effective. Once the $\varphi$ angle control potential is in close proximity to the electron it will impact the phase. For example, if a particle is split between two qdots, and a static control potential is brought in close proximity to a quantum state or an electron, this will impact the phase $\varphi$ thereof.

A diagram illustrating a second example qubit with $\varphi$ angle control is shown in FIG. 41B. The quantum interaction gate, generally referenced 740, comprises a continuous well 754, plurality of control gates 750, local depletion regions 756 for tunneling, interface wells/devices 752, 758, 751, particle 753 which can be in the full or split state, reset circuit 742, injector circuit 744, imposer circuit 746, detector circuit 748, and $\varphi$ angle control circuit 755.

In this alternative embodiment, the injector and reset circuits are on one end and the detector circuit the other. The electron is injected into the quantum well on the left side and exits on the right. In this case, the top interaction qdot has another quantum dot linked to it. A $\varphi$ angle control circuit 755 generates a static potential $V_\varphi$ that is applied to interface device 751 to control the potential on the two qdots adjacent to the quantum structure which functions to change the angle $\varphi$ of the quantum state.

Note that the $\varphi$ angle control voltage is not applied to a gate since that would affect the tunneling and impact the angle $\theta$. It is desired that the electron stays in exactly the split state it is in. Only the procession is to be affected and the procession is impacted by a static electric field. The static electric field is applied from something that is in close proximity. The well is the closest place to apply the voltage and this is done via an interface device coupled to a classic circuit. It is appreciated that the static control voltage can be applied via metal, poly or a well.

In another embodiment, the electrostatic field created by the $\varphi$ angle control voltage can be applied via one or more back gates rather than via front gates. A diagram illustrating a third example qubit with $\varphi$ angle control is shown in FIG. 41C. The example quantum interaction gate, generally referenced 760, comprises a continuous well layer 768, BOX oxide 766 and an additional layer 772 under the oxide 766 referred to as a back gate. In this embodiment, the interaction gate comprises both front gate control 762 and back gate control 764. The $\varphi$ angle control voltage is applied to the back gate control from the top side where it is electrically connected to back layer 772 via metal 774 and via well 770.

Note that the back gate under the quantum well 768 is reached via metal 774 and a portion of well 770 that penetrates through the oxide to a well 772 under the oxide 766. Thus by controlling the voltage at the back gate control terminal 764 the potential of the back gate well can be controlled which changes the angle $\varphi$ in the structure.

A diagram illustrating an example pair of qubits with $\varphi$ angle control is shown in FIG. 41D. The example quantum interaction gate, generally referenced 780, comprises two qubits. The left qubit comprises a continuous well layer 792, BOX oxide 790 and an additional layer back gate 798 under the oxide 790, front gate control #1 782, back gate control #1 786, metal 804, and well 796. The $\varphi$ angle control voltage is applied to the back gate control from the top side where it is electrically connected to back layer 798 via metal 804 and well 796. The right qubit comprises a continuous well layer 794, BOX oxide 790 and an additional layer back gate 802 under the oxide, front gate control #2 784, back gate control #2 788, metal 808, and well 800. The $\varphi$ angle control voltage is applied to the back gate control from the top side where it is electrically connected to back layer 802 via metal 808 and well 800.

Thus, in this embodiment, multiple quantum sections have separate backside connections. In this manner, the angle $\varphi$ can be impacted differently in the left qubit versus the right qubit. Note that what is important is the difference between $\varphi 1$ and $\varphi 2$ of the two qubits and not their absolute value. Therefore, if there is a difference in the angles that impacts the quantum results in a negative way, the $\varphi$ angle can be controlled via the back gate such that the two angles are aligned to a point where $\varphi 1$ minus $\varphi 2$ does not pose a problem for the quantum operation.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of controlling an angle θ of a quantum state of a quantum interaction gate incorporating a target qubit having at least two qdots and a control gate fabricated therebetween, the method comprising:

generating an electrostatic gate control voltage signal in accordance with a desired angle θ; and
applying said electrostatic gate control voltage signal to said control gate to control the angle θ of the quantum state of the target qubit thereby.

2. The method according to claim 1, wherein said electrostatic gate control voltage signal is generated by an individual digital to analog converter (DAC).

3. The method according to claim 1, wherein said electrostatic gate control voltage signal is generated by a shared digital to analog converter (DAC).

4. The method according to claim 1, wherein amplitude and timing of said electrostatic gate control voltage signal are determined in accordance with the desired quantum operation.

5. The method according to claim 1, wherein amplitude and timing portions of said electrostatic gate control voltage signal are determined by a combined amplitude and timing digital to analog converter (DAC) control unit.

6. The method according to claim 1, wherein amplitude and timing portions of said electrostatic gate control voltage signal are determined by separate amplitude and timing digital to analog converter (DAC) control units.

7. The method according to claim 1, wherein said electrostatic gate control voltage signal is selected from a group consisting of a pulse having fast rise and fall times, a pulse having slow rise and fast fall times, a pulse having fast rise and slow fall times, a pulse having slow rise and fall times, a pulse having stepped on portion, a pulse having stepped off region, multiple pulses of varying amplitude and width, a pulse with oscillatory on portion, a pulse with oscillatory off portion, multiple pulses with oscillatory on and oscillatory off portions, and multiple pulses with oscillatory on and oscillatory off portions and varying amplitude and width.

8. The method according to claim 1, where wherein said qubit comprises a position based qubit.

9. The method according to claim 1, wherein said target qubit is constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

10. A method of controlling an angle θ of a quantum state of a semiconductor quantum interaction gate incorporating a target qubit having at least two qdots and a control gate fabricated therebetween, the method comprising:

providing a control qubit;
placing said control qubit in close proximity to the target qubit to elicit quantum interaction therebetween, said control qubit having at least two qdots and a control gate fabricated therebetween;
controlling the quantum state of the control qubit so as to impact the quantum state of the target qubit thereby controlling the angle θ of the target qubit.

11. The method according to claim 10, wherein the quantum state of the control qubit is controlled by applying an appropriate electrostatic gate control voltage signal to the control gate thereof.

12. The method according to claim 10, wherein an occupancy oscillation of said target qubit is at a first frequency when a carrier in said control qubit is relatively near to said target qubit.

13. The method according to claim 10, wherein a Rabi oscillation of said target qubit is at a second frequency when a carrier in said control qubit is relatively far from said target qubit.

14. The method according to claim 10, wherein said target qubit and said control qubit are constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

15. A method of controlling an angle θ of a quantum state of a semiconductor quantum interaction gate incorporating a target qubit having at least two qdots and a control gate fabricated therebetween, the method comprising:
- generating a electrostatic gate control voltage in accordance with a desired angle θ;
- providing a control qubit;
- placing said control qubit in close proximity to the target qubit to elicit quantum interaction therebetween, said control qubit having at least two qdots and a control gate fabricated therebetween; and
- controlling the quantum state of the control qubit so as to impact the quantum state of the target qubit and applying said electrostatic gate control voltage to said control gate, both of which combined control the angle θ of the target qubit thereby.

16. The method according to claim 15, wherein a Rabi oscillation of said target qubit is at a first frequency when a carrier in said control qubit is relatively near to said target qubit.

17. The method according to claim 15, wherein a Rabi oscillation of said target qubit is at a second frequency when a carrier in said control qubit is relatively far from said target qubit.

18. The method according to claim 15, wherein amplitude and timing of said electrostatic gate control voltage signal are determined in accordance with the desired quantum operation.

19. The method according to claim 15, wherein amplitude and timing portions of said electrostatic gate control voltage signal are determined by a combined amplitude and timing digital to analog converter (DAC) control unit.

20. The method according to claim 15, wherein amplitude and timing portions of said electrostatic gate control voltage signal are determined by separate amplitude and timing digital to analog converter (DAC) control units.

21. The method according to claim 15, wherein said electrostatic gate control voltage signal is selected from a group consisting of a pulse having fast rise and fall times, a pulse having slow rise and fast fall times, a pulse having fast rise and slow fall times, a pulse having slow rise and fall times, a pulse having stepped on portion, a pulse having stepped off region, multiple pulses of varying amplitude and width, a pulse with oscillatory on portion, a pulse with oscillatory off portion, multiple pulses with oscillatory on and oscillatory off portions, and multiple pulses with oscillatory on and oscillatory off portions and varying amplitude and width.

22. The method according to claim 15, wherein said target qubit is constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

* * * * *